United States Patent
Lee et al.

(10) Patent No.: US 12,446,466 B2
(45) Date of Patent: Oct. 14, 2025

(54) COMPOUND AND ORGANIC LIGHT EMITTING DEVICE COMPRISING SAME

(71) Applicant: LG CHEM, LTD., Seoul (KR)

(72) Inventors: Hojung Lee, Daejeon (KR); Wanpyo Hong, Daejeon (KR);
(Continued)

(73) Assignee: LG CHEM, LTD., Seoul (KR)

( * ) Notice: Subject to any disclaimer, the term of this patent is extended or adjusted under 35 U.S.C. 154(b) by 896 days.

(21) Appl. No.: 17/618,309

(22) PCT Filed: Jan. 20, 2021

(86) PCT No.: PCT/KR2021/095015
§ 371 (c)(1),
(2) Date: Dec. 10, 2021

(87) PCT Pub. No.: WO2021/150091
PCT Pub. Date: Jul. 29, 2021

(65) Prior Publication Data
US 2022/0402887 A1    Dec. 22, 2022

(30) Foreign Application Priority Data
Jan. 21, 2020   (KR) .................. 10-2020-0007825

(51) Int. Cl.
*H10K 85/60*    (2023.01)
*C07D 307/77*    (2006.01)
(Continued)

(52) U.S. Cl.
CPC ....... *H10K 85/6574* (2023.02); *C07D 307/77* (2013.01); *C07D 307/91* (2013.01);
(Continued)

(58) Field of Classification Search
CPC ............. H10K 85/6574; H10K 85/615; C07B 2200/05
See application file for complete search history.

(56) References Cited

U.S. PATENT DOCUMENTS

| 10,763,441 B2 | 9/2020 | Nakano et al. |
| 10,777,752 B2 | 9/2020 | Nakano et al. |

(Continued)

FOREIGN PATENT DOCUMENTS

| KR | 10-2012-0038402 A | 4/2012 |
| KR | 2016-0141361 A | 12/2016 |

(Continued)

OTHER PUBLICATIONS

Hatakeyama et al. "Ultrapure Blue Thermally Activated Delayed Fluorescence Molecules: Efficient HOMO-LUMO Separation by the Multiple Resonance Effect," Adv. Mater. 2016, 28, 2777-2781.
(Continued)

*Primary Examiner* — Vu A Nguyen
(74) *Attorney, Agent, or Firm* — Bryan Cave Leighton Paisner LLP

(57) ABSTRACT

A compound of Chemical Formula 1:

[Chemical Formula 1]

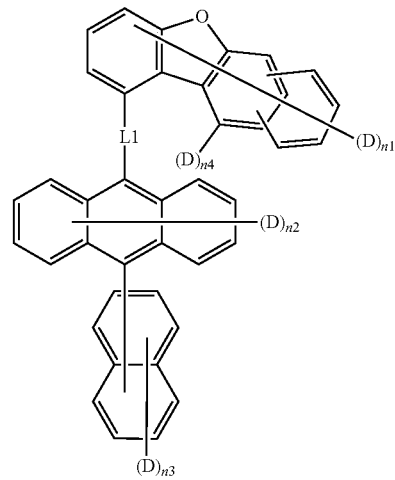

and an organic light emitting device including the same.

9 Claims, 2 Drawing Sheets

(51) Int. Cl.
  *C07D 307/91* (2006.01)
  *C09K 11/06* (2006.01)
  *H10K 50/11* (2023.01)
  *H10K 50/15* (2023.01)
  *H10K 50/16* (2023.01)
  *H10K 101/00* (2023.01)
  *H10K 101/10* (2023.01)

(52) U.S. Cl.
  CPC ............ *C09K 11/06* (2013.01); *H10K 50/156* (2023.02); *H10K 50/166* (2023.02); *H10K 85/615* (2023.02); *H10K 85/626* (2023.02); *C07B 2200/05* (2013.01); *C09K 2211/1018* (2013.01); *H10K 50/11* (2023.02); *H10K 2101/10* (2023.02); *H10K 2101/27* (2023.02)

(72) Inventors: Jae Seung Ha, Daejeon (KR); Ji Young Choi, Daejeon (KR); Woochul Lee, Daejeon (KR); Joo Ho Kim, Daejeon (KR); Hoon Jun Kim, Daejeon (KR); Seonwoo Kim, Daejeon (KR)

(56) References Cited

U.S. PATENT DOCUMENTS

| | | |
|---|---|---|
| 2012/0138914 A1 | 6/2012 | Kawamura et al. |
| 2014/0159005 A1 | 6/2014 | Kawamura et al. |
| 2015/0005512 A1 | 1/2015 | Kawamura et al. |
| 2015/0372237 A1 | 12/2015 | Kawamura et al. |
| 2016/0351817 A1 | 12/2016 | Kim et al. |
| 2017/0133600 A1 | 5/2017 | Pyo et al. |
| 2018/0301629 A1 | 10/2018 | Hatakeyama et al. |
| 2019/0058124 A1 | 2/2019 | Hatakeyama et al. |
| 2019/0115538 A1 | 4/2019 | Lim et al. |
| 2019/0305227 A1* | 10/2019 | Yoon .................... C07D 409/10 |
| 2021/0020842 A1* | 1/2021 | Han .................... C07D 409/04 |
| 2021/0053998 A1 | 2/2021 | Kim et al. |
| 2021/0336144 A1 | 10/2021 | Kim et al. |

FOREIGN PATENT DOCUMENTS

| | | | |
|---|---|---|---|
| KR | 2017-0055411 A | 5/2017 | |
| KR | 2017-0064131 A | 6/2017 | |
| KR | 20180108604 A | 10/2018 | |
| KR | 2019-0042791 A | 4/2019 | |
| KR | 2019-0113498 A | 10/2019 | |
| KR | 2019-0132945 A | 11/2019 | |
| KR | 20190139783 A * | 12/2019 | ......... H01L 51/0071 |
| KR | 10-2020-0019272 A | 2/2020 | |
| KR | 10-2021-0067267 A | 6/2021 | |
| KR | 10-2021-0075089 A | 6/2021 | |
| KR | 10-2261230 B1 | 6/2021 | |
| WO | 2010-137285 A1 | 12/2010 | |
| WO | 2019235873 A1 † | 12/2019 | |
| WO | 2020075783 A1 † | 4/2020 | |

OTHER PUBLICATIONS

Chem. Commun., 2014, 50, 14870.

* cited by examiner
† cited by third party

[FIG. 1]

| 3 |
|---|
| 4 |
| 2 |
| 1 |

[FIG. 2]

| 3 |
|---|
| 9 |
| 8 |
| 4 |
| 6-2 |
| 6-1 |
| 5 |
| 2 |
| 1 |

[FIG. 3]

| 3 |
|---|
| 9 |
| 8-2 |
| 8-1 |
| 4 |
| 7 |
| 6 |
| 5-2 |
| 5-1 |
| 2 |
| 1 |

COMPOUND AND ORGANIC LIGHT EMITTING DEVICE COMPRISING SAME

CROSS-REFERENCE TO RELATED APPLICATIONS

This application is a National Stage Application of International Application No. PCT/KR2021/095015 filed on Jan. 20, 2021, which claims priority to and the benefits of Korean Patent Application No. 10-2020-0007825, filed with the Korean Intellectual Property Office on Jan. 21, 2020, the disclosures of which are incorporated herein by reference in their entirety.

FIELD OF DISCLOSURE

The present specification relates to a compound, and an organic light emitting device including the same.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

SUMMARY

The present specification provides a compound, and an organic light emitting device including the same.

One embodiment of the present specification provides a compound of the following Chemical Formula 1.

[Chemical Formula 1]

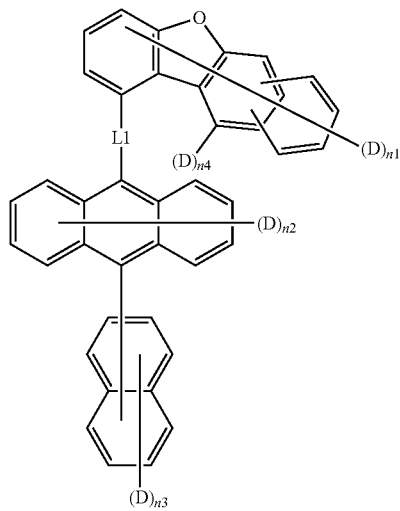

wherein in Chemical Formula 1,

L1 is a direct bond; or a substituted or unsubstituted arylene group,

D is deuterium, n1 is an integer of 0 to 8, n2 is an integer of 0 to 8, n3 is an integer of 0 to 7, n4 is 0 or 1, and $1 \leq n1+n2+n3+n4 \leq 24$.

Another embodiment of the present specification provides an organic light emitting device including a first electrode; a second electrode provided to face the first electrode; and an organic material layer including one or more layers provided between the first electrode and the second electrode, where one or more layers of the organic material layer include the compound.

Advantageous Effects

A compound described in the present specification can be used as a material of an organic material layer of an organic light emitting device. A compound according to another embodiment is capable of enhancing efficiency, lowering a driving voltage and/or enhancing lifetime properties in an organic light emitting device.

DESCRIPTION OF DRAWINGS

FIG. 1 to FIG. 3 each illustrate an example of an organic light emitting device according to one embodiment of the present specification.

DESCRIPTION OF REFERENCE NUMERALS

1: Substrate
2: First Electrode
3: Second Electrode
4: Light Emitting Layer
5: Hole Injection Layer
5-1: First Hole Injection Layer
5-2: Second Hole Injection Layer
6: Hole Transfer Layer
6-1: First Hole Transfer Layer
6-2: Second Hole Transfer Layer
7: Electron Blocking Layer
8: Electron Transfer Layer
8-1: First Electron Transfer Layer
8-2: Second Electron Transfer Layer
9: Electron Injection Layer

DETAILED DESCRIPTION

Hereinafter, the present specification will be described in more detail.

One embodiment of the present specification provides a compound of Chemical Formula 1.

Chemical Formula 1 according to one embodiment of the present specification includes 1) a naphthyl group and 2) benzonaphthofuran bonding through L1 as substituents in the anthracene core, and Chemical Formula 1 has a structure in which at least one hydrogen at a substitutable position is substituted with deuterium, and therefore, has structural properties of enhancing electron and hole mobility and improving molecular stability. Accordingly, an organic light emitting device including the same is superior in terms of driving voltage, efficiency and lifetime.

Examples of substituents in the present specification are described below, however, the substituents are not limited thereto.

In the present specification,

means a linking site.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, a term "substituted or unsubstituted" means being substituted with one or more substituents selected from the group consisting of deuterium, a halogen group, a hydroxyl group, a cyano group, a nitro group, an alkyl group, a cycloalkyl group, an alkoxy group, an alkenyl group, a haloalkyl group, a silyl group, a boron group, an amine group, an aryl group, and a heteroaryl group, or being substituted with a substituent formed by linking two or more of the above-exemplified substituents, or having no substituents.

In the present specification, linking two or more substituents refers to substituting hydrogen of any one substituent with another substituent. For example, linking two or more substituents may include a phenyl group and a naphthyl group being linked to become a substituent of

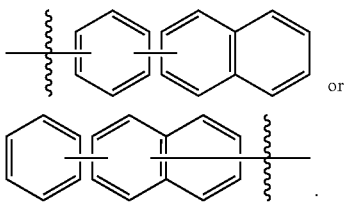

or

In addition, linking three substituents includes not only linking (substituent 1)-(substituent 2)-(substituent 3) sequentially, but also linking (substituent 2) and (substituent 3) to (substituent 1). For example, a phenyl group, a naphthyl group and an isopropyl group may be linked to become a substituent of

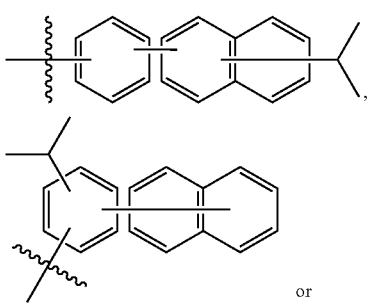

or

-continued

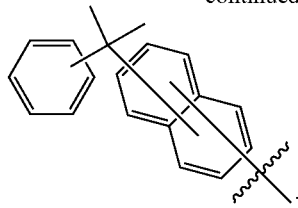

The same rule applies when linking four or more substituents.

In the present specification, examples of the halogen group may include fluorine, chlorine, bromine or iodine.

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms. Specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, an adamantyl group and the like, but are not limited thereto.

In the present specification, the alkoxy group may be linear, branched or cyclic. The number of carbon atoms of the alkoxy group is not particularly limited, but is preferably from 1 to 30. Specific examples thereof may include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the alkenyl group may be linear or branched, and although not particularly limited thereto, the number of carbon atoms is preferably from 2 to 30. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the haloalkyl group means, in the definition of the alkyl group, hydrogen of the alkyl group being substituted with at least one halogen group.

In the present specification, the aryl group is not particularly limited, but preferably has 6 to 30 carbon atoms, and the aryl group may be monocyclic or polycyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracene group, a phenanthrene group, a triphenylene group, a pyrene group, a phenalene group, a perylene group, a chrysene group, a fluorene group and the like, but are not limited thereto.

In the present specification, the fluorene group may be substituted, and adjacent groups may bond to each other to form a ring.

When the fluorene group is substituted,

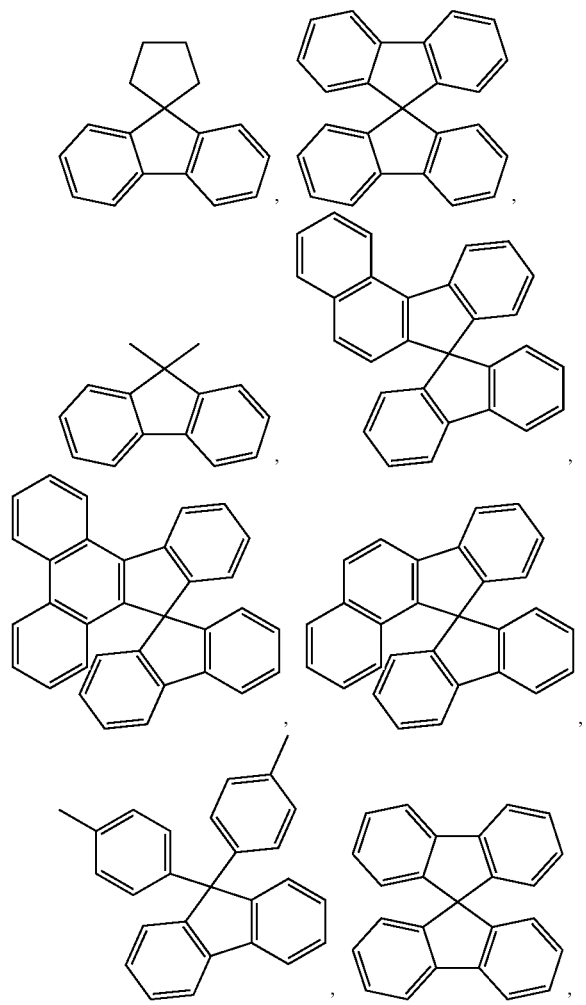

and the like may be included, however, the structure is not limited thereto.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In the present specification, the heteroaryl group is a group including one or more atoms that are not carbon, that is, heteroatoms, and specifically, the heteroatom may include one or more atoms selected from the group consisting of O, N, Se, S and the like. The number of carbon atoms is not particularly limited, but is preferably from 2 to 30, and the heteroaryl group may be monocyclic or polycyclic. Examples of the heteroaryl group may include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a dibenzofuran group, dibenzosilole group, a phenoxanthine group, a phenoxazine group, a phenothiazine group, a dihydroindenocarbazole group, a spirofluorenexanthene group, a spirofluorenethioxanthene group and the like, but are not limited thereto.

In the present specification, the silyl group may be an alkylsilyl group, an arylsilyl group, a heteroarylsilyl group or the like. As the alkyl group in the alkylsilyl group, the examples of the alkyl group described above may be applied, and as the aryl group in the arylsilyl group, the examples of the aryl group described above may be applied, and as the heteroaryl group in the heteroarylsilyl group, the examples of the heteroaryl group may be applied.

In the present specification, the boron group may be $-BR_{100}R_{101}$. $R_{100}$ and $R_{101}$ are the same as or different from each other, and may be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted linear or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms. Specific examples of the boron group may include a trimethylboron group, a triethylboron group, a t-butyldimethylboron group, a triphenylboron group, a phenylboron group and the like, but are not limited thereto.

In the present specification, the amine group may be selected from the group consisting of $-NH_2$, an alkylamine group, an N-alkylarylamine group, an arylamine group, an N-arylheteroarylamine group, an N-alkylheteroarylamine group and a heteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenylterphenylamine group, an N-phenanthrenylfluorenylamine group, an N-biphenylfluorenylamine group and the like, but are not limited thereto.

In the present specification, the N-alkylarylamine group means an amine group in which N of the amine group is substituted with an alkyl group and an aryl group. The alkyl group and the aryl group in the N-alkylarylamine group are the same as the examples of the alkyl group and the aryl group described above.

In the present specification, the N-arylheteroarylamine group means an amine group in which N of the amine group is substituted with an aryl group and a heteroaryl group. The aryl group and the heteroaryl group in the N-arylheteroarylamine group are the same as the examples of the aryl group and the heteroaryl group described above.

In the present specification, the N-alkylheteroarylamine group means an amine group in which N of the amine group is substituted with an alkyl group and a heteroaryl group. The alkyl group and the heteroaryl group in the N-alkylheteroarylamine group are the same as the examples of the alkyl group and the heteroaryl group described above.

In the present specification, examples of the alkylamine group include a substituted or unsubstituted monoalkylamine group, or a substituted or unsubstituted dialkylamine group. The alkyl group in the alkylamine group may be a linear or branched alkyl group. The alkylamine group including two or more alkyl groups may include linear alkyl groups, branched alkyl groups, or both linear alkyl groups and branched alkyl groups. For example, the alkyl group in the alkylamine group may be selected from among the examples of the alkyl group described above.

In the present specification, examples of the arylamine group include a substituted or unsubstituted monoarylamine group, or a substituted or unsubstituted diarylamine group. The aryl group in the arylamine group may be a monocyclic aryl group or a polycyclic aryl group. The arylamine group including two or more aryl groups may include monocyclic aryl groups, polycyclic aryl groups, or both monocyclic aryl groups and polycyclic aryl groups. For example, the aryl group in the arylamine group may be selected from among the examples of the aryl group described above.

In the present specification, examples of the heteroarylamine group include a substituted or unsubstituted monoheteroarylamine group, or a substituted or unsubstituted diheteroarylamine group. The heteroarylamine group including two or more heteroaryl groups may include monocyclic heteroaryl groups, polycyclic heteroaryl groups, or both monocyclic heteroaryl groups and polycyclic heteroaryl groups. For example, the heteroaryl group in the heteroarylamine group may be selected from among the examples of the heteroaryl group described above.

In the present specification, the arylene group means the aryl group having two bonding sites, that is, a divalent group. The descriptions on the aryl group provided above may be applied thereto except for those that are each a divalent group.

In the present specification, "deuteration" or "deuterated" means that hydrogen at a substitutable position of a compound is substituted with deuterium.

In the present specification, "perdeuterated" means a compound or a group in which all hydrogens in the molecule are substituted with deuterium, and has the same meaning as "100% deuterated".

In the present specification, "X % deuterated", "degree of deuteration of X %" or "deuterium substitution rate of X %" means that, in the corresponding structure, X % of hydrogens at substitutable positions are substituted with deuterium. For example, when the corresponding structure is dibenzofuran, the dibenzofuran being "25% deuterated", the dibenzofuran having a "degree of deuteration of 25%", or the dibenzofuran having a "deuterium substitution rate of 25%" means that two of eight hydrogens at substitutable positions of the dibenzofuran are substituted with deuterium.

In the present specification, the degree of deuteration may be identified using known methods such as nuclear magnetic resonance spectroscopy (1H NMR), TLC/MS (thin-layer chromatography/mass spectrometry) or MALDI-TOF MS (matrix assisted laser desorption/ionization time-of-flight mass spectrometry).

Unless defined otherwise in the present specification, all technological and scientific terms used in the present specification have the same meanings as terms commonly understood by those skilled in the art. Although methods and materials similar or equivalent to those described in the present specification may be used in implementing or experimenting embodiments of the present disclosure, suitable methods and materials are described later. All publications, patent applications, patents and other reference documents mentioned in the present specification are incorporated by reference in the present specification as a whole, and when conflicting, the present specification including definitions has priority unless specific passage is mentioned. Furthermore, materials, methods and examples are for illustrative purposes only, and not to limit the present specification.

According to one embodiment of the present specification, 0 in the definition of n1 to n4 means that hydrogen bonds instead of deuterium.

According to one embodiment of the present specification, Chemical Formula 1 may be the following Chemical Formula 1-1 or 1-2.

[Chemical Formula 1-1]

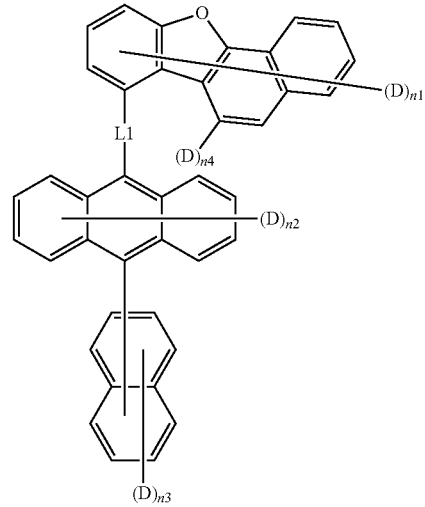

[Chemical Formula 1-2]

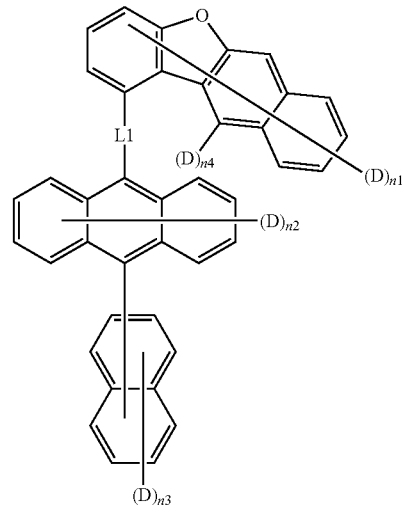

wherein in Chemical Formulae 1-1 and 1-2,

L1, D and n1 to n4 have the same definitions as in Chemical Formula 1.

According to one embodiment of the present specification, Chemical Formula 1 may be the following Chemical Formula 1-3 or 1-4.

[Chemical Formula 1-3]

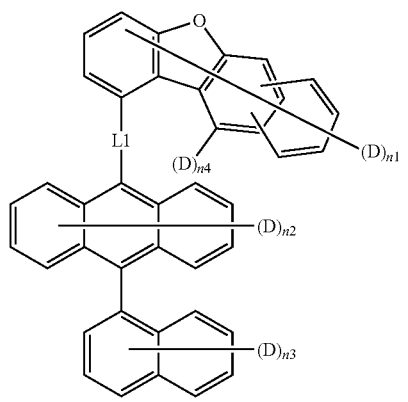

[Chemical Formula 1-4]

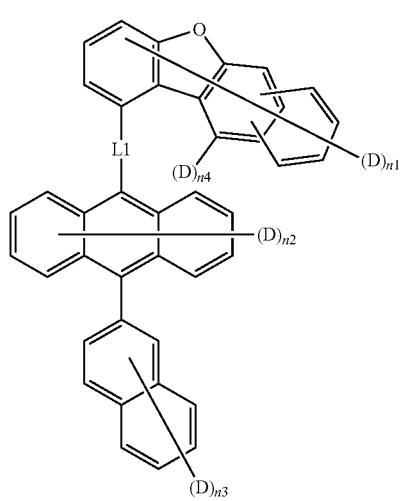

wherein in Chemical Formulae 1-3 and 1-4,

L1, D and n1 to n4 have the same definitions as in Chemical Formula 1.

According to one embodiment of the present specification, Chemical Formula 1 may be any one of the following Chemical Formulae 1-5 to 1-8.

[Chemical Formula 1-5]

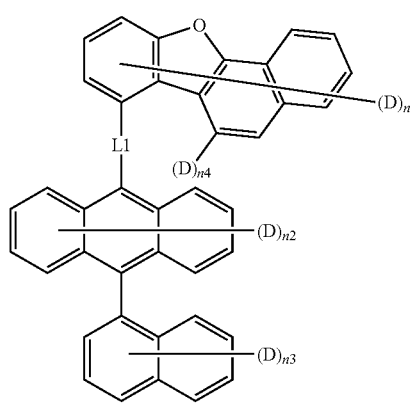

[Chemical Formula 1-6]

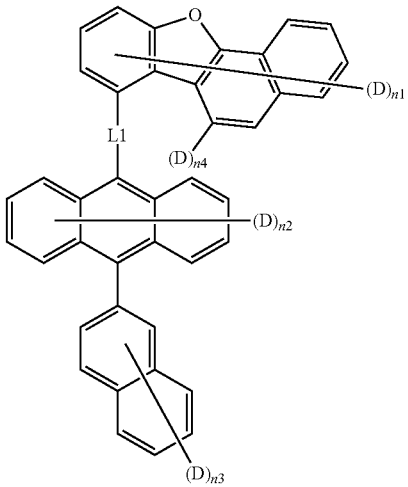

[Chemical Formula 1-7]

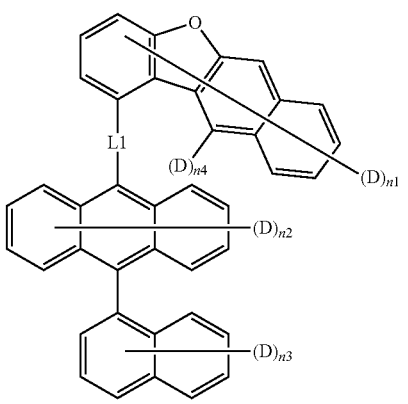

[Chemical Formula 1-8]

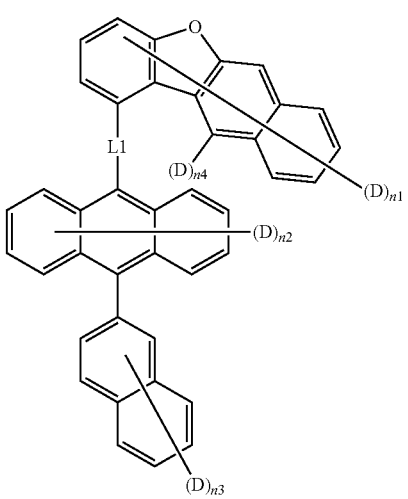

wherein in Chemical Formulae 1-5 to 1-8,

L1, D and n1 to n4 have the same definitions as in Chemical Formula 1.

According to one embodiment of the present specification, Chemical Formula 1 is the following Chemical Formula 1-9 or 1-10.

[Chemical Formula 1-9]

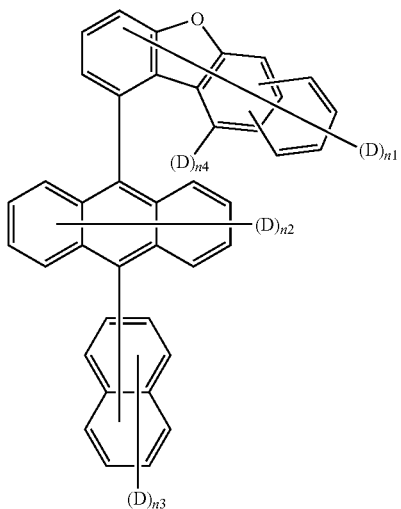

[Chemical Formula 1-10]

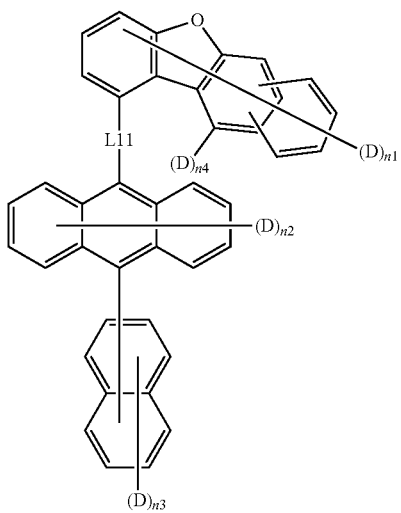

wherein in Chemical Formulae 1-9 and 1-10,
D and n1 to n3 have the same definitions as in Chemical Formula 1, and
L11 is a substituted or unsubstituted arylene group.

According to one embodiment of the present specification, L1 is a direct bond; or a substituted or unsubstituted monocyclic or polycyclic arylene group having 6 to 30 carbon atoms.

According to one embodiment of the present specification, L1 is a direct bond; or a substituted or unsubstituted monocyclic or polycyclic arylene group having 6 to 20 carbon atoms.

According to one embodiment of the present specification, L1 is a direct bond; or a substituted or unsubstituted monocyclic or polycyclic arylene group having 6 to 10 carbon atoms.

According to one embodiment of the present specification, L1 is a direct bond; or an arylene group unsubstituted or substituted with deuterium.

According to one embodiment of the present specification, L1 is a direct bond; or a monocyclic or polycyclic arylene group having 6 to 30 carbon atoms unsubstituted or substituted with deuterium.

According to one embodiment of the present specification, L1 is a direct bond; or a monocyclic or polycyclic arylene group having 6 to 20 carbon atoms unsubstituted or substituted with deuterium.

According to one embodiment of the present specification, L1 is a direct bond; or a monocyclic or polycyclic arylene group having 6 to 10 carbon atoms unsubstituted or substituted with deuterium.

According to one embodiment of the present specification, L1 is a direct bond; a phenylene group unsubstituted or substituted with deuterium; or a naphthylene group unsubstituted or substituted with deuterium.

According to one embodiment of the present specification, L1 is a direct bond.

According to one embodiment of the present specification, L1 is a phenylene group.

According to one embodiment of the present specification, L1 is a naphthylene group.

According to one embodiment of the present specification, L1 is a phenylene group substituted with deuterium.

According to one embodiment of the present specification, L1 is a naphthylene group substituted with deuterium.

According to one embodiment of the present specification, Chemical Formula 1 is the following Chemical Formula 1-11 or 1-12.

[Chemical Formula 1-11]

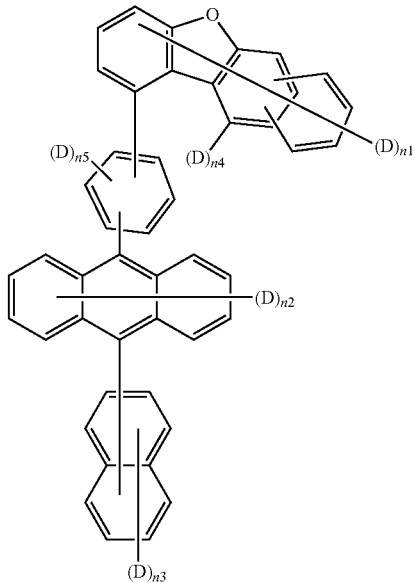

[Chemical Formula 1-12]
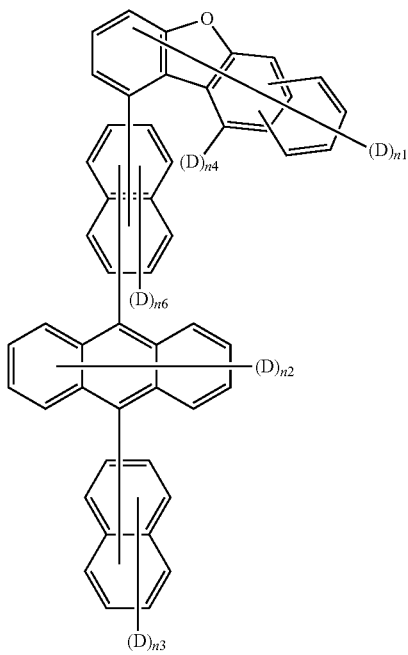
[Chemical Formula 1-14]
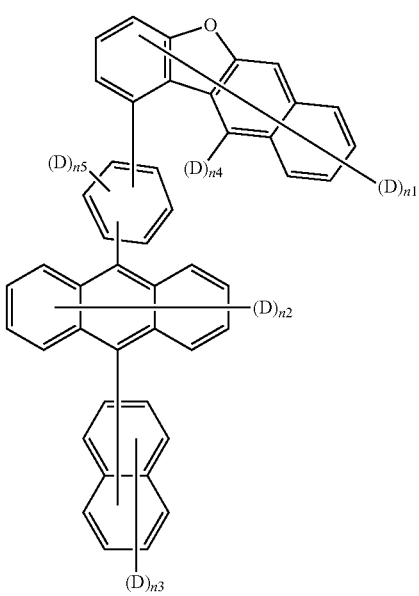
wherein in Chemical Formulae 1-11 and 1-12,
D and n1 to n4 have the same definitions as in Chemical Formula 1,
n5 is an integer of 0 to 4, and
n6 is an integer of 1 to 6.
According to one embodiment of the present specification, Chemical Formula 1 is any one of the following Chemical Formulae 1-13 to 1-16.
[Chemical Formula 1-13]
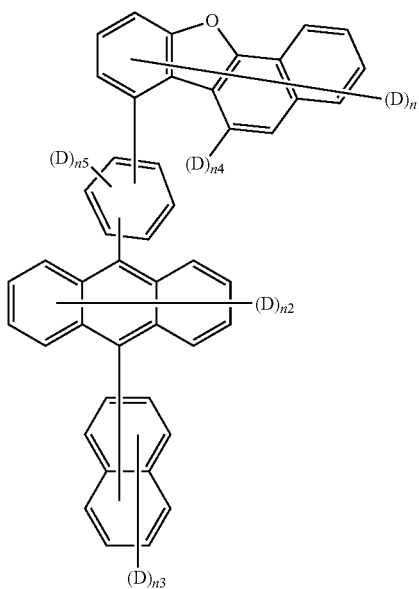
[Chemical Formula 1-15]
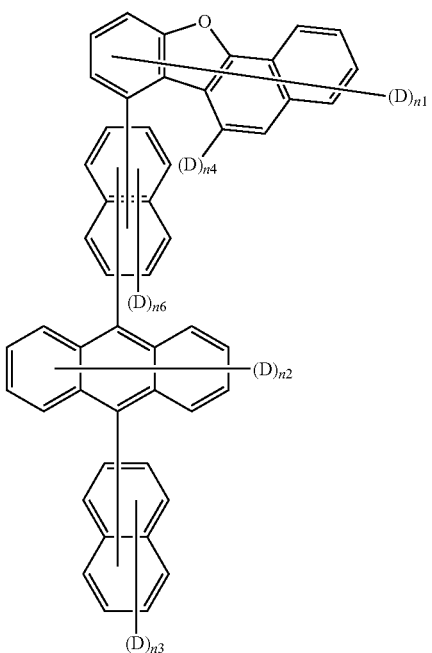

[Chemical Formula 1-16]
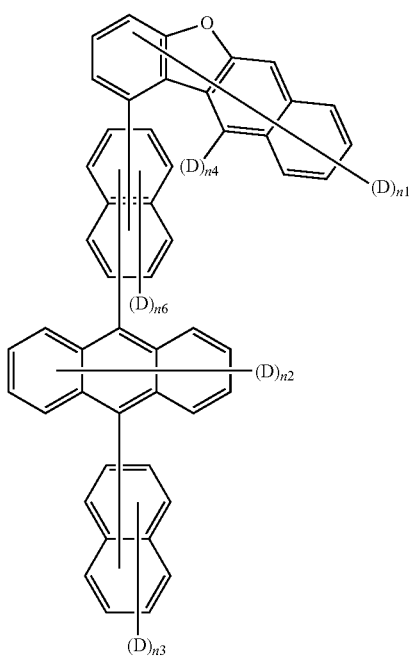
wherein in Chemical Formulae 1-13 to 1-16,
D and n1 to n4 have the same definitions as in Chemical Formula 1,
n5 is an integer of 0 to 4, and
n6 is an integer of 1 to 6.
According to one embodiment of the present specification, Chemical Formula 1 is any one of the following structural formulae.
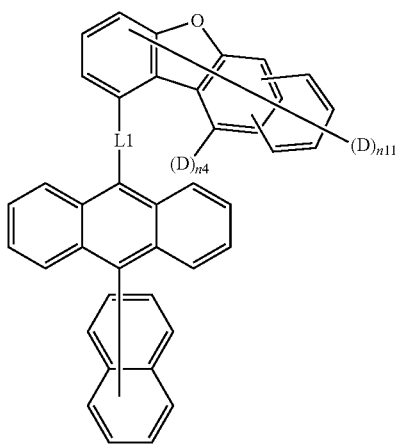
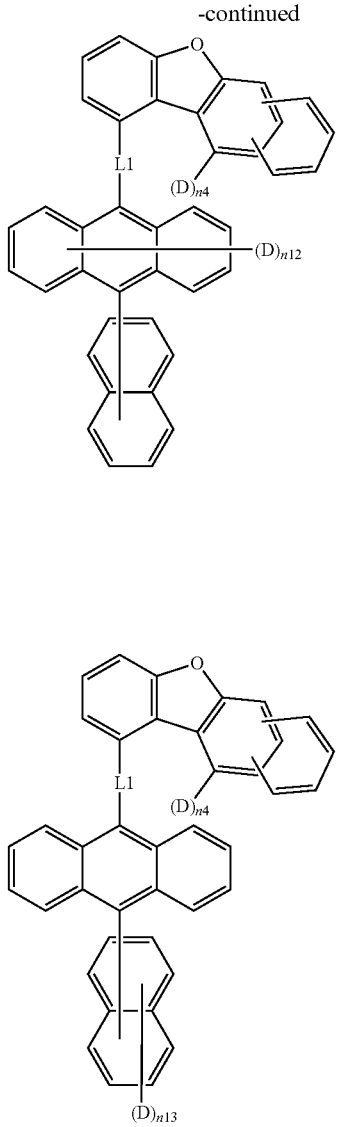

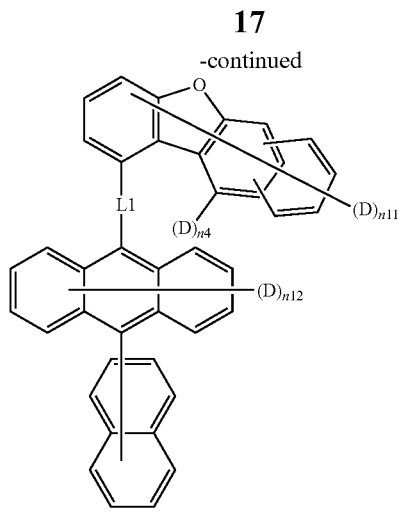
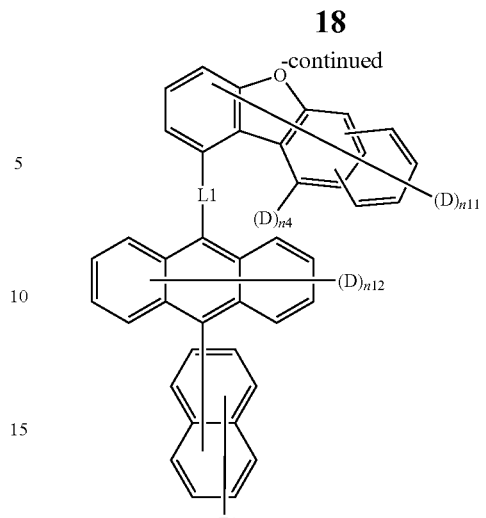
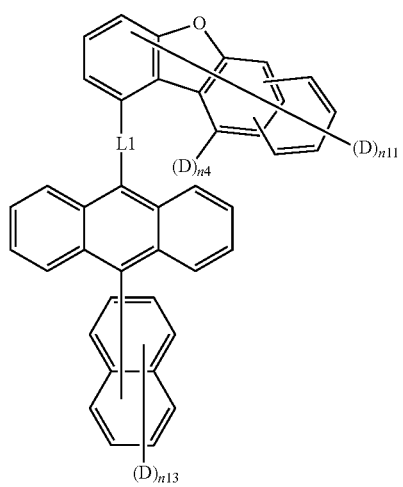
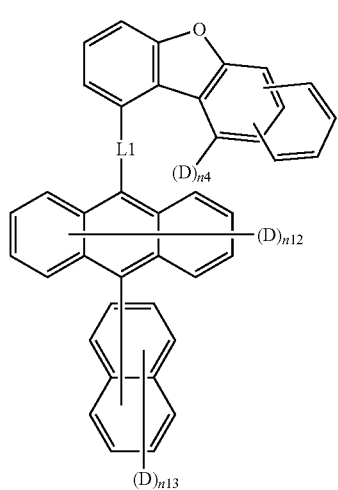
wherein in the structural formulae,
L1, D and n4 have the same definitions as in Chemical Formula 1,
n11 is an integer of 1 to 8,
n12 is an integer of 1 to 8,
n13 is an integer of 1 to 7, and
n14 is 1.
According to one embodiment of the present specification, Chemical Formula 1 is any one of the following structural formulae.
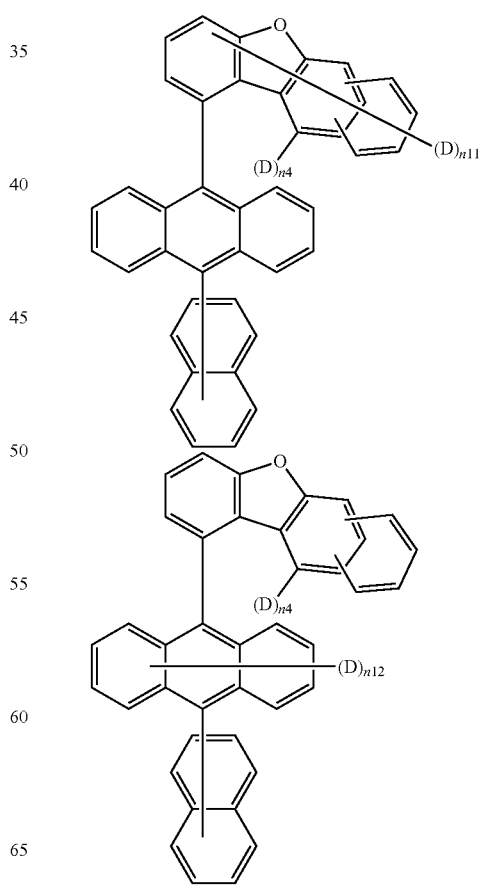

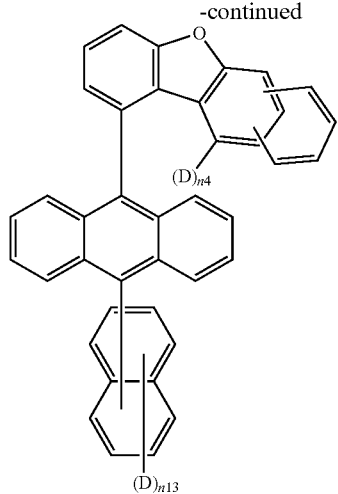
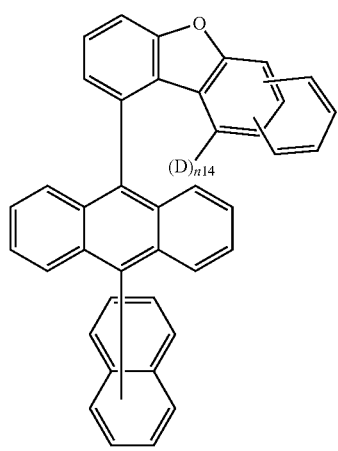
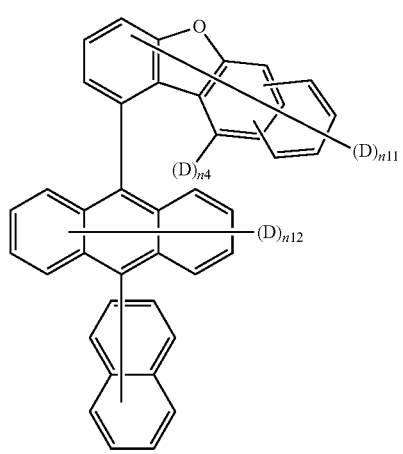
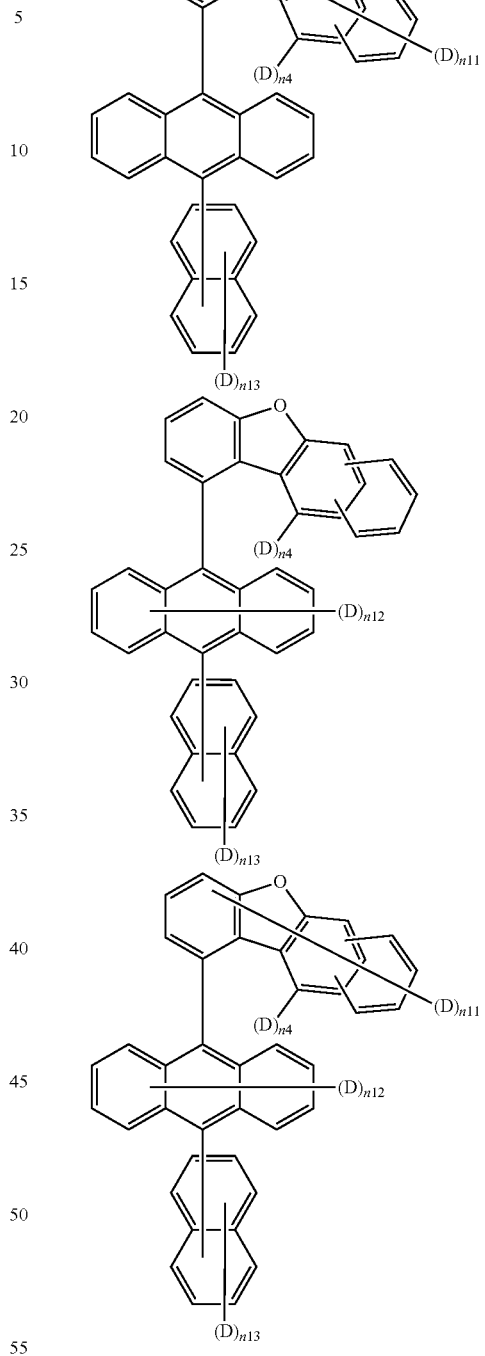
wherein in the structural formulae,
D and n4 have the same definitions as in Chemical Formula 1,
n11 is an integer of 1 to 8,
n12 is an integer of 1 to 8,
n13 is an integer of 1 to 7, and
n14 is 1.
According to one embodiment of the present specification, Chemical Formula 1 is any one of the following structural formulae.

-continued
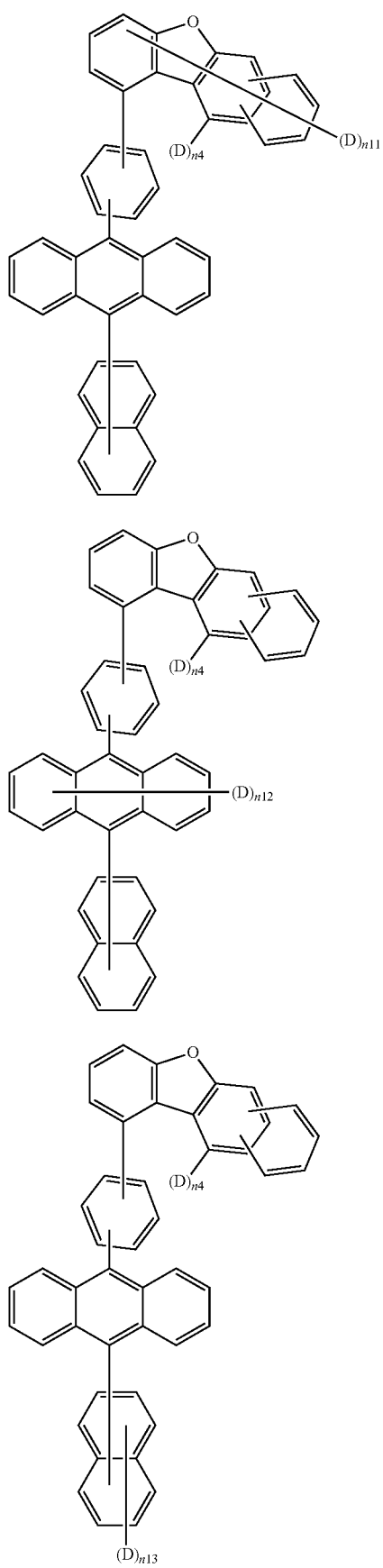
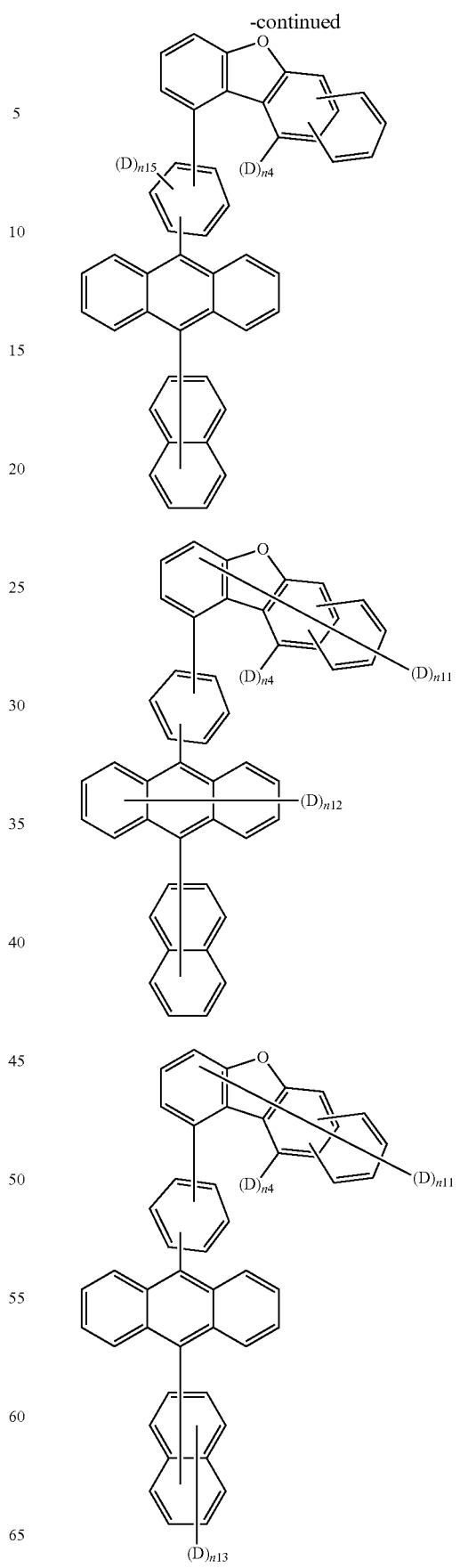

-continued
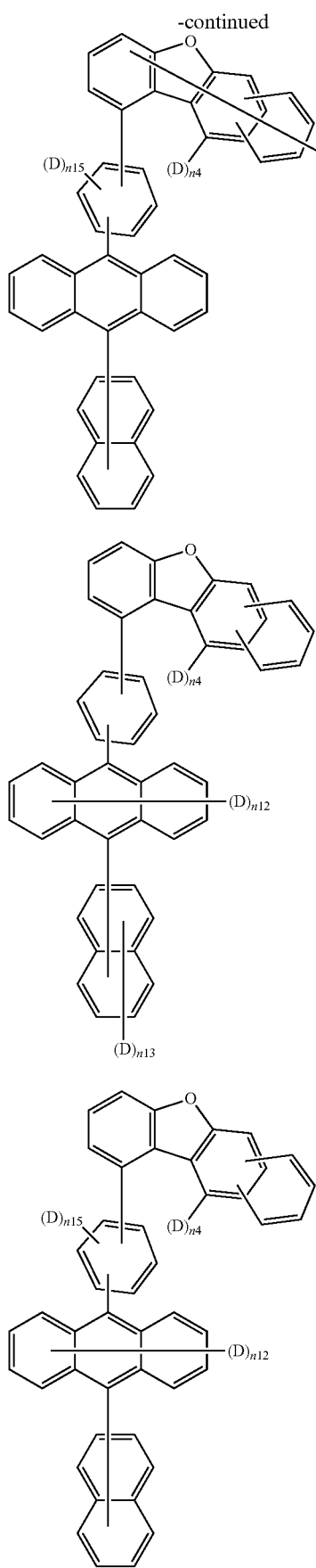
-continued
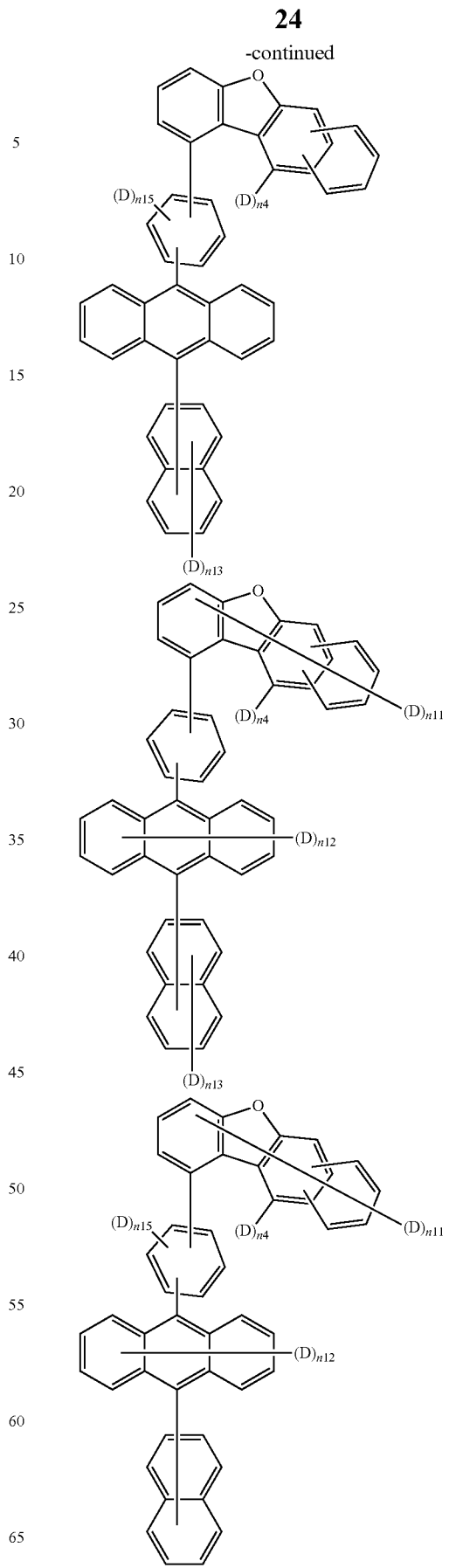

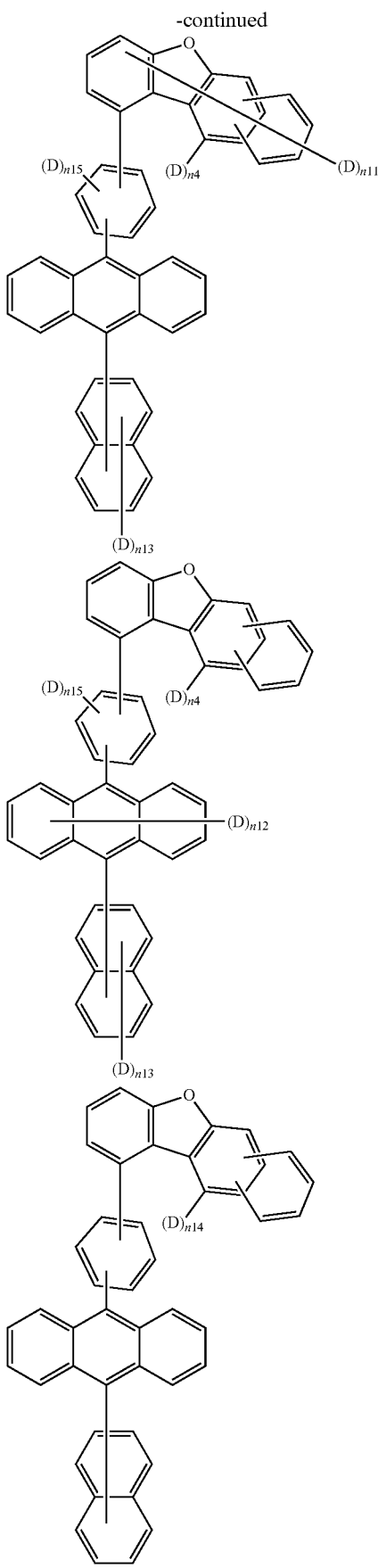
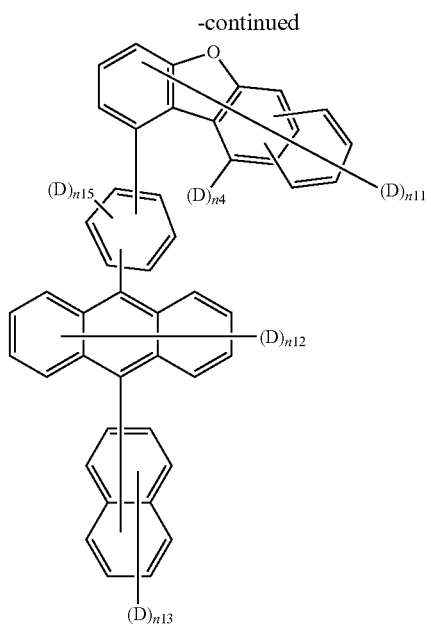
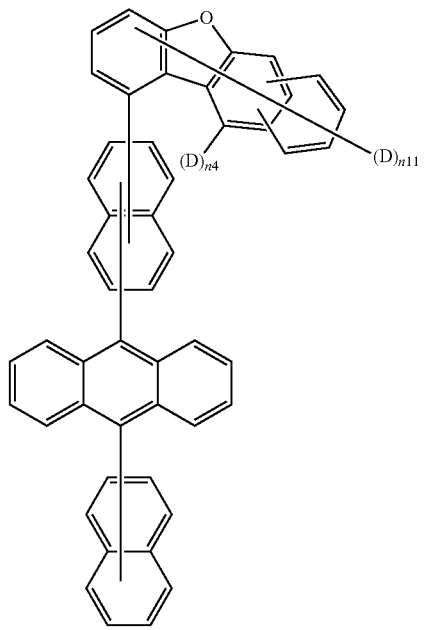
wherein in the structural formulae,
D and n4 have the same definitions as in Chemical Formula 1,
n11 is an integer of 1 to 8,
n12 is an integer of 1 to 8,
n13 is an integer of 1 to 7,
n14 is 1, and
n15 is from 1 to 4.
According to one embodiment of the present specification, Chemical Formula 1 is any one of the following structural formulae.

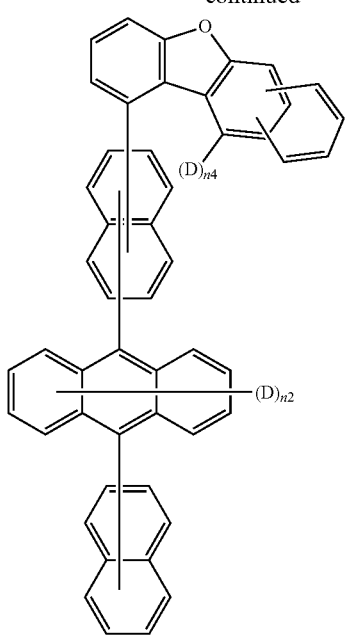
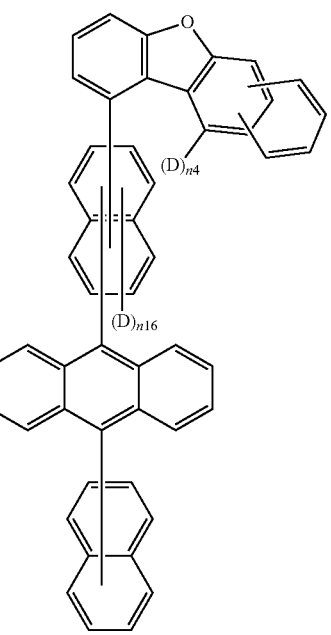
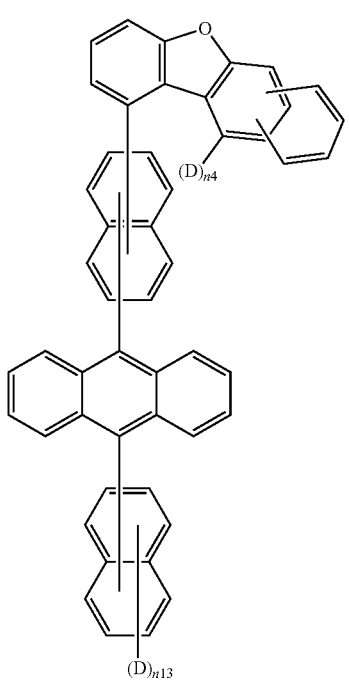
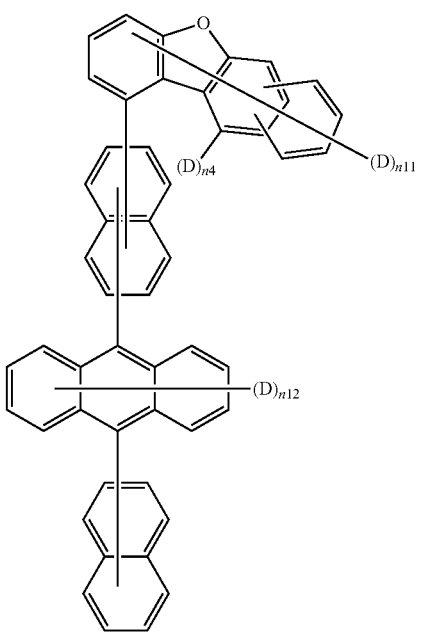

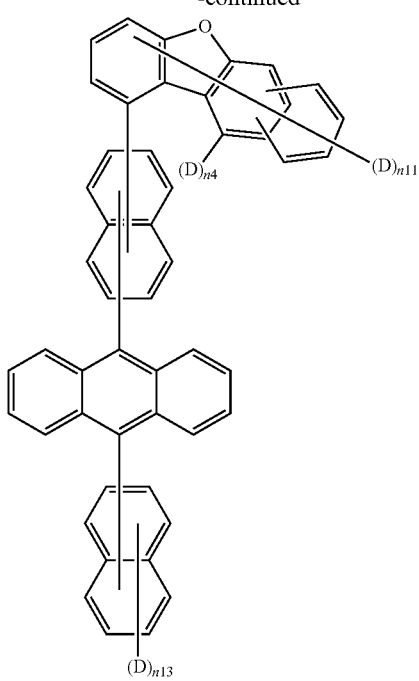
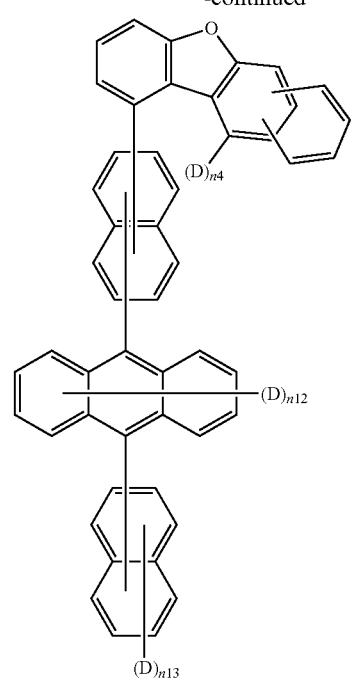
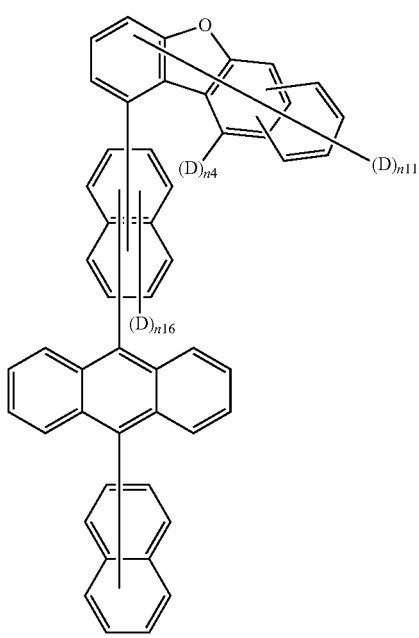
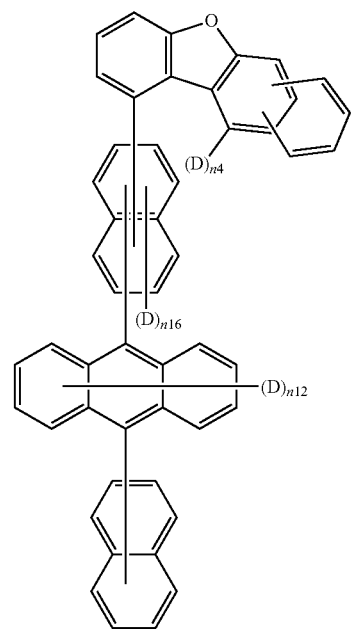

31
-continued
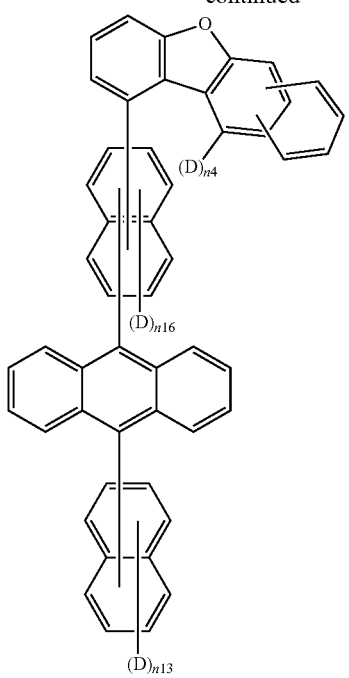
32
-continued
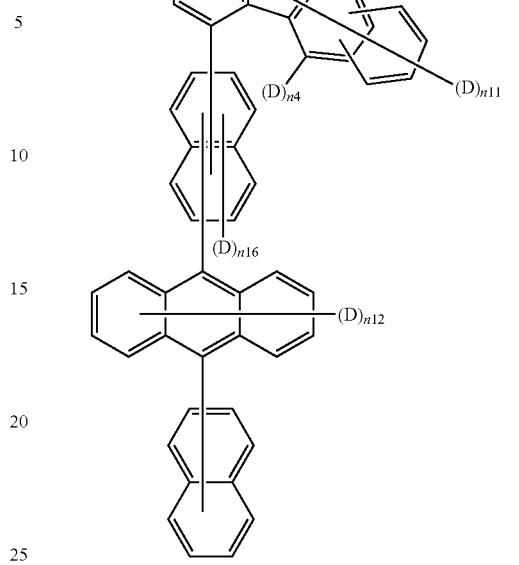
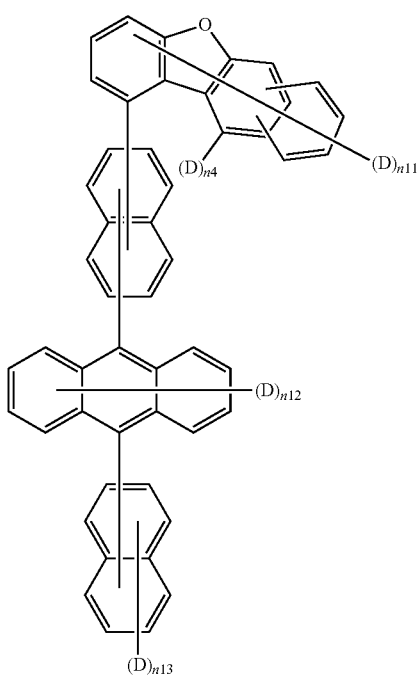
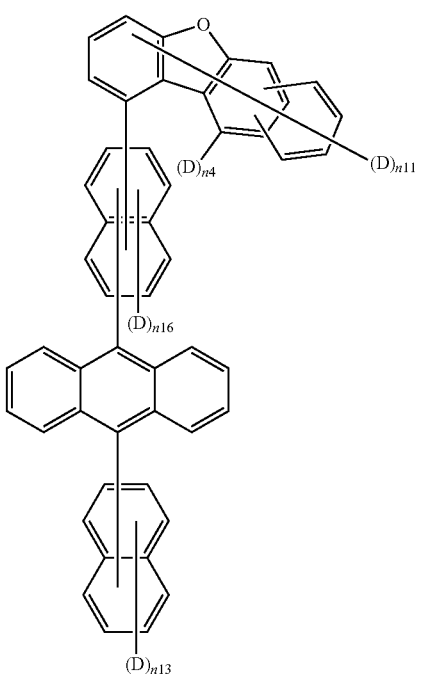

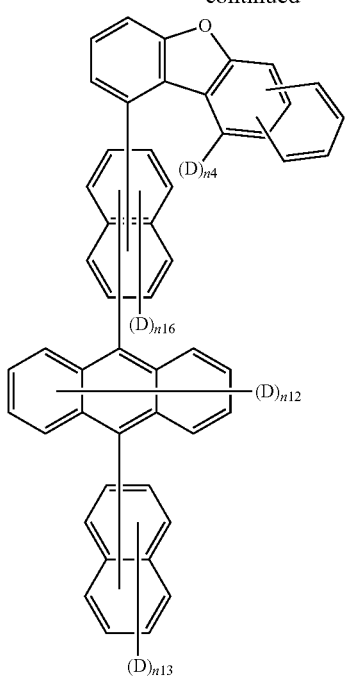

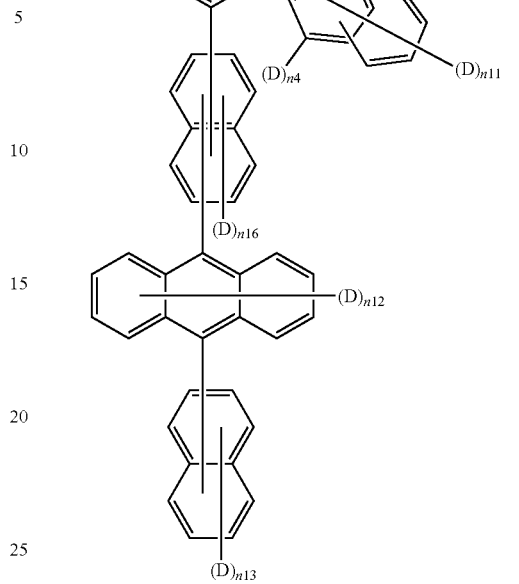

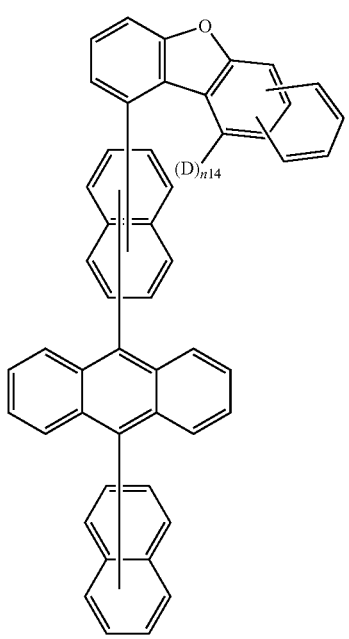

wherein in the structural formulae,

D and n4 have the same definitions as in Chemical Formula 1, n11 is an integer of 1 to 8, n12 is an integer of 1 to 8, n13 is an integer of 1 to 7, n14 is 1, and n16 is from 1 to 6.

According to one embodiment of the present specification, at least one hydrogen at a substitutable position is substituted with deuterium in Chemical Formula 1.

According to one embodiment of the present specification, Chemical Formula 1 has a deuterium substitution rate of 100%.

According to one embodiment of the present specification, Chemical Formula 1 has a deuterium substitution rate of 10% to 90%.

According to one embodiment of the present specification, Chemical Formula 1 has a deuterium substitution rate of 20% to 80%.

According to one embodiment of the present specification, Chemical Formula 1 has a deuterium substitution rate of 30% to 70%.

According to one embodiment of the present specification, Chemical Formula 1 has a deuterium substitution rate of 40% to 60%.

According to one embodiment of the present specification, Chemical Formula 1 has a deuterium substitution rate of 50%.

According to one embodiment of the present specification, Chemical Formula 1 is any one selected from among the following compounds.

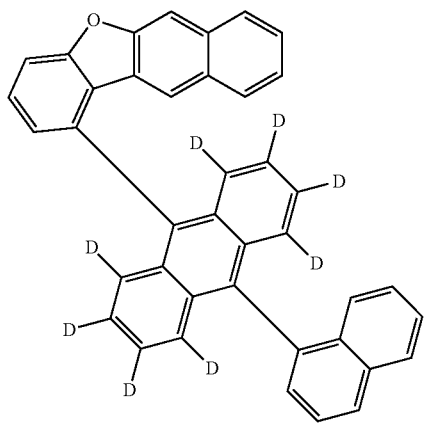
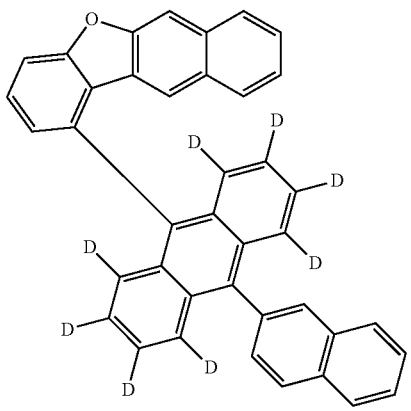
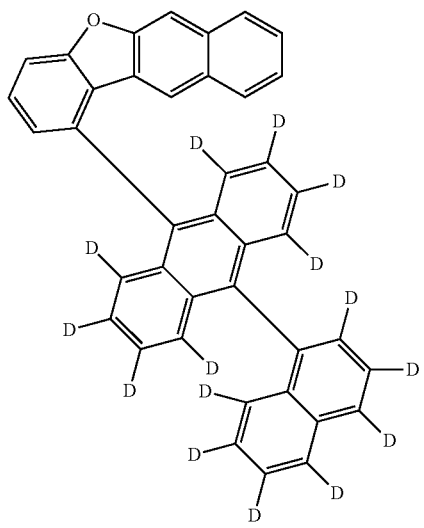
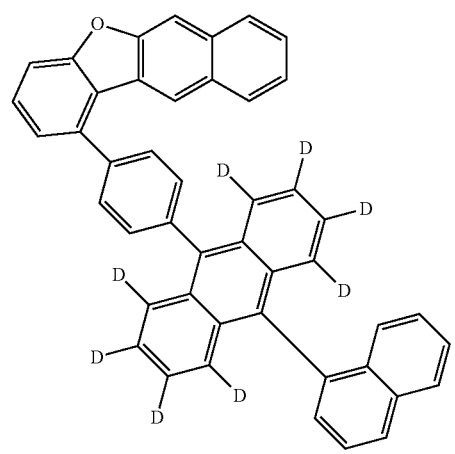
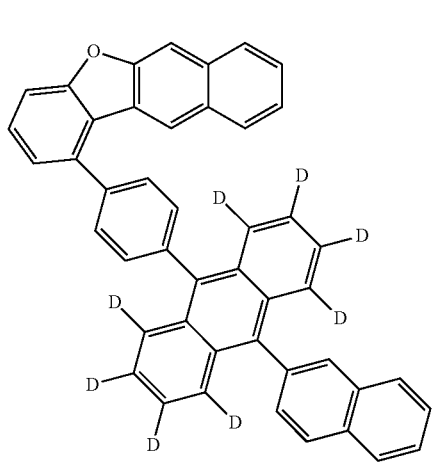
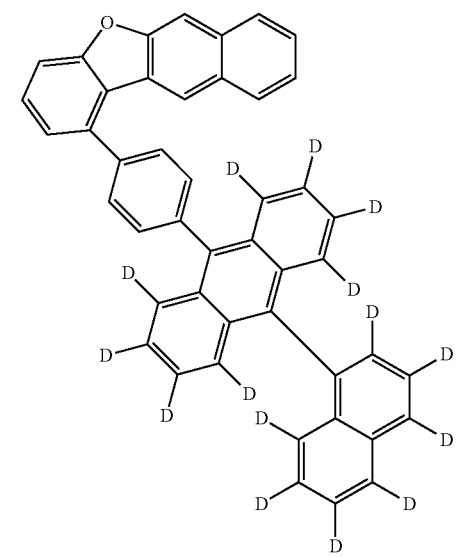

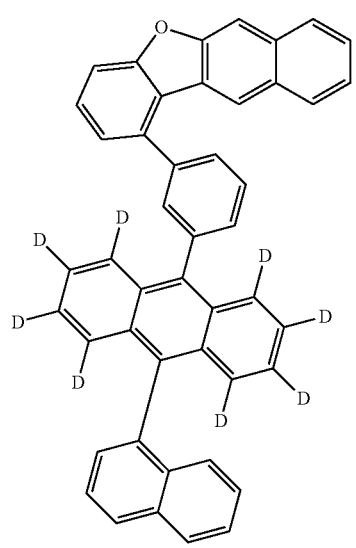
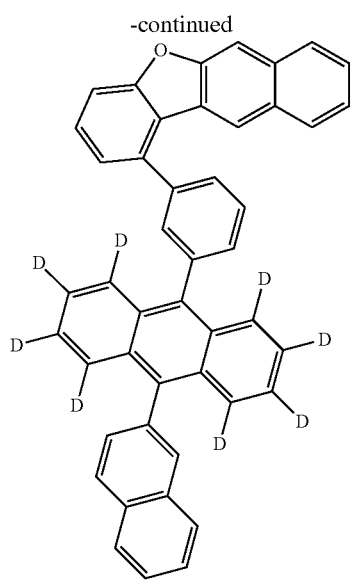
-continued
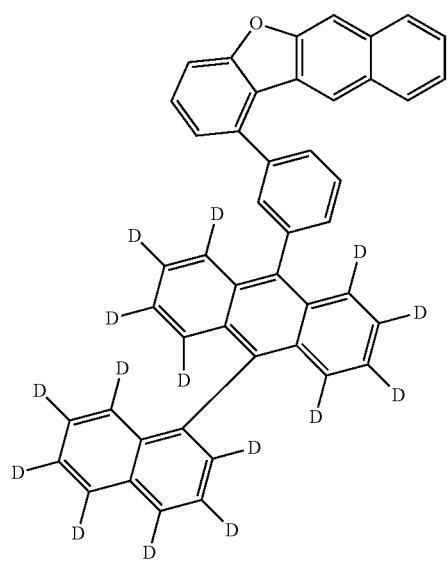
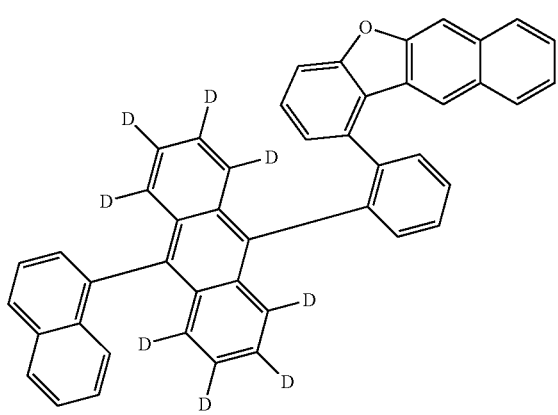
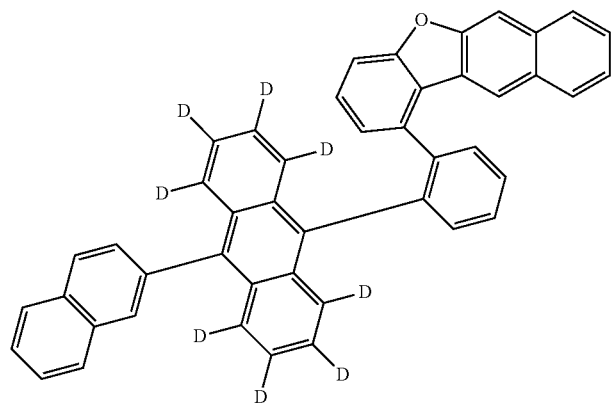

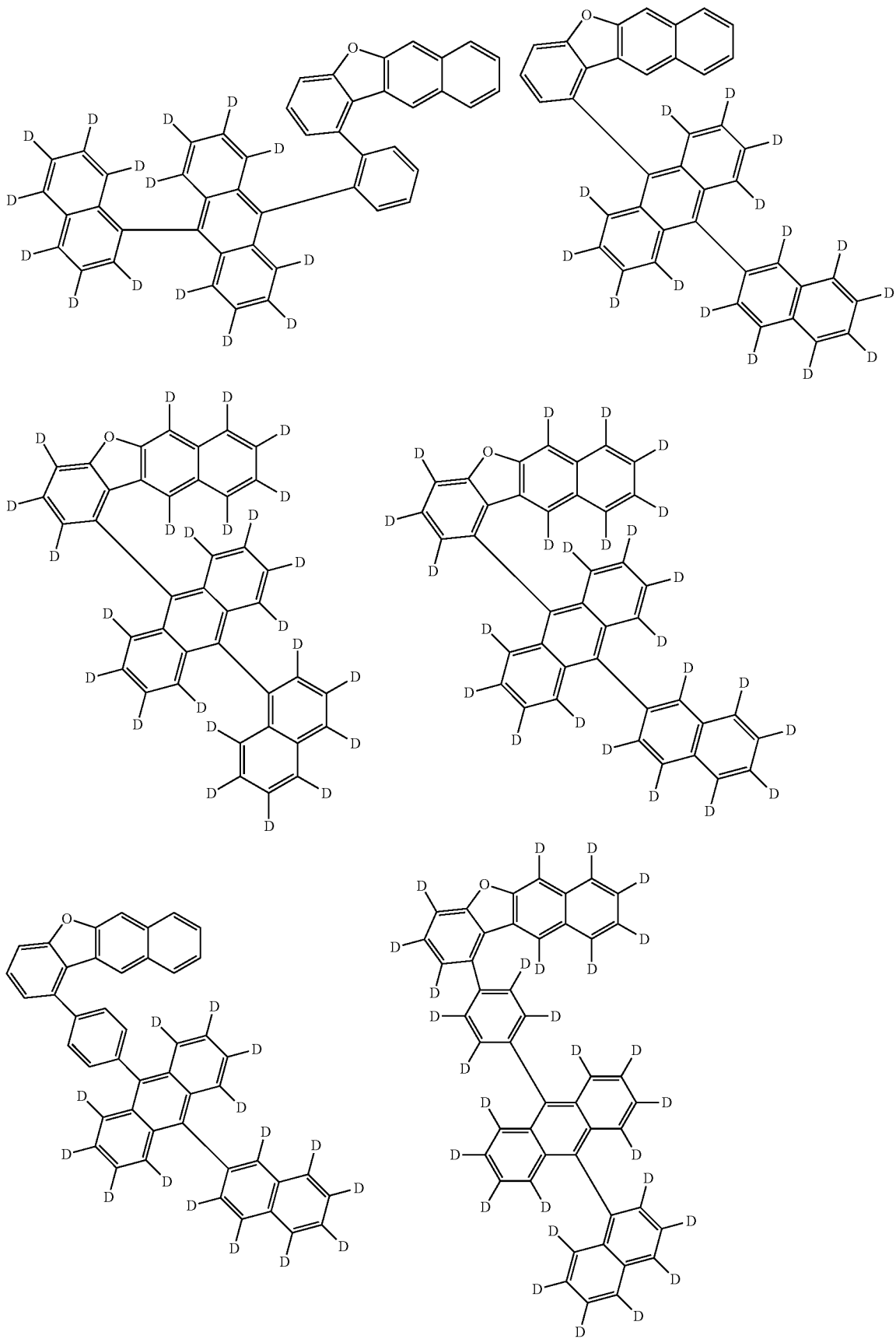

-continued
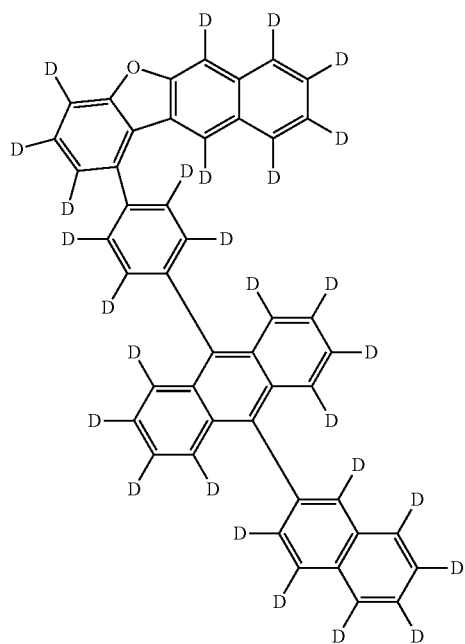
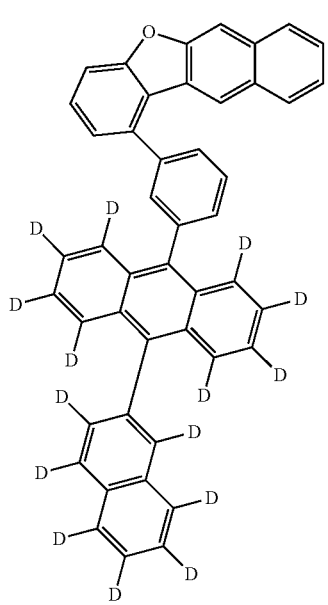
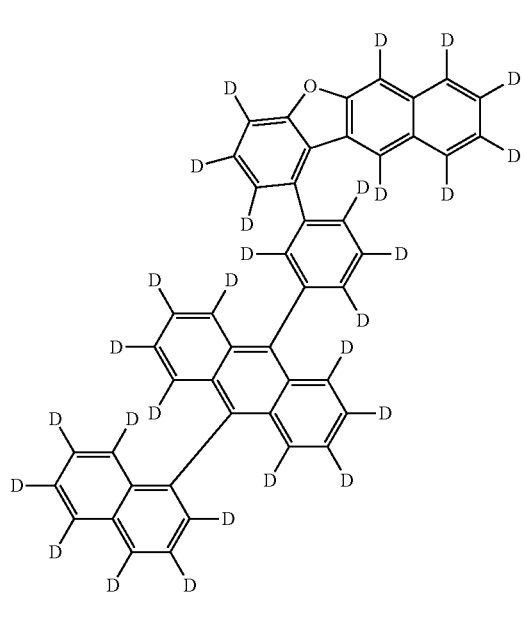
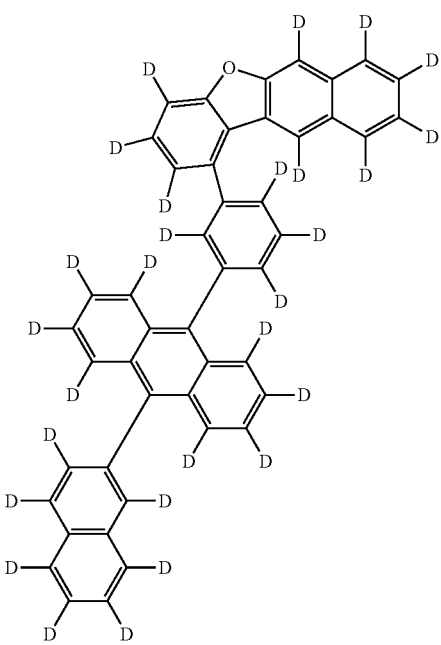
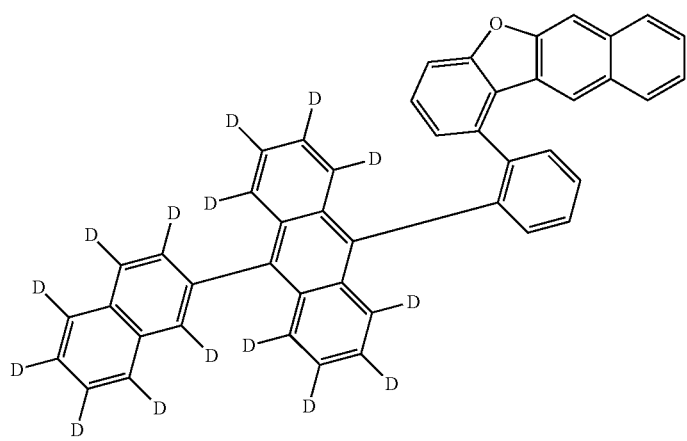

-continued
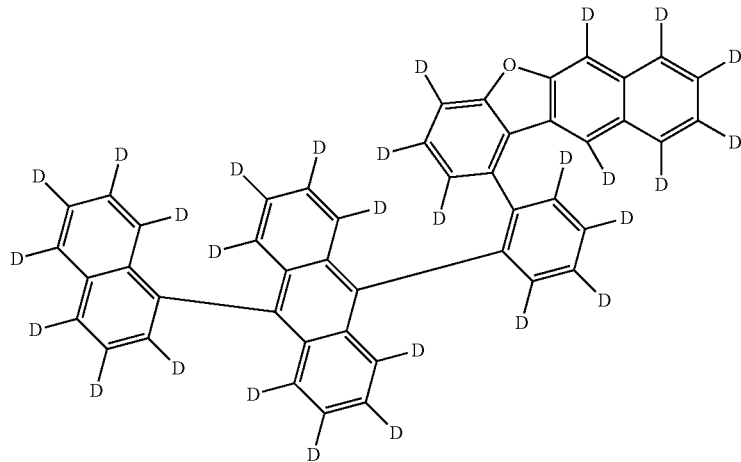
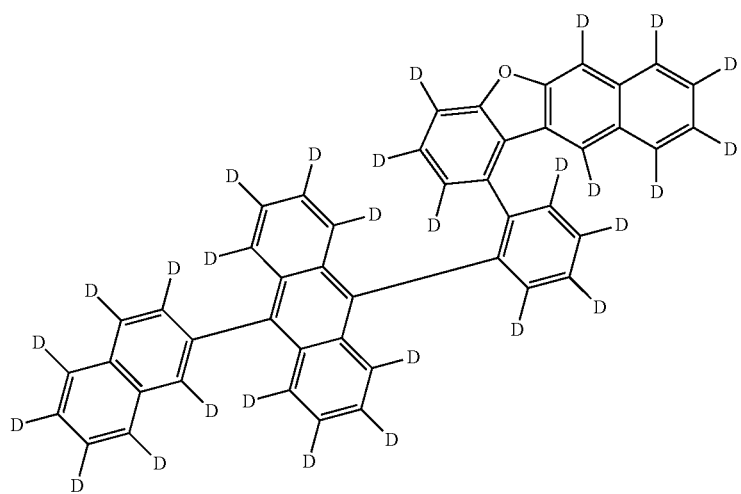
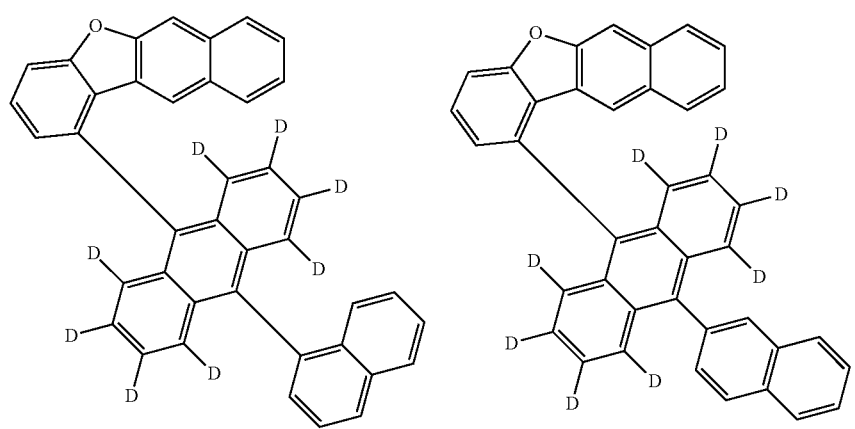

-continued
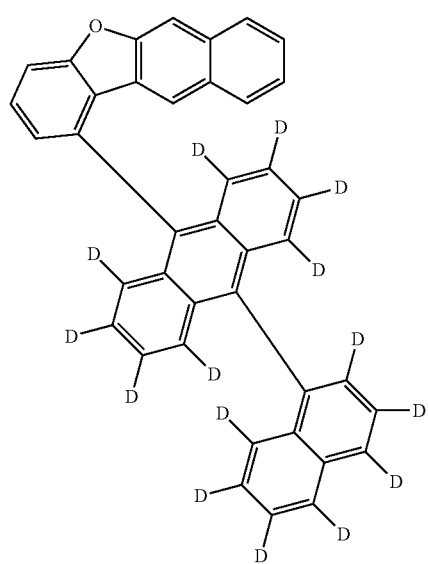
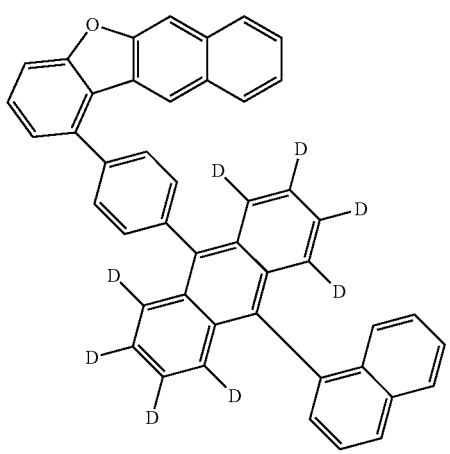
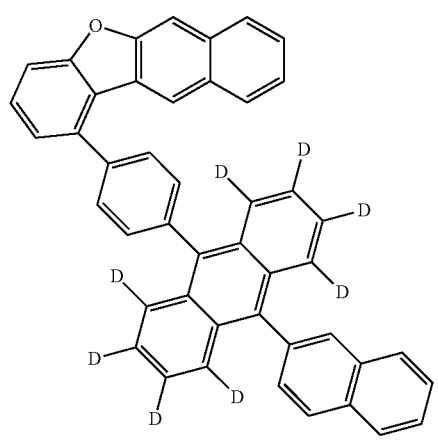
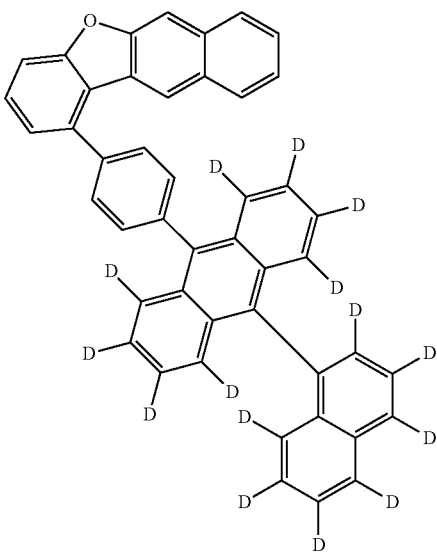
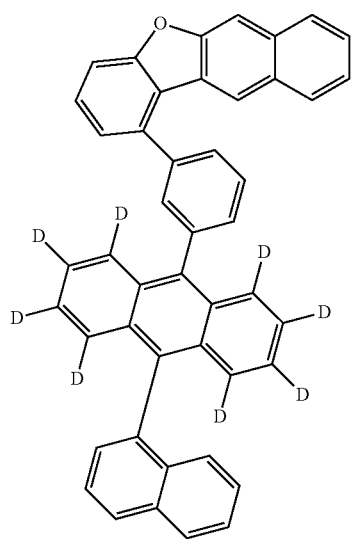
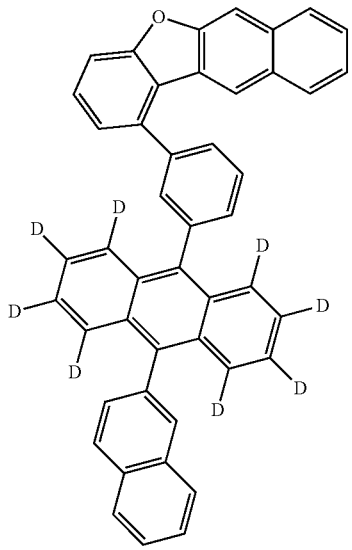

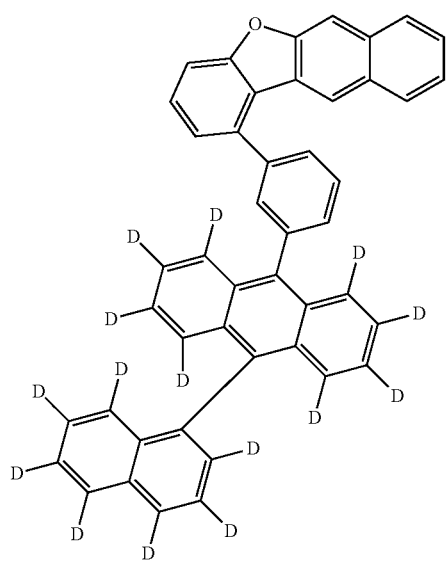
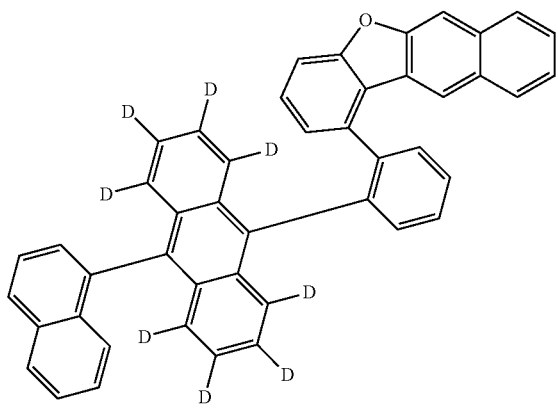
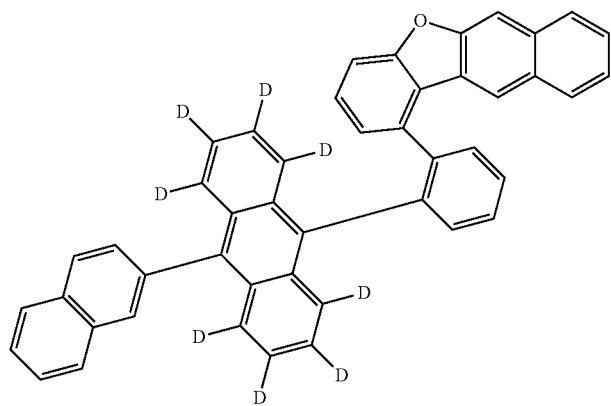
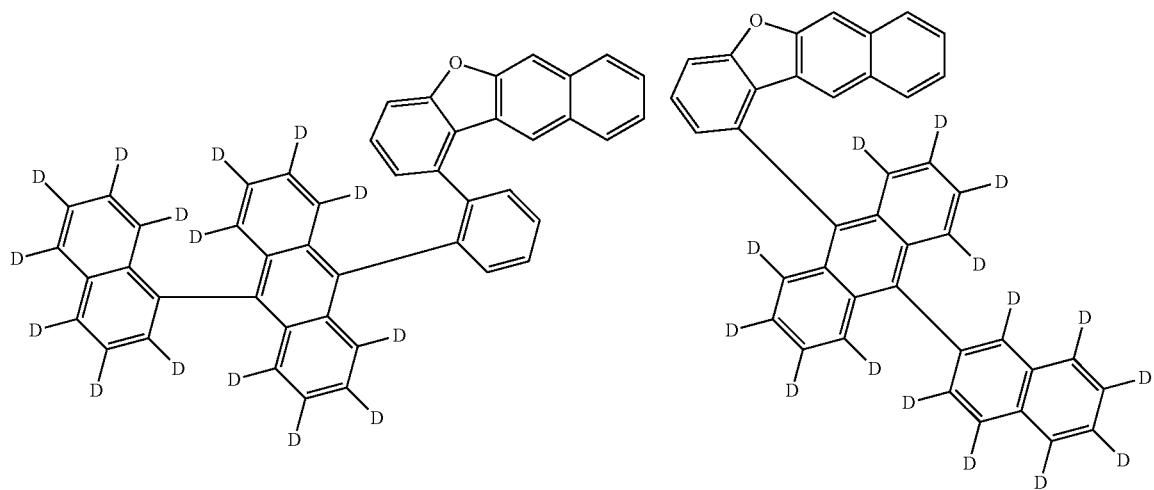

-continued
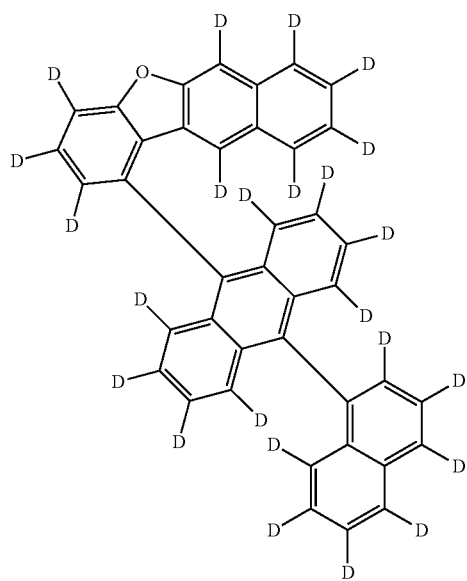
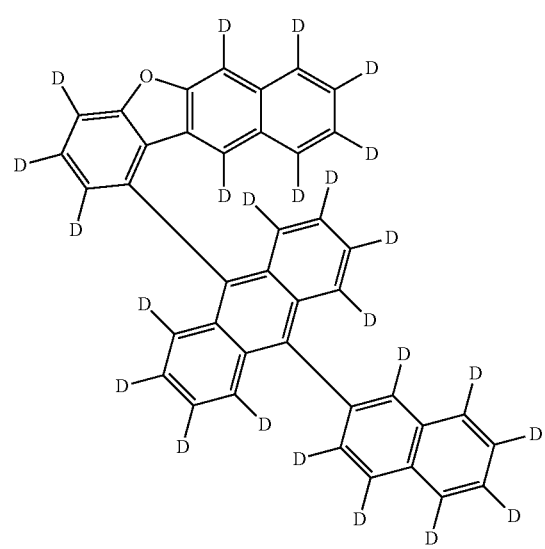
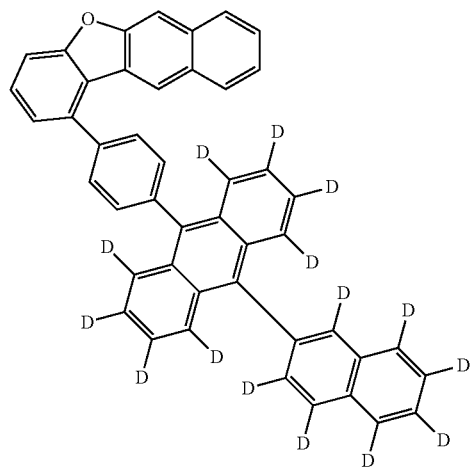
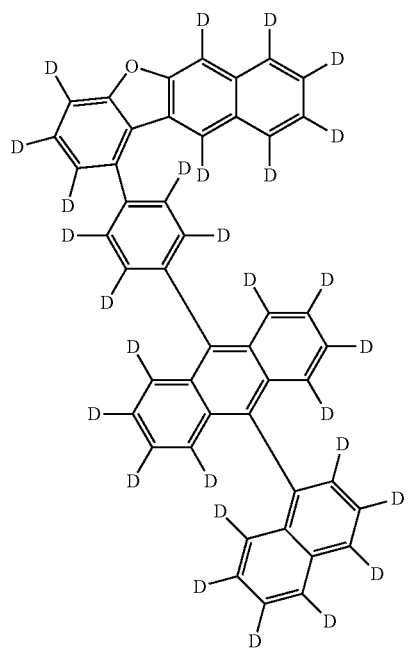

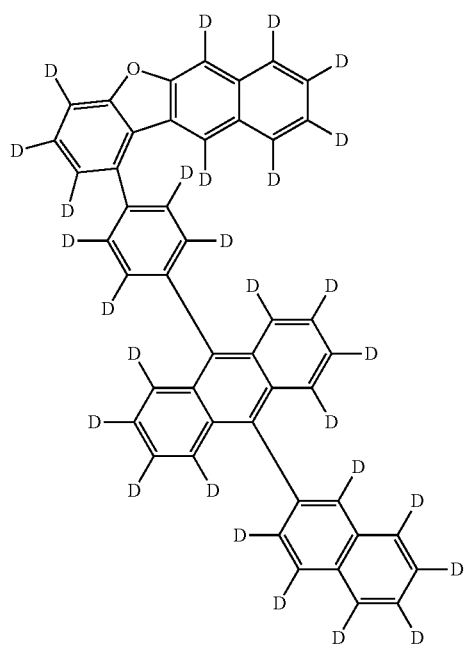
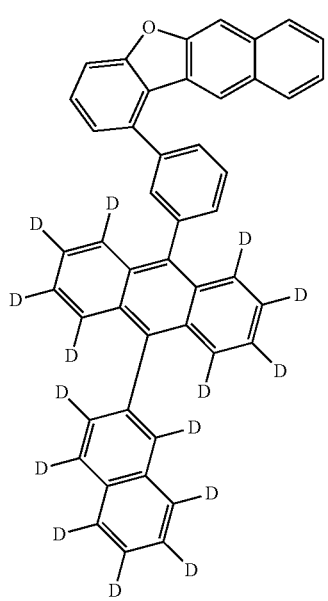
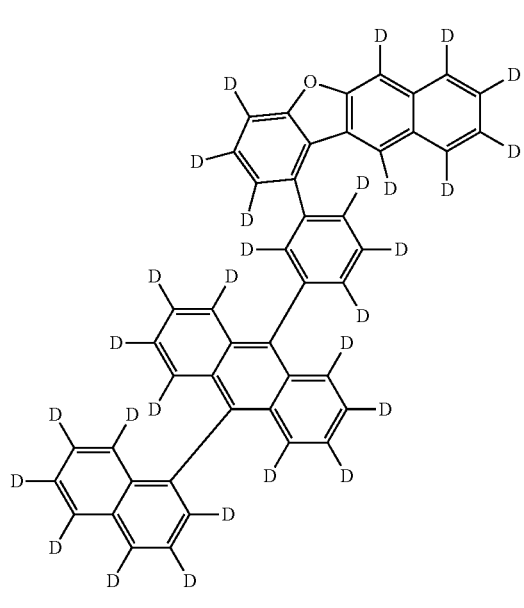
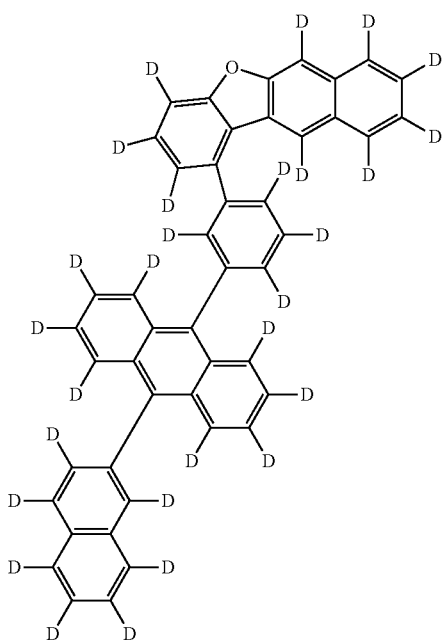
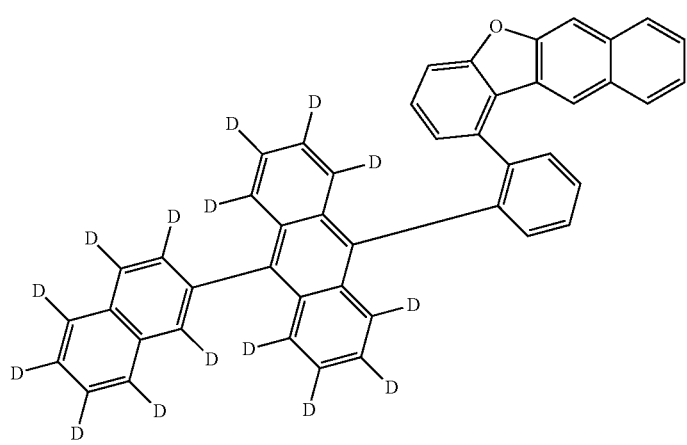

-continued
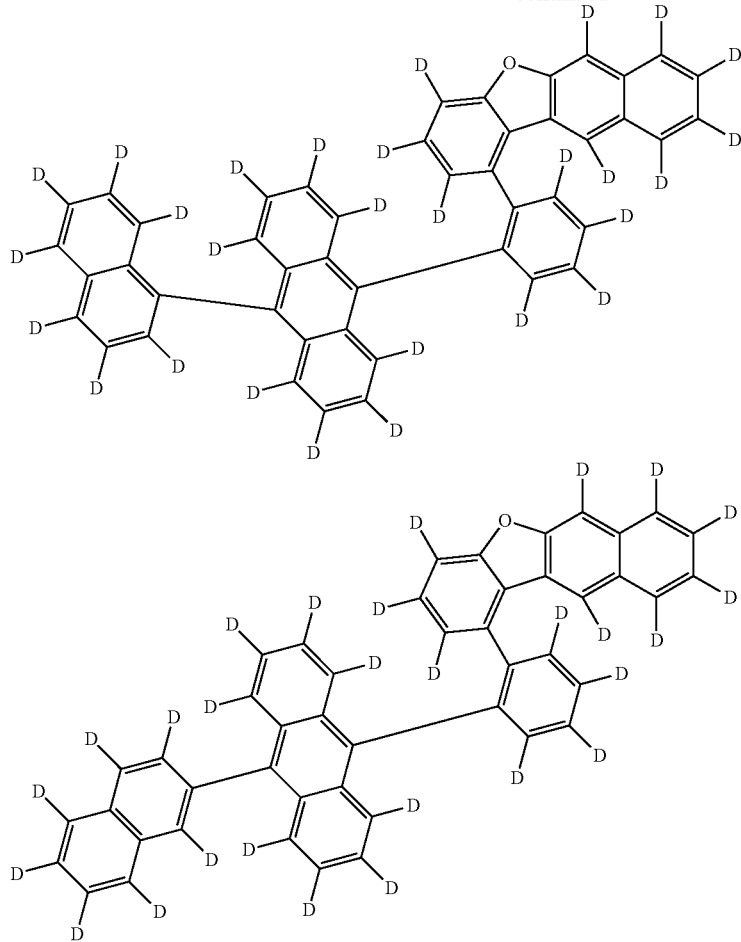
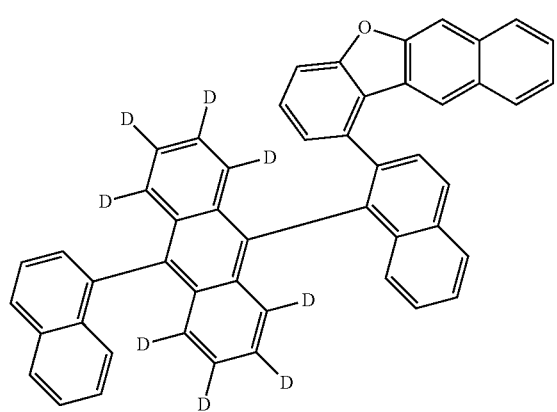

-continued
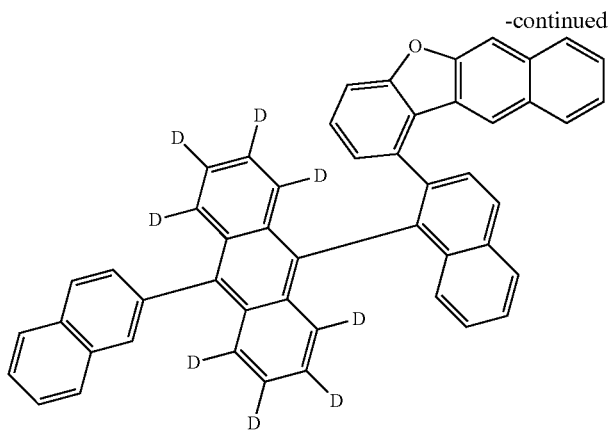
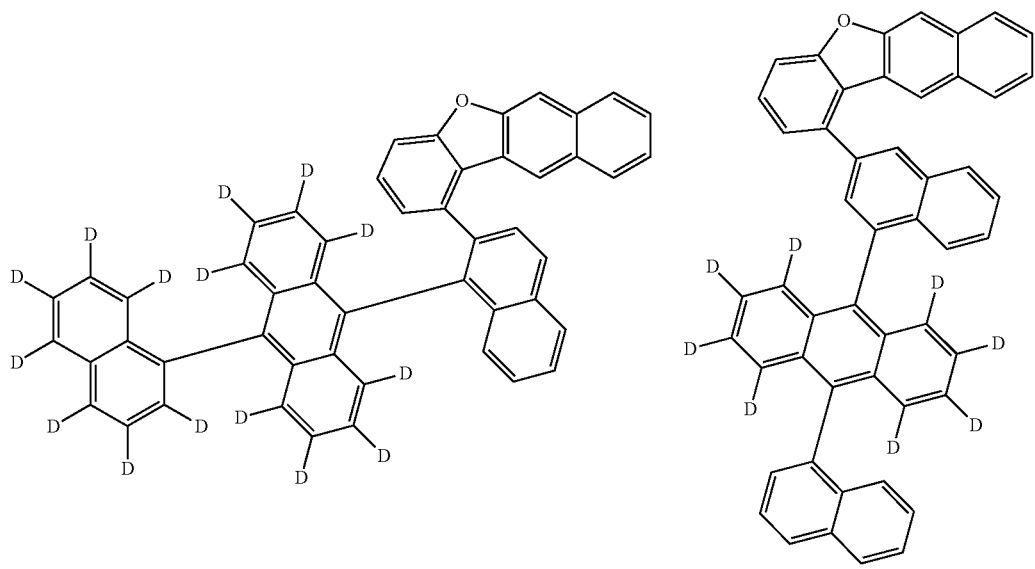
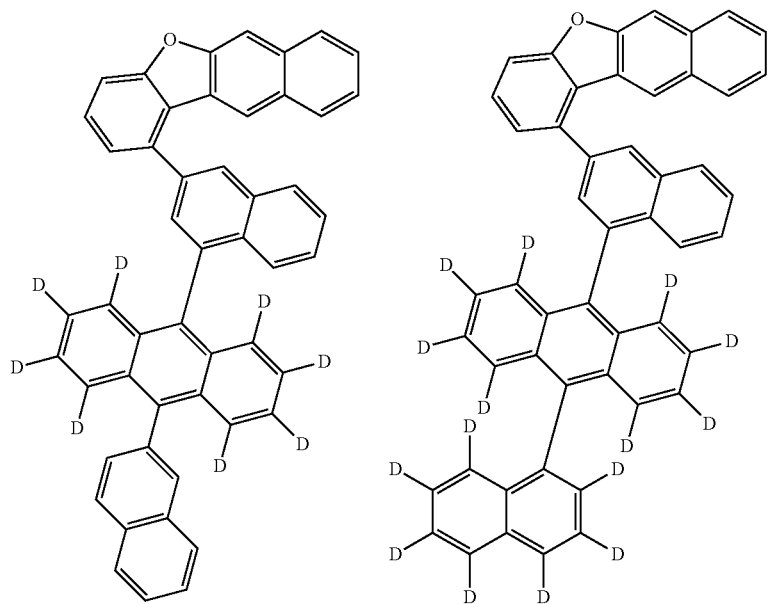 [SMILES: [2H]c1c([2H])c([2H])c2c(-c3cc(-c4cccc5oc6cc7ccccc7cc6c45)cc4ccccc34)c3c([2H])c([2H])c([2H])c([2H])c3c(-c3ccc4ccccc4c3)c2c1[2H] ; [2H]c1c([2H])c([2H])c2c(-c3c4c([2H])c([2H])c([2H])c([2H])c4c(-c4cc(-c5cccc6oc7cc8ccccc8cc7c56)cc5ccccc45)c4c([2H])c([2H])c([2H])c([2H])c34)c([2H])c([2H])c([2H])c2c1[2H]]

-continued
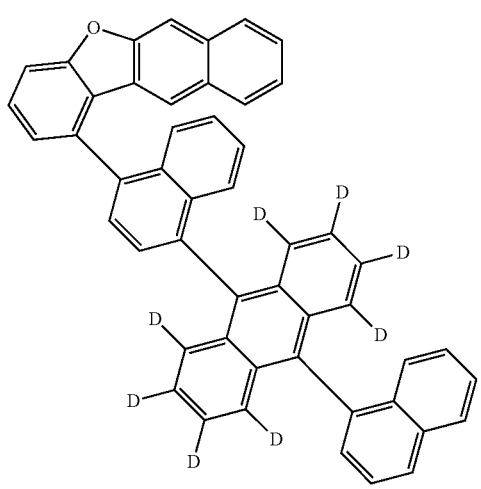
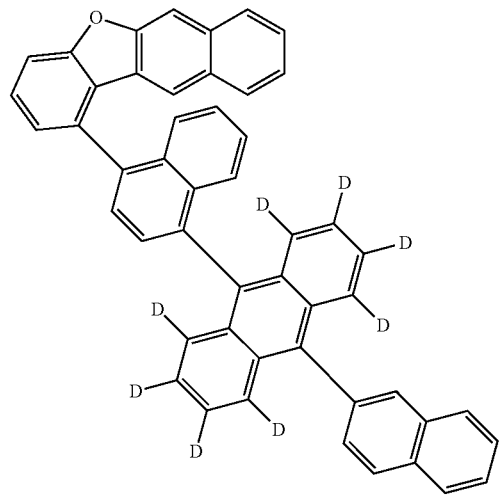
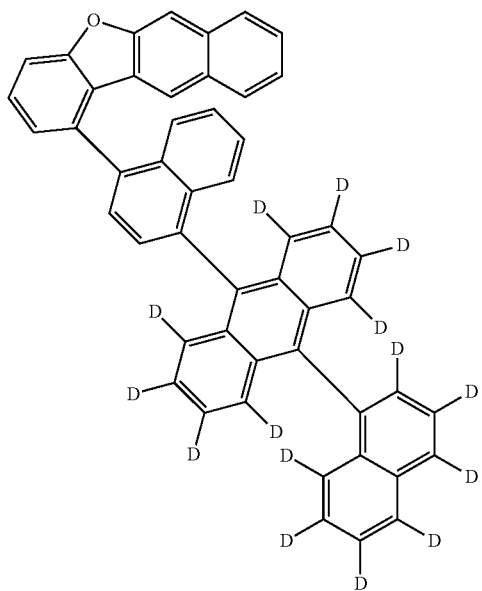
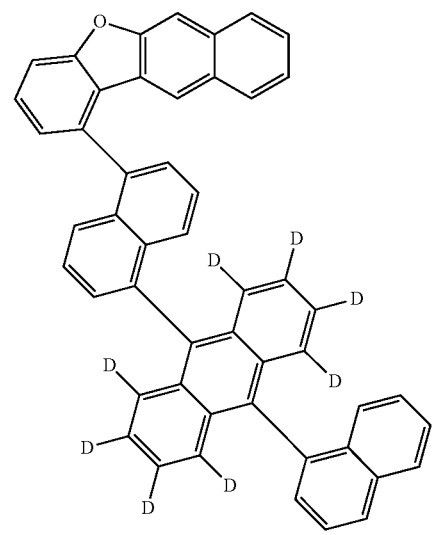
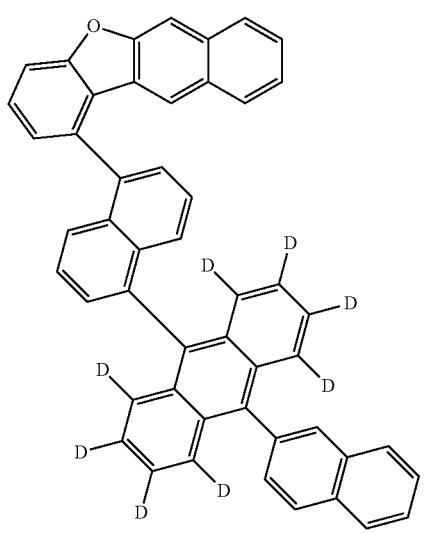
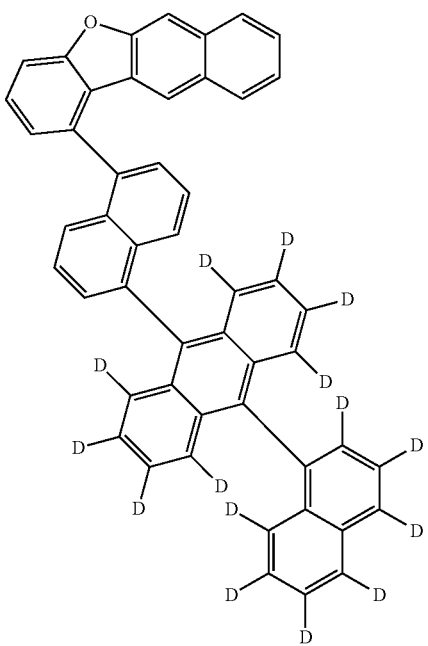

-continued
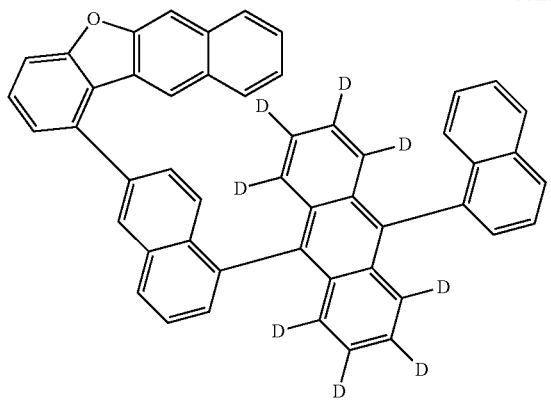
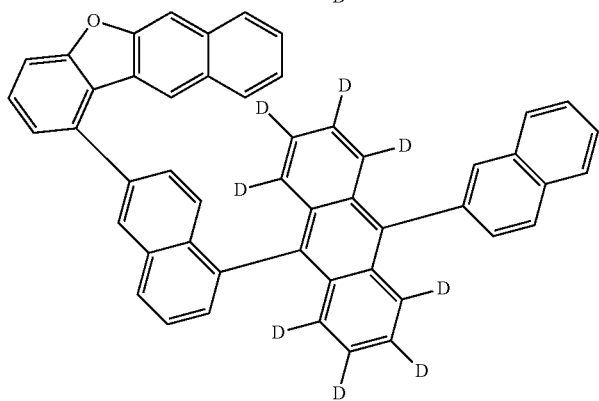
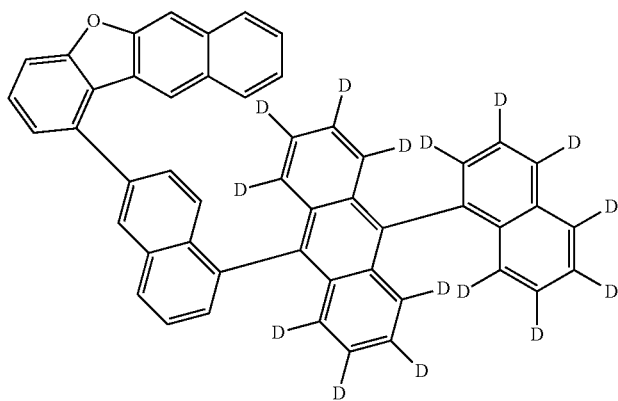
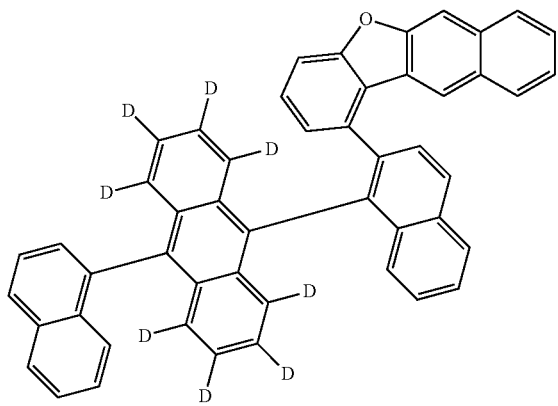

-continued
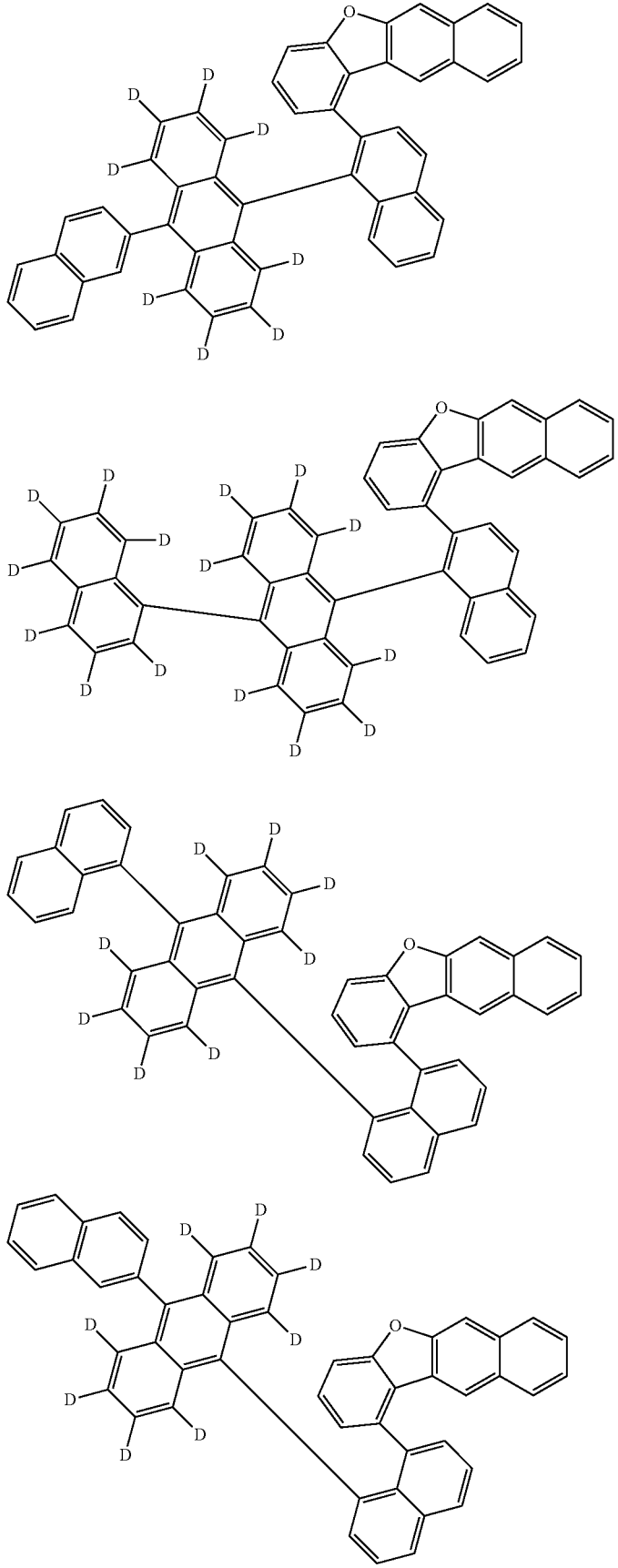

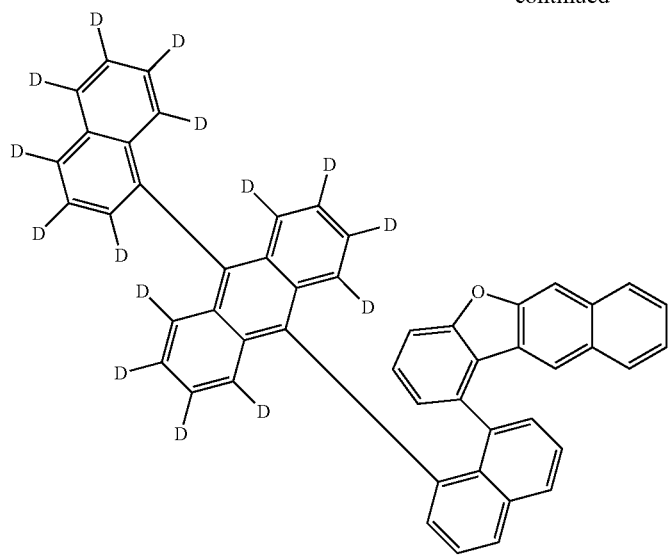
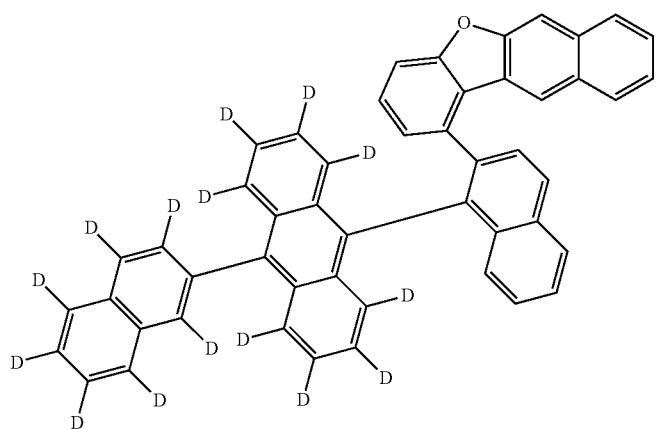
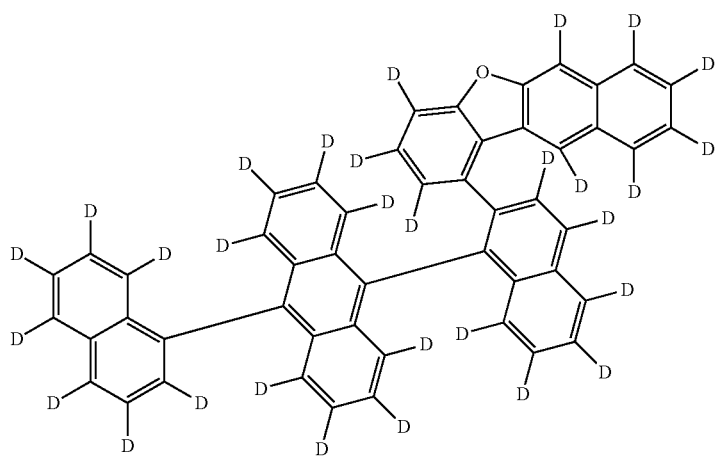

-continued
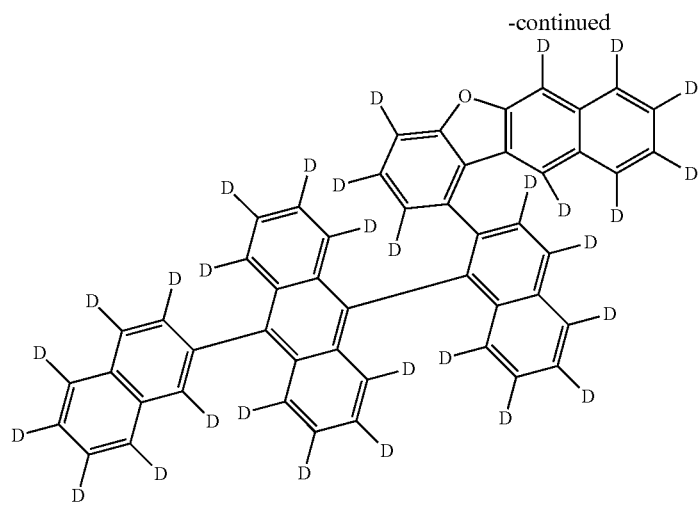
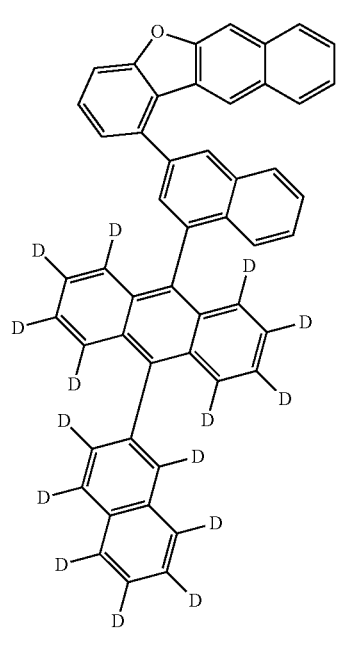
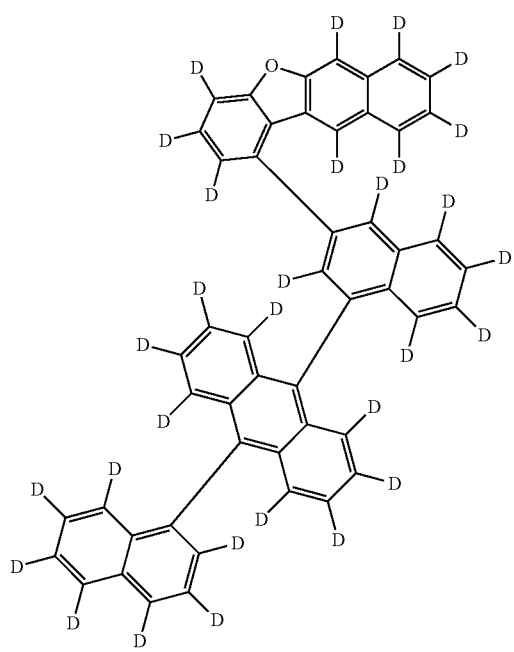

-continued
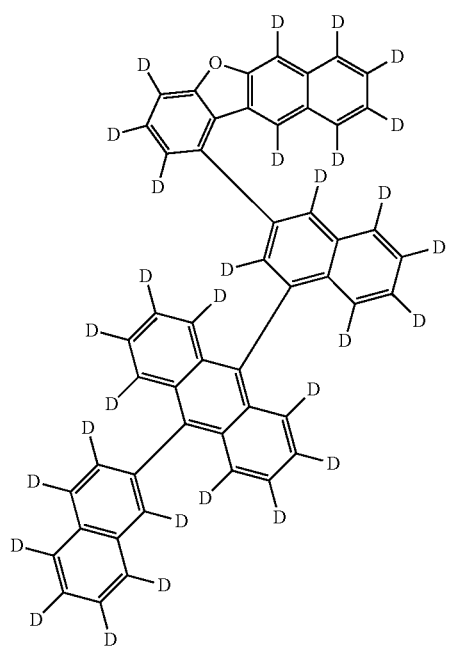
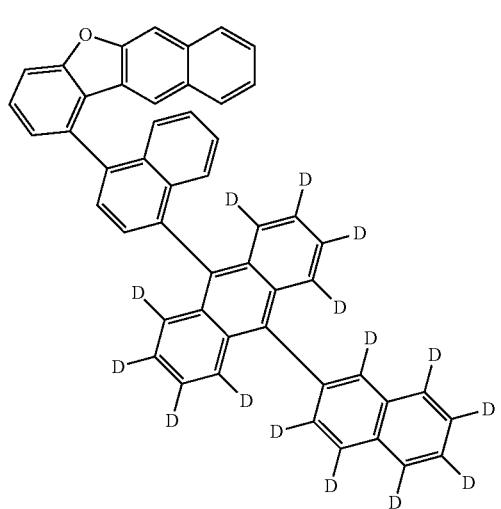
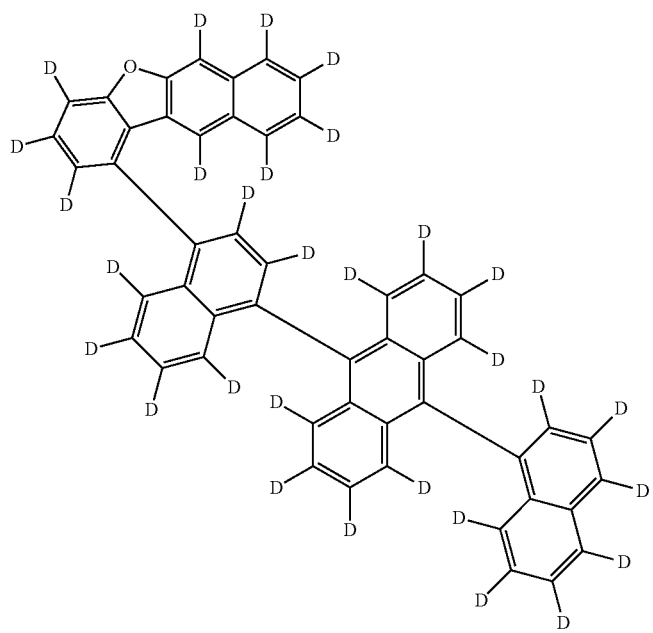

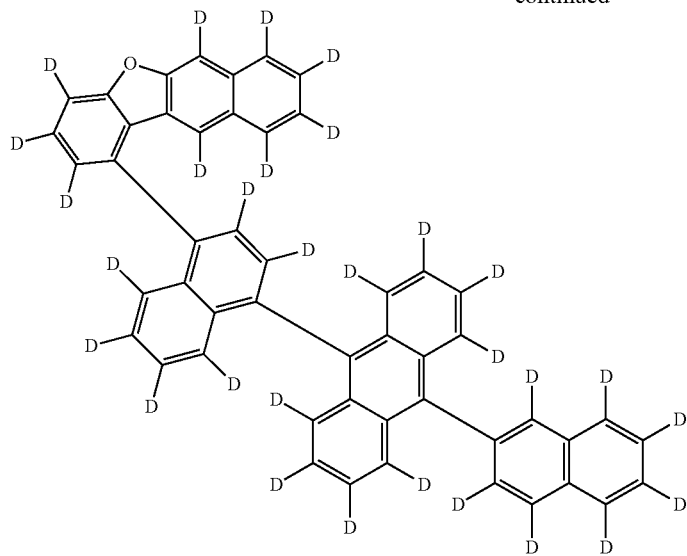
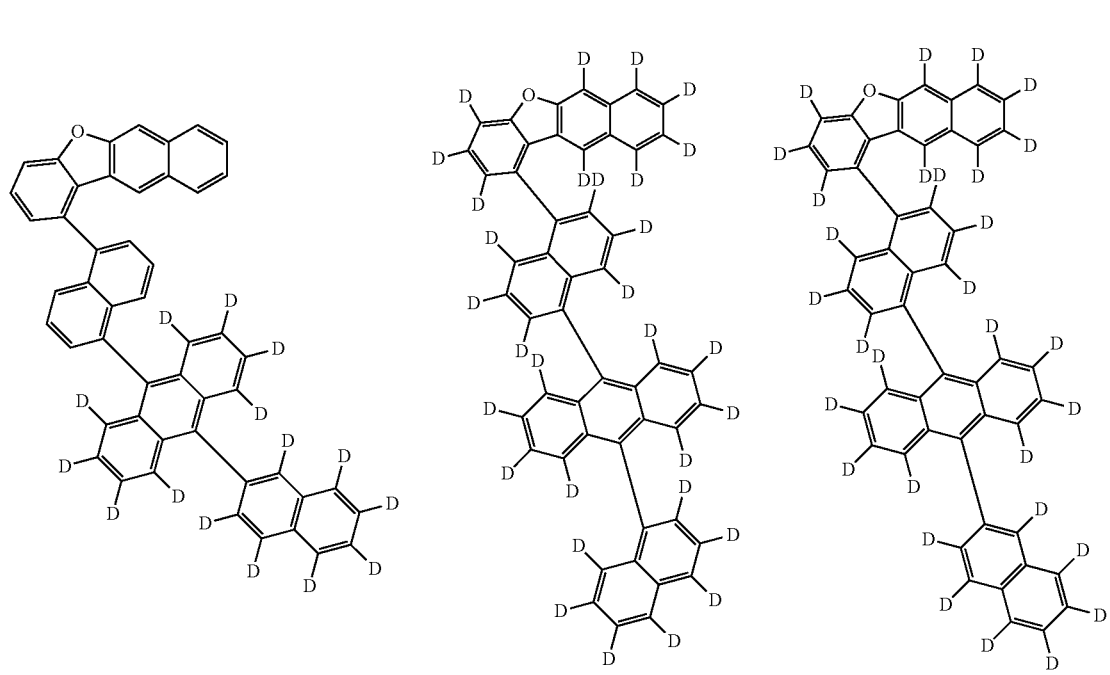

-continued
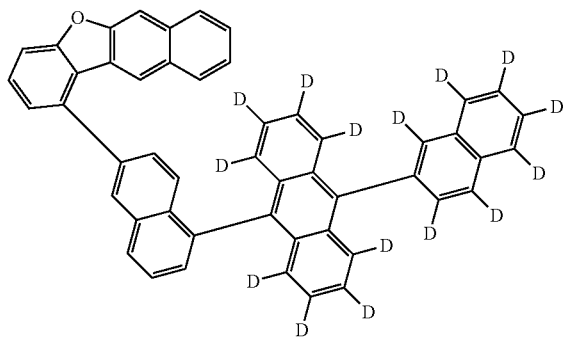
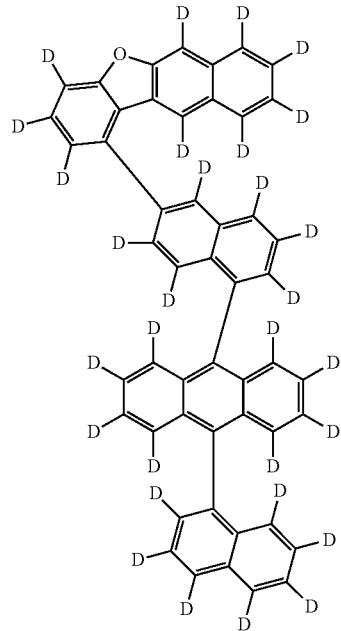
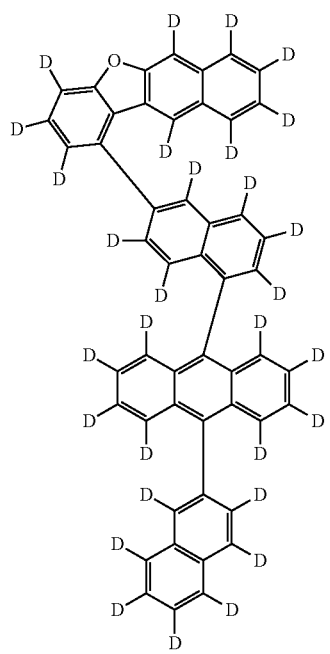
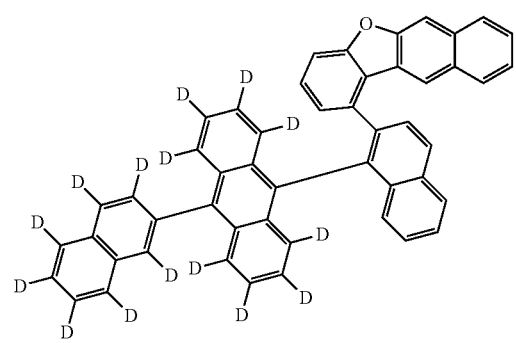

-continued
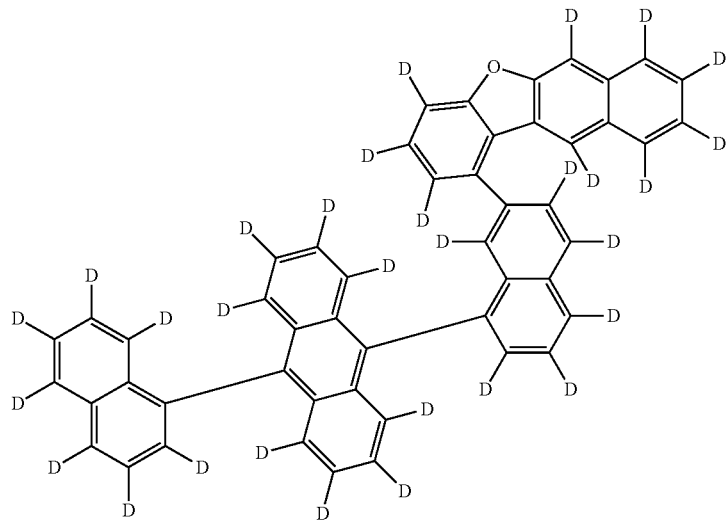
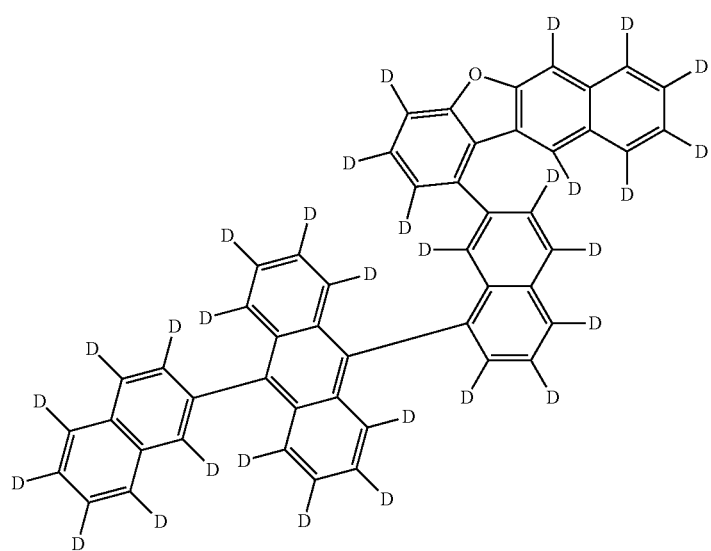
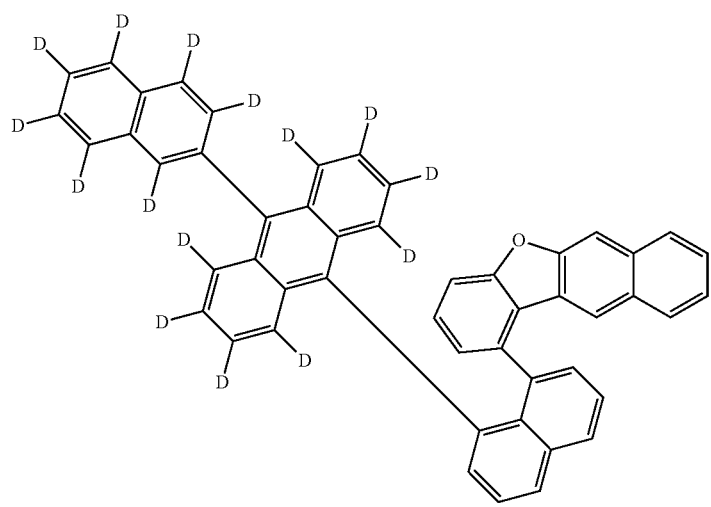

-continued
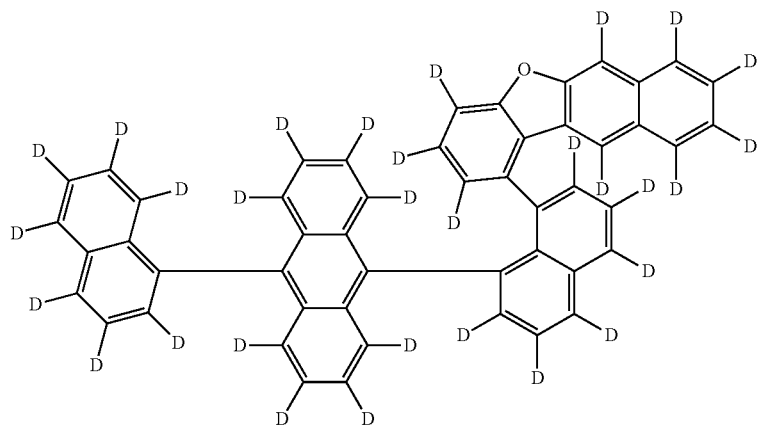
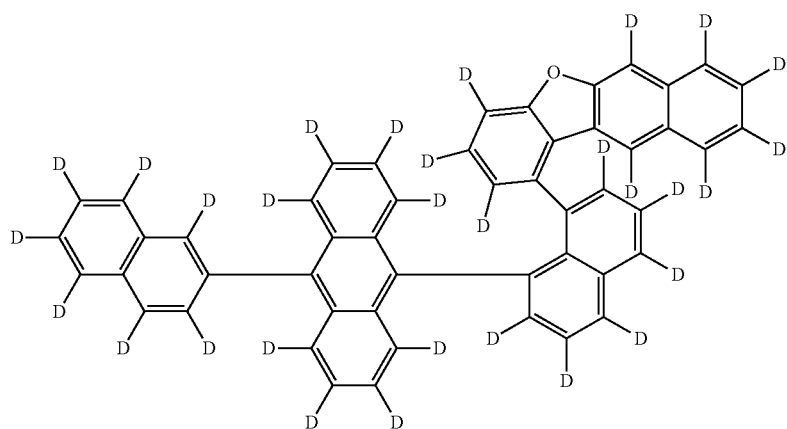
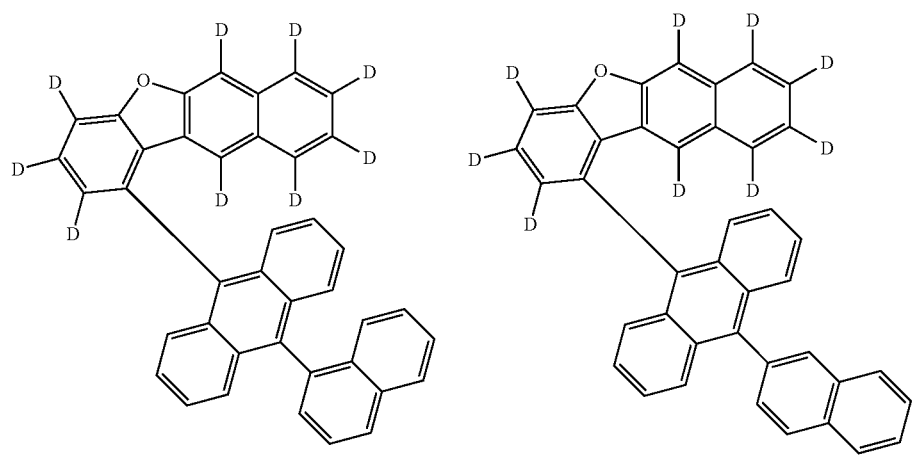

77
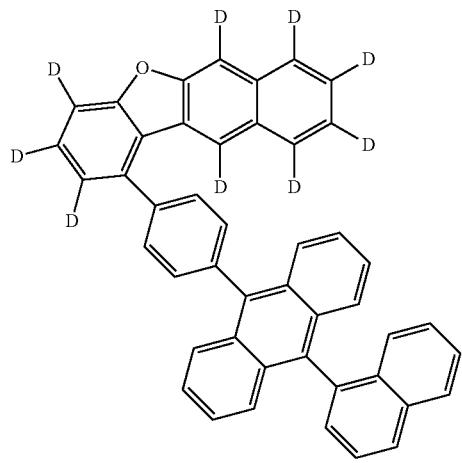
78
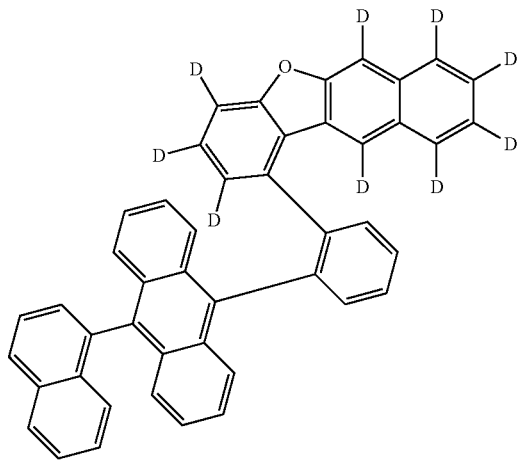
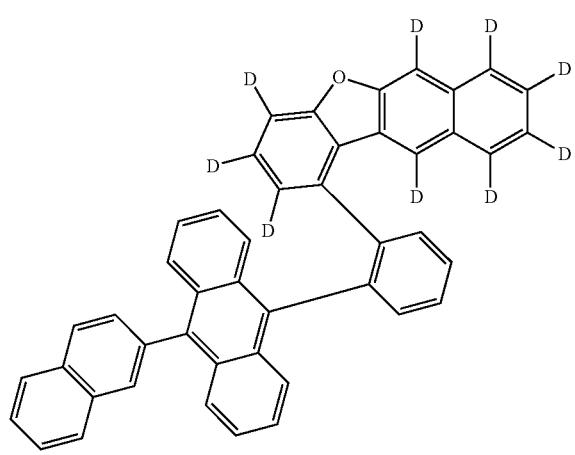
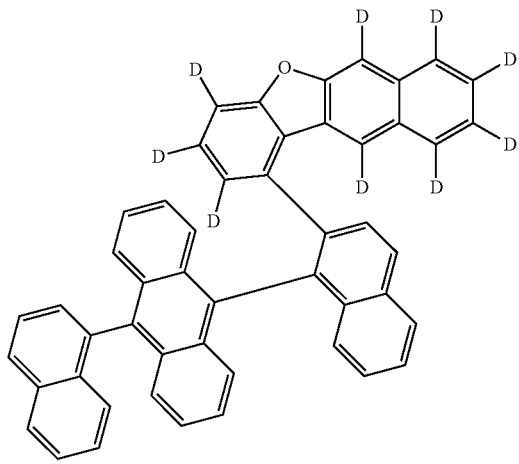
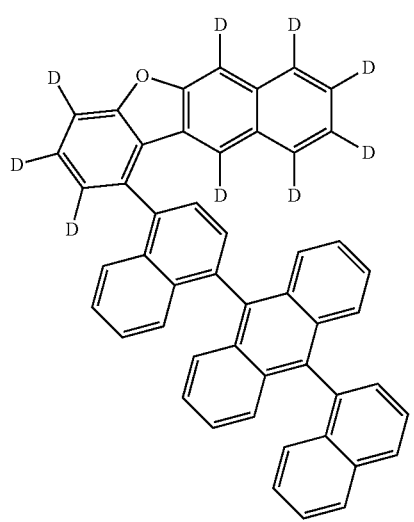
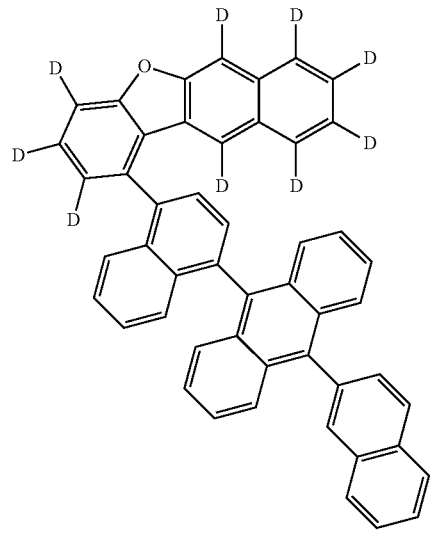

-continued
79
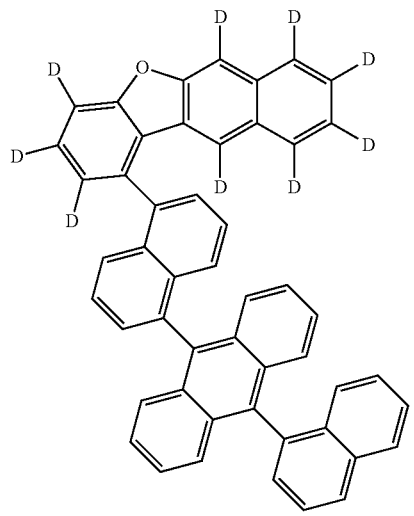
80
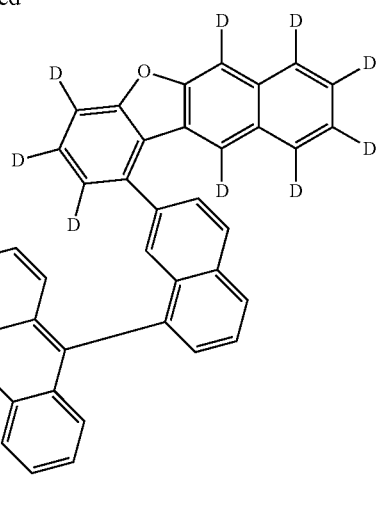
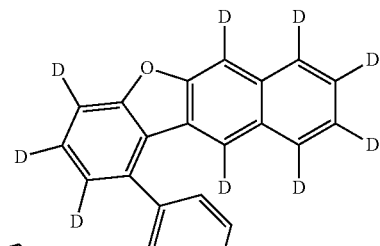
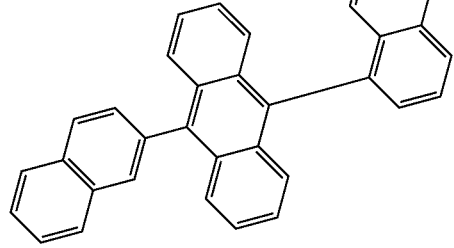
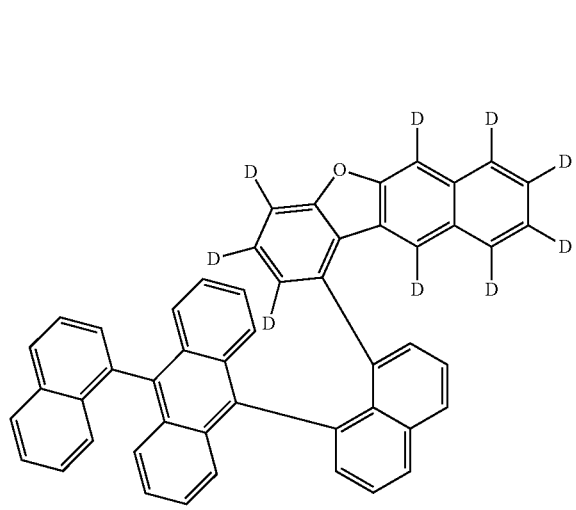
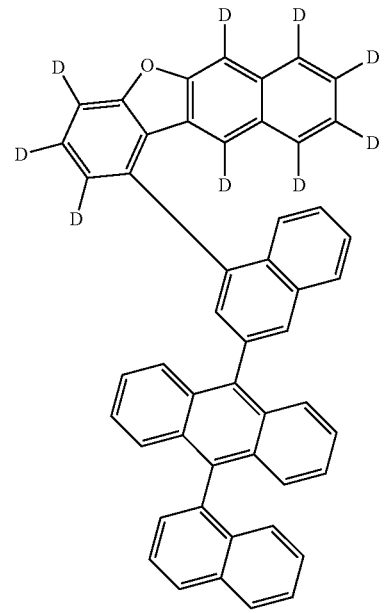

-continued
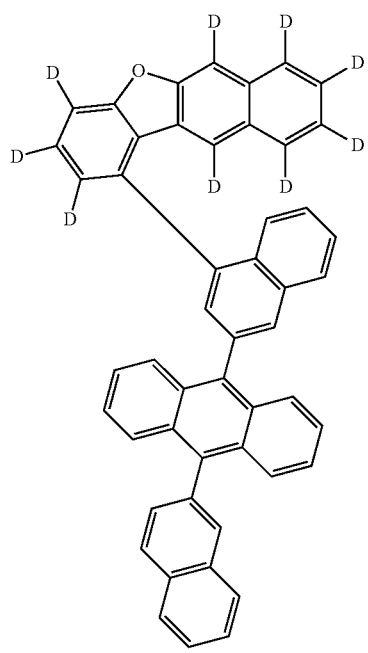
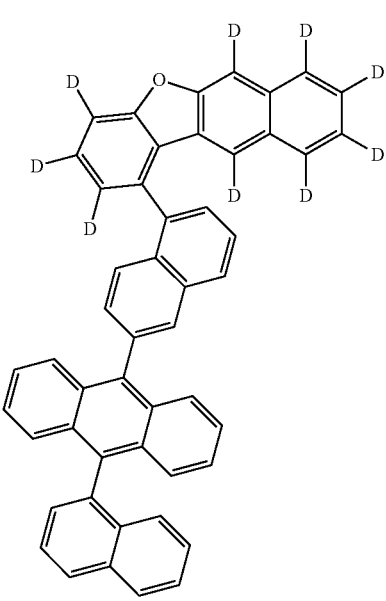
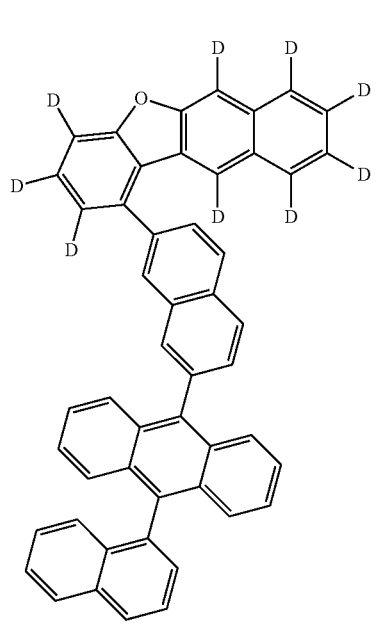
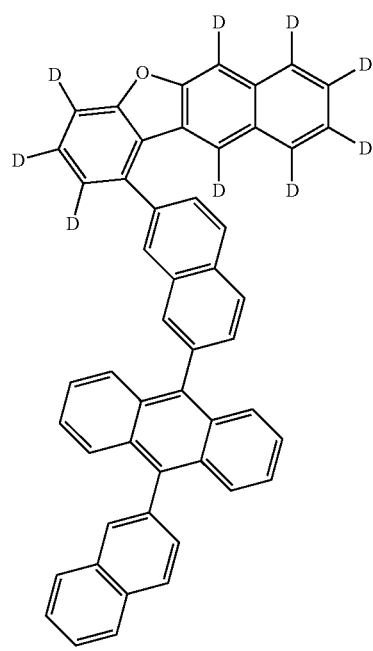

83 84
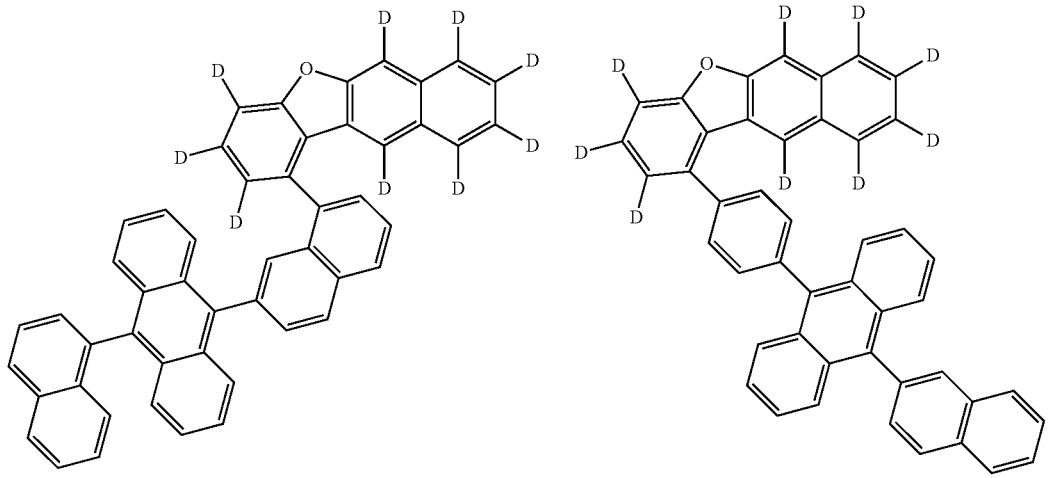
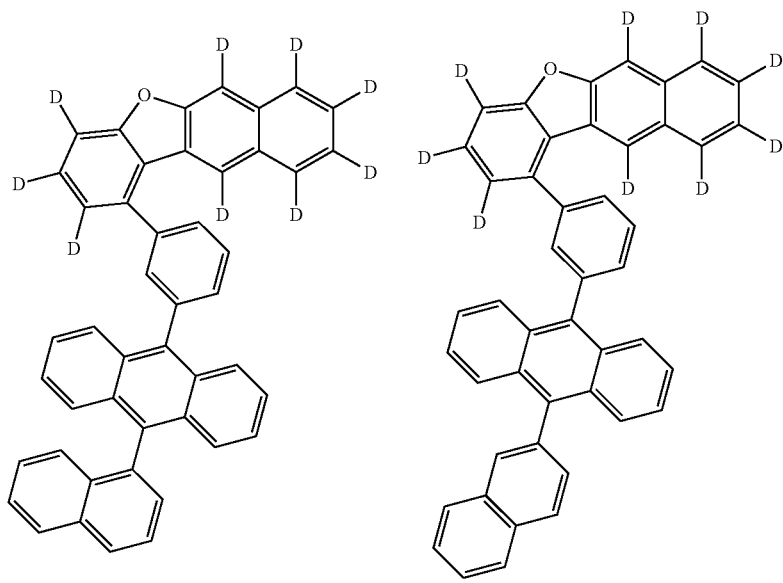
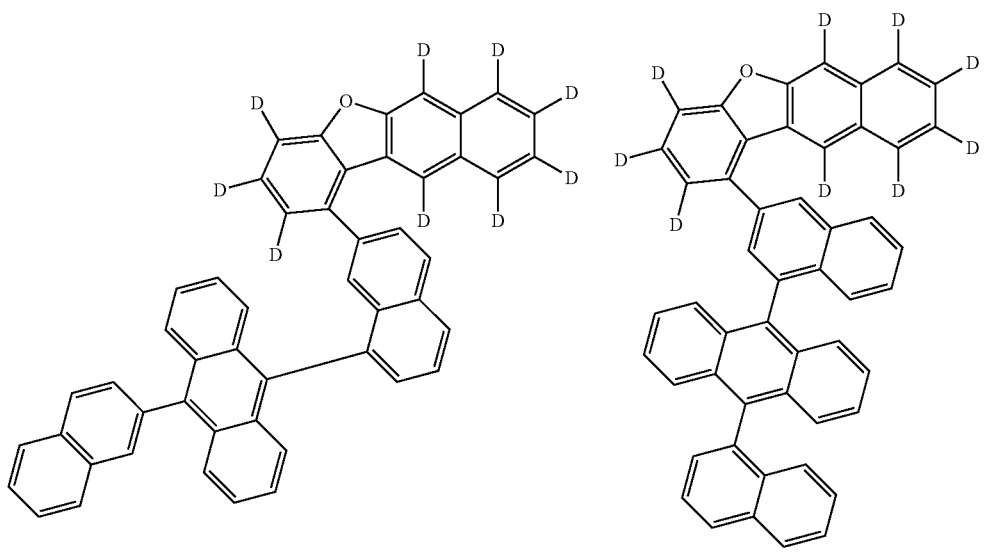

-continued
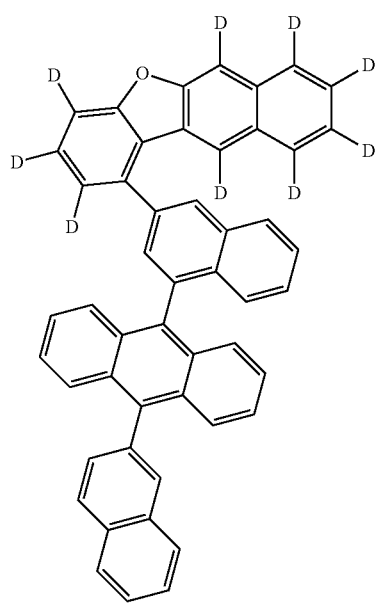
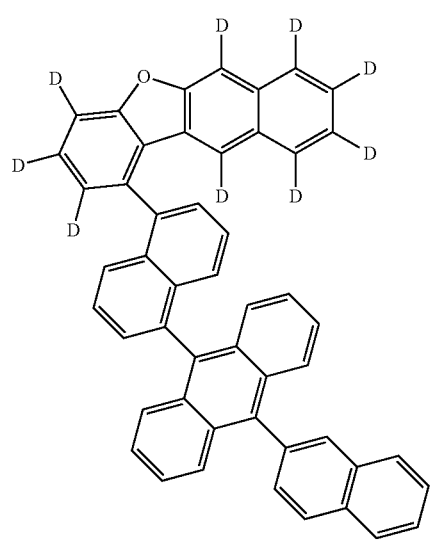
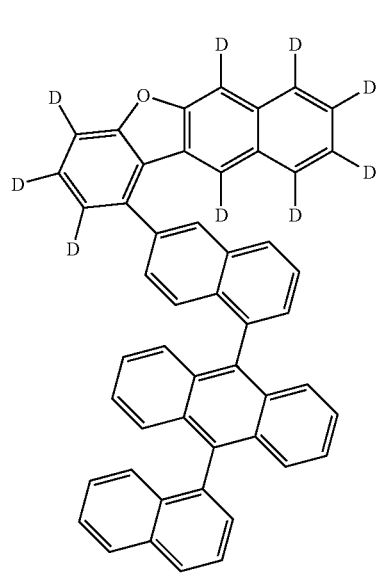
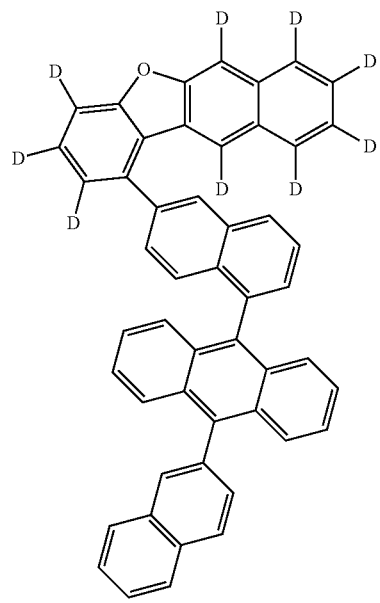
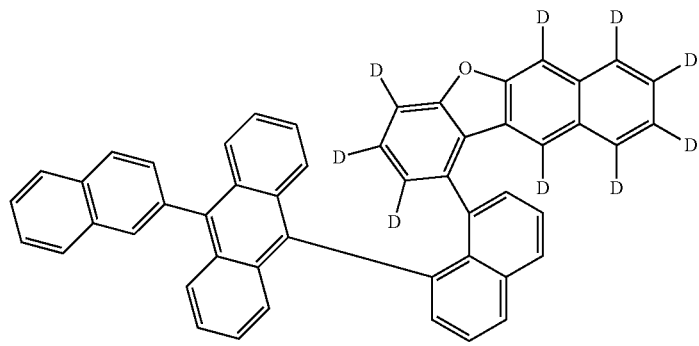

87
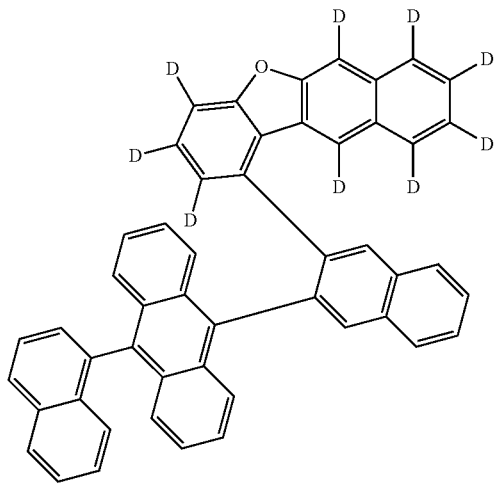
88
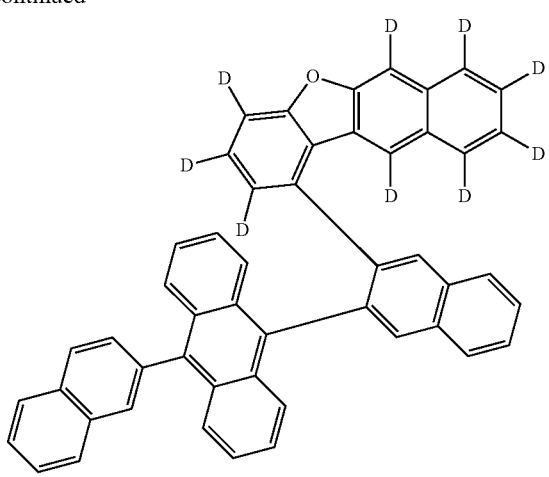
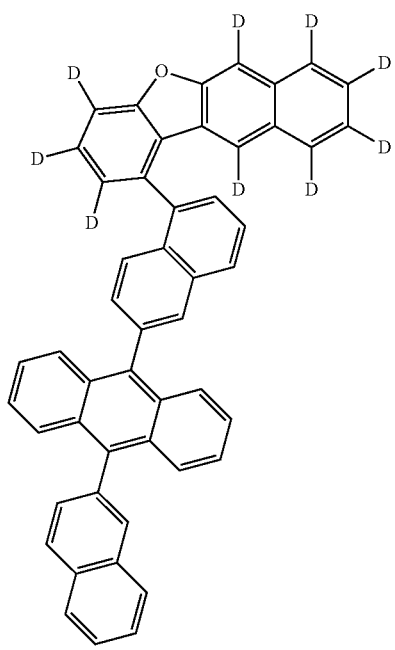
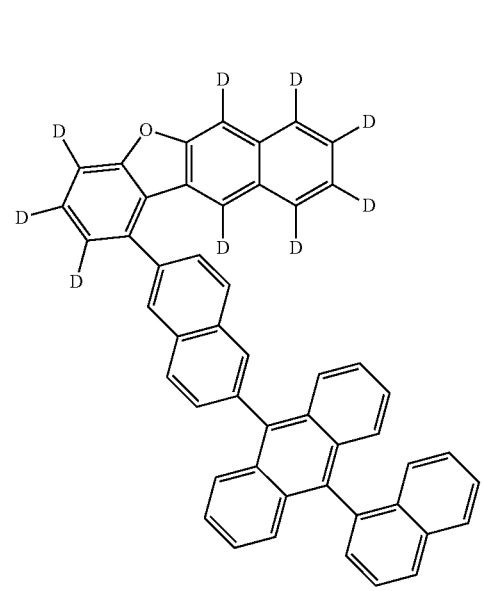
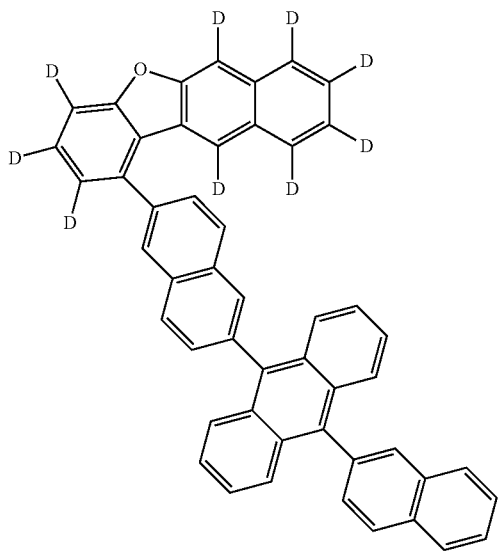
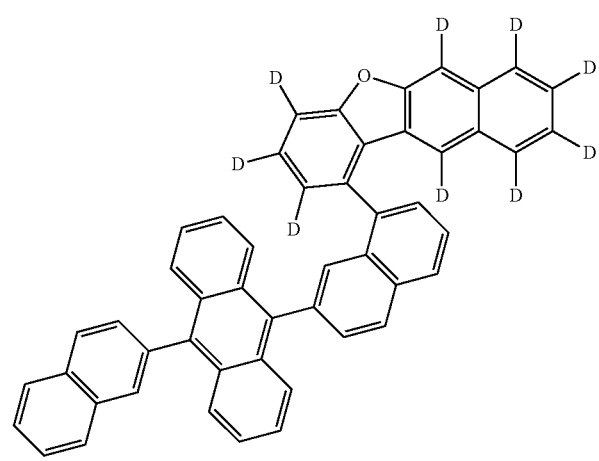

89 90
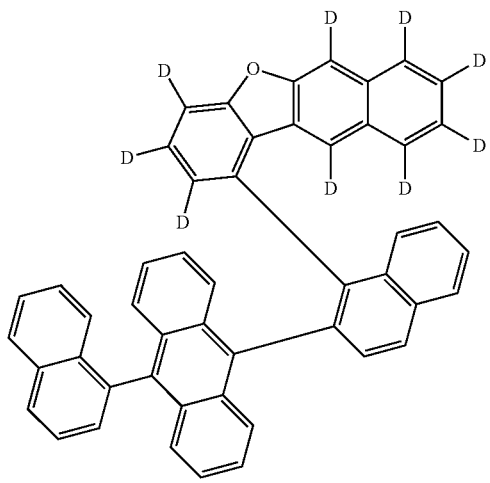
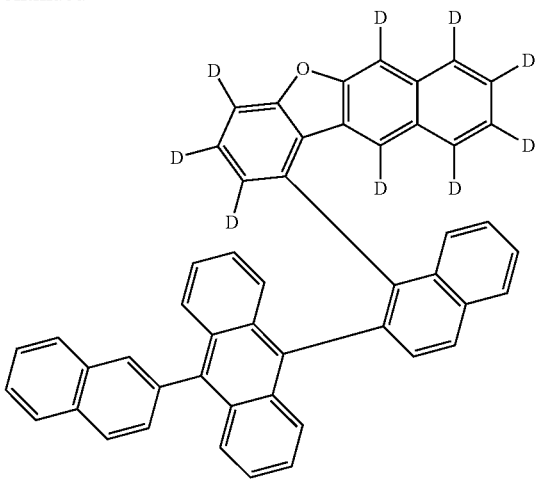
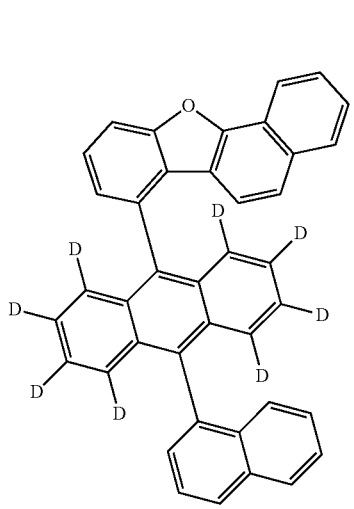
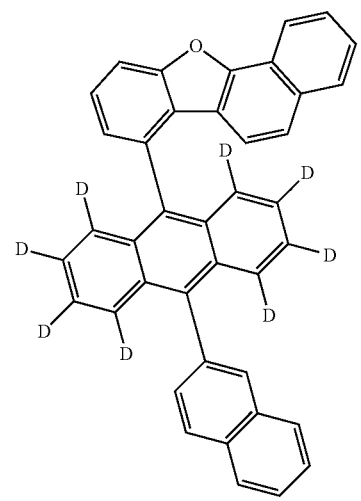
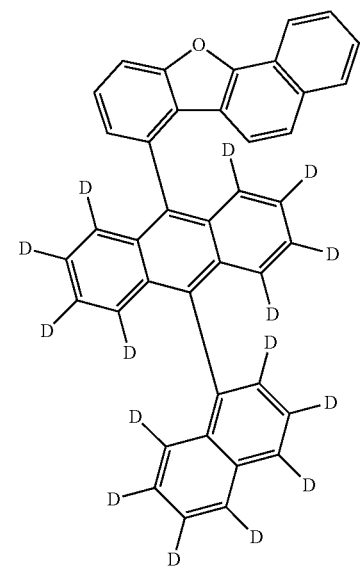
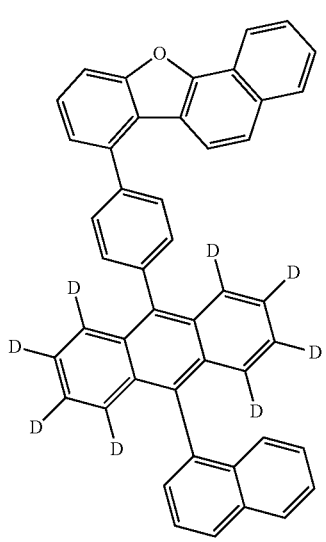
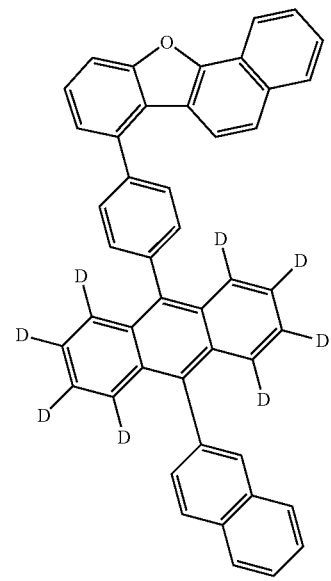
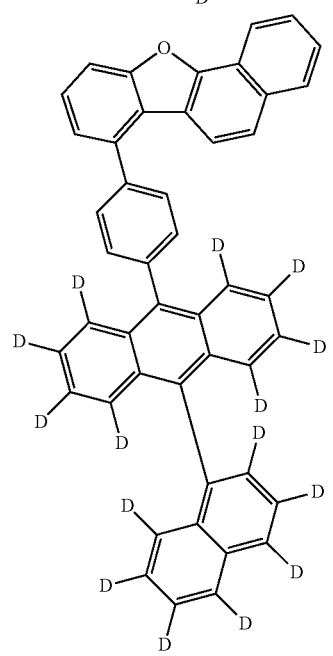

-continued
91
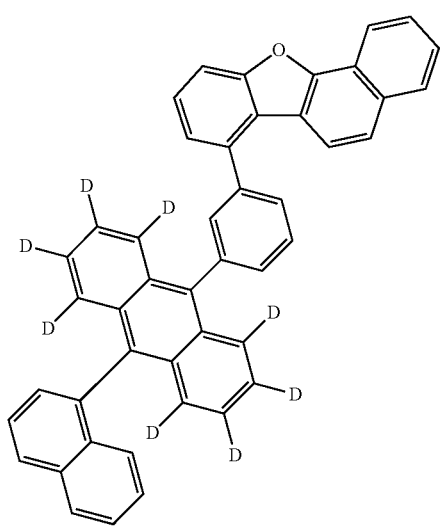
92
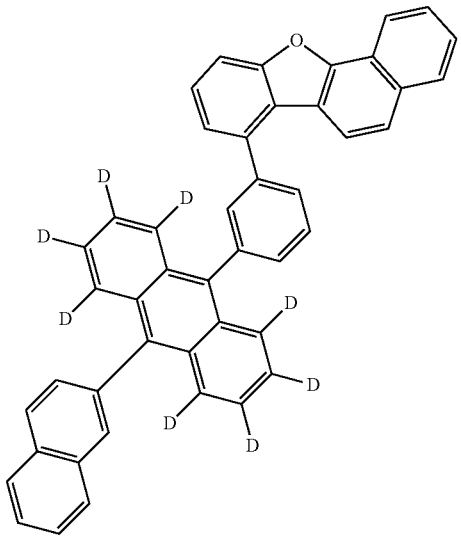
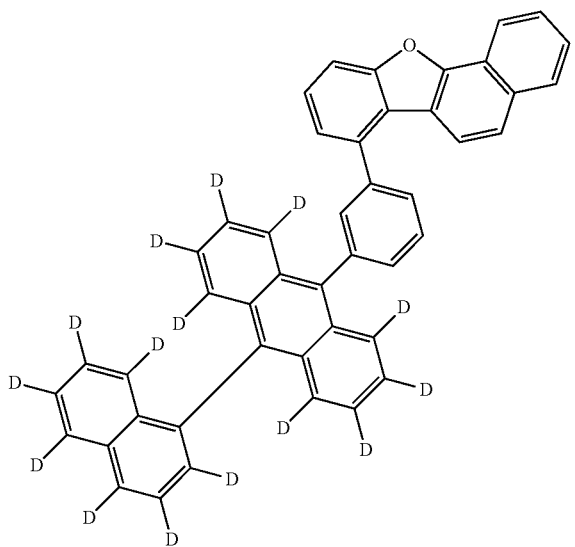
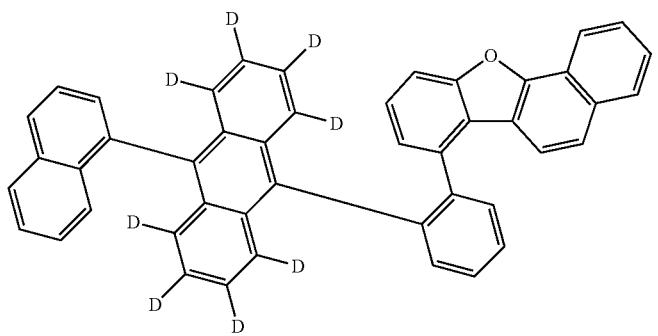

-continued
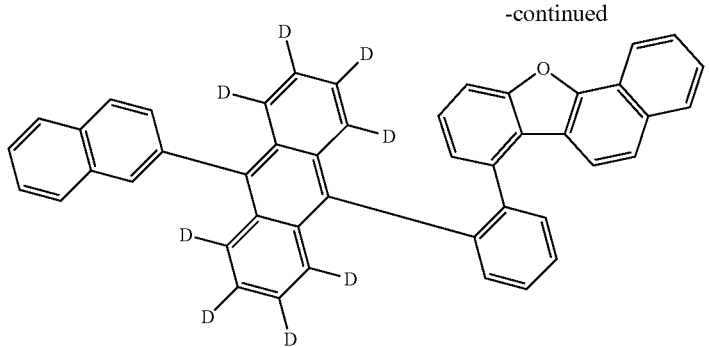
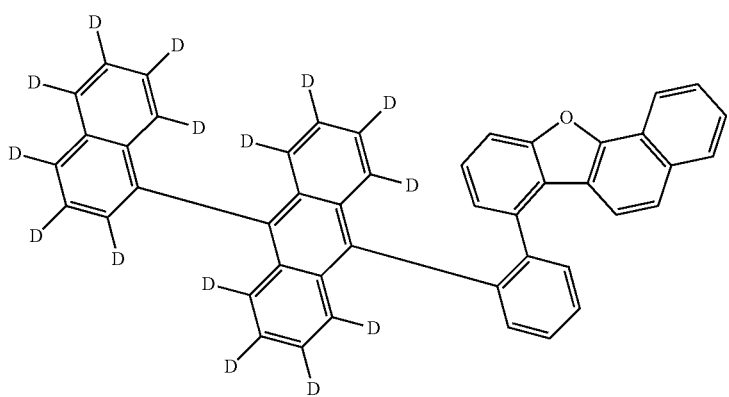
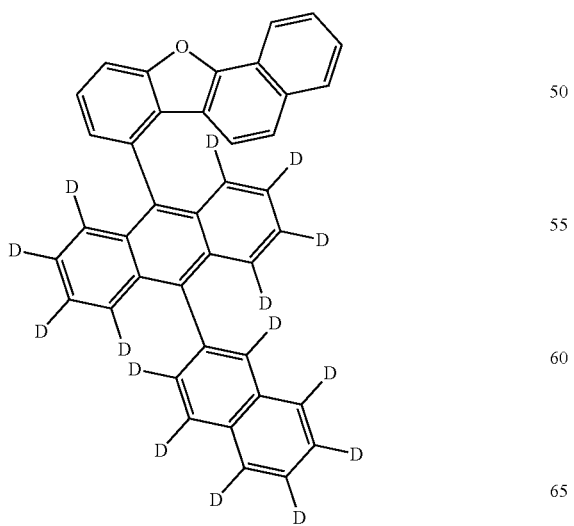

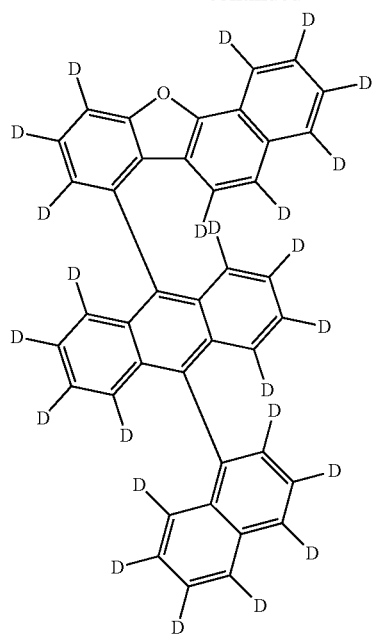
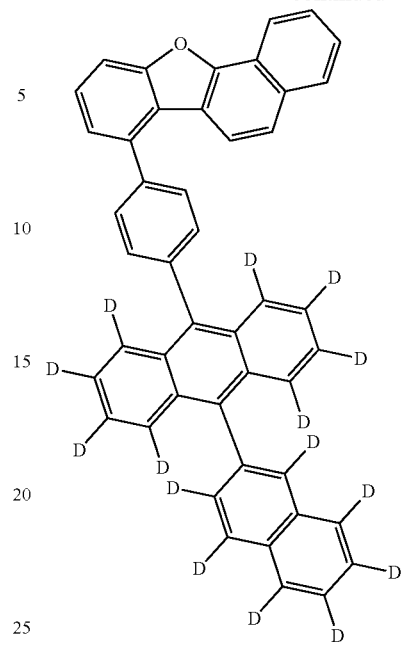
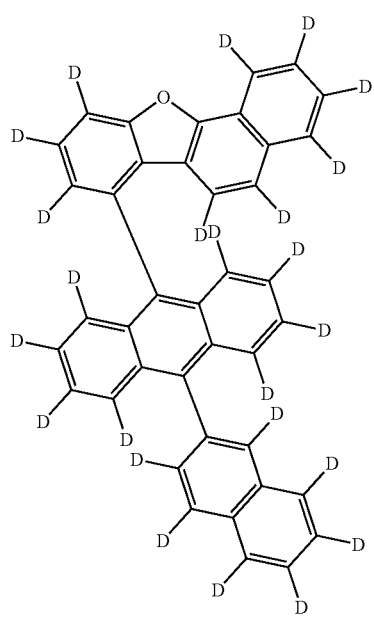
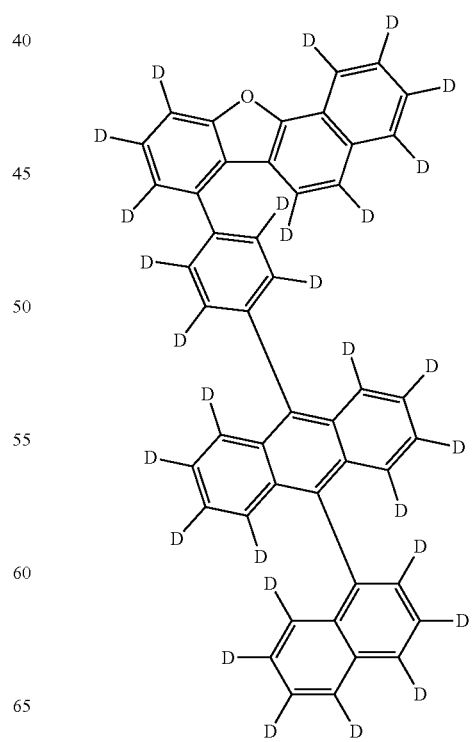

97
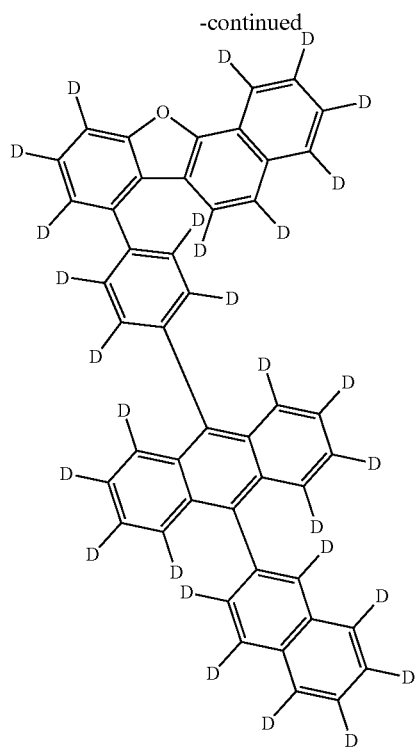
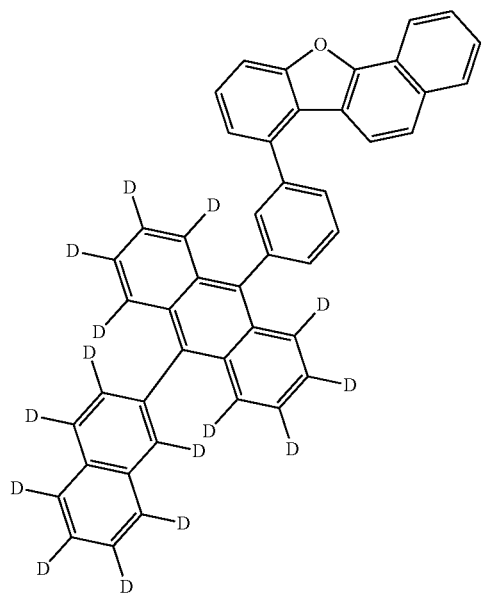
98
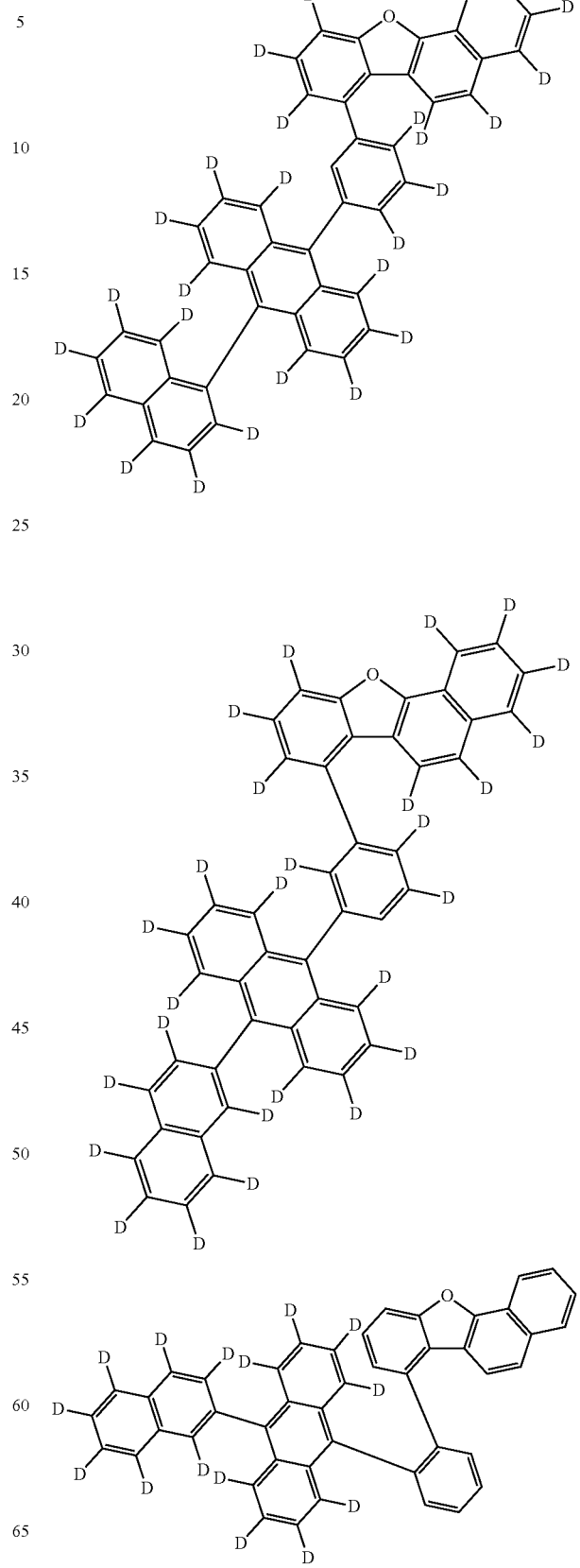

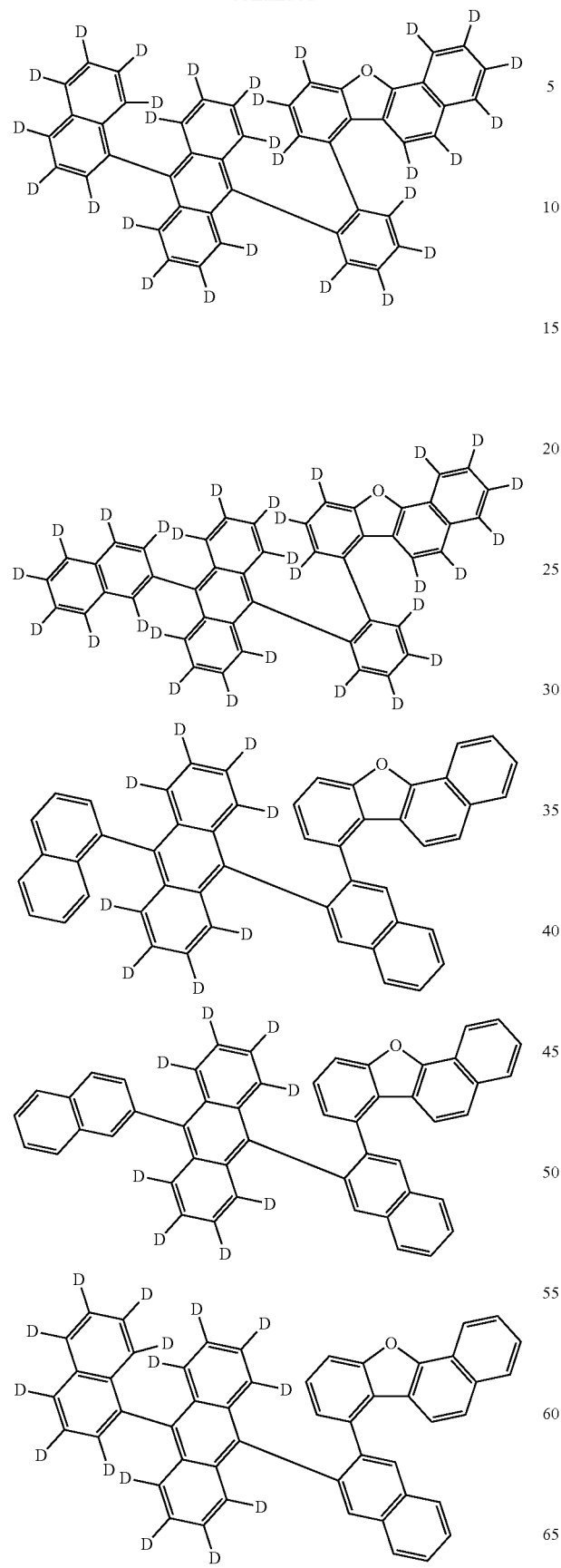
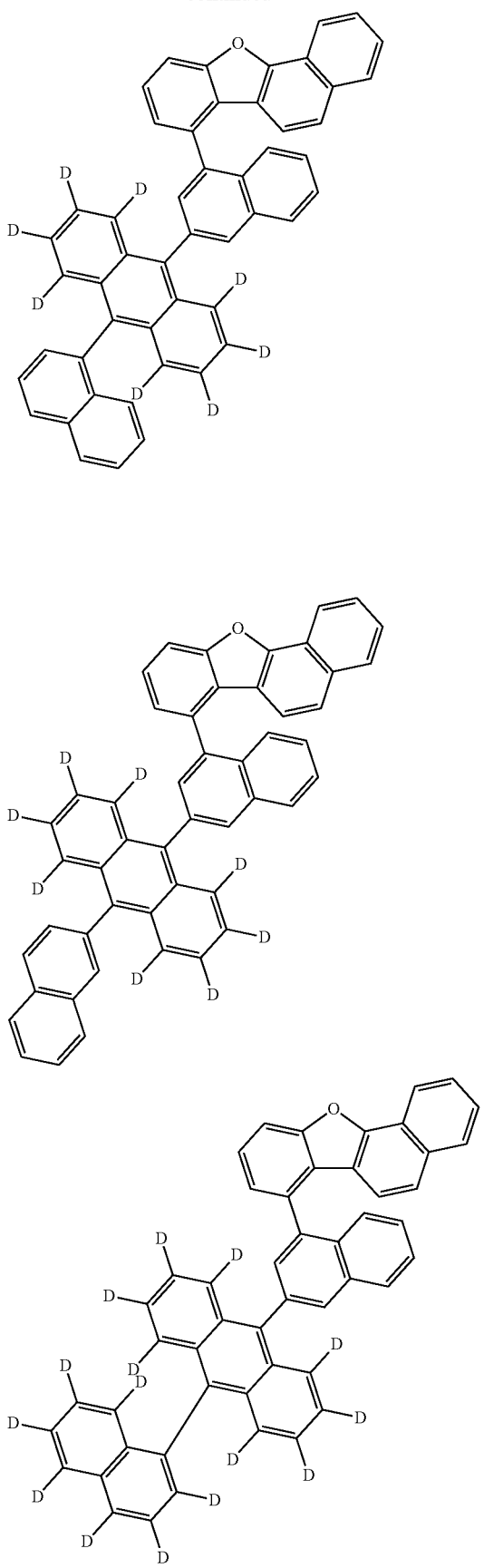

101
-continued
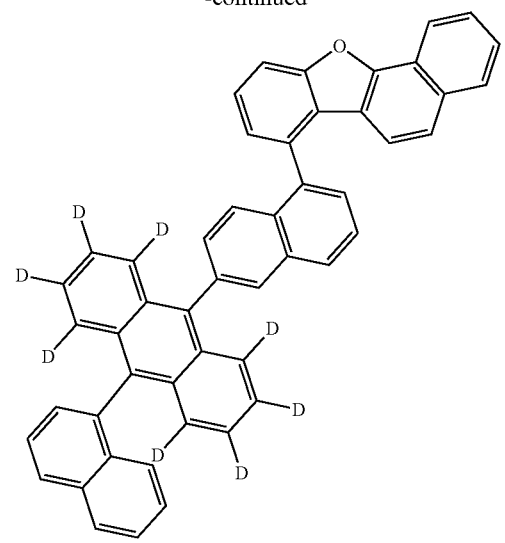
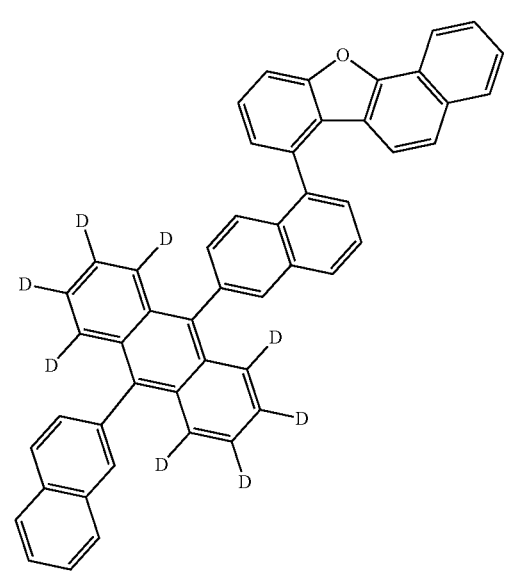
102
-continued
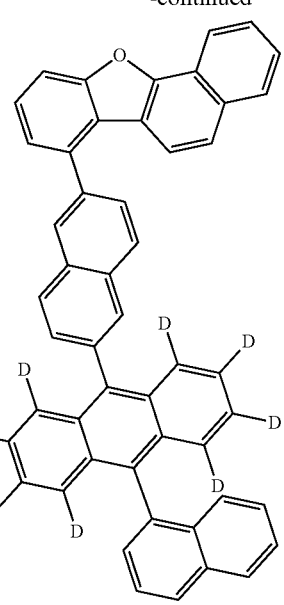
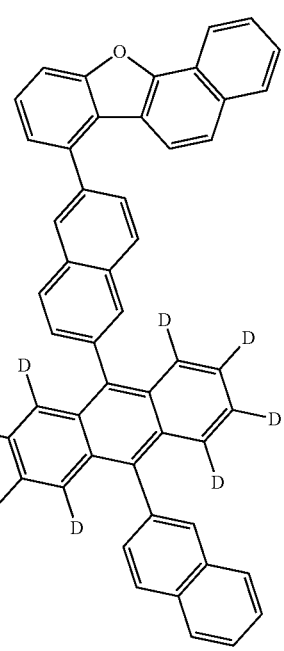

103
-continued
104
-continued
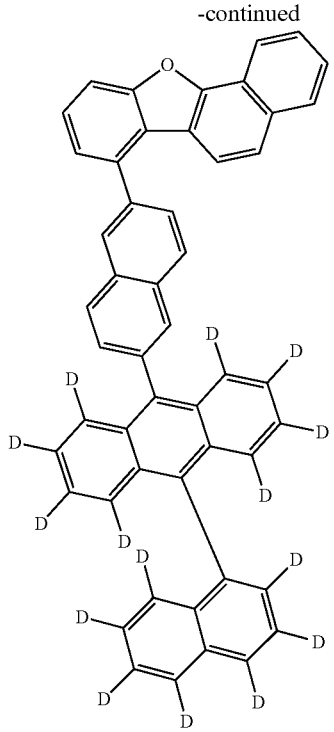
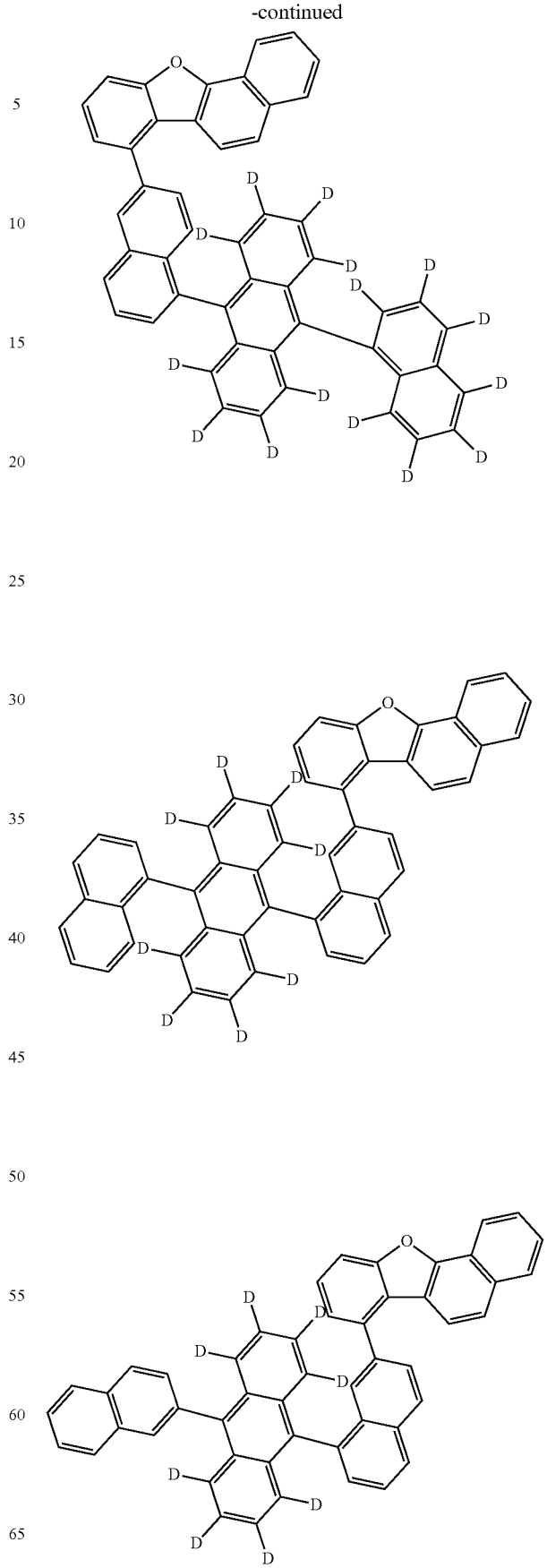

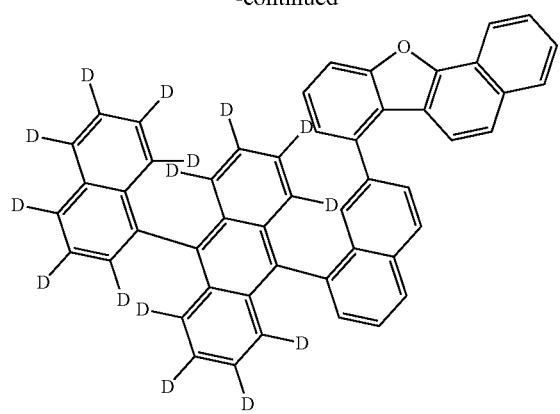
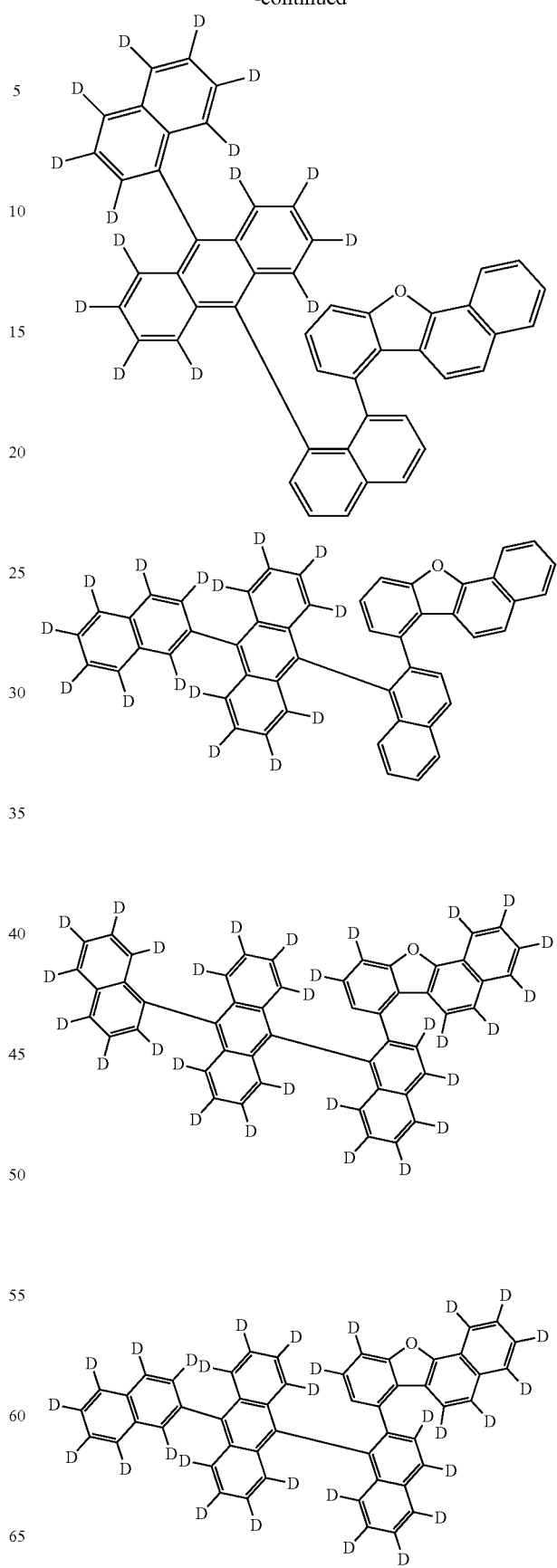

107
-continued
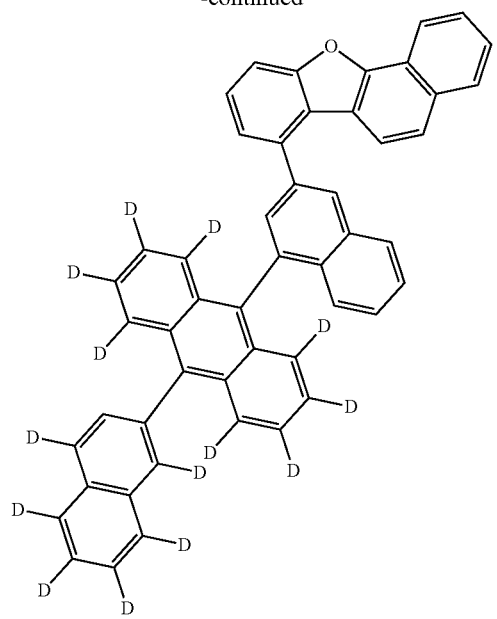
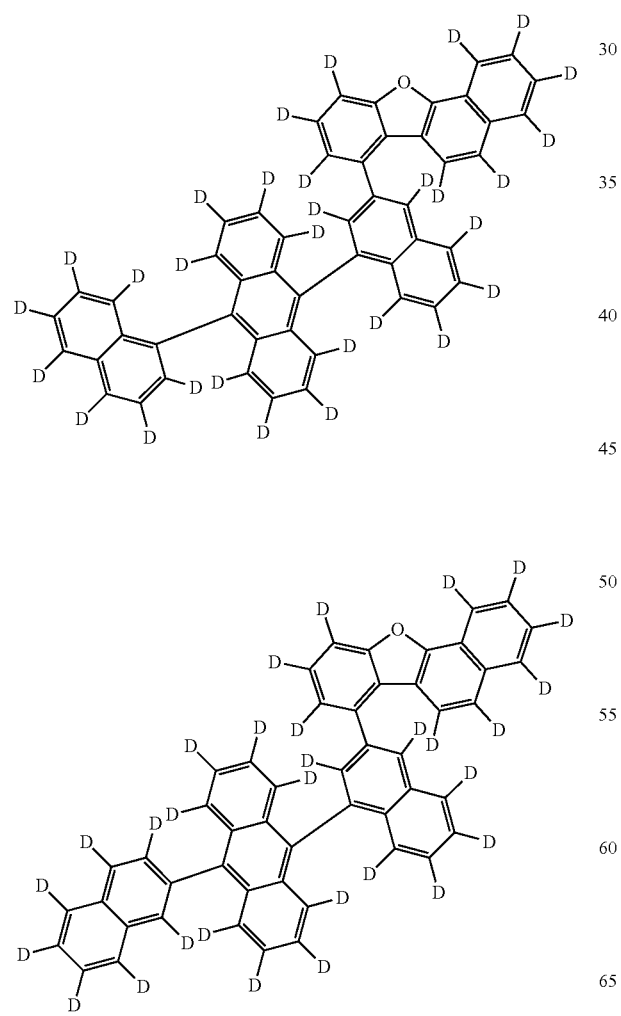
108
-continued
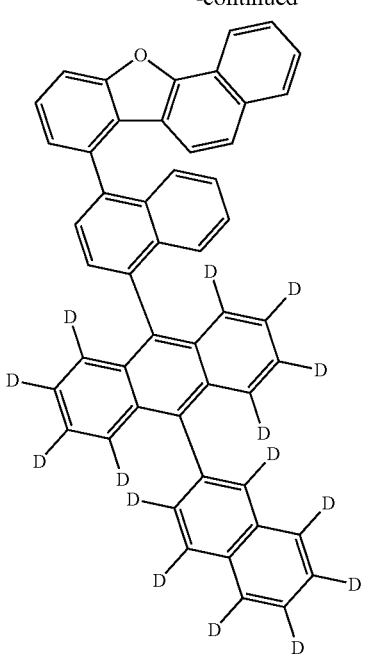
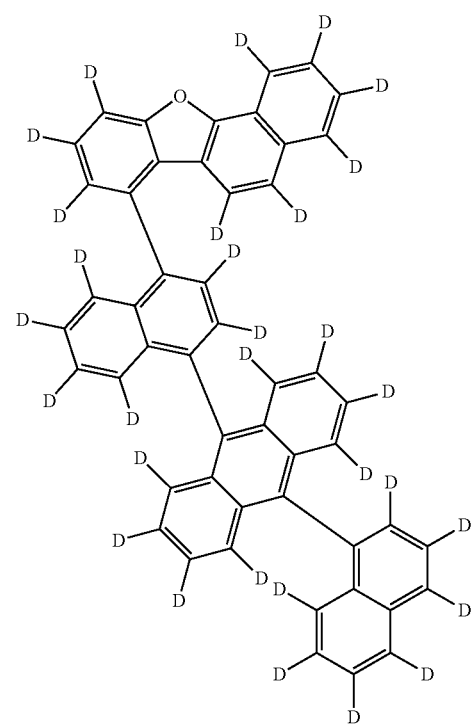

109
-continued
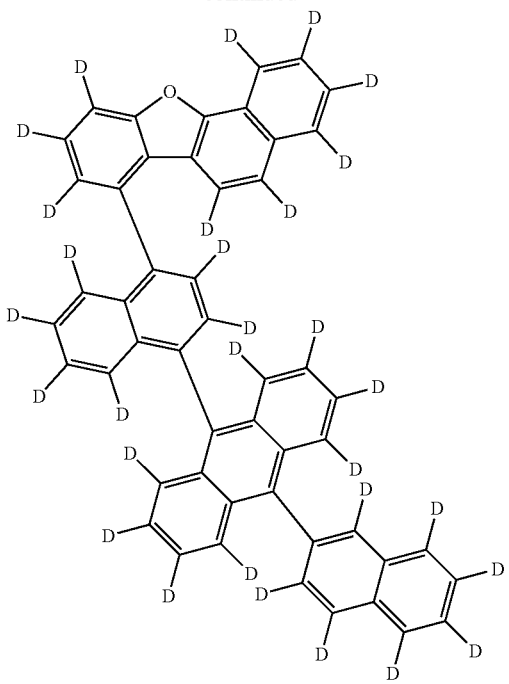
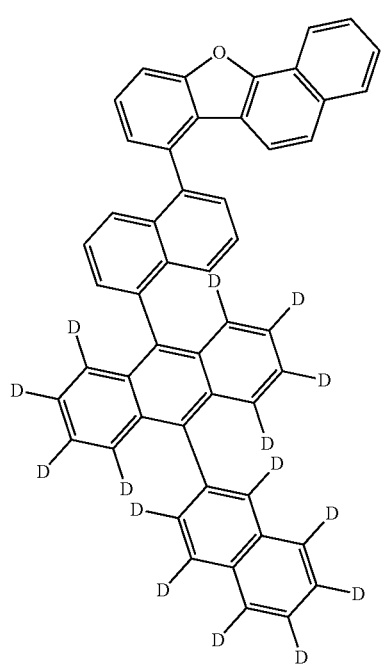
110
-continued
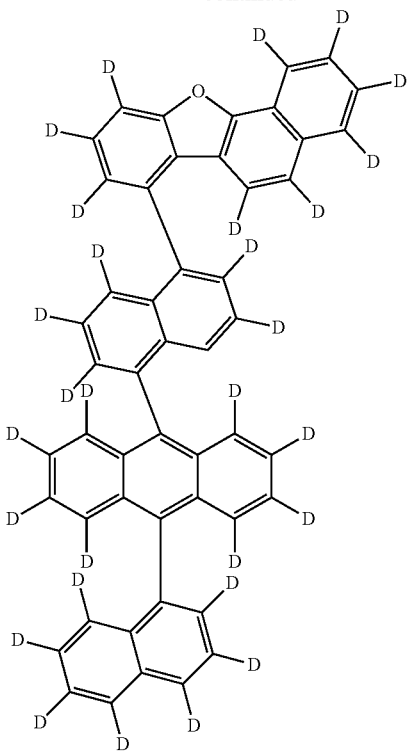

111
-continued
112
-continued
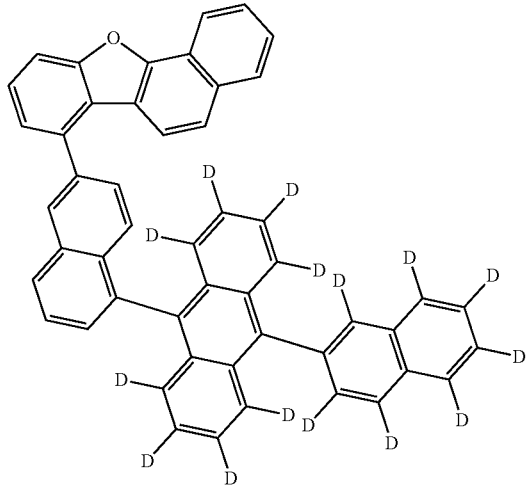
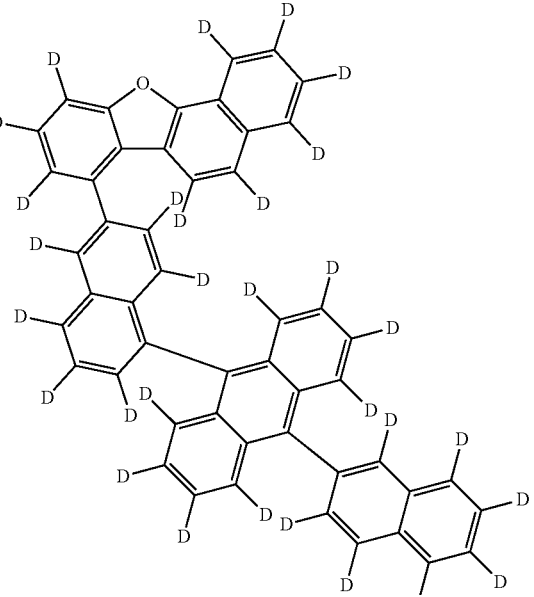
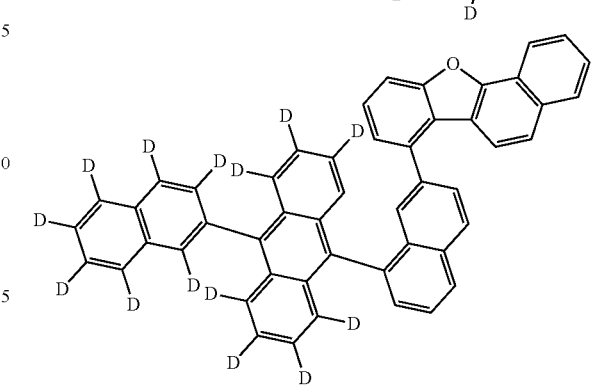
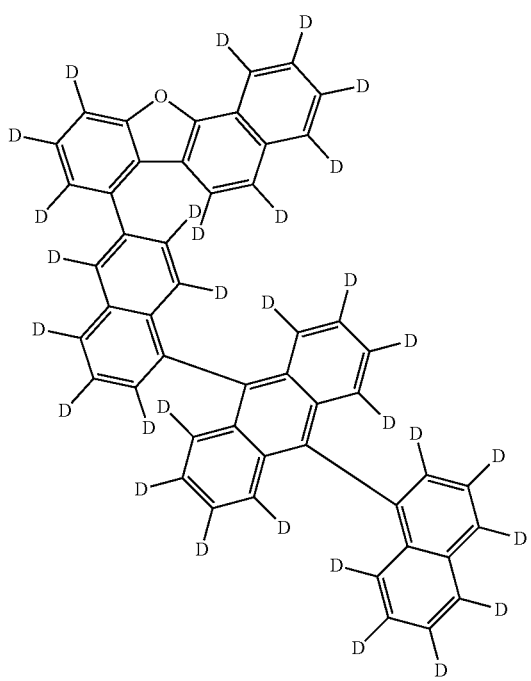

113
-continued
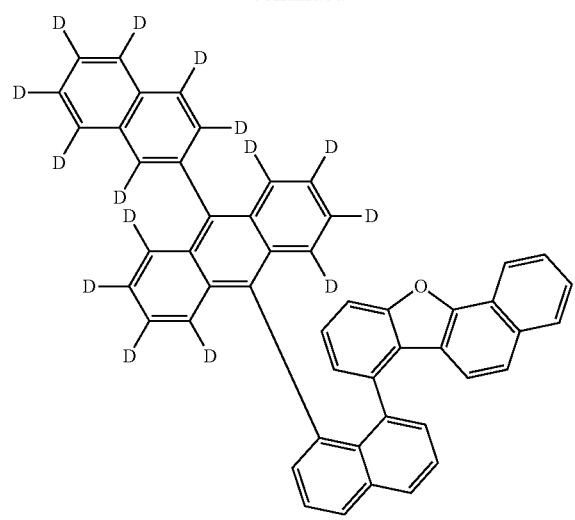
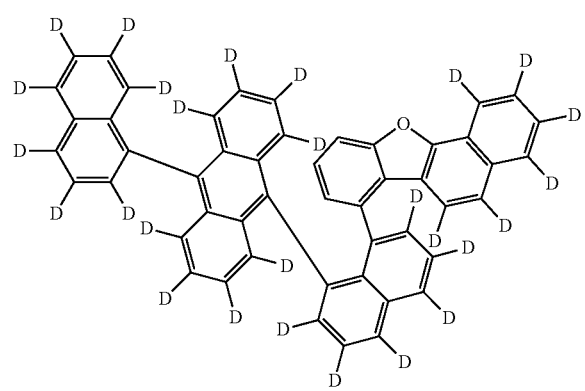
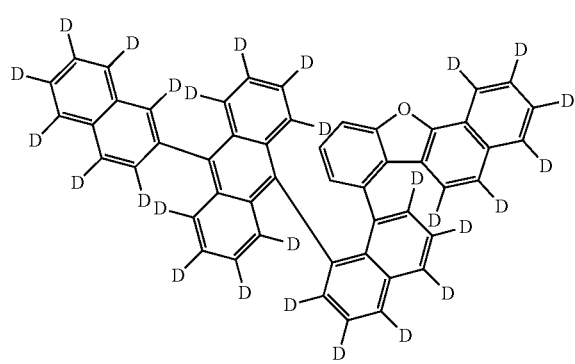
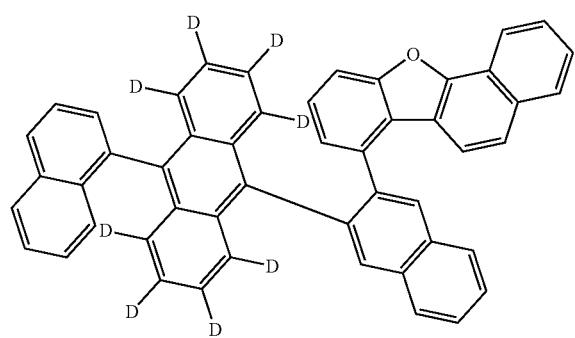
114
-continued
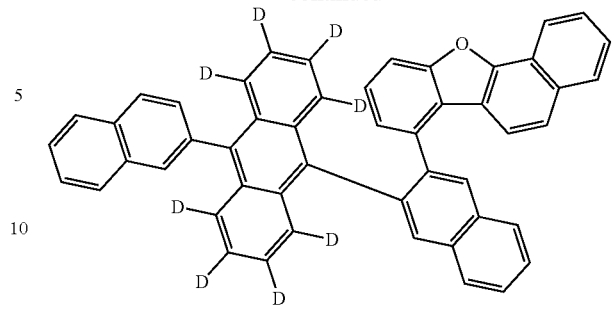
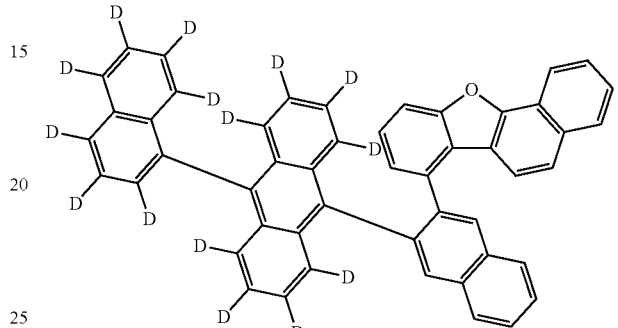
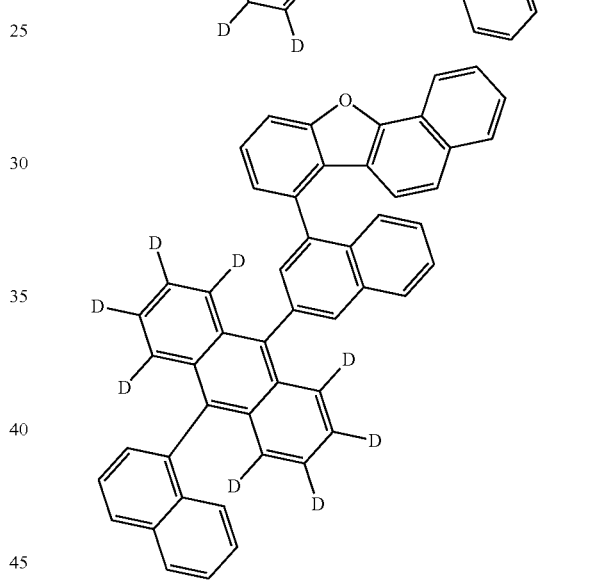
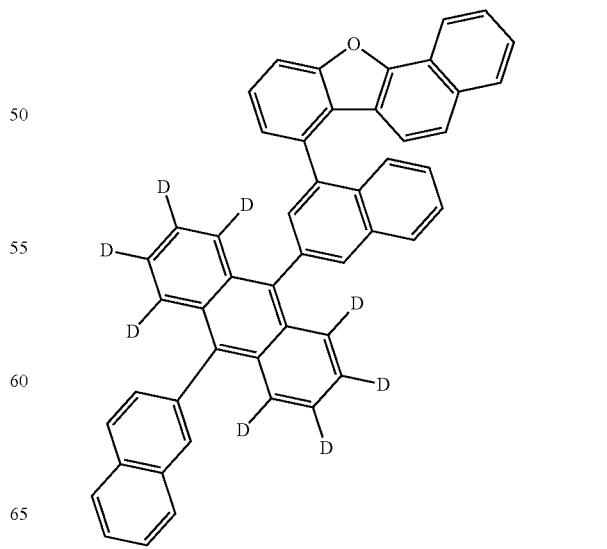

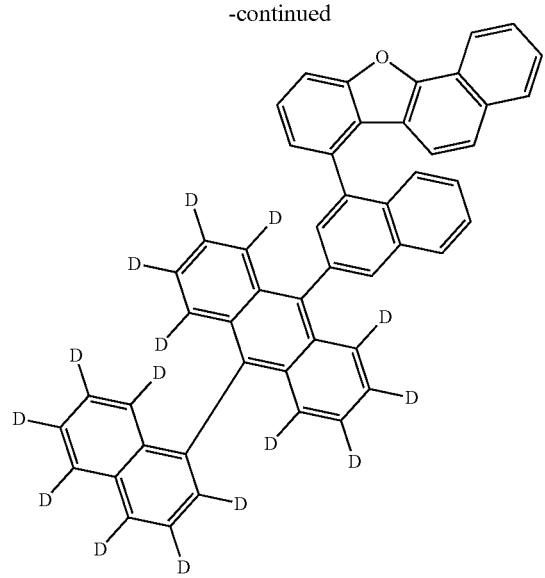
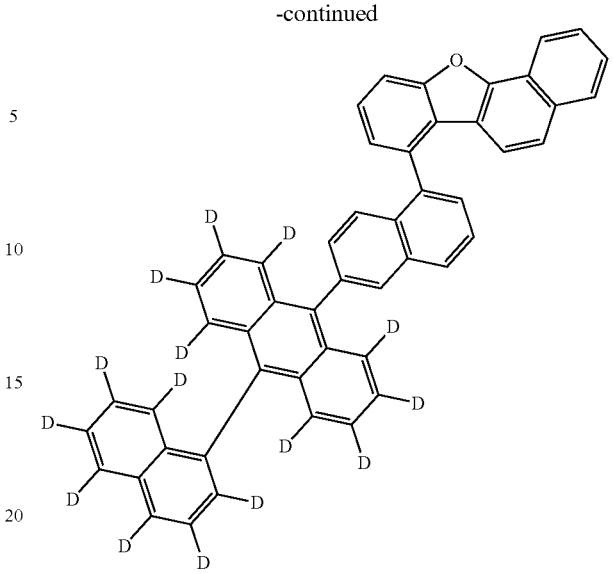
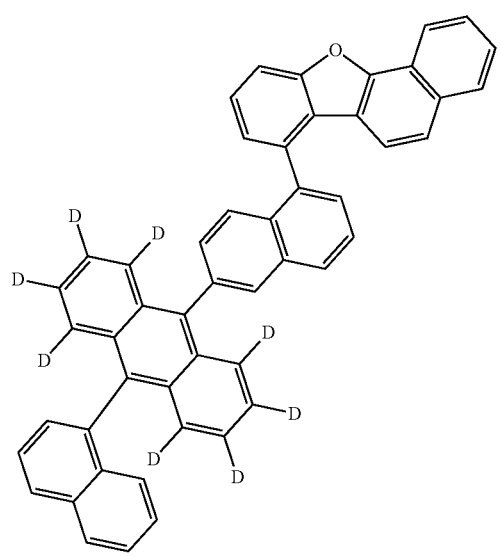
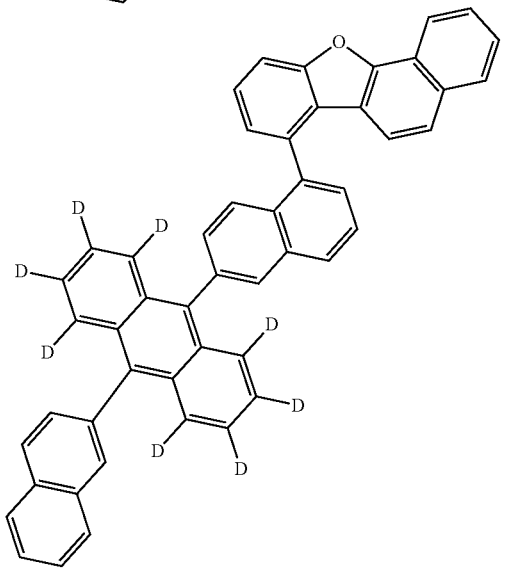
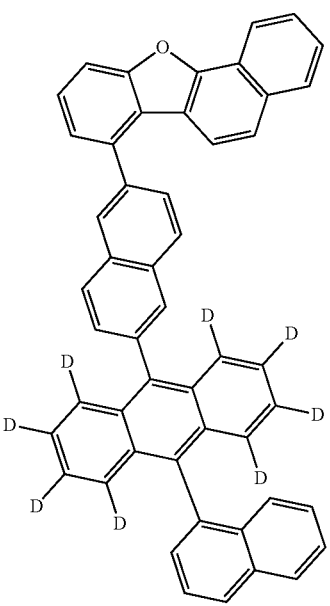

117
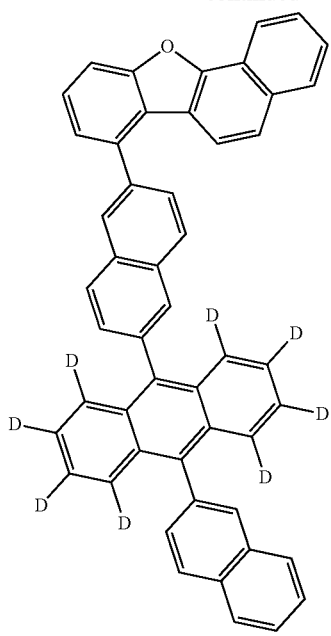
118
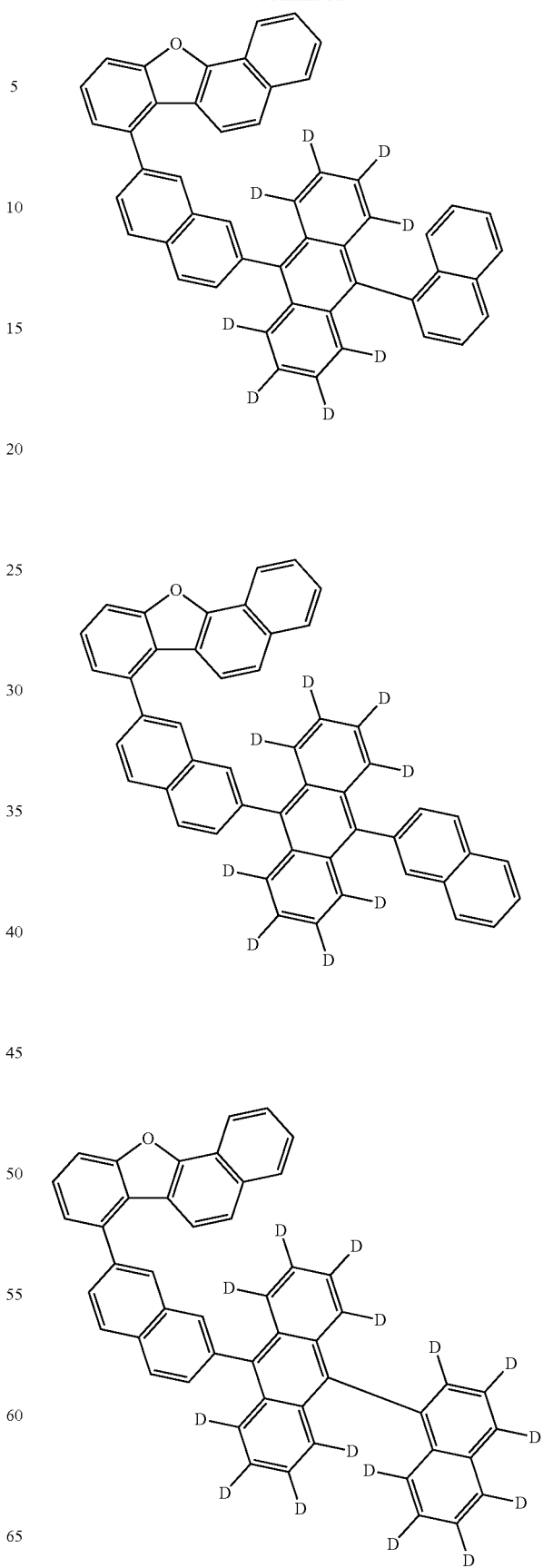

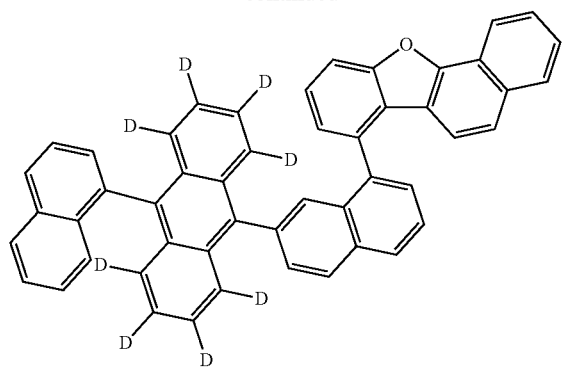
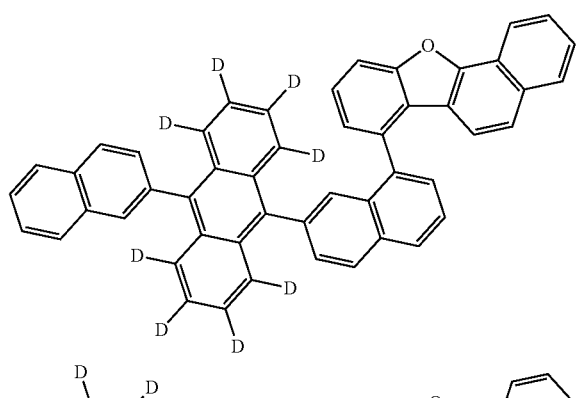
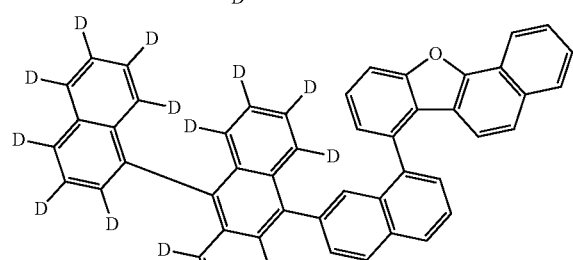
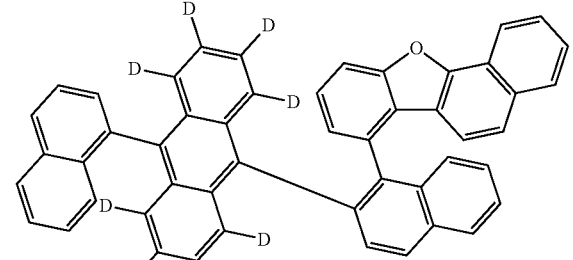
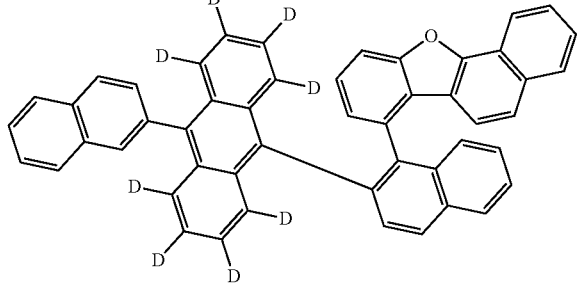
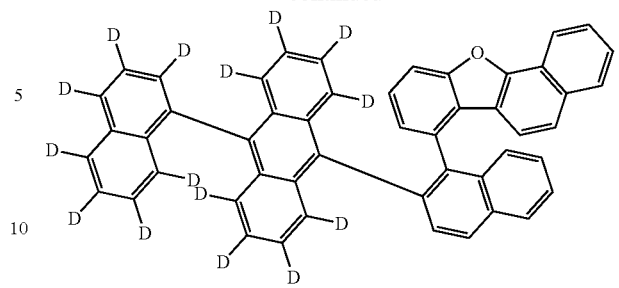
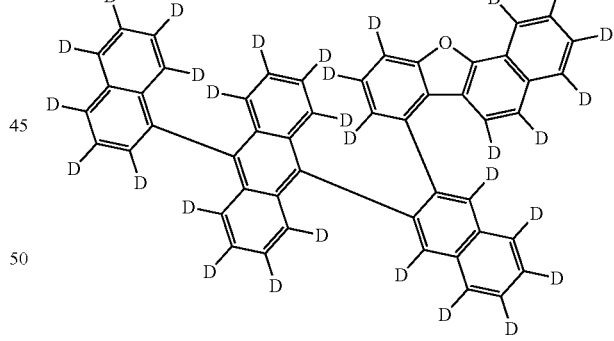
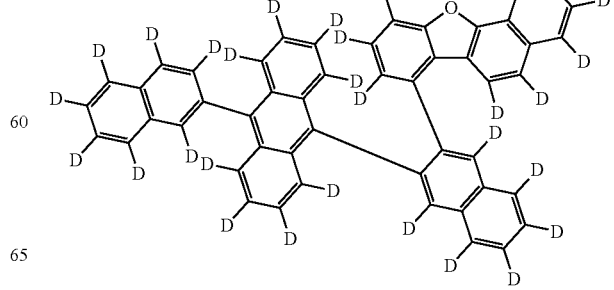

121
-continued
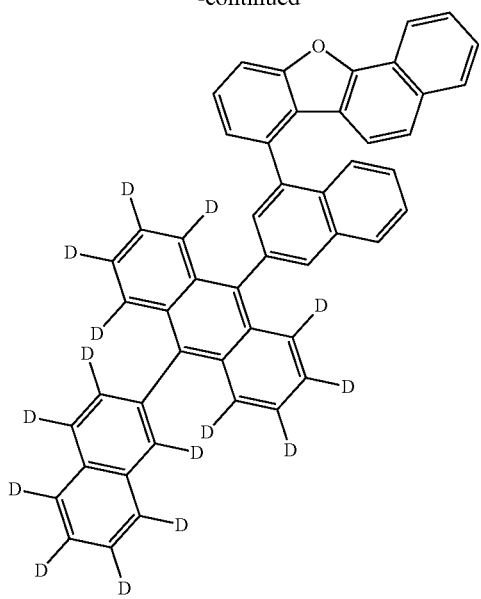
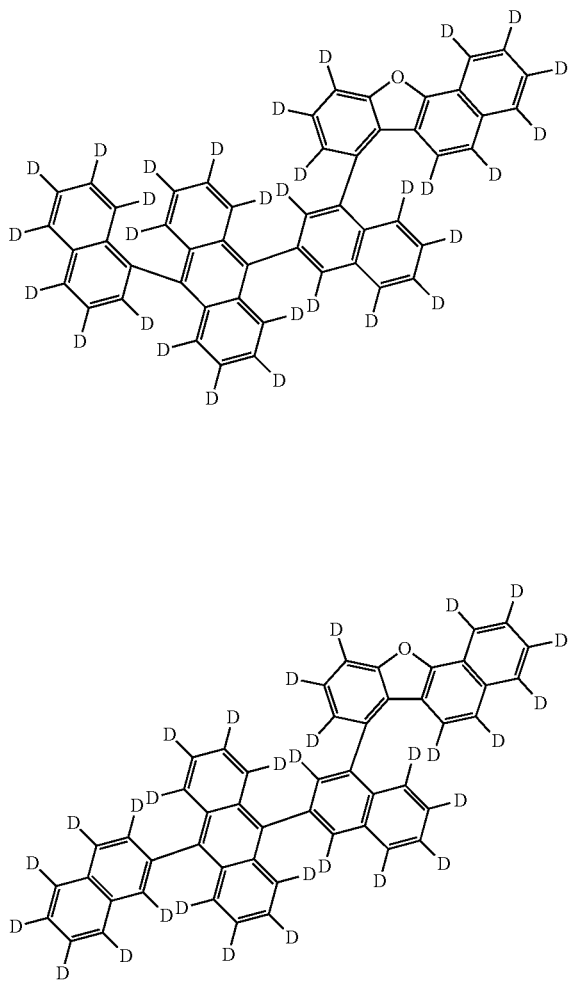
122
-continued
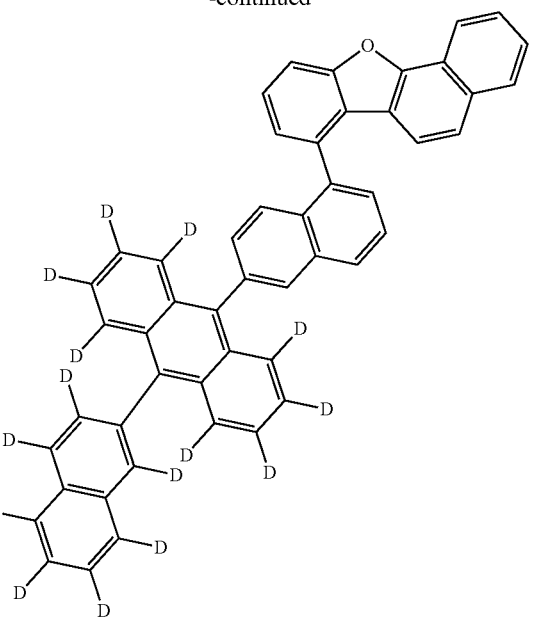

123
-continued
124
-continued
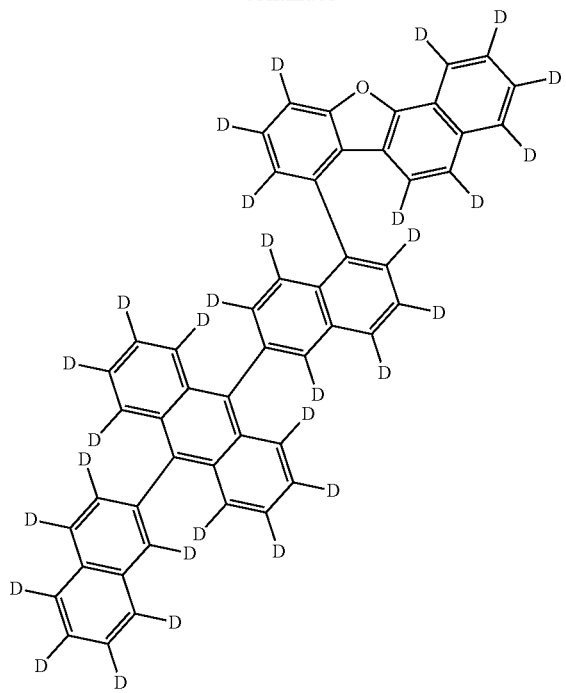
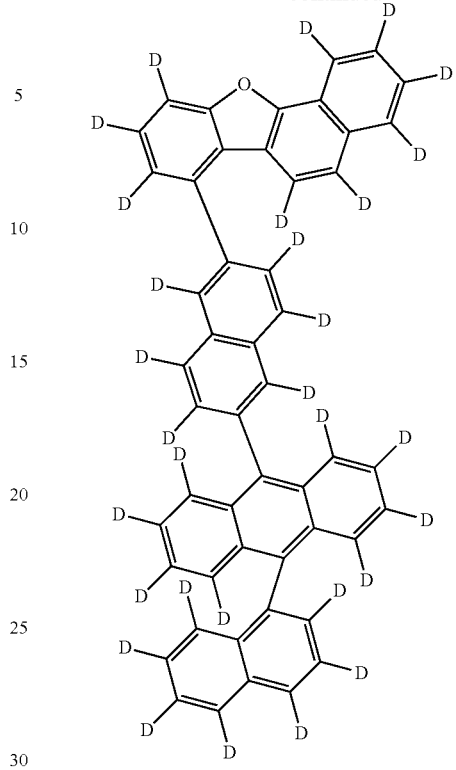
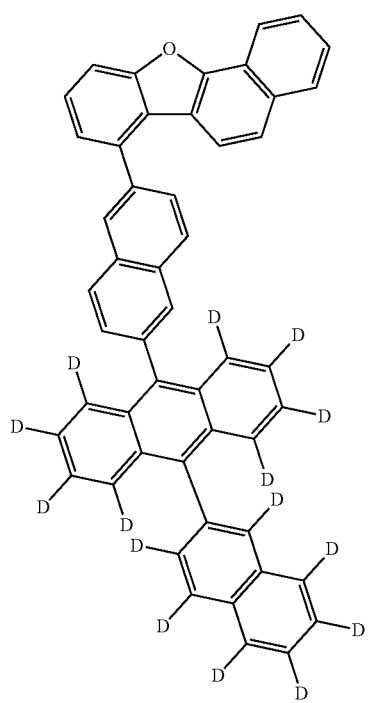

125
126
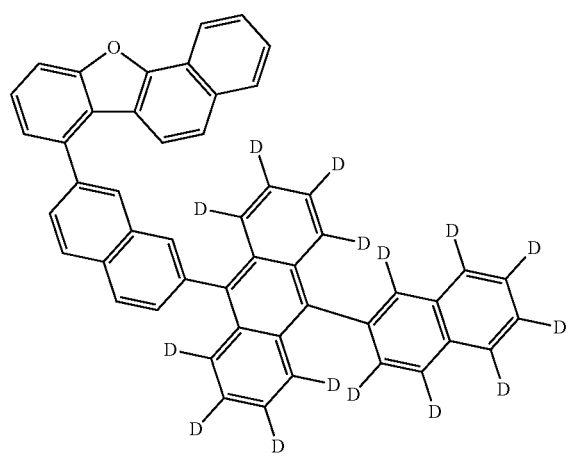
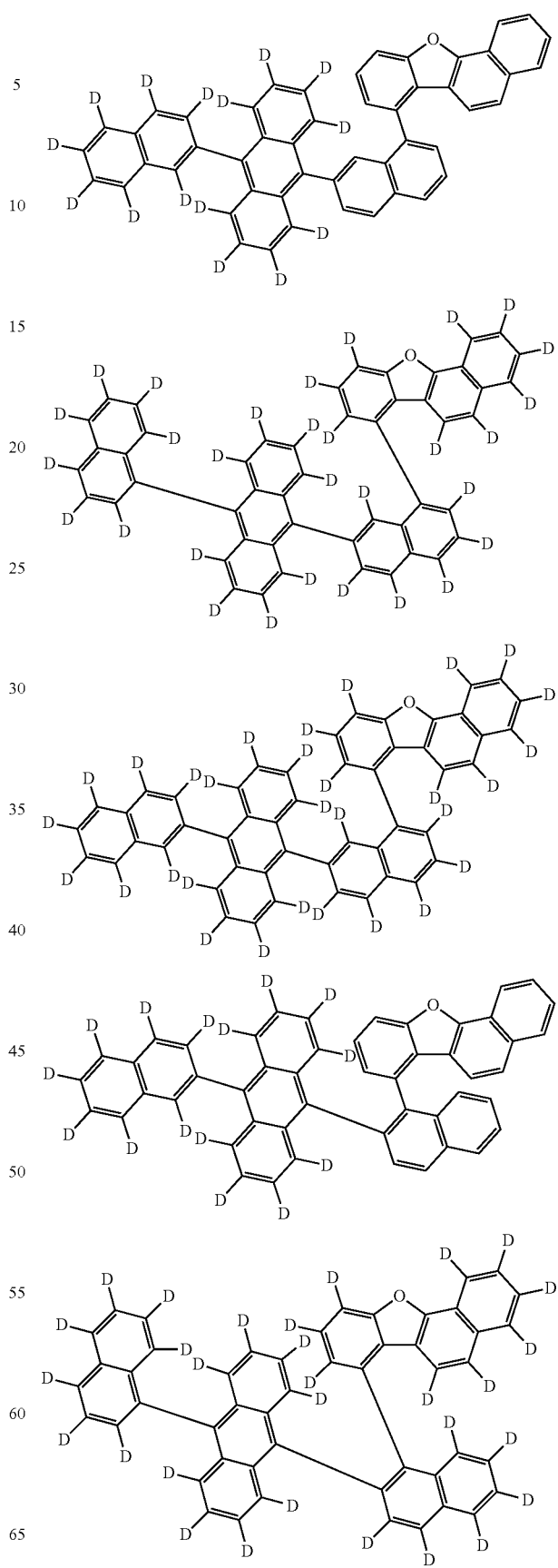

127
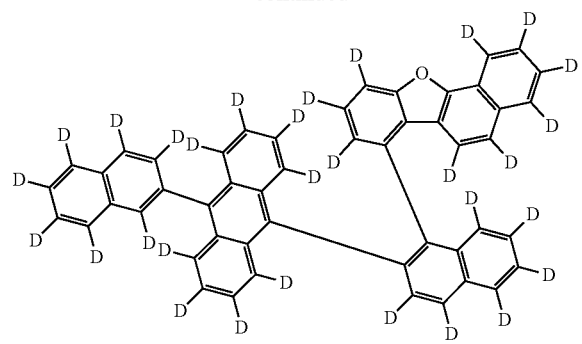
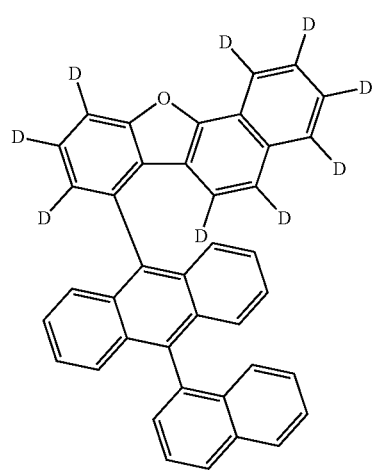
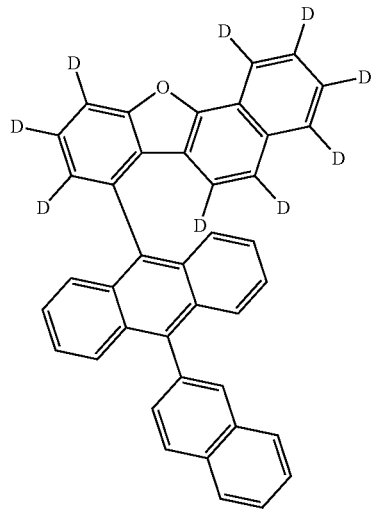
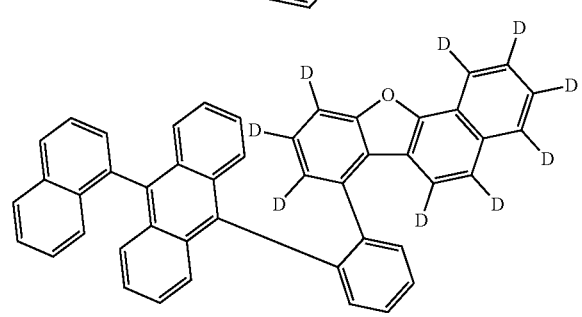
128
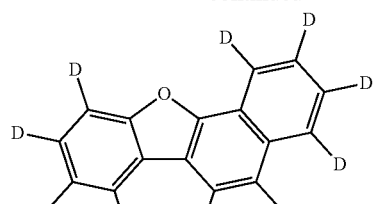
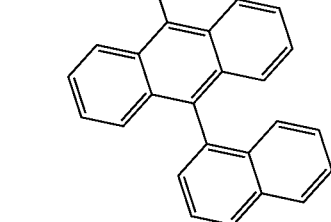
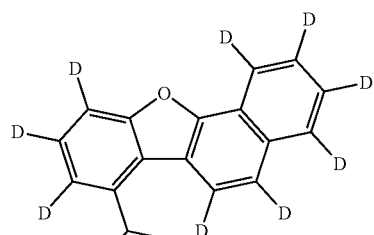
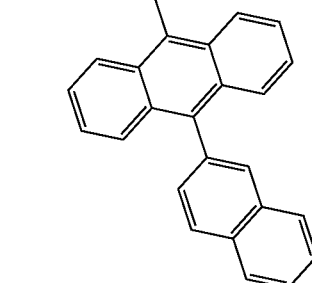
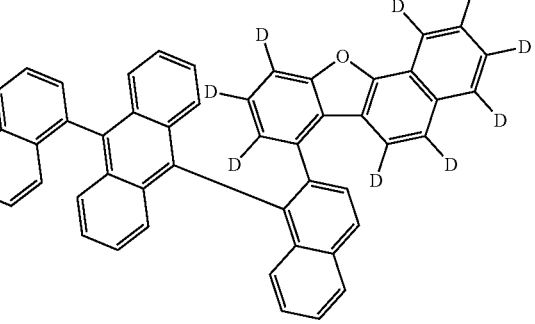

-continued
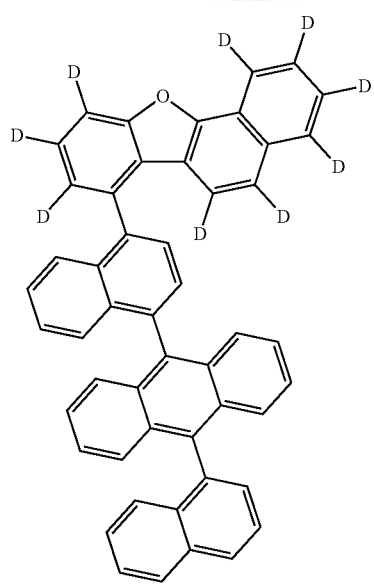
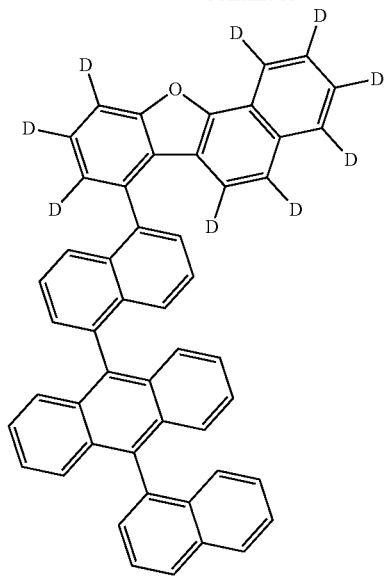
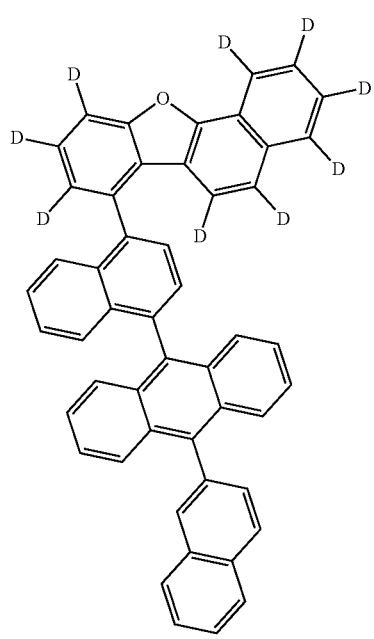
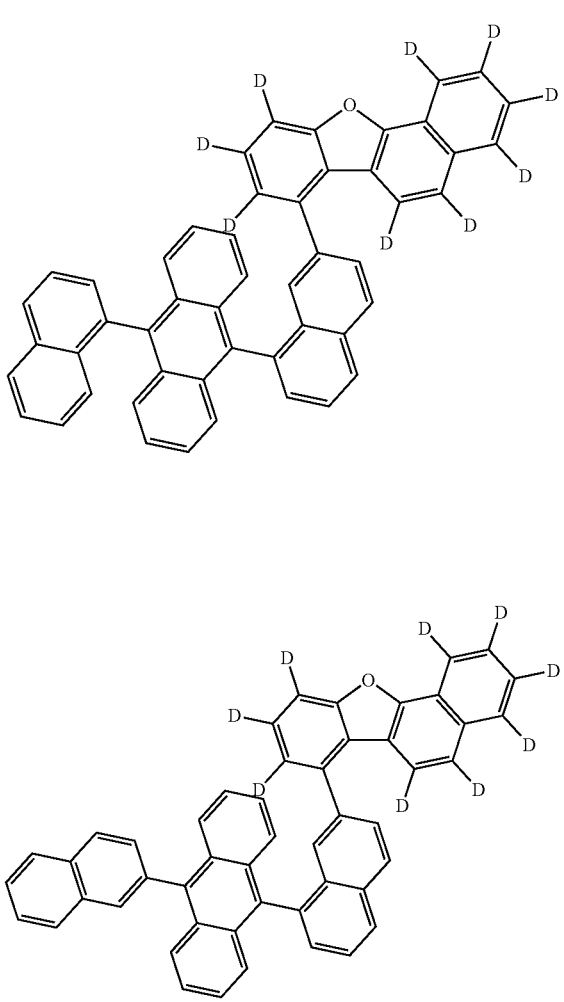

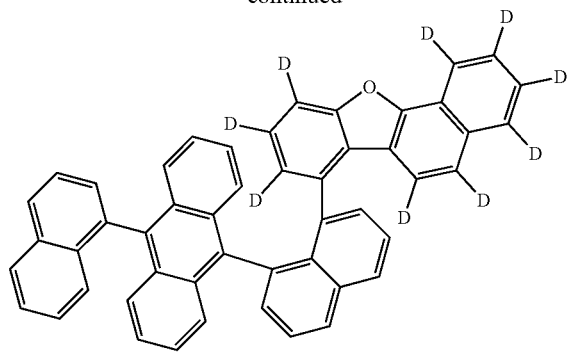
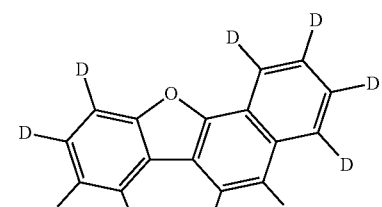
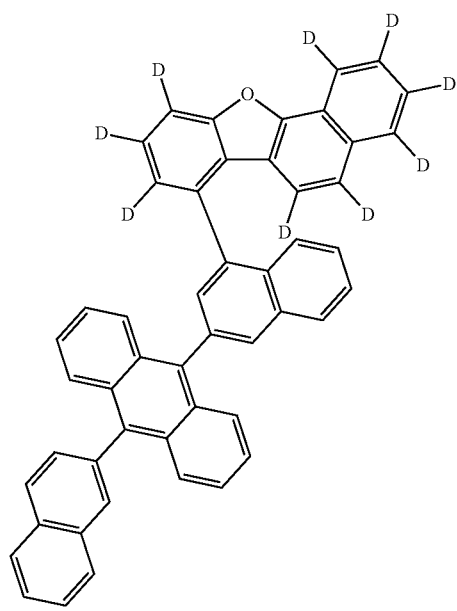
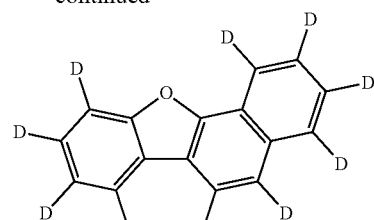
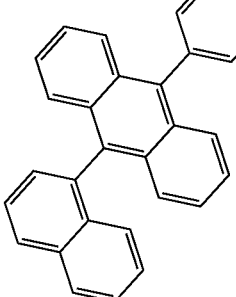
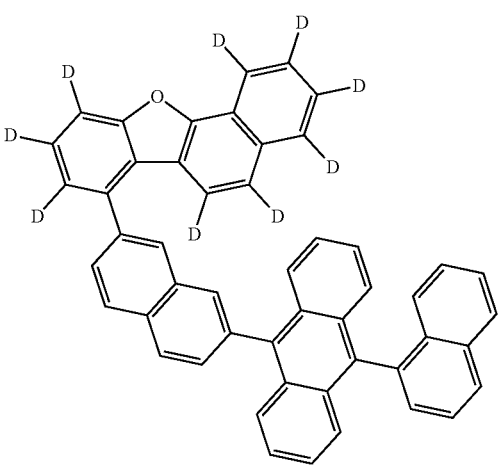
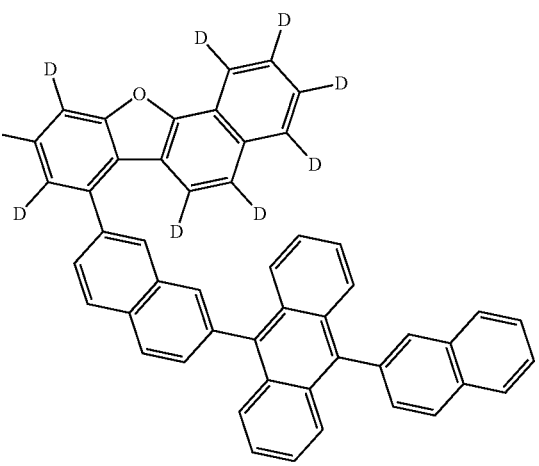

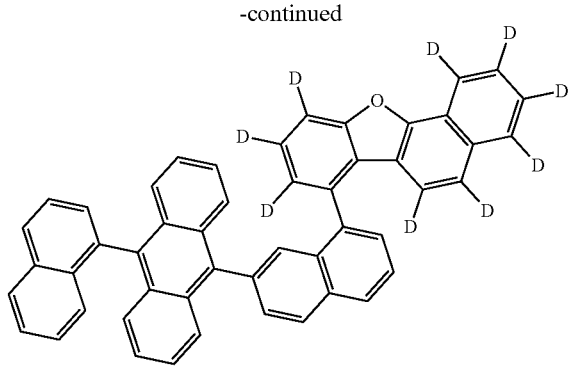
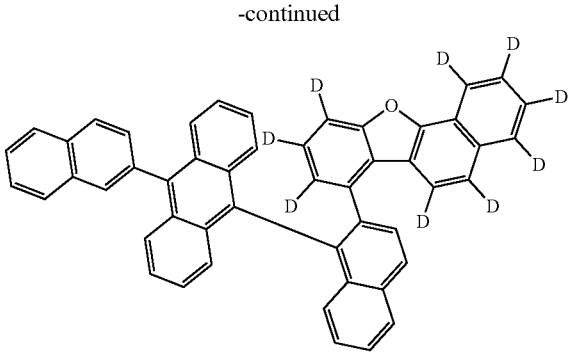
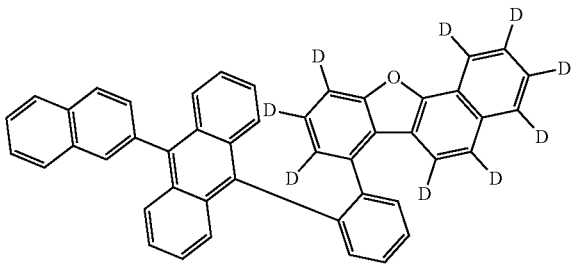
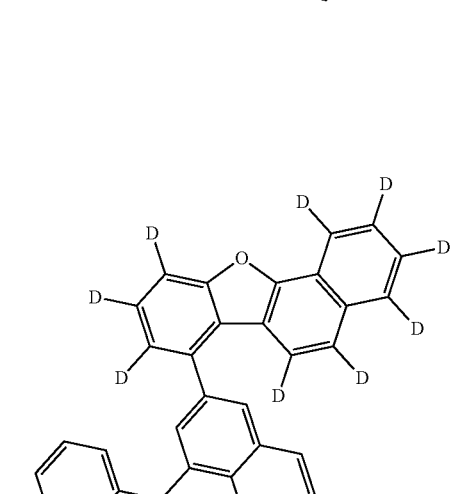
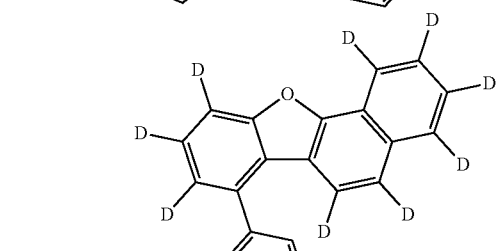
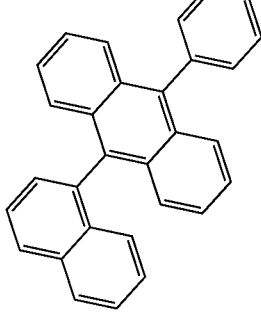
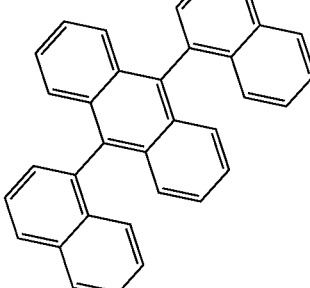
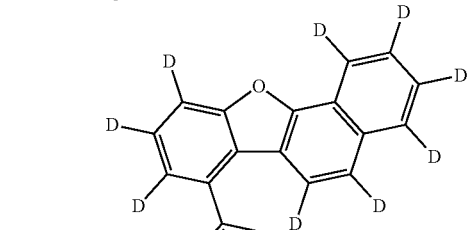
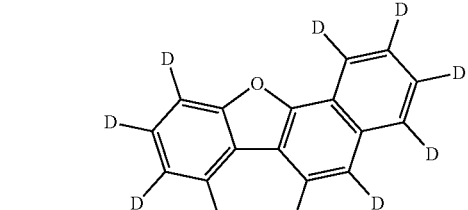
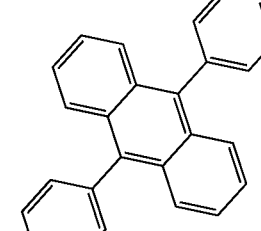
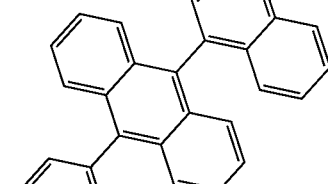
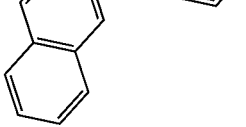

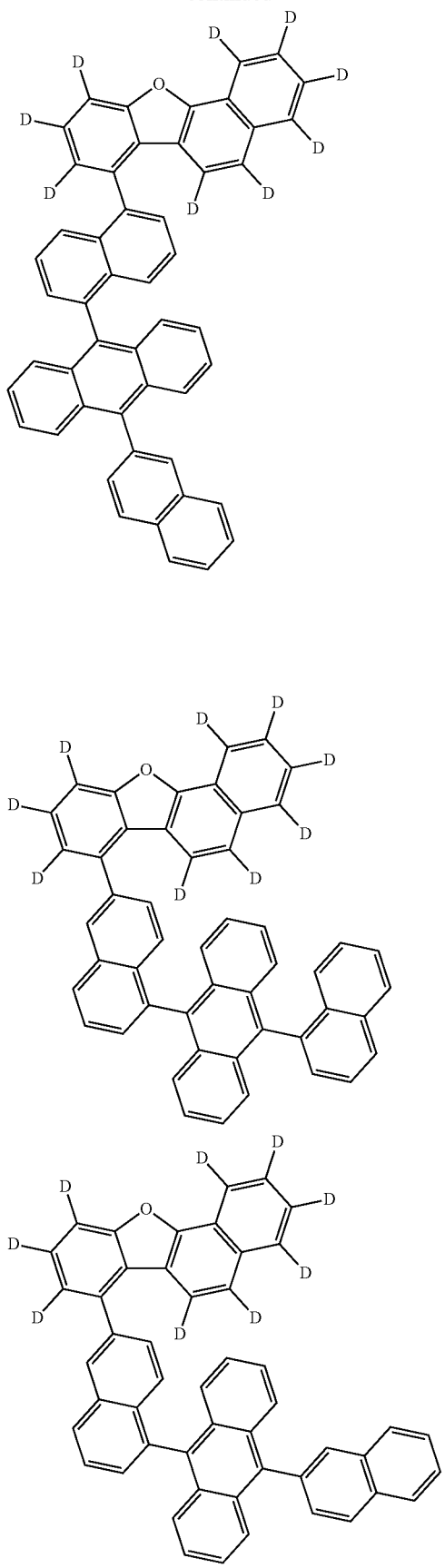
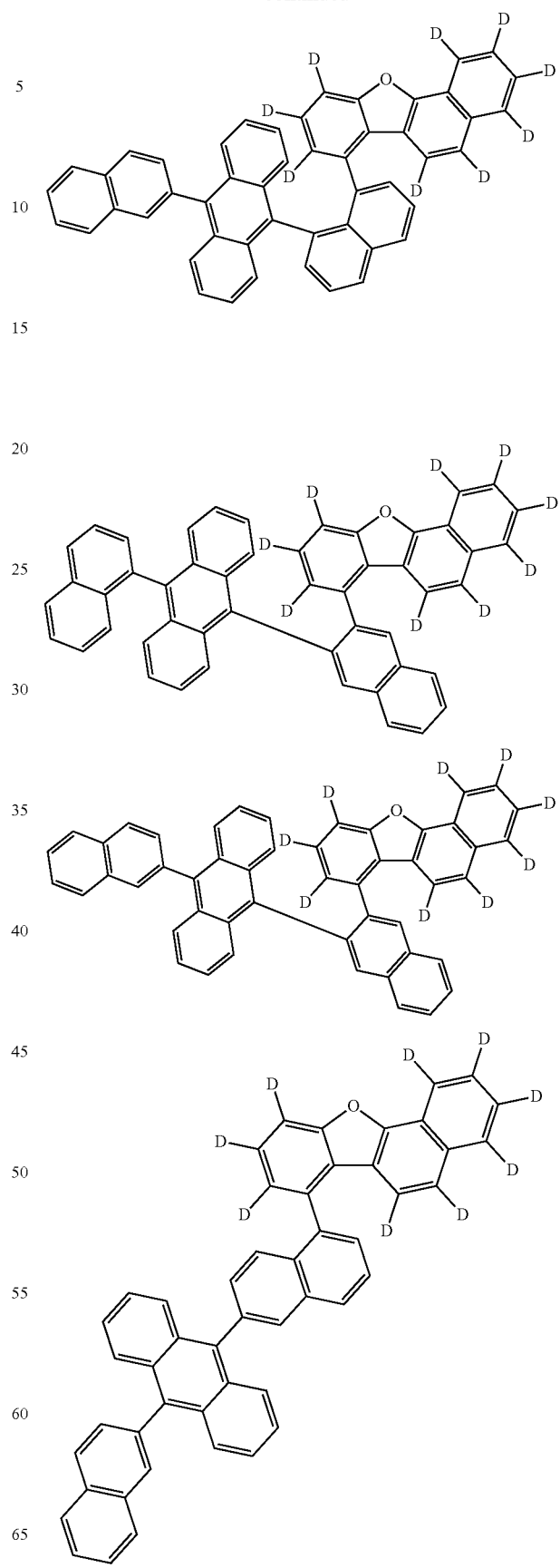

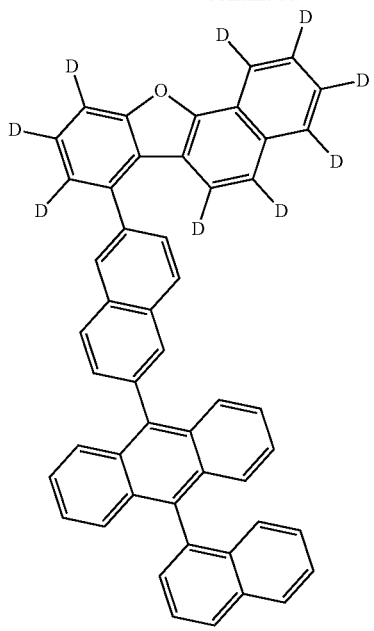
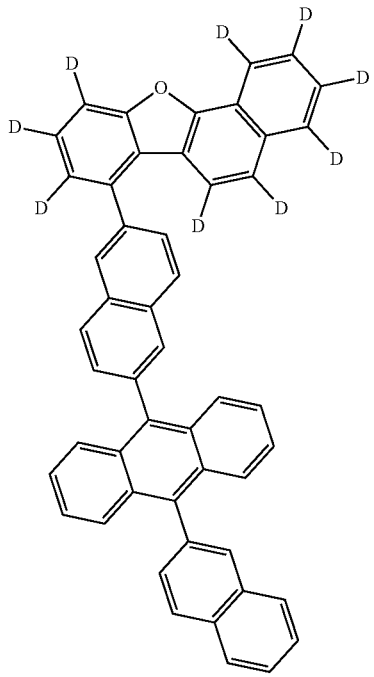
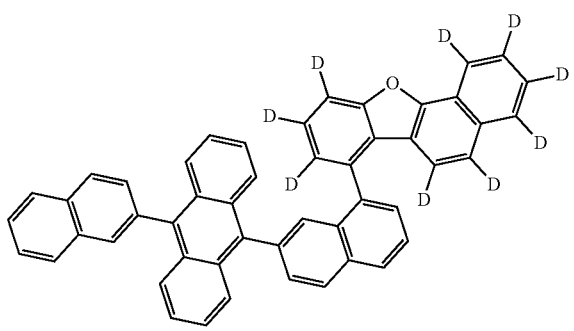
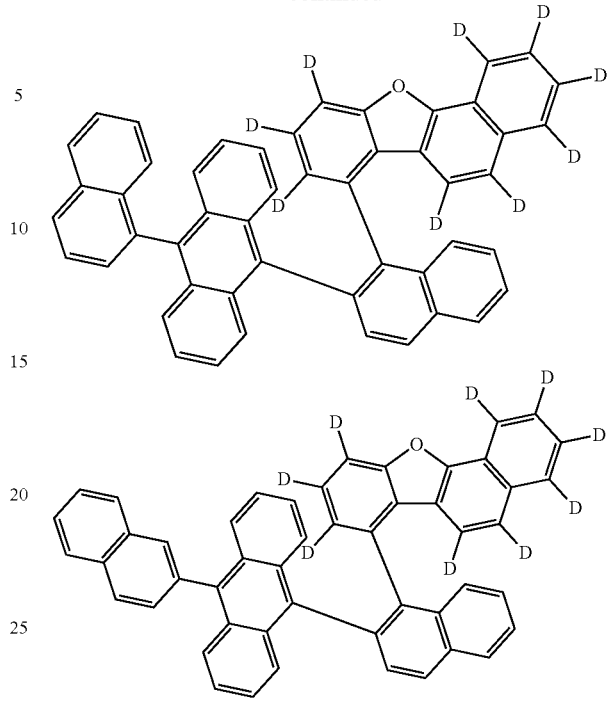

One embodiment of the present specification provides an organic light emitting device including the compound described above.

In the present specification, a description of a certain member being placed "on" another member includes not only a case of the one member being in contact with the another member but a case of still another member being present between the two members.

In the present specification, a description of a certain part "including" certain constituents means capable of further including other constituents, and does not exclude other constituents unless particularly stated on the contrary.

In the present specification, the "layer" has a meaning compatible with a 'film' mainly used in the art, and means coating covering a target area. The size of the "layer" is not limited, and each "layer" may have the same or a different size. According to one embodiment, the size of the "layer" may be the same as the whole device, may correspond to the size of a specific functional area, or may be as small as a single sub-pixel.

In the present specification, a meaning of a specific A material being included in a B layer includes both i) one or more types of A materials being included in one B layer, and ii) a B layer being formed in one or more layers, and an A material being included in one or more of the B layers that is a multilayer.

In the present specification, a meaning of a specific A material being included in a C layer or a D layer includes both i) being included in one or more layers of one or more C layers, ii) being included in one or more layers of one or more D layers, or iii) being included in each of one or more C layers and one or more D layers.

One embodiment of the present specification provides an organic light emitting device including a first electrode; a second electrode provided to face the first electrode; and an organic material layer including one or more layers provided between the first electrode and the second electrode, wherein one or more layers of the organic material layer include the compound of Chemical Formula 1.

The organic material layer of the organic light emitting device of the present specification may be formed in a single layer structure, but may also be formed in a multilayer structure in which two or more organic material layers are laminated. For example, the organic light emitting device of the present specification may have a structure including a hole injection layer, a hole transfer layer, a light emitting layer, an electron transfer layer, an electron injection layer, an electron blocking layer, a hole blocking layer and the like. However, the structure of the organic light emitting device is not limited thereto, and may include a smaller number of organic layers.

According to one embodiment of the present specification, the organic material layer includes a hole injection layer, a hole transfer layer or an electron blocking layer, and the hole injection layer, the hole transfer layer or the electron blocking layer includes the compound.

According to one embodiment of the present specification, the organic material layer includes a light emitting layer, and the light emitting layer includes the compound.

According to one embodiment of the present specification, the organic material layer includes a light emitting layer, and the light emitting layer includes the compound as a host of the light emitting layer.

According to one embodiment of the present specification, the light emitting layer includes a dopant, and the dopant includes one or more selected from the group consisting of a fluorescent dopant, a phosphorescent dopant and a thermal delayed fluorescence-based dopant.

According to one embodiment of the present specification, the fluorescent dopant includes one or more selected from the group consisting of an arylamine-based compound and a boron-based compound.

According to one embodiment of the present specification, the fluorescent dopant is an arylamine-based compound.

According to one embodiment of the present specification, the fluorescent dopant is a boron-based compound.

According to one embodiment of the present specification, the organic material layer includes a light emitting layer, the light emitting layer includes a host and a dopant, the host includes the compound, and the dopant includes one or more selected from the group consisting of the fluorescent dopant, the phosphorescent dopant and the thermal delayed fluorescence-based dopant.

According to one embodiment of the present specification, the arylamine-based compound is a compound of the following Chemical Formula D-1.

[Chemical Formula D-1]

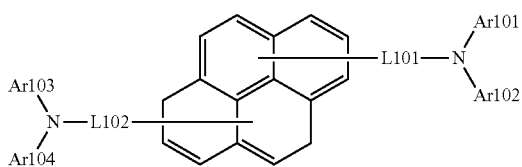

wherein in Chemical Formula D-1,
L101 and L102 are the same as or different from each other, and each independently a direct bond; or a substituted or unsubstituted arylene group, and Ar101 to Ar104 are the same as or different from each other, and each independently a substituted or unsubstituted aryl group; or a substituted or unsubstituted heteroaryl group.

According to one embodiment of the present specification, L101 and L102 are a direct bond.

According to one embodiment of the present specification, Ar101 to Ar104 are the same as or different from each other, and each independently a substituted or unsubstituted monocyclic or polycyclic aryl group having 6 to 30 carbon atoms; or a substituted or unsubstituted monocyclic or polycyclic heteroaryl group having 2 to 30 carbon atoms.

According to one embodiment of the present specification, Ar101 to Ar104 are the same as or different from each other, and each independently a monocyclic or polycyclic aryl group having 6 to 30 carbon atoms unsubstituted or substituted with a linear or branched alkyl group having 1 to 30 carbon atoms; or a monocyclic or polycyclic heteroaryl group having 2 to 30 carbon atoms.

According to one embodiment of the present specification, Ar101 to Ar104 are the same as or different from each other, and each independently a phenyl group substituted with a methyl group; or a dibenzofuran group.

According to one embodiment of the present specification, the compound of Chemical Formula D-1 is the following compound.

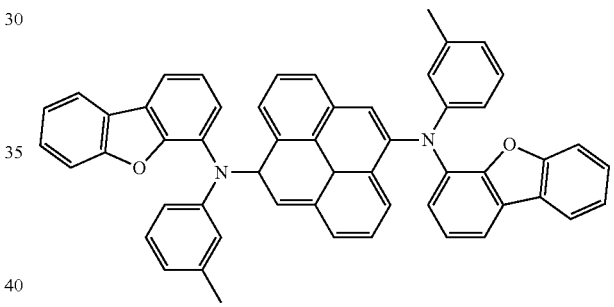

According to one embodiment of the present specification, the boron-based compound is a compound of the following Chemical Formula D-2.

[Chemical Formula D-2]

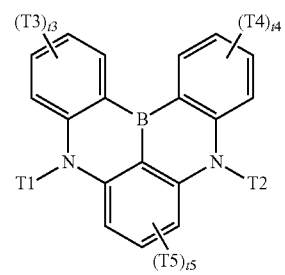

wherein in Chemical Formula D-2,
T1 to T5 are the same as or different from each other, and each independently hydrogen; a substituted or unsubstituted alkyl group; a substituted or unsubstituted amine group; or a substituted or unsubstituted aryl group,
t3 and t4 are each an integer of 1 to 4,
t5 is an integer of 1 to 3, when t3 is 2 or greater, the two or more T3s are the same as or different from each other, when t4 is 2 or greater, the two or more T4s are the same as or different from each other, and when t5 is 2 or greater, the two or more T5s are the same as or different from each other.

According to one embodiment of the present specification, T1 to T5 are the same as or different from each other, and each independently hydrogen; a substituted or unsubstituted linear or branched alkyl group having 1 to 30 carbon atoms; a substituted or unsubstituted monocyclic or polycyclic arylamine group having 6 to 30 carbon atoms; or a substituted or unsubstituted monocyclic or polycyclic aryl group having 6 to 30 carbon atoms.

According to one embodiment of the present specification, T1 to T5 are the same as or different from each other, and each independently hydrogen; a linear or branched alkyl group having 1 to 30 carbon atoms; a monocyclic or polycyclic arylamine group having 6 to 30 carbon atoms; or a monocyclic or polycyclic aryl group having 6 to 30 carbon atoms unsubstituted or substituted with a linear or branched alkyl group having 1 to 30 carbon atoms.

According to one embodiment of the present specification, T1 to T5 are the same as or different from each other, and each independently hydrogen; a tert-butyl group; a diphenylamine group; or a phenyl group unsubstituted or substituted with a tert-butyl group.

According to one embodiment of the present specification, the compound of Chemical Formula D-2 is the following compound.

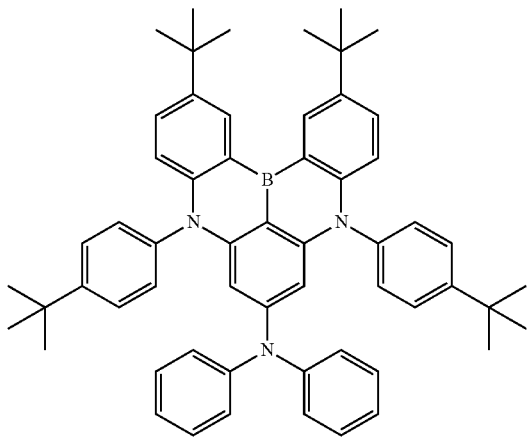 [SMILES: CC(C)(C)c1ccc(N2c3ccc(C(C)(C)C)cc3B3c4cc(C(C)(C)C)ccc4N(c4ccc(C(C)(C)C)cc4)c4cc(N(c5ccccc5)c5ccccc5)cc2c43)cc1]

According to one embodiment of the present specification, those known in the art may be used as the phosphorescent dopant and the thermal delayed fluorescence-based dopant, however, the phosphorescent dopant and the thermal delayed fluorescence-based dopant are not limited thereto.

According to one embodiment of the present specification, the light emitting layer includes the host and the dopant in a weight ratio of 99:1 to 1:99. Specifically, the light emitting layer includes the host and the dopant in a weight ratio of 99:1 to 50:50, and more specifically in a weight ratio of 99:1 to 95:5.

According to one embodiment of the present specification, the organic light emitting device further includes one, two or more layers selected from the group consisting of a hole injection layer, a hole transfer layer, a light emitting layer, an electron transfer layer, an electron injection layer, a hole blocking layer and an electron blocking layer.

According to one embodiment of the present specification, the organic light emitting device includes a first electrode; a second electrode provided to face the first electrode; a light emitting layer provided between the first electrode and the second electrode; and two or more organic material layers provided either between the light emitting layer and the first electrode or between the light emitting layer and the second electrode.

According to one embodiment of the present specification, as the two or more organic material layers provided either between the light emitting layer and the first electrode or between the light emitting layer and the second electrode, two or more may be selected from the group consisting of a light emitting layer, a hole transfer layer, a hole injection layer, a hole injection and transfer layer, an electron blocking layer, a hole blocking layer, an electron injection layer, an electron transfer layer, and an electron injection and transfer layer.

According to one embodiment of the present specification, two or more hole injection layers are included between the light emitting layer and the first electrode. The two or more hole injection layers may include materials the same as or different from each other.

According to one embodiment of the present specification, two or more hole transfer layers are included between the light emitting layer and the first electrode. The two or more hole transfer layers may include materials the same as or different from each other.

According to one embodiment of the present specification, two or more electron transfer layers are included between the light emitting layer and the second electrode. The two or more electron transfer layers may include materials the same as or different from each other.

According to one embodiment of the present specification, the first electrode is an anode or a cathode.

According to one embodiment of the present specification, the second electrode is a cathode or an anode.

According to one embodiment of the present specification, the organic light emitting device may be an organic light emitting device having a structure in which an anode, an organic material layer including one or more layers, and a cathode are consecutively laminated on a substrate (normal type).

According to one embodiment of the present specification, the organic light emitting device may be an organic light emitting device having a structure in a reverse direction in which a cathode, an organic material layer including one or more layers, and an anode are consecutively laminated on a substrate (inverted type).

Figures 1, 2:
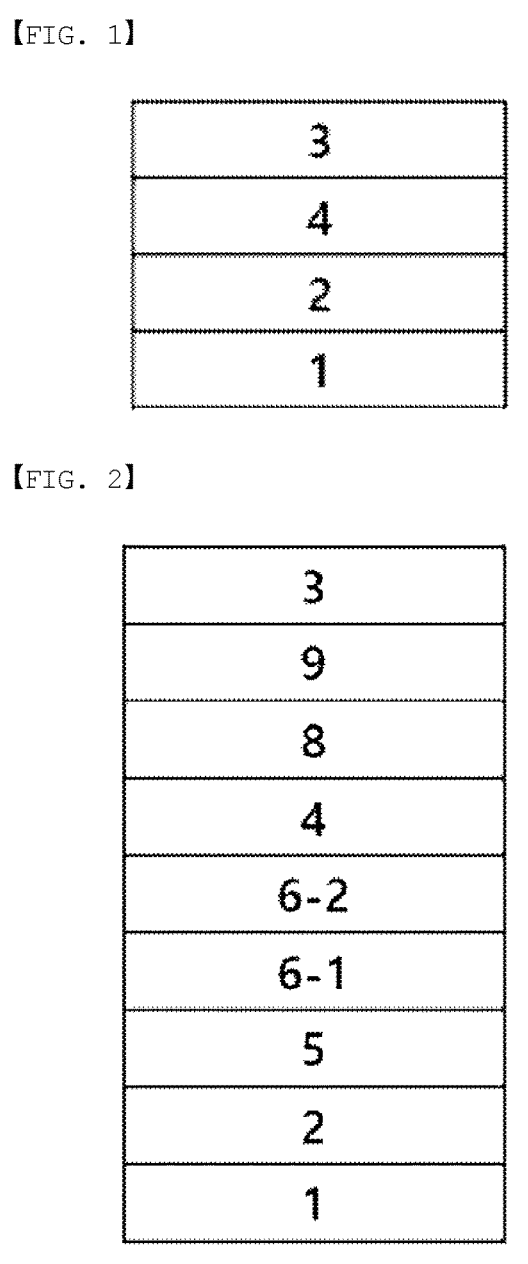
Figure 3:
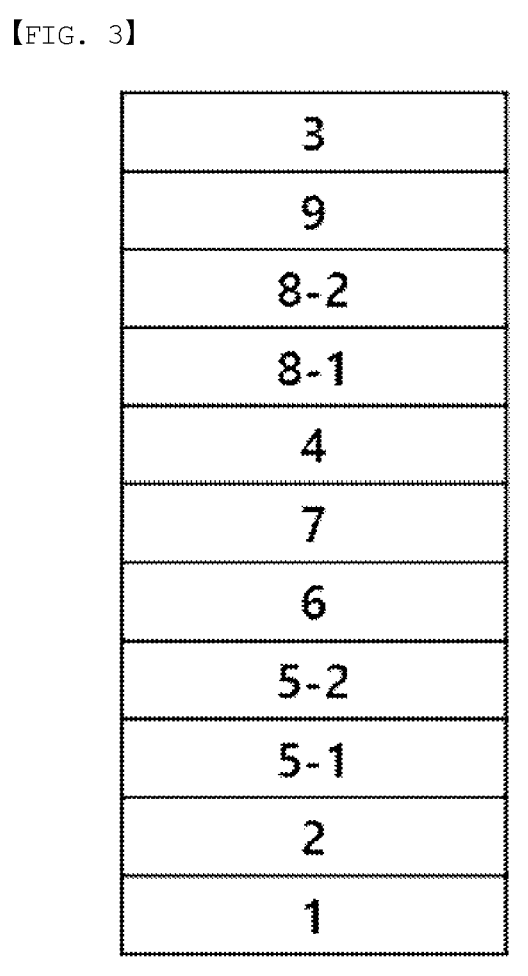

For example, structures of the organic light emitting device according to one embodiment of the present specification are illustrated in FIG. 1 to FIG. 3. FIG. 1 to FIG. 3 only illustrate the organic light emitting device, and the organic light emitting device is not limited thereto.

FIG. 1 illustrates a structure of the organic light emitting device in which a first electrode (2), a light emitting layer (4) and a second electrode (3) are consecutively laminated on a substrate (1). The compound of Chemical Formula 1 is included in the light emitting layer.

FIG. 2 illustrates a structure of the organic light emitting device in which a first electrode (2), a hole injection layer (5), a first hole transfer layer (6-1), a second hole transfer layer (6-2), a light emitting layer (4), an electron transfer layer (8), an electron injection layer (9) and a second electrode (3) are consecutively laminated on a substrate (1). The compound of Chemical Formula 1 is included in the light emitting layer.

FIG. 3 illustrates a structure of the organic light emitting device in which a first electrode (2), a first hole injection layer (5-1), a second hole injection layer (5-2), a hole transfer layer (6), an electron blocking layer (7), a light emitting layer (4), a first electron transfer layer (8-1), a second electron transfer layer (8-2), an electron injection layer (9) and a second electrode (3) are consecutively laminated on a substrate (1). The compound of Chemical Formula 1 is included in the light emitting layer.

The organic light emitting device of the present specification may be manufactured using materials and methods known in the art, except that the light emitting layer includes the compound, that is, the compound of Chemical Formula 1.

When the organic light emitting device includes a plurality of organic material layers, the organic material layers may be formed with the same materials or different materials.

For example, the organic light emitting device of the present specification may be manufactured by consecutively laminating a first electrode, an organic material layer and a second electrode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer and an electron transfer layer thereon, and then depositing a material usable as a cathode thereon. In addition to such a method, the organic light emitting device may also be manufactured by consecutively depositing a second electrode material, an organic material layer and a first electrode material on a substrate.

In addition, the compound of Chemical Formula 1 may be formed into an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

In addition to such a method, the organic light emitting device may also be manufactured by consecutively laminating a second electrode material, an organic material layer and a first electrode material on a substrate. However, the manufacturing method is not limited thereto.

As the first electrode material, materials having large work function are normally preferred so that hole injection to an organic material layer is smooth. Examples thereof include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the second electrode material, materials having small work function are normally preferred so that electron injection to an organic material layer is smooth. Examples thereof include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The light emitting layer may include a host material and a dopant material. When an additional light emitting layer is included in addition to the light emitting layer including the compound of Chemical Formula 1 according to one embodiment of the present specification, the host material includes fused and/or non-fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamine group and includes arylamine group-including pyrene, anthracene, chrysene, peryflanthene and the like. In addition, the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamine group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The hole injection layer is a layer receiving holes from an electrode. The hole injection material preferably has, by having an ability to transfer holes, a hole receiving effect from an anode and an excellent hole injection effect for a light emitting layer or a light emitting material. In addition, the hole injection material is preferably a material having an excellent ability to prevent excitons generated in the light emitting layer from moving to an electron injection layer or an electron injection material. In addition, a material having an excellent thin film foaming ability is preferred. In addition, the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials; hexanitrile hexaazatriphenylene-based organic materials; quinacridone-based organic materials; perylene-based organic materials; polythiophene-based conductive polymers such as anthraquinone or polyaniline, and the like, but are not limited thereto.

The hole transfer layer is a layer receiving holes from a hole injection layer and transferring the holes to a light emitting layer. As the hole transfer material, materials having, as a material capable of receiving holes from an anode or a hole injection layer and moving the holes to a light emitting layer, high mobility for the holes are preferred. Specific examples thereof include arylamine-based organic materials, conductive polymers, block copolymers having conjugated parts and non-conjugated parts together, and the like, but are not limited thereto.

The electron transfer layer is a layer receiving electrons from an electron injection layer and transferring the electrons to a light emitting layer. As the electron transfer material, materials capable of favorably receiving electrons from a cathode, moving the electrons to a light emitting layer, and having high mobility for the electrons are preferred. Specific examples thereof include Al complexes of 8-hydroxyquinoline; complexes including Alq$_3$; organic radical compounds; hydroxyflavon-metal complexes and the like, but are not limited thereto. The electron transfer layer may be used together with any desired cathode material as used in the art. Particularly, the suitable cathode material is a common material having low work function and having an aluminum layer or a silver layer following. Specifically, cesium, barium, calcium, ytterbium, samarium and the like are included, and in each case, an aluminum layer or a silver layer follows.

The electron injection layer is a layer receiving electrons from an electrode. As the electron injection material, materials having an excellent electron transferring ability, having an electron receiving effect from a second electrode, and having an excellent electron injection effect for a light emitting layer or light emitting material are preferred. In addition, materials preventing excitons generated in the light emitting layer from moving to a hole injection layer, and having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato) (1-naphtholato)aluminum, bis(2-methyl-8-quinolinato) (2-naphtholato)gallium and the like, but is not limited thereto.

The electron blocking layer is a layer capable of enhancing lifetime and efficiency of a device by preventing electrons injected from an electron injection layer from passing through a light emitting layer and entering a hole injection layer. Known material may be used without limit, and the electron blocking layer may be formed between the light emitting layer and the hole injection layer, between the light emitting layer and a hole transfer layer, or between the light emitting layer and a layer carrying out hole injection and hole transfer at the same time.

The hole blocking layer is a layer blocking holes from reaching a cathode, and may be generally formed under the same condition as the electron injection layer. Specific examples thereof may include oxadiazole derivatives, triazole derivatives, phenanthroline derivatives, aluminum complexes and the like, but are not limited thereto.

The organic light emitting device according to the present specification may be a top-emission type, a bottom-emission type or a dual-emission type depending on the materials used.

Hereinafter, the present specification will be described in detail with reference to examples, comparative examples and the like. However, the examples and the comparative examples according to the present specification may be modified to various other forms, and the scope of the present specification is not to be construed as being limited to the examples and the comparative examples described below. Examples and comparative examples of the present specification are provided in order to more fully describe the present specification to those having average knowledge in the art.

SYNTHESIS EXAMPLE

Synthesis Example 1. Synthesis of BH-1

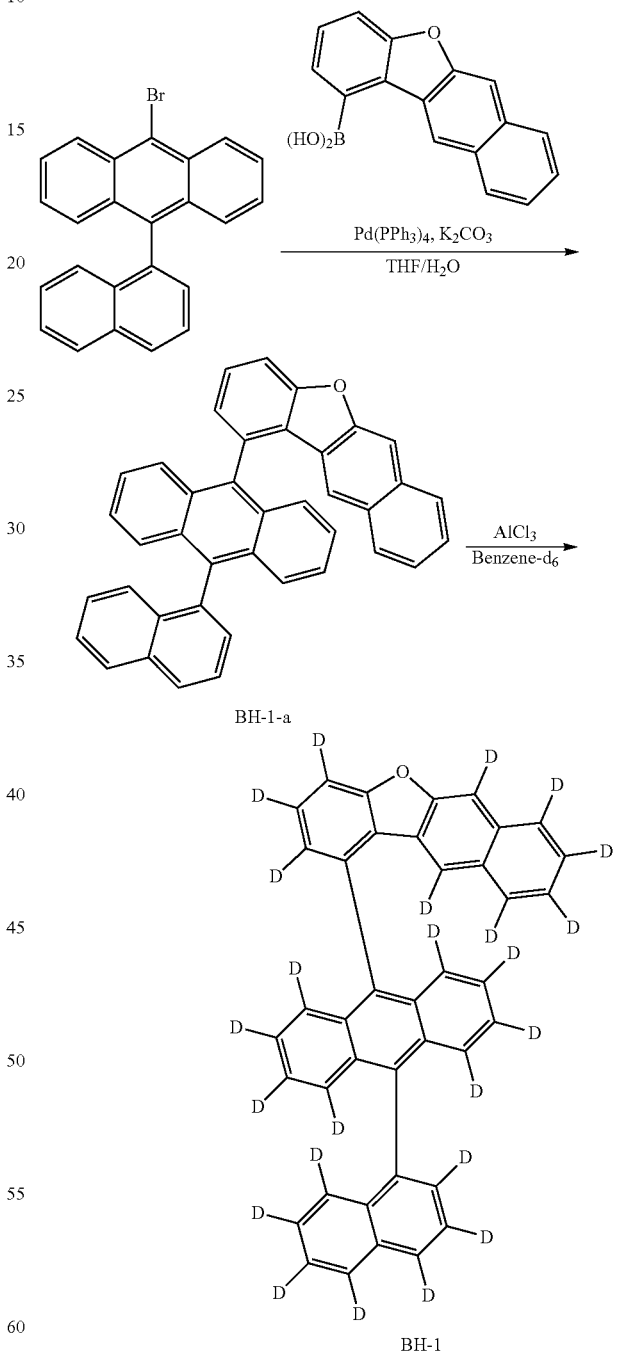

<1-a> Preparation of Compound BH-1-a

After dissolving 9-bromo-10-(naphthalen-1-yl)anthracene (50 g, 130.4 mmol) and naphtho[2,3-b]benzofuran-1- ylboronic acid (37.6 g, 143.44 mmol) in tetrahydrofuran (1000 ml), an aqueous 2 M $K_2CO_3$ solution (200 ml) was introduced thereto. After that, $Pd(PPh_3)_4$ (1.50 g, 1.3 mmol) was introduced thereto, and the result was refluxed for 5 hours. The reaction solution was cooled, and the organic layer was extracted with ethyl acetate and then dried with anhydrous magnesium sulfate. The organic solvent was removed under vacuum, and the result was purified using column chromatography to obtain Compound BH-1-a (54.3 g, yield 80%).

MS: [M+H]+=521

<1-b> Preparation of Compound BH-1

Compound BH-1-a (40 g, 76.8 mmol) and aluminum chloride ($AlCl_3$) (5.0 g, 38.4 mmol) were introduced to $C_6D_6$ (800 ml), and the mixture was stirred for 3 hours. After the reaction was finished, $D_2O$ (100 ml) was introduced thereto, the result was stirred for 30 minutes, and trimethylamine (10 ml) was added dropwise thereto. The reaction solution was transferred to a separatory funnel, and extracted with water and toluene. The result was dried with anhydrous magnesium sulfate, and, after removing the organic solvent under vacuum, purified using column chromatography to obtain Compound BH-1 (30.5 g, yield 73%).

MS: [M+H]+=545

Synthesis Example 2. Synthesis of BH-2

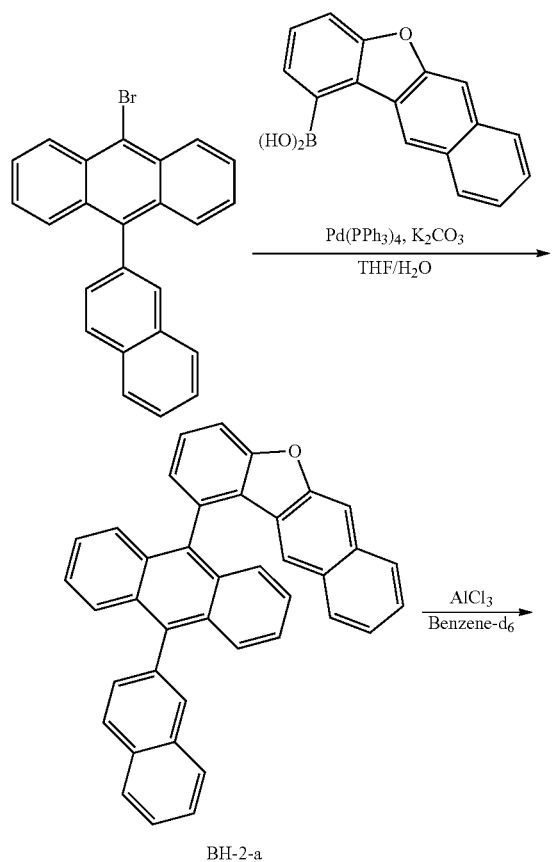

BH-2-a

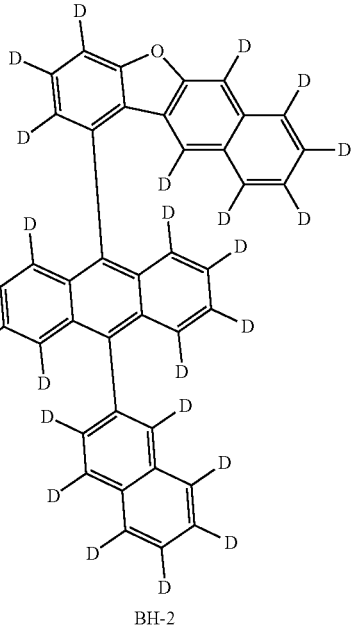

BH-2

<2-a> Preparation of Compound BH-2-a

Compound BH-2-a was obtained by conducting synthesis and purification in the same manner as in Synthesis Example 1-a except that 9-bromo-10-(naphthalen-2-yl)anthracene was used instead of 9-bromo-10-(naphthalen-1-yl)anthracene.

MS: [M+H]+=521

<2-b> Preparation of Compound BH-2

Compound BH-2 was obtained by conducting synthesis and purification in the same manner as in Synthesis Example 1-b except that Compound BH-2-a was used instead of Compound BH-1-a.

MS: [M+H]+=545

Synthesis Example 3. Synthesis of BH-3

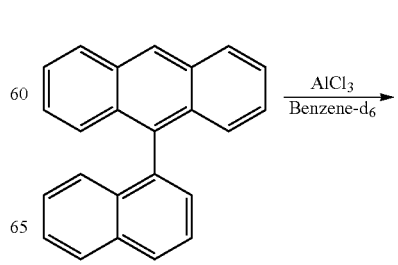

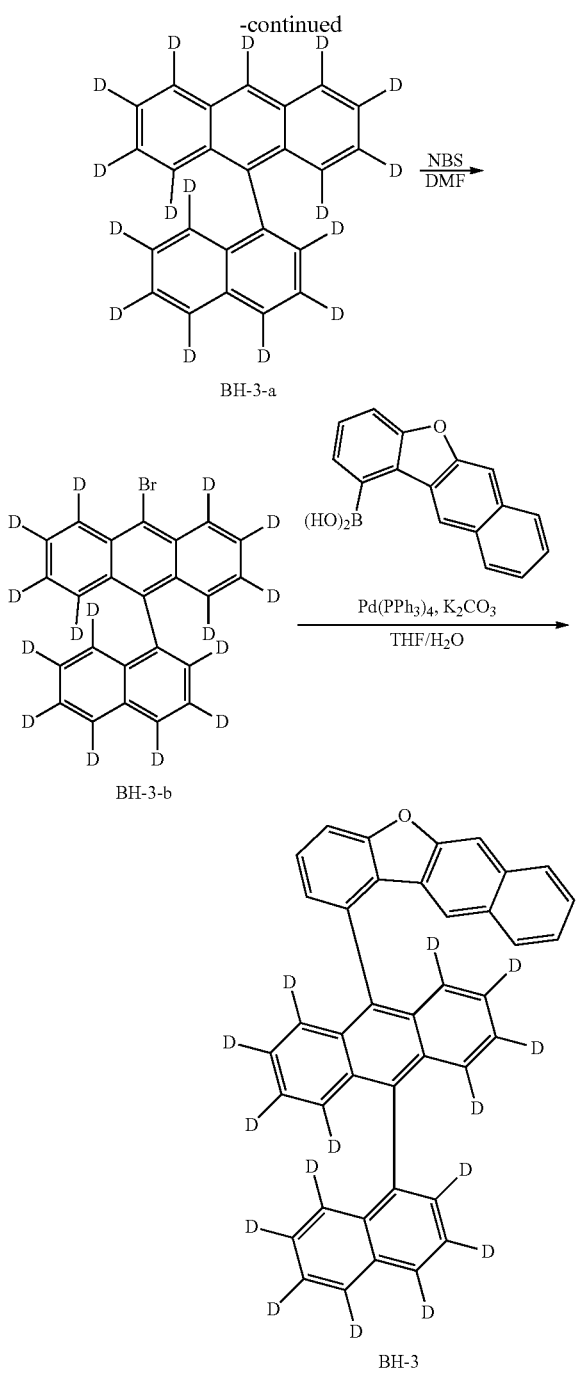

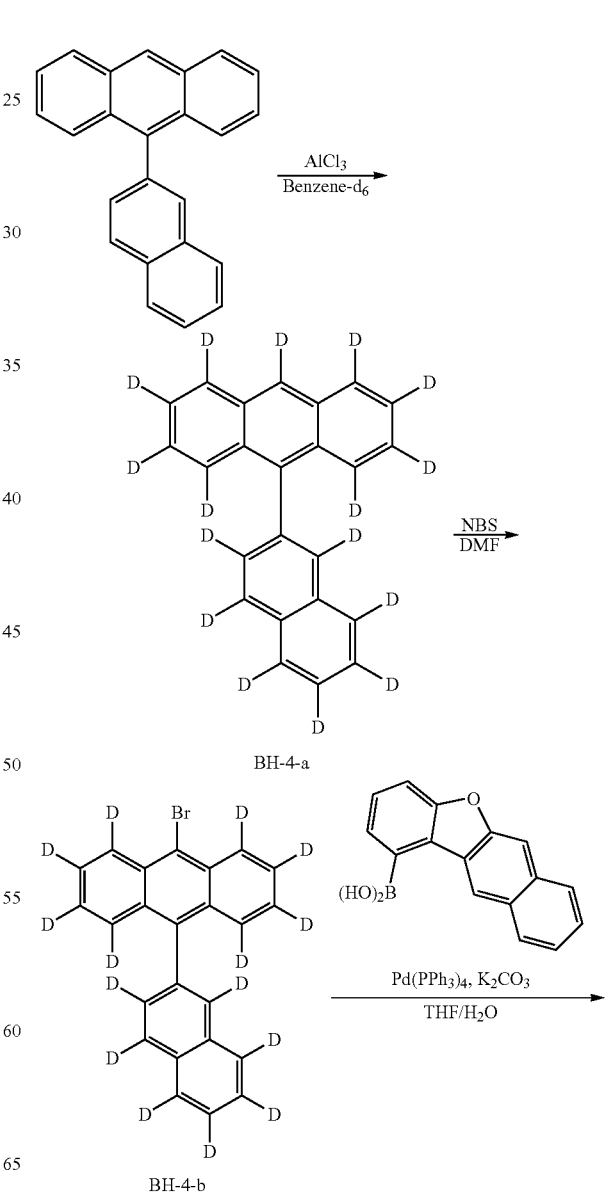

<3-a> Preparation of Compound BH-3-a

Compound BH-3-a was obtained by conducting synthesis and purification in the same manner as in Synthesis Example 1-b except that 9-(naphthalen-1-yl)anthracene was used instead of Compound BH-1-a.
MS: [M+H]+=321

<3-b> Preparation of Compound BH-3-b

After dispersing Compound BH-3-a (30 g, 93.6 mmol) into dimethylformamide (450 ml), an n-bromosuccinimide (16.7 g, 93.6 mmol) solution dissolved in dimethylforma-mide (50 ml) was slowly added dropwise thereto. The result was reacted for 3 hours at room temperature, and then water (1 L) was added dropwise thereto. Produced solids were filtered, dissolved in ethyl acetate, transferred to a separatory funnel, and washed several times with distilled water. The result was recrystallized in ethyl acetate to obtain Compound BH-3-b (25.2 g, yield 68%).
MS: [M+H]+=399

<3-c> Preparation of Compound BH-3

Compound BH-3 was obtained by conducting synthesis and purification in the same manner as in Synthesis Example 1-a except that Compound BH-3-b was used instead of 9-bromo-10-(naphthalen-1-yl)anthracene.
MS: [M+H]+=536

Synthesis Example 4. Synthesis of BH-4

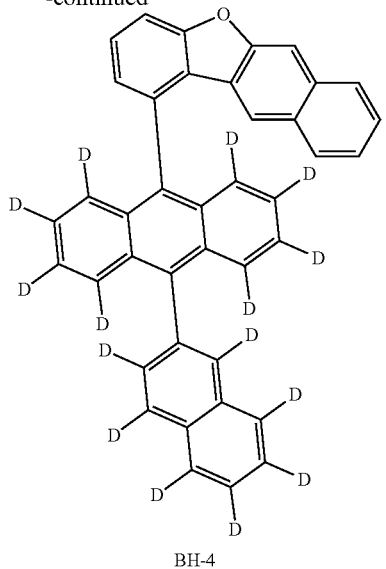

BH-4

<4-a> Preparation of Compound BH-4-a

Compound BH-4-a was obtained by conducting synthesis and purification in the same manner as in Synthesis Example 1-b except that 9-(naphthalen-2-yl)anthracene was used instead of Compound BH-1-a.
MS: [M+H]+=321

<4-b> Preparation of Compound BH-4-b

Compound BH-4-b was obtained by conducting synthesis and purification in the same manner as in Synthesis Example 3-b except that Compound BH-4-a was used instead of Compound BH-3-a.
MS: [M+H]+=398

<4-c> Preparation of Compound BH-4

Compound BH-4 was obtained by conducting synthesis and purification in the same manner as in Synthesis Example 1-a except that Compound BH-4-b was used instead of 9-bromo-10-(naphthalen-1-yl)anthracene.
MS: [M+H]+=536

Synthesis Example 5. Synthesis of BH-5

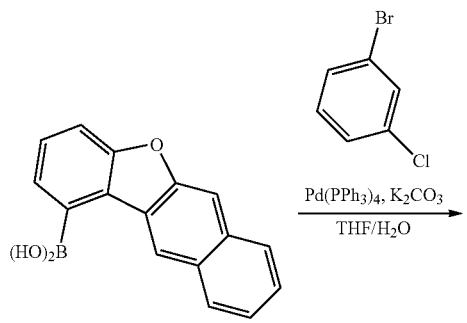

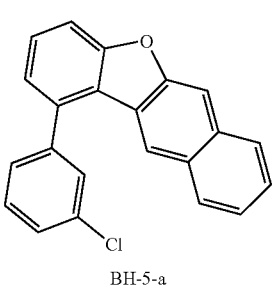

BH-5-a

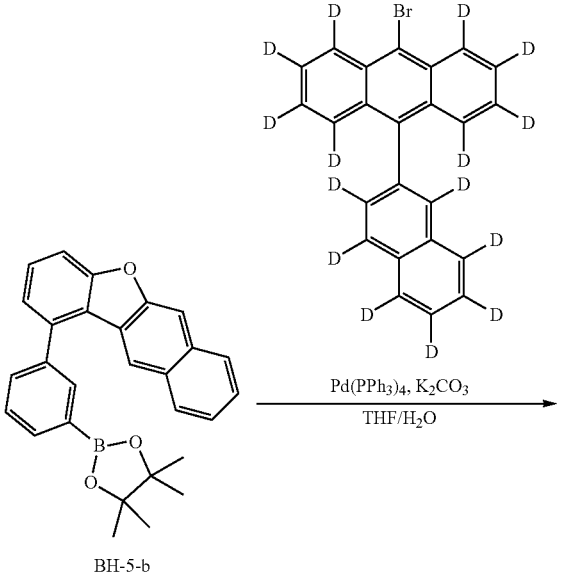

BH-5-b

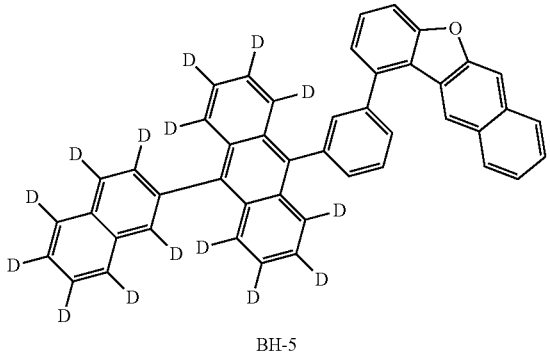

BH-5

<5-a> Preparation of Compound BH-5-a

Compound BH-5-a was obtained by conducting synthesis and purification in the same manner as in Synthesis Example 1-a except that 1-bromo-3-chlorobenzene was used instead of 9-bromo-10-(naphthalen-1-yl)anthracene.
MS: [M+H]+=329

<5-b> Preparation of Compound BH-5-b

Compound BH-5-a (30 g, 91.2 mmol), bis(pinacolato)diboron (34.7 g, 136.8 mmol), tricyclohexylphosphine (1.0 g, 3.64 mmol), potassium acetate (26.9 g, 273.6 mmol) and Pd(dba)$_2$ (1.0 g, 1.82 mmol) were introduced to 1,4-dioxane (450 ml), and the mixture was refluxed for 6 hours. The reaction solution was cooled, and the organic layer was extracted with ethyl acetate and then dried with anhydrous magnesium sulfate. The organic solvent was removed under vacuum, and the result was purified using column chromatography to obtain Compound BH-5-b (26.1 g, yield 68%).

MS: [M+H]+=421

<5-c> Preparation of Compound BH-5

Compound BH-5 was obtained by conducting synthesis and purification in the same manner as in Synthesis Example 1-a except that Compound BH-4-b was used instead of 9-bromo-10-(naphthalen-1-yl)anthracene, and Compound BH-5-b was used instead of naphtho[2,3-b]benzofuran-1-ylboronic acid.

MS: [M+H]+=612

Synthesis Example 6. Synthesis of BH-6

<6-a> Preparation of Compound BH-6

Compound BH-6 was obtained by conducting synthesis and purification in the same manner as in Synthesis Example 1-a except that Compound BH-3-b was used instead of 9-bromo-10-(naphthalen-1-yl)anthracene, and Compound BH-5-b was used instead of naphtho[2,3-b]benzofuran-1-ylboronic acid.

MS: [M+H]+=612

Synthesis Example 7. Synthesis of BH-7

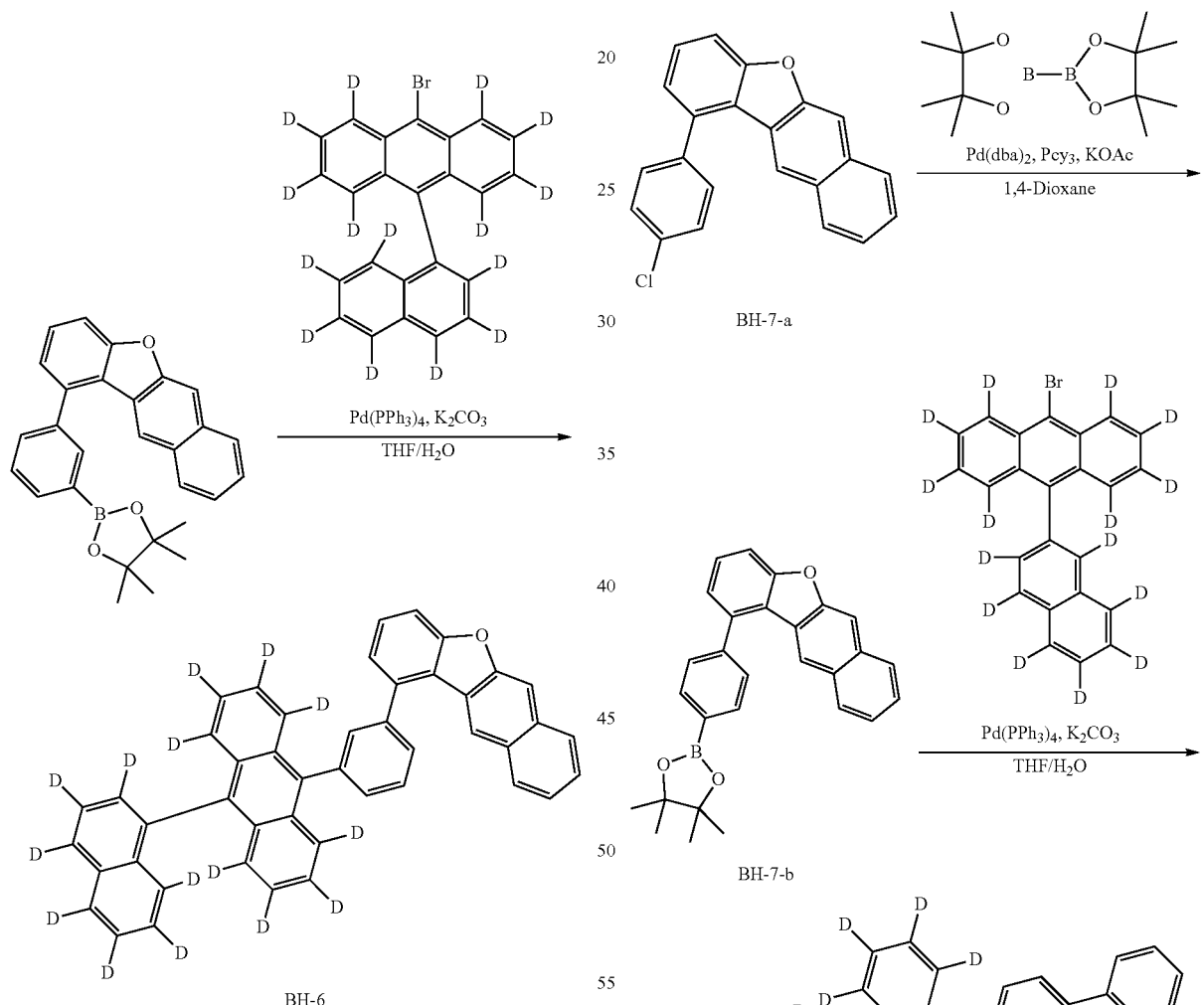

<7-a> Preparation of Compound BH-7-a

Compound BH-7-a was obtained by conducting synthesis and purification in the same manner as in Synthesis Example 1-a except that 1-bromo-4-chlorobenzene was used instead of 9-bromo-10-(naphthalen-1-yl)anthracene.

MS: [M+H]+=329

<7-b> Preparation of Compound BH-7-b

Compound BH-7-b was obtained by conducting synthesis and purification in the same manner as in Reaction Formula 5-b except that Compound BH-7-a was used instead of Compound BH-5-a.

MS: [M+H]+=421

<7-c> Preparation of Compound BH-7

Compound BH-7 was obtained by conducting synthesis and purification in the same manner as in Synthesis Example 1-a except that Compound BH-4-b was used instead of 9-bromo-10-(naphthalen-1-yl)anthracene, and Compound BH-7-b was used instead of naphtho[2,3-b]benzofuran-1-ylboronic acid.

MS: [M+H]+=612

Synthesis Example 8. Synthesis of BH-8

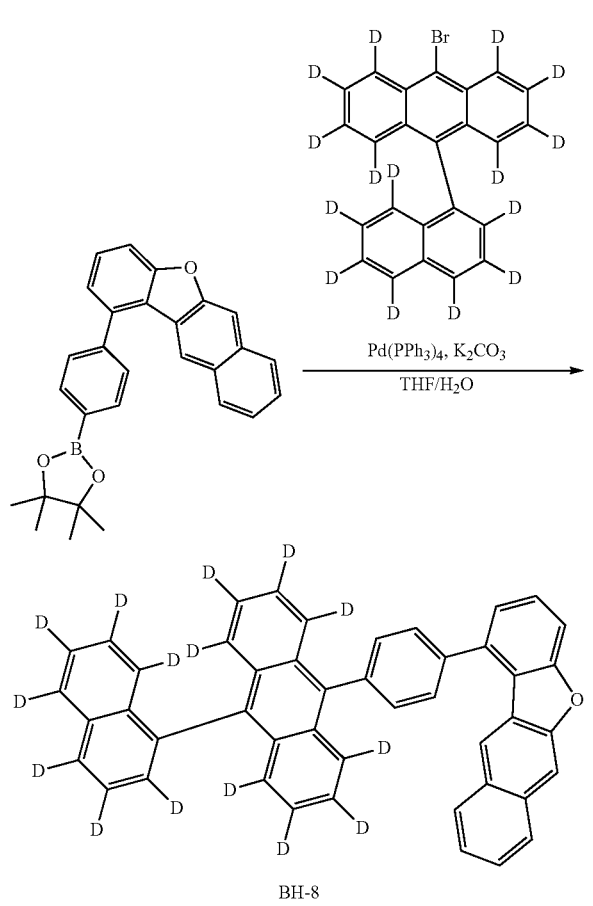

BH-8

<8-a> Preparation of Compound BH-8

Compound BH-8 was obtained by conducting synthesis and purification in the same manner as in Synthesis Example 1-a except that Compound BH-3-b was used instead of 9-bromo-10-(naphthalen-1-yl)anthracene, and Compound BH-7-b was used instead of naphtho[2,3-b]benzofuran-1-ylboronic acid.

MS: [M+H]+=612

Synthesis Example 9. Synthesis of BH-9

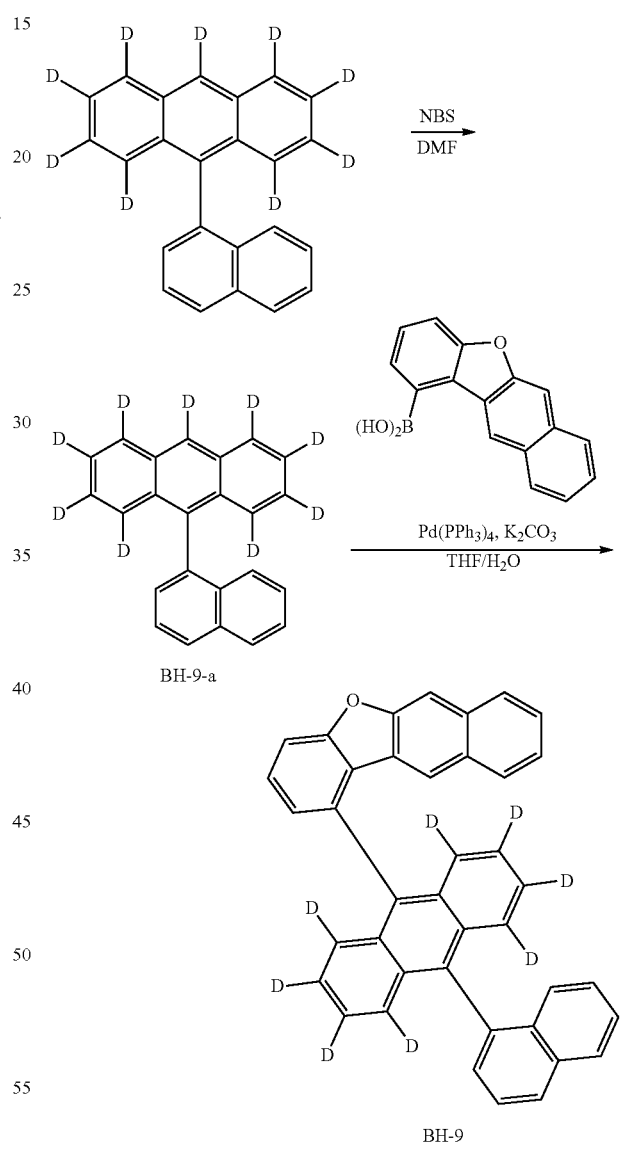

BH-9

<9-a> Preparation of Compound BH-9-a

Compound BH-9-a was obtained by conducting synthesis and purification in the same manner as in Synthesis Example 3-b except that 9-(naphthalen-1-yl)anthracene-1,2,3,4,5,6,7,8,10-d9 was used instead of Compound BH-3-a.

MS: [M+H]+=392

<9-b> Preparation of Compound BH-9

Compound BH-9 was obtained by conducting synthesis and purification in the same manner as in Synthesis Example 1-a except that Compound BH-9-a was used instead of 9-bromo-10-(naphthalen-1-yl)anthracene.

MS: [M+H]+=529

Synthesis Example 10. Synthesis of BH-10

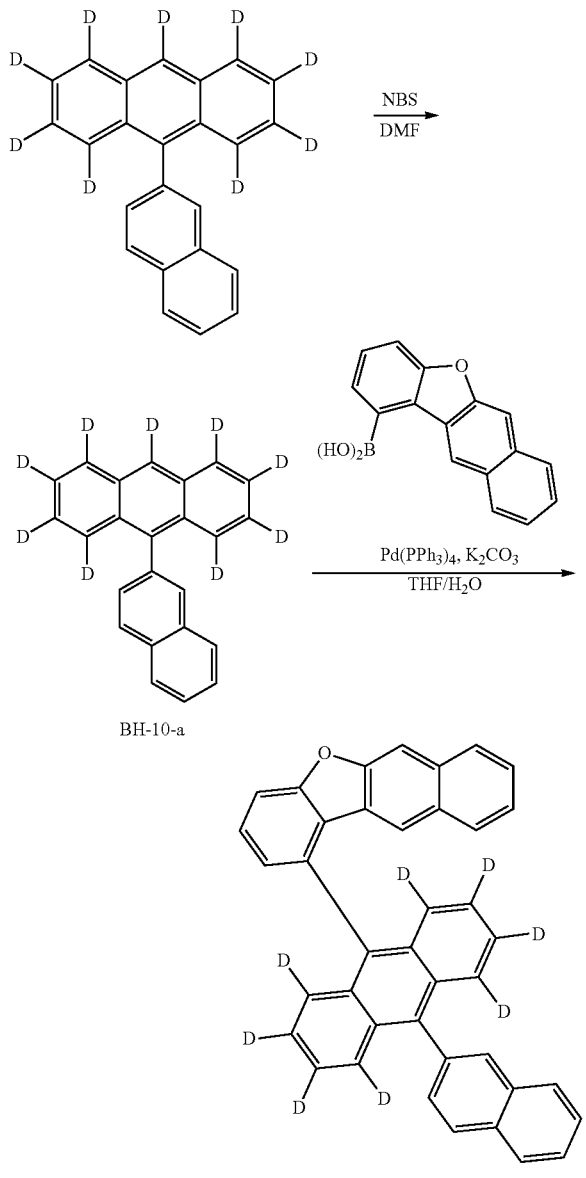

BH-10-a

BH-10

<10-a> Preparation of Compound BH-10-a

Compound BH-10-a was obtained by conducting synthesis and purification in the same manner as in Synthesis Example 3-b except that 9-(naphthalen-2-yl)anthracene-1,2,3,4,5,6,7,8,10-d9 was used instead of Compound BH-3-a.

MS: [M+H]+=392

<10-b> Preparation of Compound BH-10

Compound BH-10 was obtained by conducting synthesis and purification in the same manner as in Synthesis Example 1-a except that Compound BH-10-a was used instead of 9-bromo-10-(naphthalen-1-yl)anthracene.

MS: [M+H]+=529

Synthesis Example 11. Synthesis of BH-11

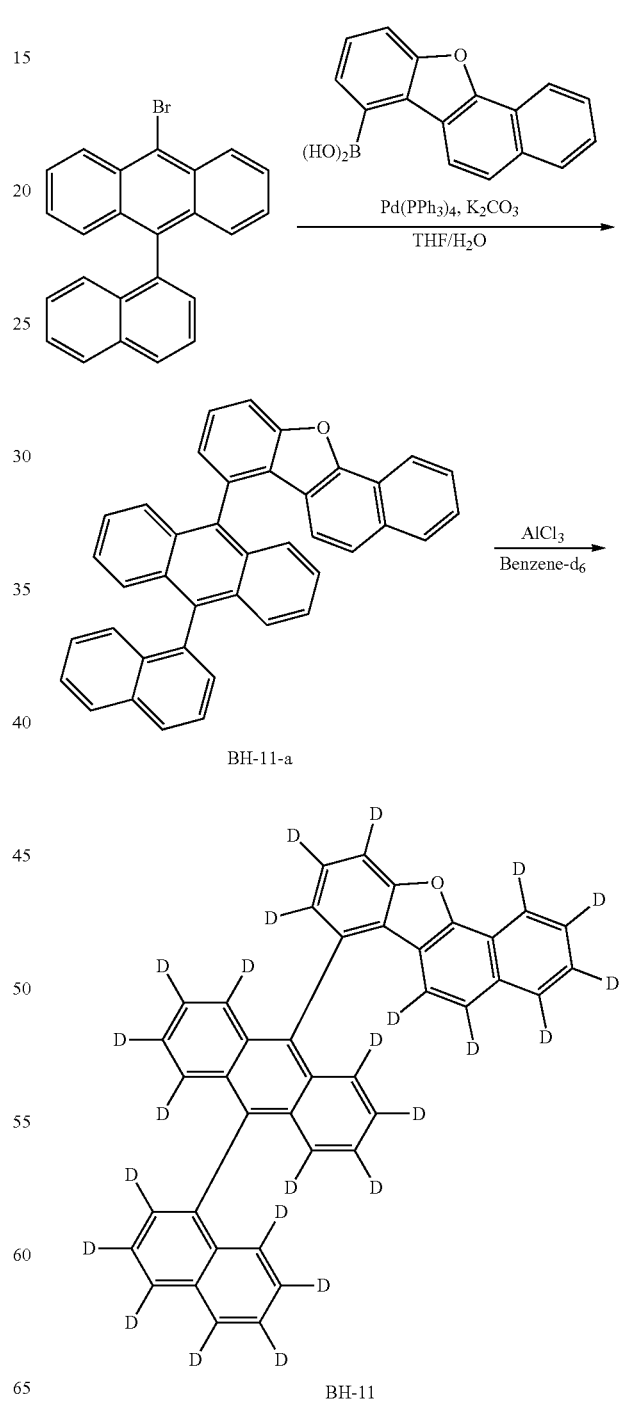

BH-11-a

BH-11

<11-a> Preparation of Compound BH-11-a

Compound BH-11-a was obtained by conducting synthesis and purification in the same manner as in Synthesis Example 1-a except that naphtho[1,2-b]benzofuran-7-ylboronic acid was used instead of naphtho[2,3-b]benzofuran-1-ylboronic acid.

MS: [M+H]+=521

<11-b> Preparation of Compound BH-11

Compound BH-11 was obtained by conducting synthesis and purification in the same manner as in Synthesis Example 1-b except that Compound BH-11-a was used instead of Compound BH-1-a.

MS: [M+H]+=545

Synthesis Example 12. Synthesis of BH-12

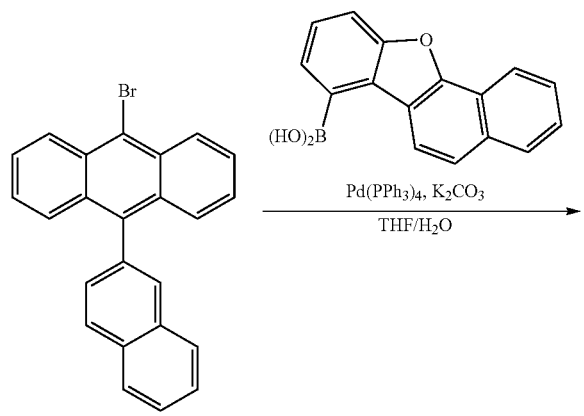

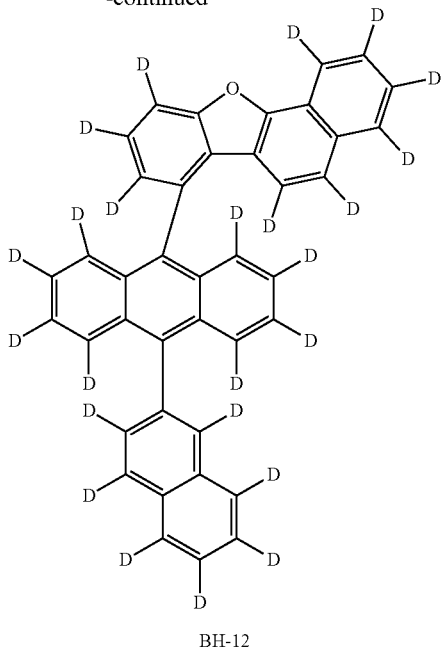

BH-12

<12-a> Preparation of Compound BH-12-a

Compound BH-12-a was obtained by conducting synthesis and purification in the same manner as in Synthesis Example 1-a except that 9-bromo-10-(naphthalen-2-yl)anthracene was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=521

<12-b> Preparation of Compound BH-12

Compound BH-12 was obtained by conducting synthesis and purification in the same manner as in Synthesis Example 1-b except that Compound BH-12-a was used instead of Compound BH-1-a.

MS: [M+H]+=545

Synthesis Example 13. Synthesis of BH-13

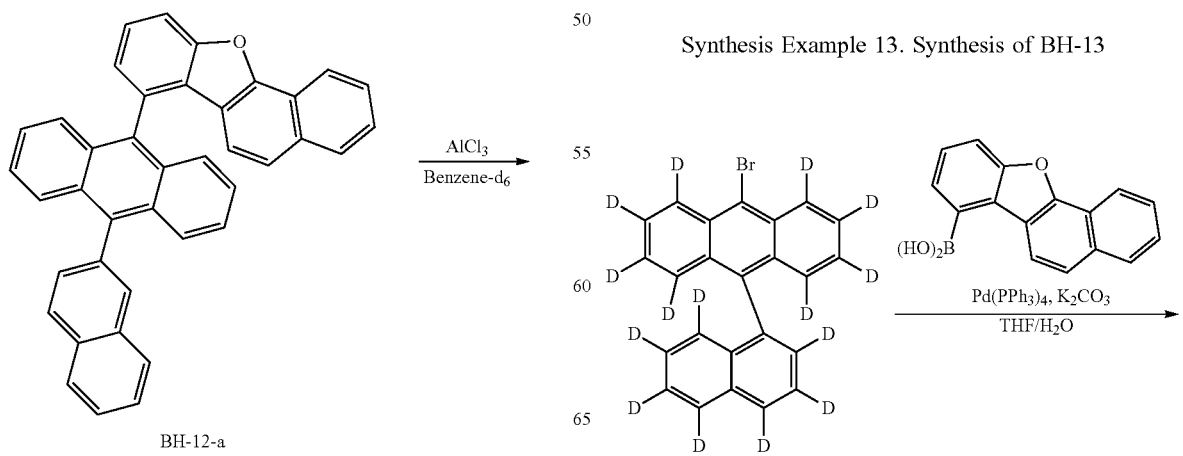

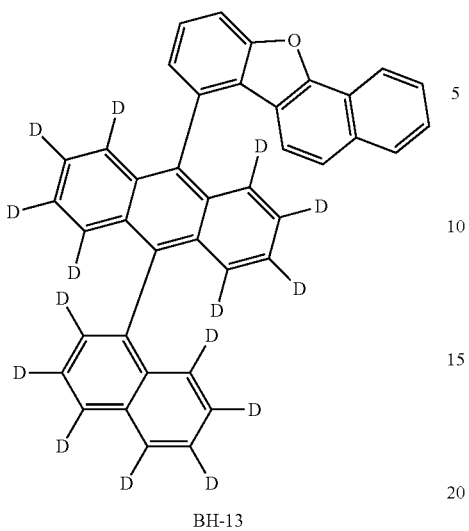

BH-13

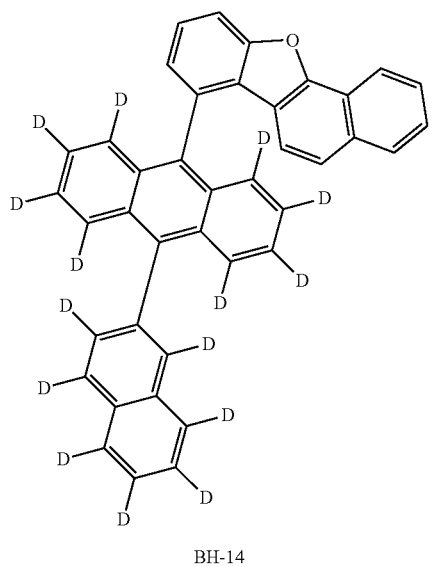

BH-14

<3-a> Preparation of Compound BH-13

Compound BH-13 was obtained by conducting synthesis and purification in the same manner as in Synthesis Example 1-a except that Compound BH-3-b was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=536

Synthesis Example 14. Synthesis of BH-14

<14-a> Preparation of Compound BH-14

Compound BH-14 was obtained by conducting synthesis and purification in the same manner as in Synthesis Example 1-a except that Compound BH-4-b was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=536

Synthesis Example 15. Synthesis of BH-15

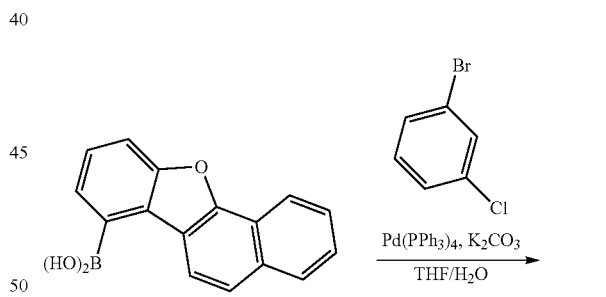

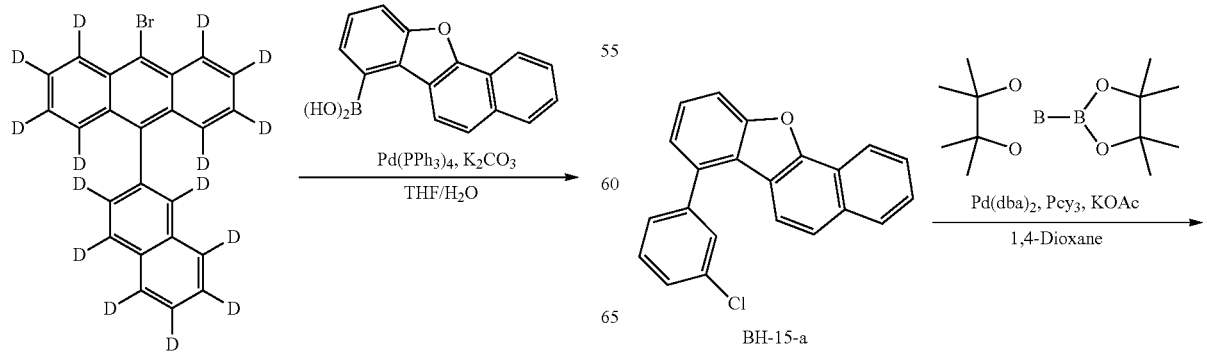

BH-15-a

163

-continued

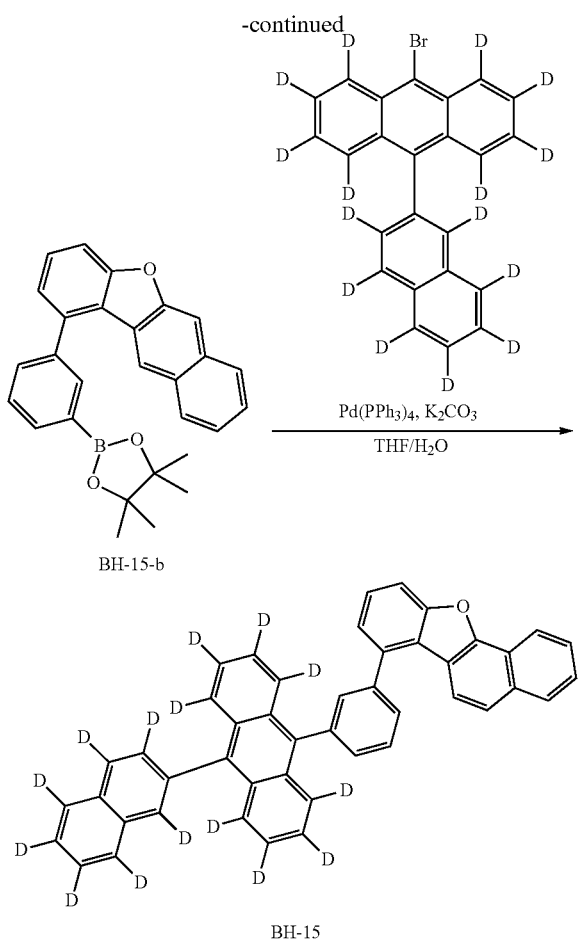

BH-15-b

BH-15

<15-a> Preparation of Compound BH-15-a

Compound BH-15-a was obtained by conducting synthesis and purification in the same manner as in Synthesis Example 1-a except that 1-bromo-4-chlorobenzene was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=329

<15-b> Preparation of Compound BH-15-b

Compound BH-15-b was obtained by conducting synthesis and purification in the same manner as in Reaction Formula 5-b except that Compound BH-15-a was used instead of Compound BH-5-a.

MS: [M+H]+=421

<15-c> Preparation of Compound BH-15

Compound BH-15 was obtained by conducting synthesis and purification in the same manner as in Synthesis Example 1-a except that Compound BH-4-b was used instead of 9-bromo-10-(naphthalen-1-yl)anthracene, and Compound BH-15-b was used instead of naphtho[2,3-b]benzofuran-1-ylboronic acid.

MS: [M+H]+=612

Synthesis Example 16. Synthesis of BH-16

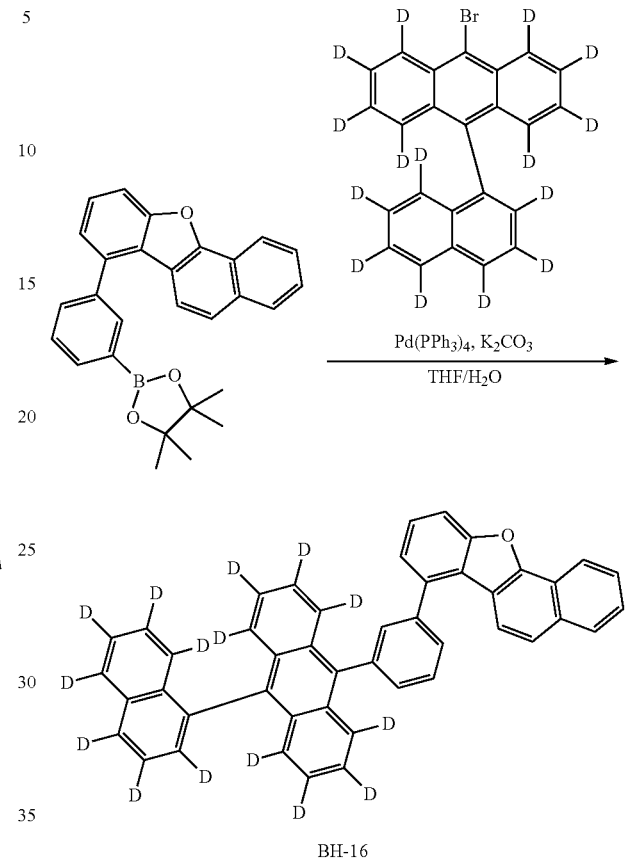

BH-16

<16-a> Preparation of Compound BH-16

Compound BH-16 was obtained by conducting synthesis and purification in the same manner as in Synthesis Example 1-a except that Compound BH-3-b was used instead of 9-bromo-10-(naphthalen-1-yl)anthracene, and Compound BH-15-b was used instead of naphtho[2,3-b]benzofuran-1-ylboronic acid.

MS: [M+H]+=612

Synthesis Example 17. Synthesis of BH-17

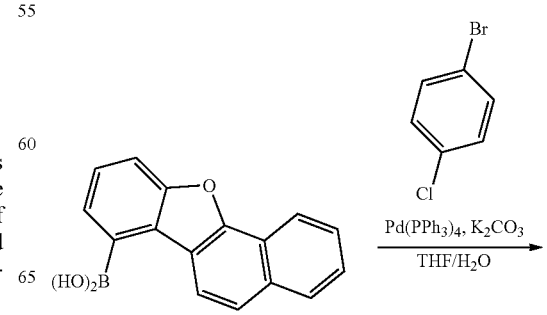

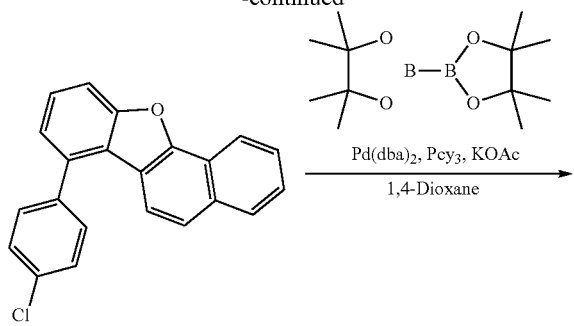

BH-17-a

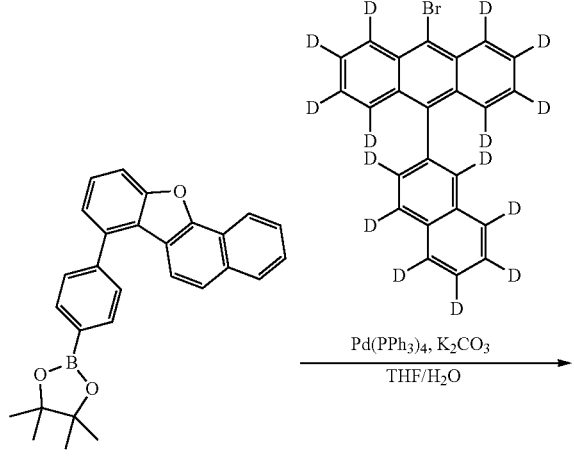

BH-17-b

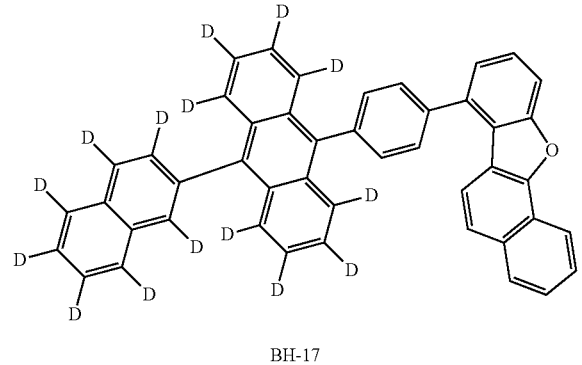

BH-17

<17-a> Preparation of Compound BH-17-a

Compound BH-17-a was obtained by conducting synthesis and purification in the same manner as in Synthesis Example 1-a except that 1-bromo-4-chlorobenzene was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=329

<17-b> Preparation of Compound BH-17-b

Compound BH-17-b was obtained by conducting synthesis and purification in the same manner as in Reaction Formula 5-b except that Compound BH-17-a was used instead of Compound BH-5-a.

MS: [M+H]+=421

<17-c> Preparation of Compound BH-17

Compound BH-17 was obtained by conducting synthesis and purification in the same manner as in Synthesis Example 1-a except that Compound BH-4-b was used instead of 9-bromo-10-(naphthalen-1yl)anthracene, and Compound BH-17-b was used instead of naphtho[2,3-b]benzofuran-1-ylboronic acid.

MS: [M+H]+=612

Synthesis Example 18. Synthesis of BH-18

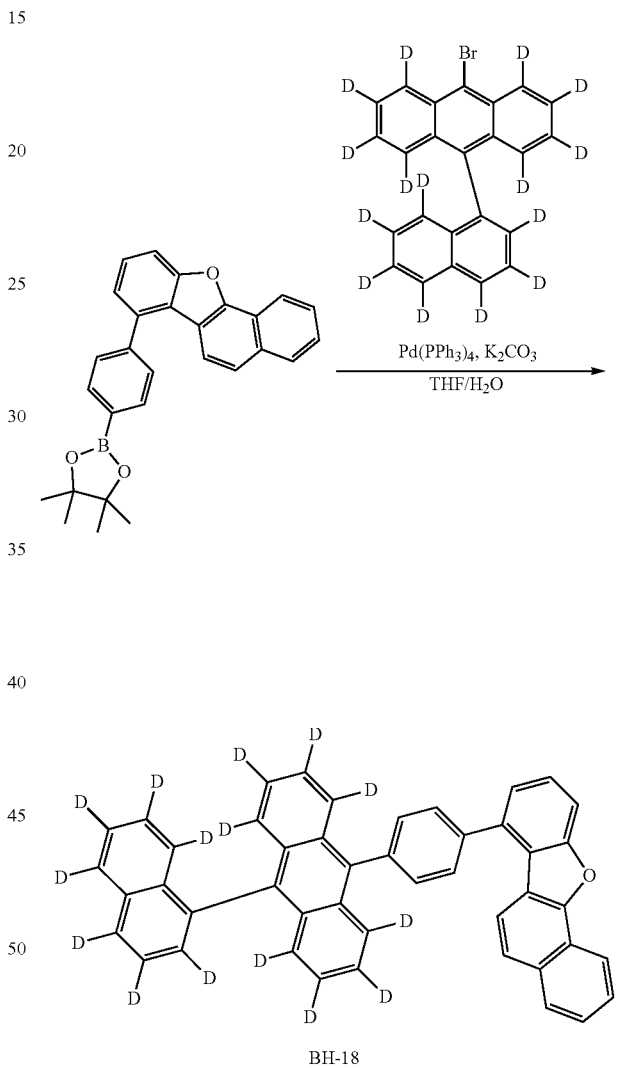

BH-18

<18-a> Preparation of Compound BH-18

Compound BH-18 was obtained by conducting synthesis and purification in the same manner as in Synthesis Example 1-a except that Compound BH-3-b was used instead of 9-bromo-10-(naphthalen-1-yl)anthracene, and Compound BH-17-b was used instead of naphtho[2,3-b]benzofuran-1-ylboronic acid.

MS: [M+H]+=612

Synthesis Example 19. Synthesis of BH-19

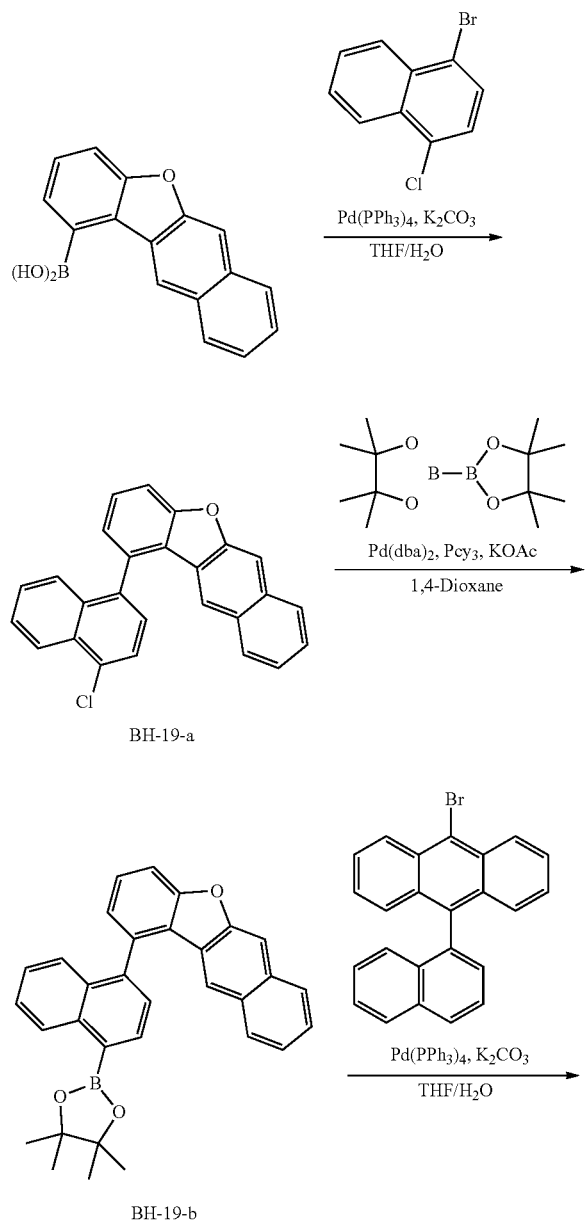

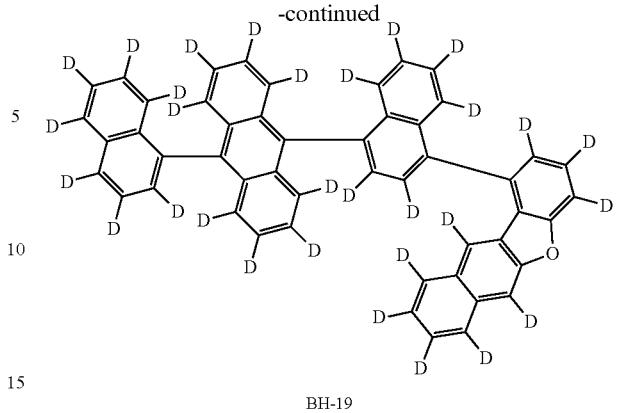

BH-19

<19-a> Preparation of Compound BH-19-a

Compound BH-19-a was obtained by conducting synthesis and purification in the same manner as in Synthesis Example 1-a except that 1-bromo-4-chloronaphthalene was used instead of 9-bromo-10-(naphthalen-1-yl)anthracene.
MS: [M+H]+=379

<19-b> Preparation of Compound BH-19-b

Compound BH-19-b was obtained by conducting synthesis and purification in the same manner as in Reaction Formula 5-b except that Compound BH-19-a was used instead of Compound BH-5-a.
MS: [M+H]+=471

<19-c> Preparation of Compound BH-19-c

Compound BH-19-c was obtained by conducting synthesis and purification in the same manner as in Synthesis Example 1-a except that Compound BH-19-b was used instead of naphtho[2,3-b] benzofuran-1-ylboronic acid.
MS: [M+H]+=647

<19-d> Preparation of Compound BH-19

Compound BH-19 was obtained by conducting synthesis and purification in the same manner as in Synthesis Example 1-b except that Compound BH-19-c was used instead of Compound BH-1-a.
MS: [M+H]+=677

Synthesis Example 20. Synthesis of BH-20

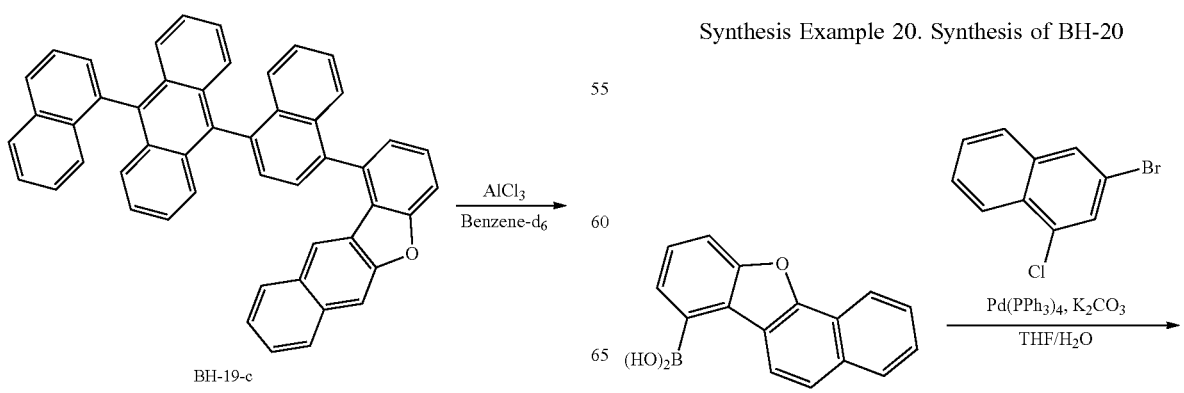

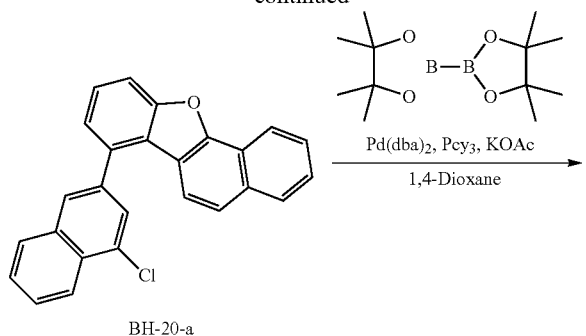

BH-20-a

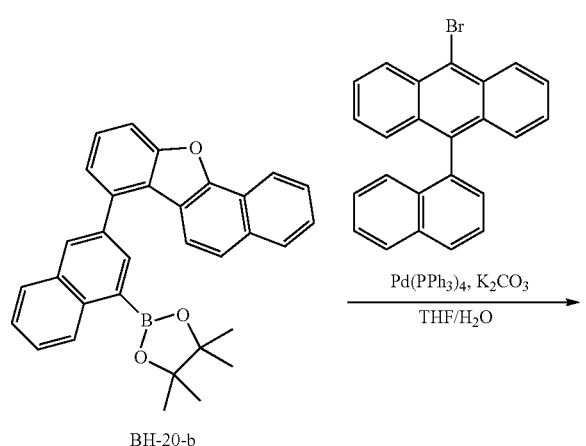

BH-20-b

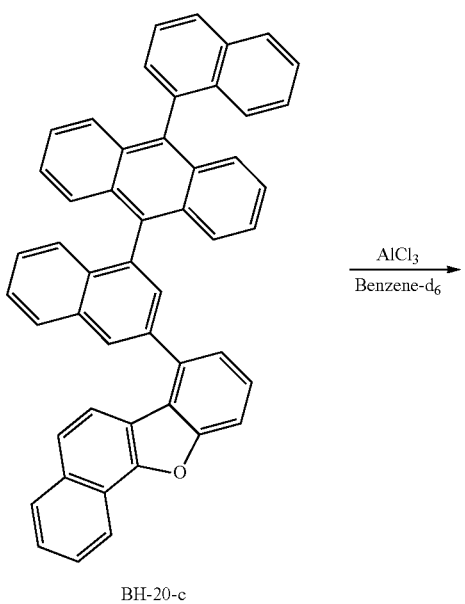

BH-20-c

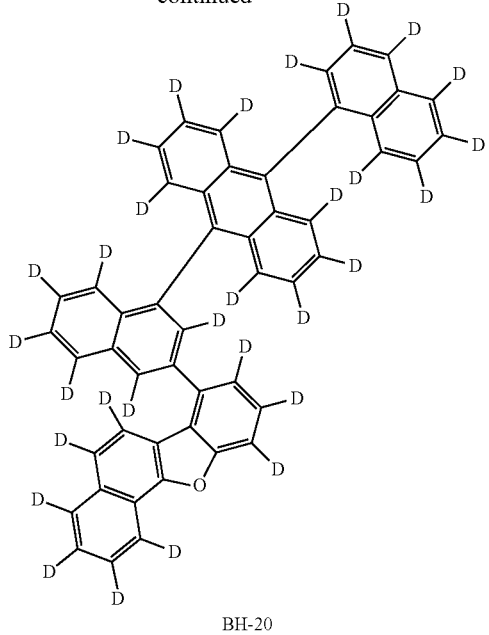

BH-20

<20-a> Preparation of Compound BH-20-a

Compound BH-20-a was obtained by conducting synthesis and purification in the same manner as in Synthesis Example 1-a except that 3-bromo-1-chloronaphthalene was used instead of 9-bromo-10-(naphthalen-1-yl)anthracene, and naphtho[1,2-b]benzofuran-7-ylboronic acid was used instead of naphtho[2,3-b]benzofuran-1-ylboronic acid.

MS: [M+H]+=379

<20-b> Preparation of Compound BH-20-b

Compound BH-20-b was obtained by conducting synthesis and purification in the same manner as in Reaction Formula 5-b except that Compound BH-20-a was used instead of Compound BH-5-a.

MS: [M+H]+=471

<20-c> Preparation of Compound BH-20-c

Compound BH-20-c was obtained by conducting synthesis and purification in the same manner as in Synthesis Example 1-a except that Compound BH-20-b was used instead of naphtho[2,3-b]benzofuran-1-ylboronic acid.

MS: [M+H]+=647

<20-d> Preparation of Compound BH-20

Compound BH-20 was obtained by conducting synthesis and purification in the same manner as in Synthesis Example 1-b except that Compound BH-20-c was used instead of Compound BH-1-a.

MS: [M+H]+=677

Experimental Example 1: Device Example

Example 1

A glass substrate on which indium tin oxide (ITO) was coated as a thin film to a thickness of 1,400 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum deposition apparatus.

On the transparent ITO electrode prepared as above, the following HI-A and HATCN were thermal vacuum deposited to thicknesses of 650 Å and 50 Å, respectively, to form a first hole injection layer and a second hole injection layer. On the hole injection layer, a hole transfer layer was formed by vacuum depositing the following HT-A to a thickness of 600 Å. The following HT-B was vacuum deposited to a thickness of 50 Å on the hole transfer layer to form an electron blocking layer.

Subsequently, on the electron blocking layer, a light emitting layer was formed to a thickness of 200 Å by vacuum depositing the following Compound BD-A as a blue light emitting dopant in 4 wt % with respect to the total weight of the light emitting layer, and the following BH-1 as a host in 96 wt % with respect to the total weight of the light emitting layer.

Then, on the light emitting layer, the following Compound ET-A was vacuum deposited to 50 Å as a first electron transfer layer, and subsequently, the following ET-B and LiQ were vacuum deposited in a weight ratio of 1:1 to a thickness of 360 Å to form a second electron transfer layer. An electron injection layer was formed on the second electron transfer layer by vacuum depositing LiQ to a thickness of 5 Å. On the electron injection layer, a cathode was formed by depositing aluminum and silver in a weight ratio of 10:1 to a thickness of 220 Å, and then depositing aluminum thereon to a thickness of 1000 Å.

In the above-described process, the deposition rates of the organic materials were maintained at 0.4 Å/sec to 0.9 Å/sec, the deposition rate of the aluminum of the cathode was maintained at 2 Å/sec, and the degree of vacuum during the deposition was maintained at $5 \times 10^{-8}$ torr to $1 \times 10^{-7}$ torr, and as a result, an organic light emitting device was manufactured.

HATCN

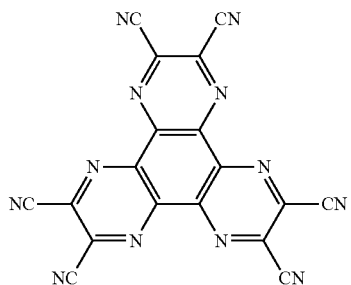

HI-A

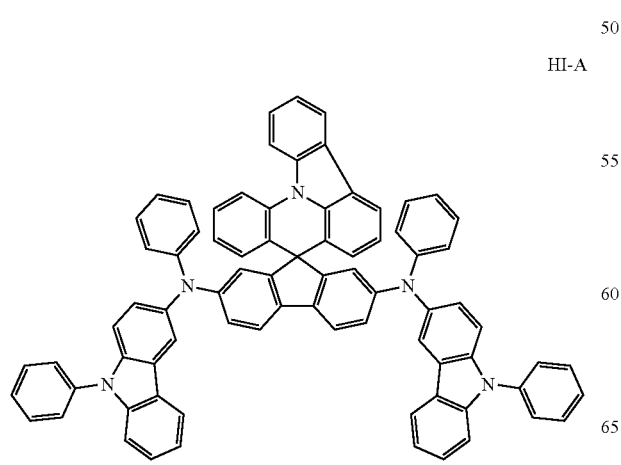

HT-A

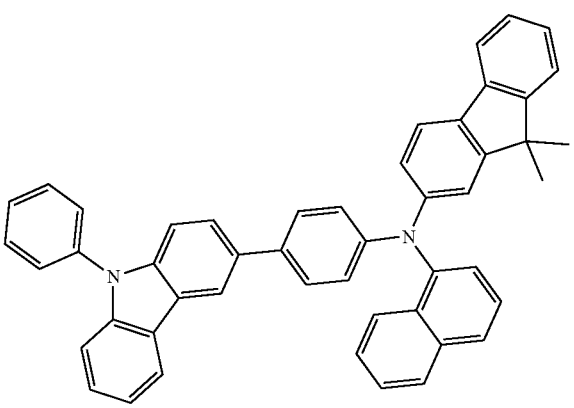

HT-B

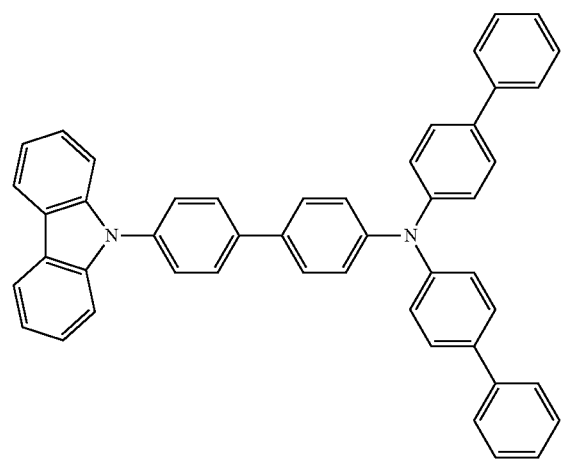

BH-1
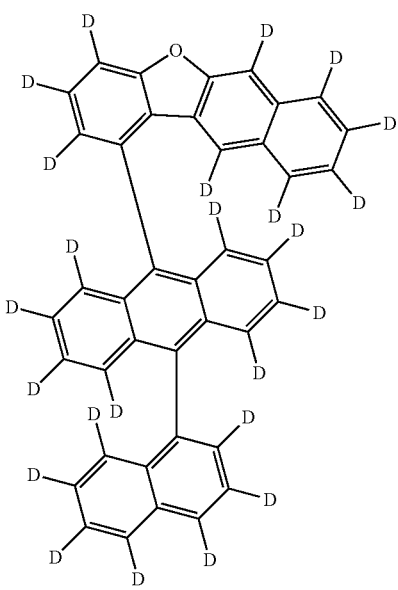
BD-A
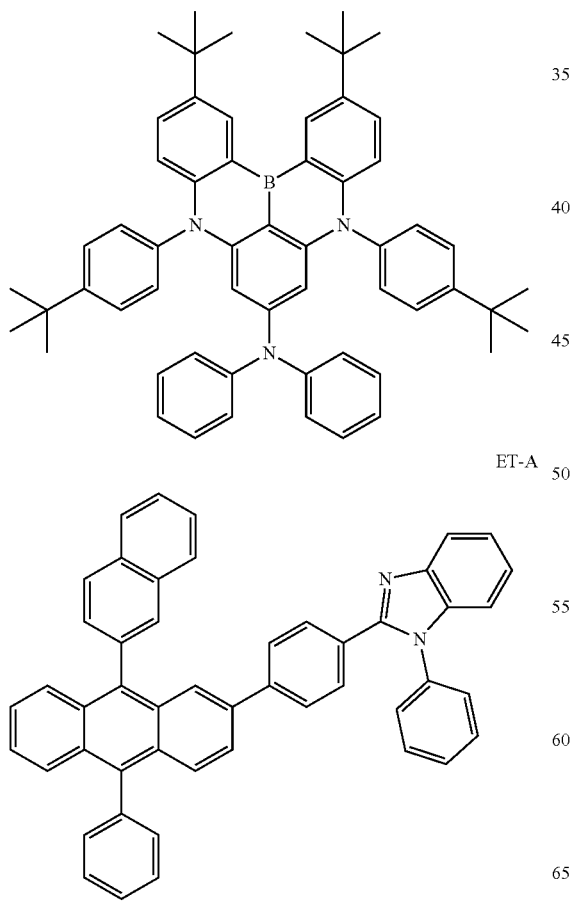
ET-A
ET-B
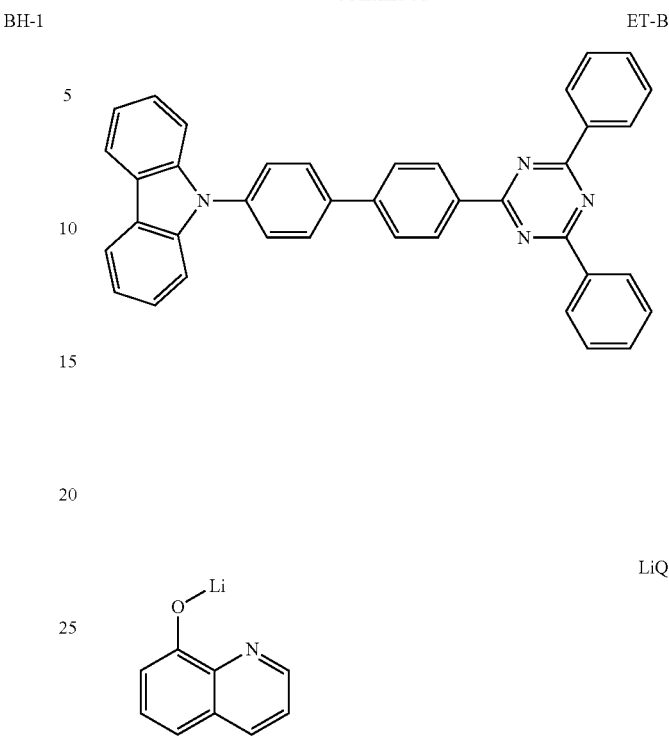
LiQ
Examples 2 to 20
Organic light emitting devices of Examples 2 to 20 were each manufactured in the same manner as in Example 1 except that compounds described in the following Table 1 were each used as the host of the light emitting layer instead of Compound BH-1.
BH-2
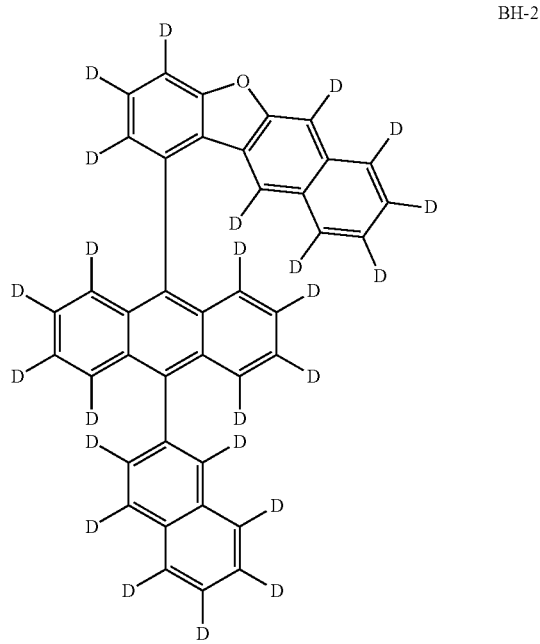

BH-3
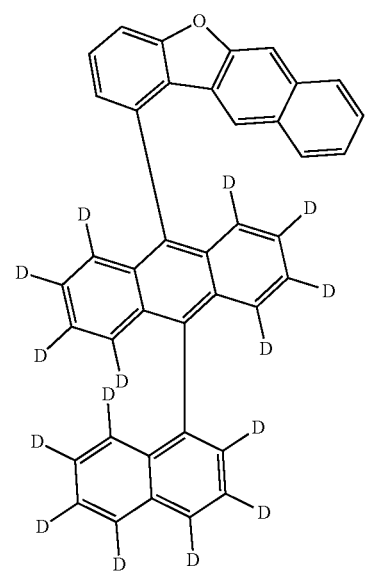
BH-4
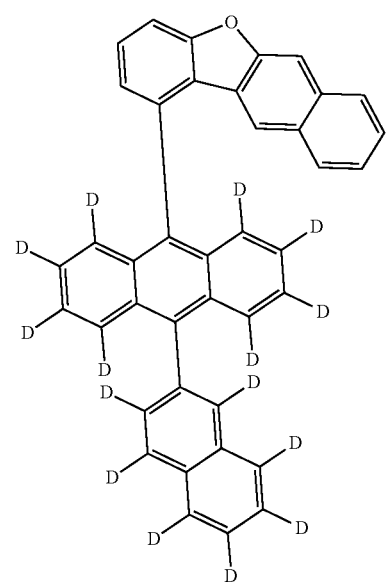
BH-5
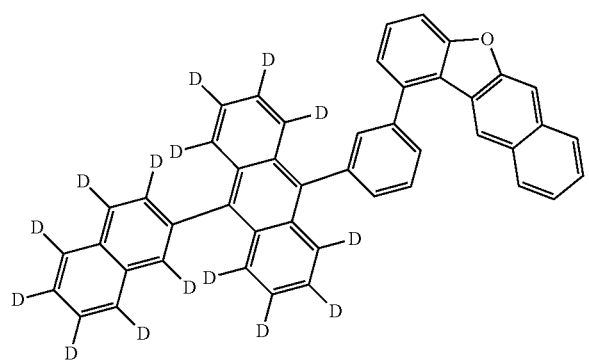
BH-6
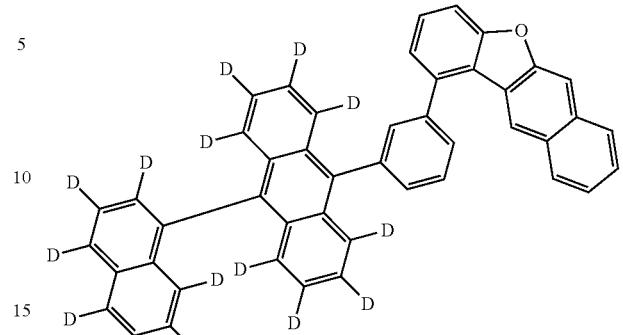
BH-7
BH-8
BH-9

BH-10
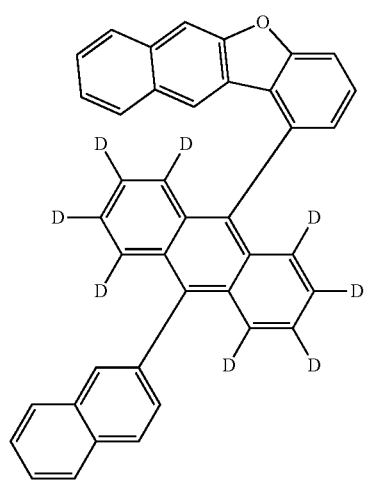
BH-11
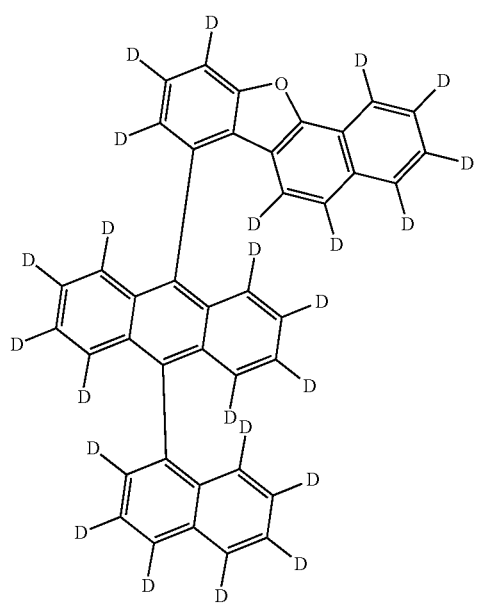
BH-12
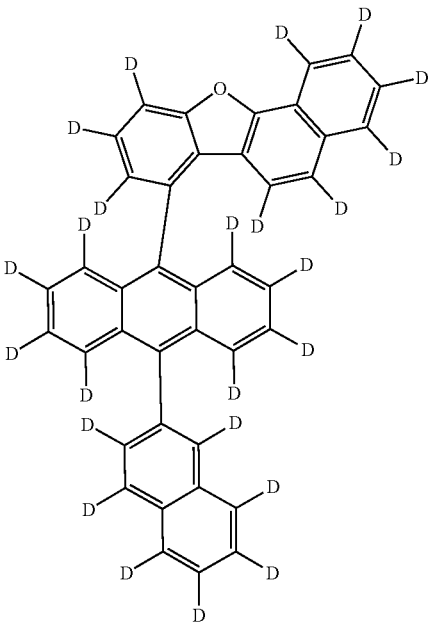
BH-13
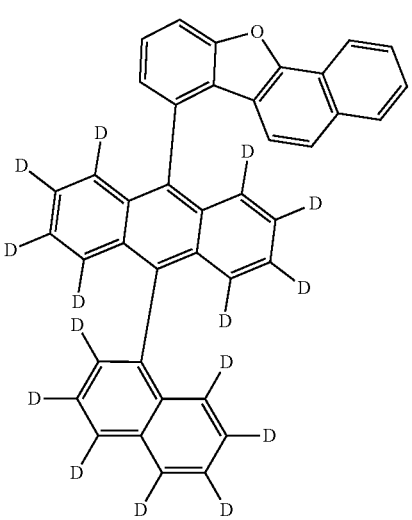
BH-14

-continued
BH-15
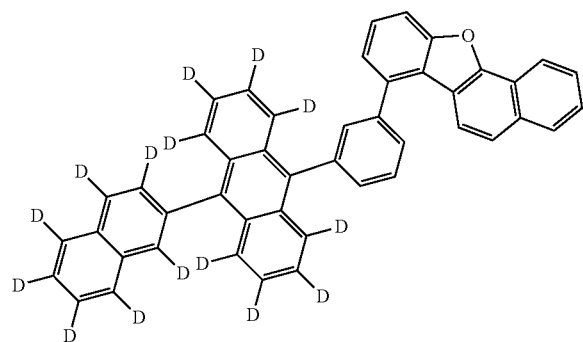
BH-16
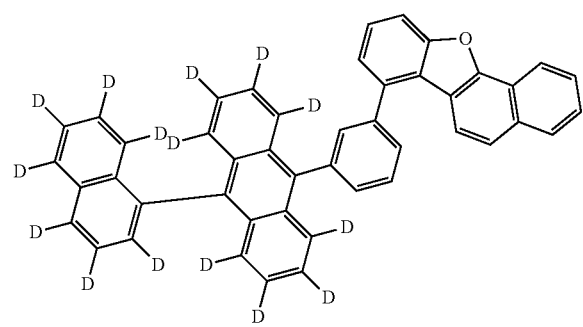
BH-17
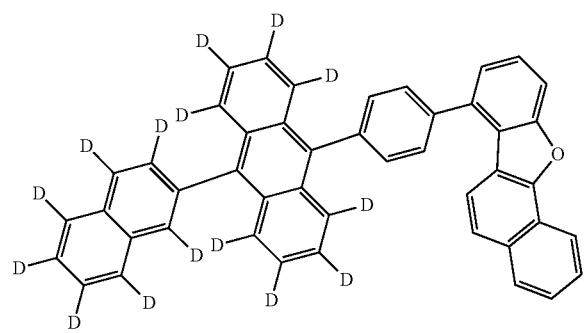
BH-18
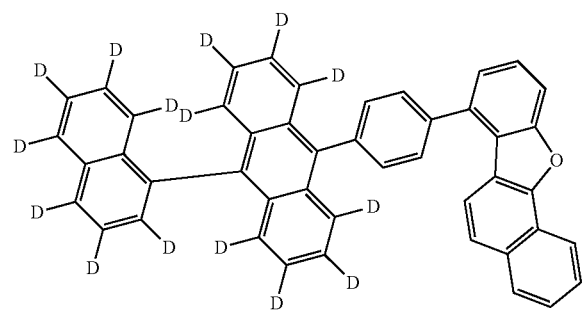
-continued
BH-19
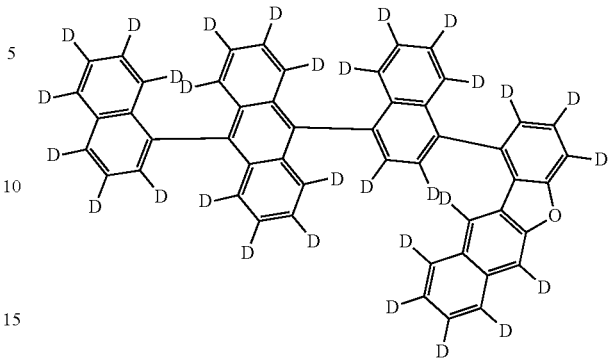
BH-20
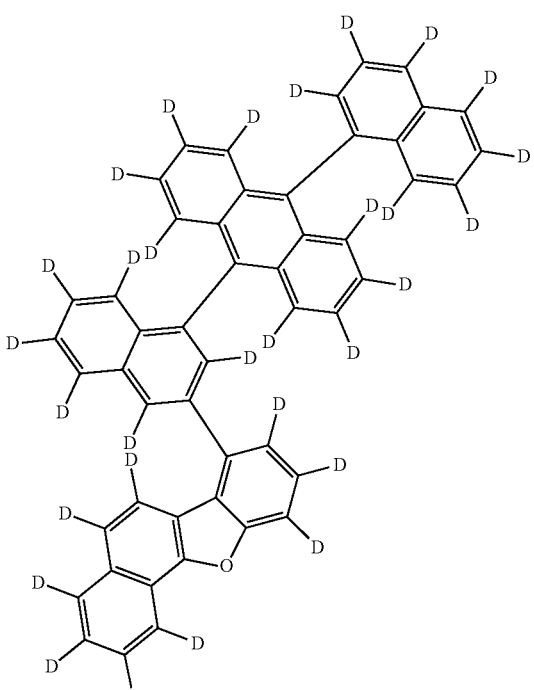
Comparative Examples 1 to 7
Organic light emitting devices of Comparative Examples 1 to 7 were each manufactured in the same manner as in Example 1 except that compounds described in the following Table 1 were each used as the host of the light emitting layer instead of Compound BH-1.

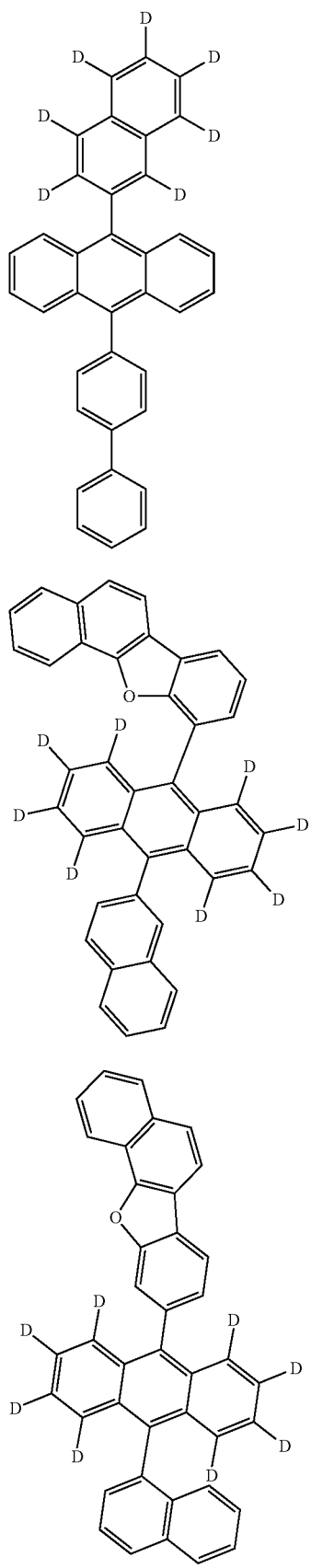
BH-A
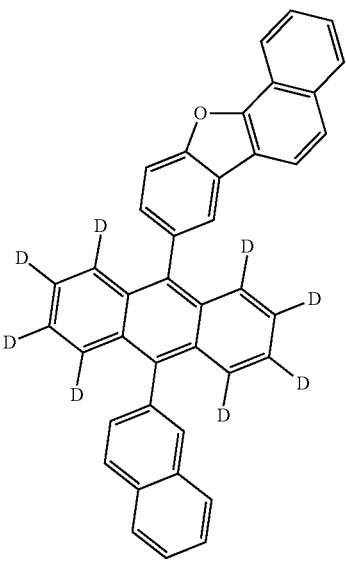
BH-B
BH-C
BH-D
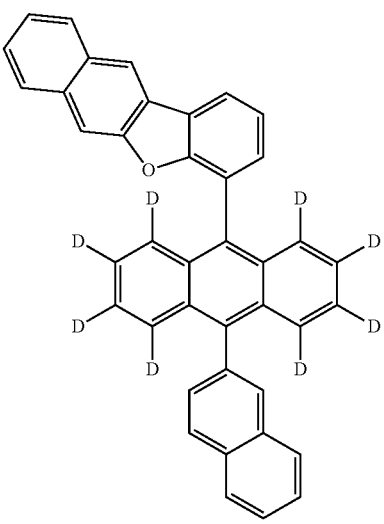
BH-E
BH-F
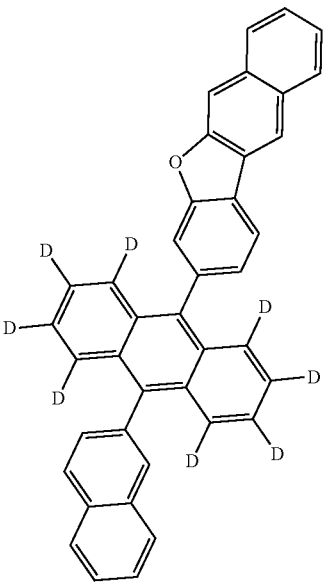

-continued

BH-G

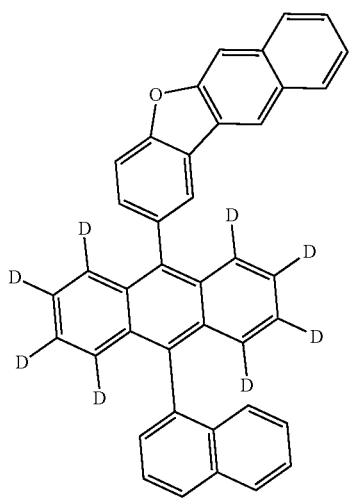

For each of the organic light emitting devices of Examples 1 to 20 and Comparative Examples 1 to 7, voltage and efficiency (cd/A/y) when applying current density of 10 mA/cm² and a lifetime (LT95) when applying current density of 20 mA/cm² were measured, and the results are shown in the following Table 1. Herein, LT95 means time taken for luminance to decrease to 95% when employing initial luminance at current density of 20 mA/cm² as 100%, and the percentage is shown based on Comparative Example 1.

TABLE 1

| | Light Emitting Layer | | 10 mA/cm² | | 20 mA/cm² |
| | Host | Dopant | Driving Voltage (V) | Converted Efficiency (cd/A/y) | LT95 (%) |
|---|---|---|---|---|---|
| Example 1 | BH-1 | BD-A | 3.43 | 41.0 | 182 |
| Example 2 | BH-2 | BD-A | 3.38 | 38.9 | 168 |
| Example 3 | BH-3 | BD-A | 3.42 | 41.3 | 170 |
| Example 4 | BH-4 | BD-A | 3.38 | 38.6 | 149 |
| Example 5 | BH-5 | BD-A | 3.43 | 37.2 | 132 |
| Example 6 | BH-6 | BD-A | 3.45 | 40.1 | 152 |
| Example 7 | BH-7 | BD-A | 3.41 | 36.1 | 130 |
| Example 8 | BH-8 | BD-A | 3.43 | 39.6 | 151 |
| Example 9 | BH-9 | BD-A | 3.43 | 41.2 | 155 |
| Example 10 | BH-10 | BD-A | 3.41 | 38.7 | 132 |
| Example 11 | BH-11 | BD-A | 3.47 | 42.7 | 193 |
| Example 12 | BH-12 | BD-A | 3.42 | 40.4 | 169 |
| Example 13 | BH-13 | BD-A | 3.49 | 43.0 | 177 |
| Example 14 | BH-14 | BD-A | 3.41 | 40.2 | 150 |
| Example 15 | BH-15 | BD-A | 3.43 | 39.8 | 145 |
| Example 16 | BH-16 | BD-A | 3.50 | 41.9 | 173 |
| Example 17 | BH-17 | BD-A | 3.42 | 38.7 | 143 |
| Example 18 | BH-18 | BD-A | 3.48 | 41.0 | 169 |
| Example 19 | BH-19 | BD-A | 3.41 | 39.2 | 140 |
| Example 20 | BH-20 | BD-A | 3.47 | 42.2 | 139 |
| Comparative Example 1 | BH-A | BD-A | 3.72 | 35.2 | 100 |
| Comparative Example 2 | BH-B | BD-A | 3.58 | 39.5 | 125 |
| Comparative Example 3 | BH-C | BD-A | 3.46 | 41.3 | 123 |
| Comparative Example 4 | BH-D | BD-A | 3.48 | 42.5 | 129 |
| Comparative Example 5 | BH-E | BD-A | 3.54 | 38.8 | 120 |
| Comparative Example 6 | BH-F | BD-A | 3.42 | 40.8 | 118 |
| Comparative Example 7 | BH-G | BD-A | 3.50 | 41.7 | 131 |

The compound of Chemical Formula 1 according to one embodiment of the present specification is a compound in which L1 bonds to a No. 1 position of the benzo[b]naphtho[2,3-d]furan or L1 bonds to a No. 7 position of the benzo[b]naphtho[2,1-d]furan, and has structural properties of having excellent electron and hole transfer. In addition, Chemical Formula 1 has improved molecular stability by including deuterium as a substituent. Accordingly, as shown in Table 1, Examples 1 to 20 including the compound in the light emitting layer of the organic light emitting device exhibit superior efficiency, driving voltage and lifetime efficiency compared to Comparative Example 1 including a compound that does not include the benzo[b]naphtho[2,3-d]furan or the benzo[b]naphtho[2,1-d]furan of Chemical Formula 1.

Examples 1 to 20 exhibited superior results in driving voltage, efficiency and/or lifetime compared to Comparative Examples 2 to 7 including a compound in which L1 bonds to No. 2 to No. 4 positions of benzo[b]naphtho[2,3-d]furan or L1 bonds to No. 8 to No. 10 positions of benzo[b]naphtho[2,1-d]furan, and particularly, significantly superior effects were obtained in terms of lifetime.

The invention claimed is:

1. A compound of the following Chemical Formula 1:

[Chemical Formula 1]

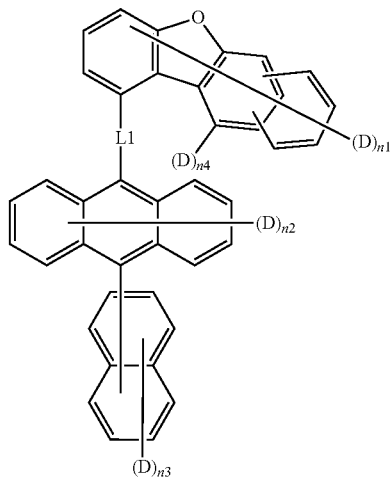

wherein in Chemical Formula 1,

L1 is a direct bond; or a substituted or unsubstituted arylene group,

D is deuterium, n1 is an integer of 0 to 8, n2 is 8, n3 is 7, n4 is 0 or 1, and $15 \leq n1+n2+n3+n4 \leq 24$.

2. The compound of claim 1, wherein L1 is a direct bond; or a monocyclic or polycyclic arylene group having 6 to 30 carbon atoms unsubstituted or substituted with deuterium.
3. The compound of claim 1, wherein the compound of Chemical Formula 1 is any one selected from the following compounds:
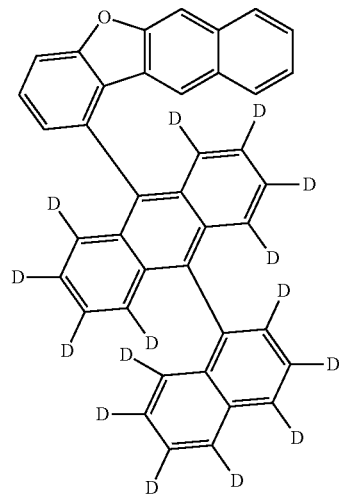 [SMILES: [2H]c1c([2H])c([2H])c2c(-c3c4c([2H])c([2H])c([2H])c([2H])c4c(-c4cccc5oc6cc7ccccc7cc6c45)c4c([2H])c([2H])c([2H])c([2H])c34)c([2H])c([2H])c([2H])c2c1[2H]]
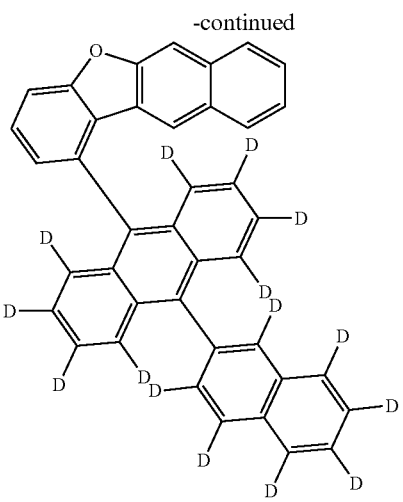
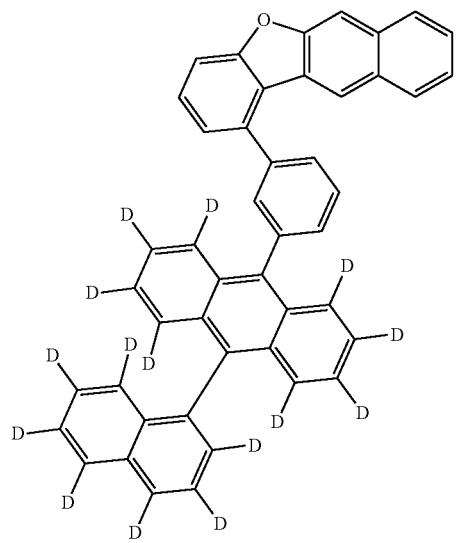 [SMILES: [2H]c1c([2H])c([2H])c2c(-c3c4c([2H])c([2H])c([2H])c([2H])c4c(-c4cccc(-c5cccc6oc7cc8ccccc8cc7c56)c4)c4c([2H])c([2H])c([2H])c([2H])c34)c([2H])c([2H])c([2H])c2c1[2H]]
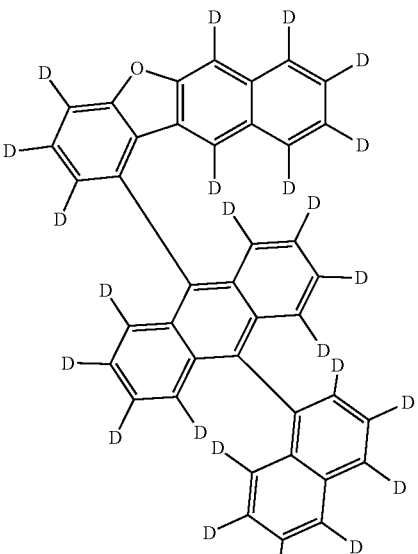
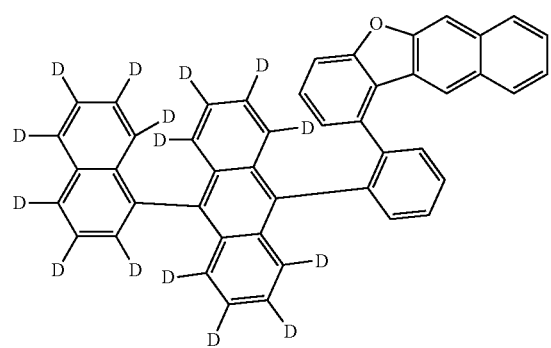
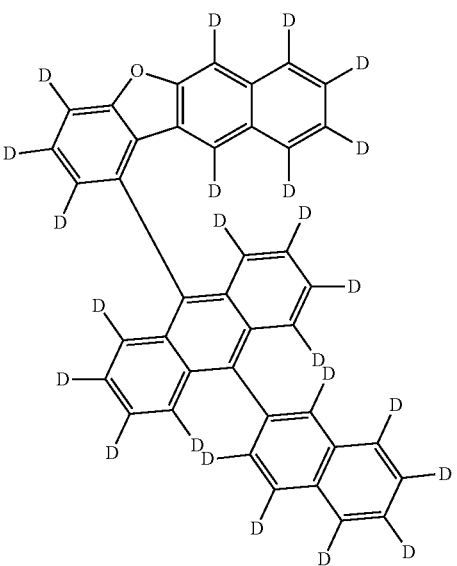
-continued

187
-continued
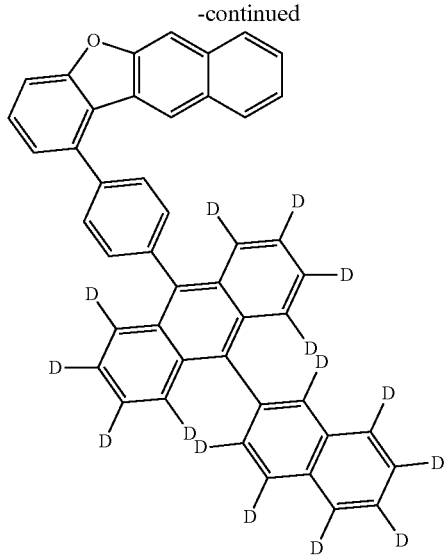
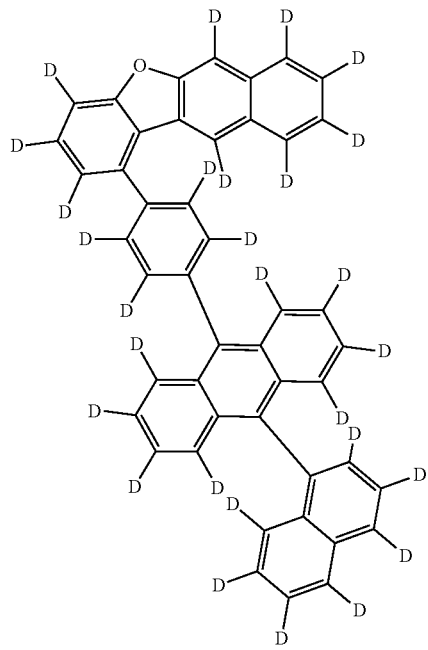
188
-continued
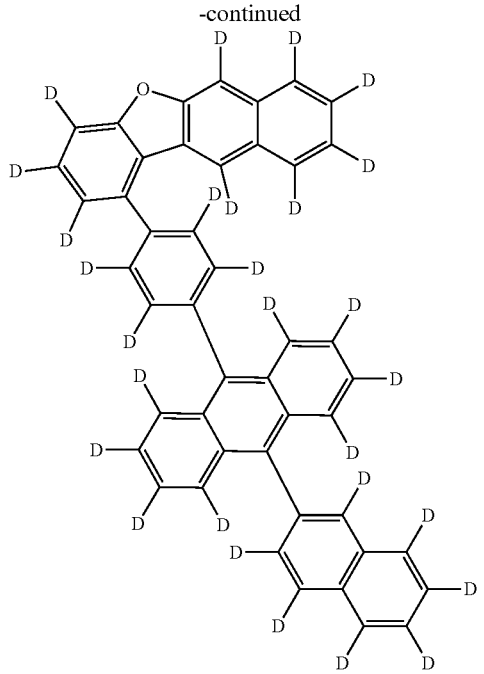
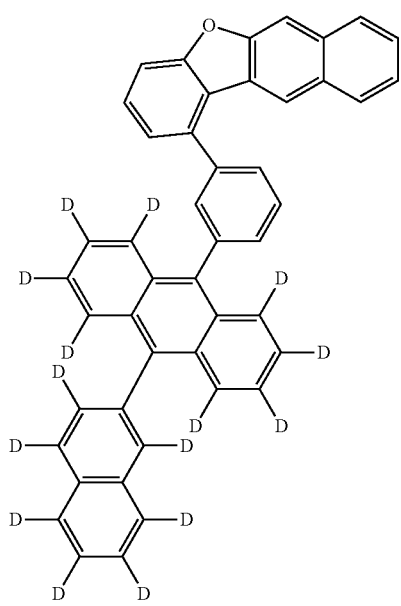

189
-continued
190
-continued
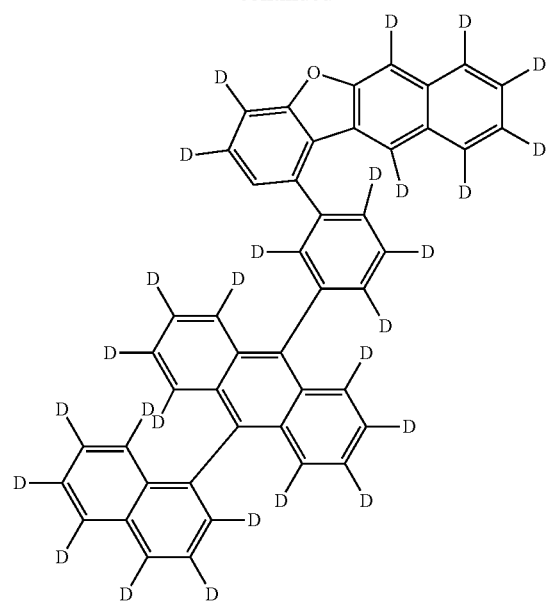
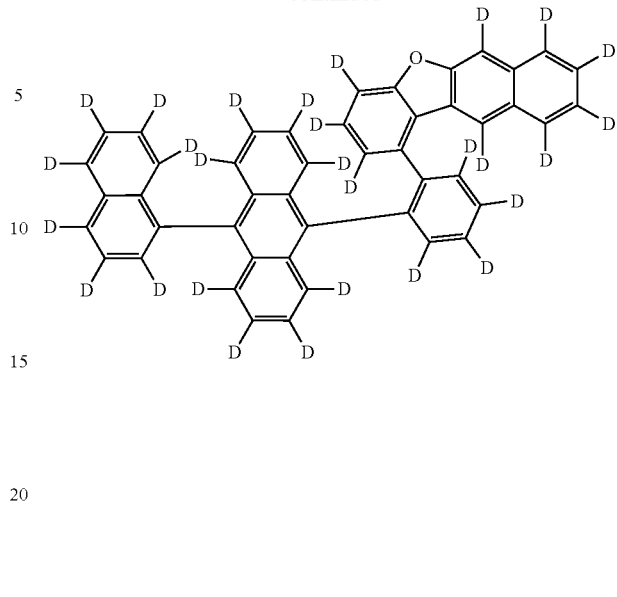
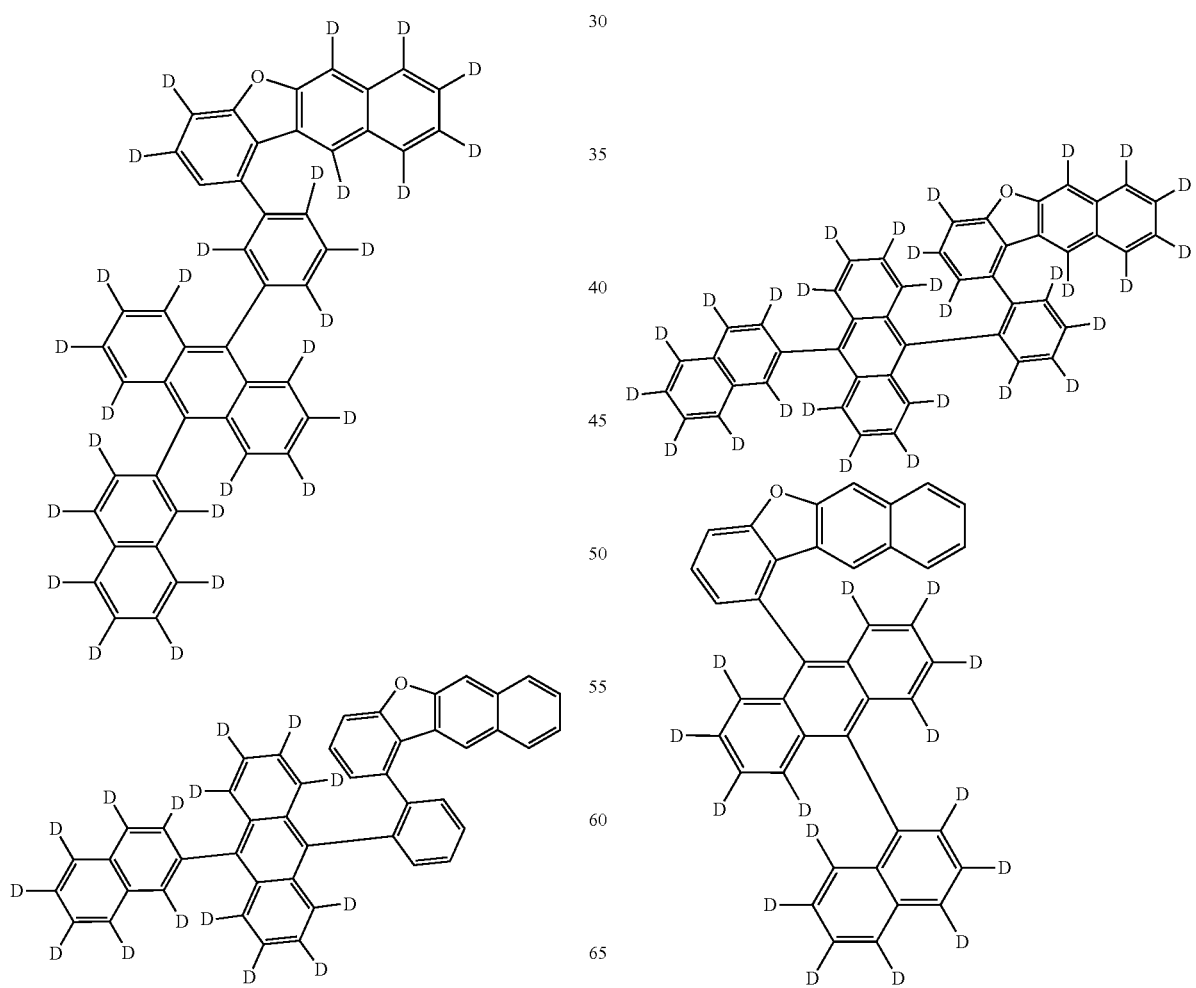

191
-continued
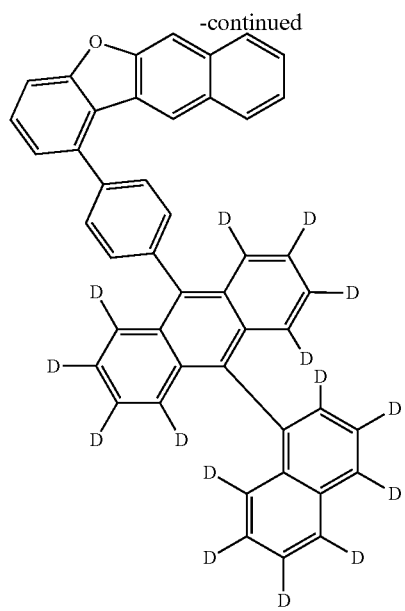
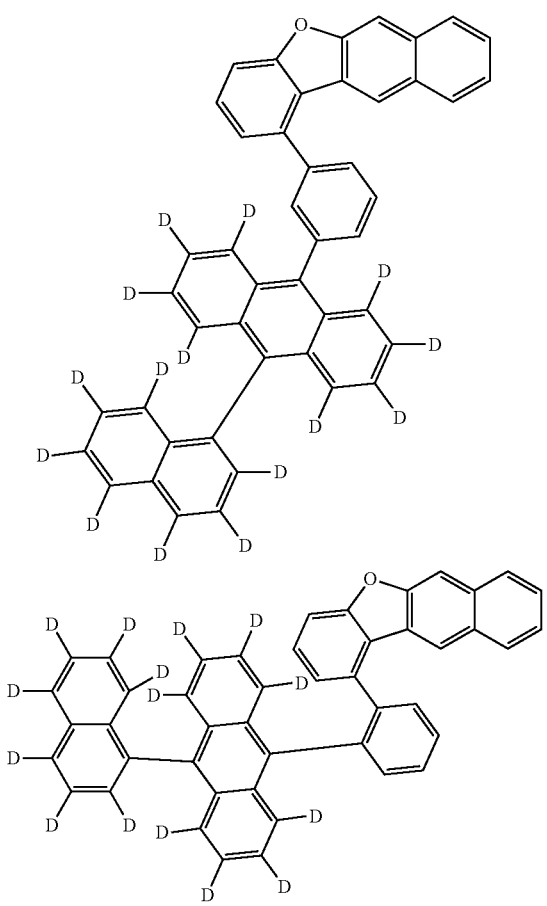
192
-continued
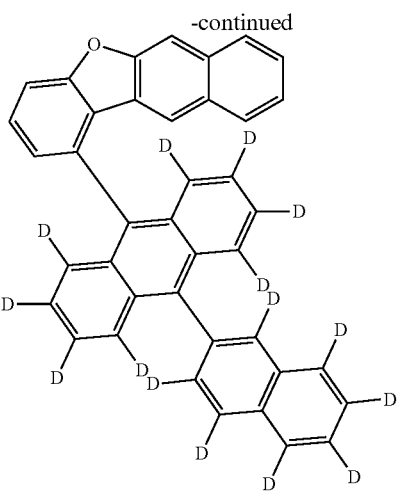
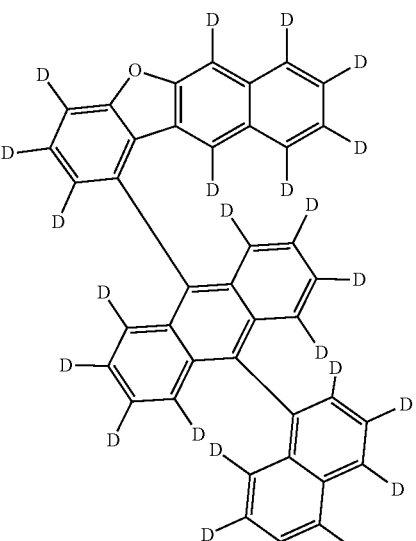
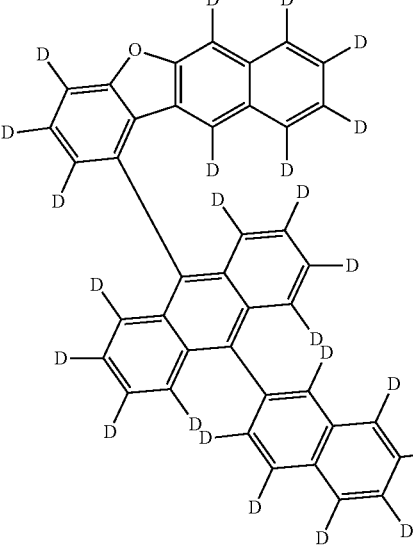

193
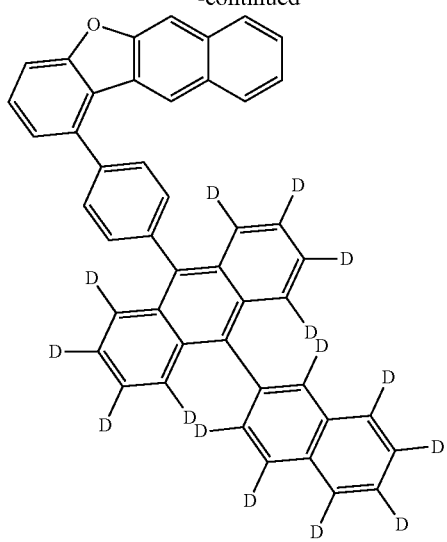
194
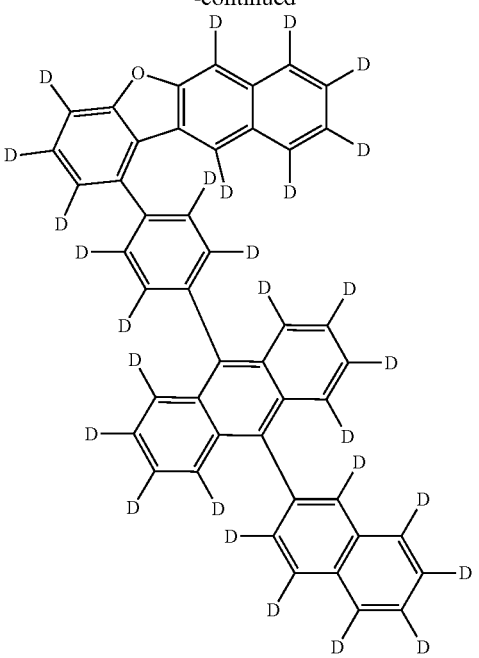
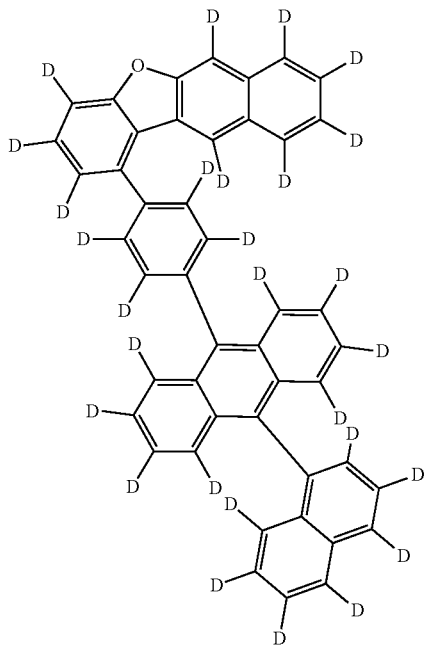
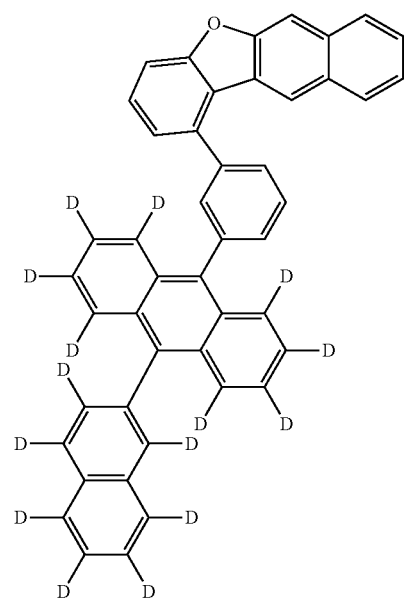

195
-continued
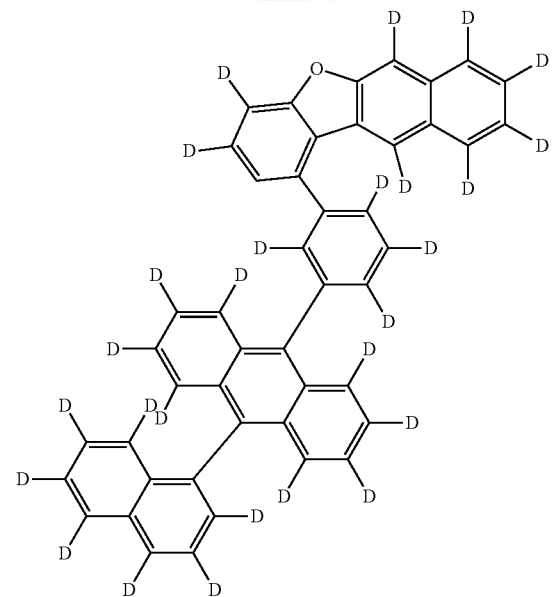
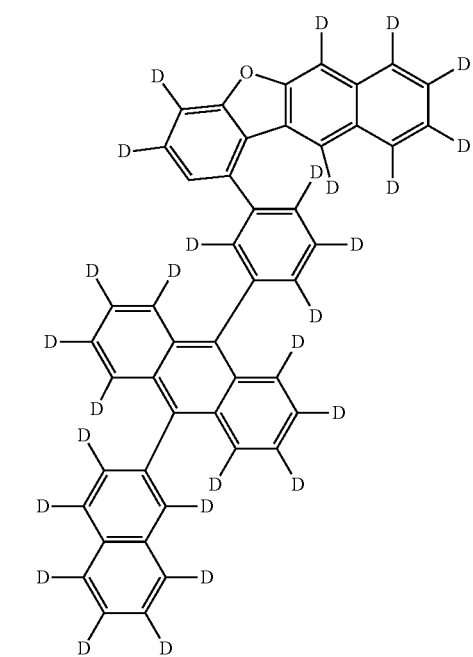
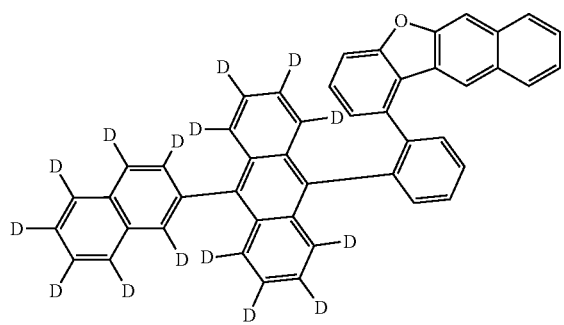
196
-continued
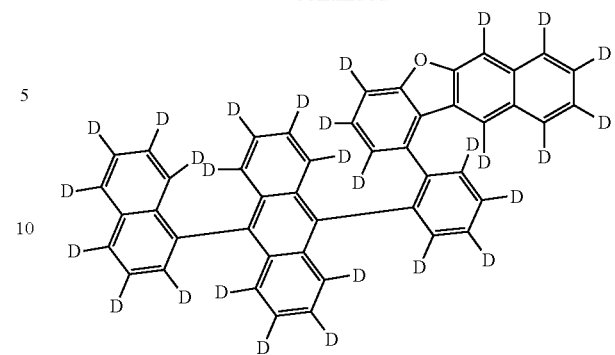
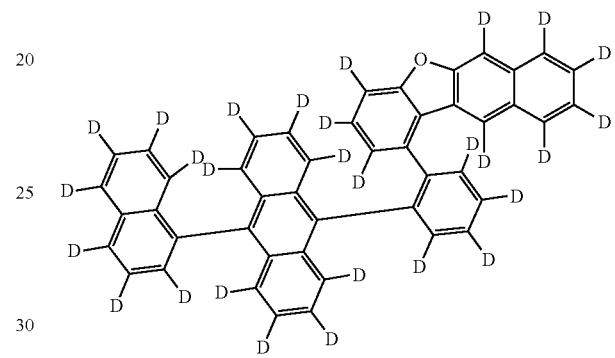
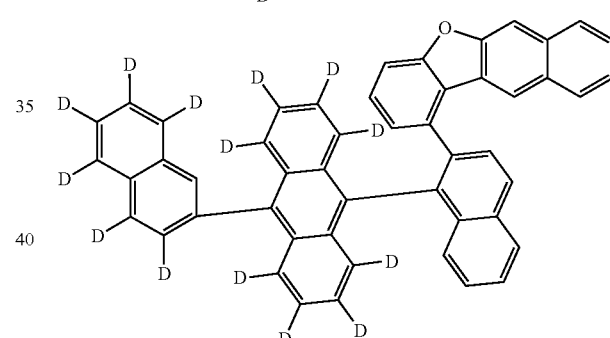
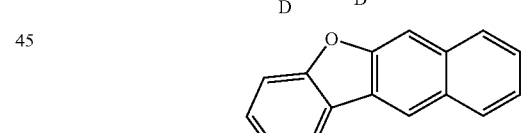
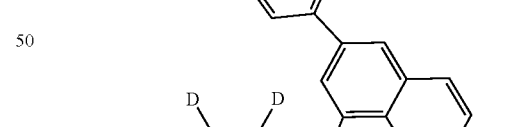
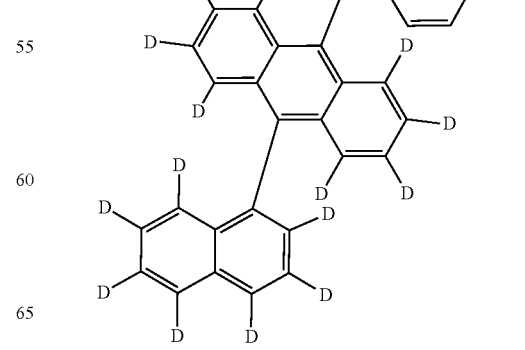

197
-continued
198
-continued
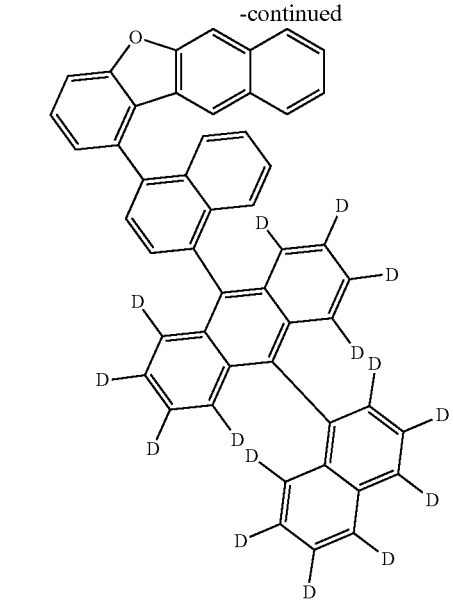
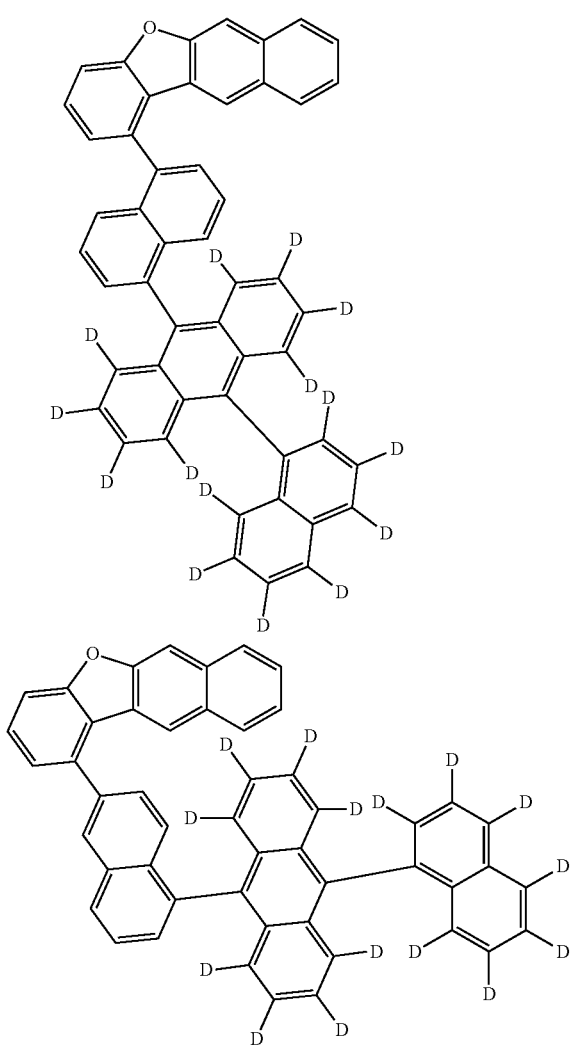
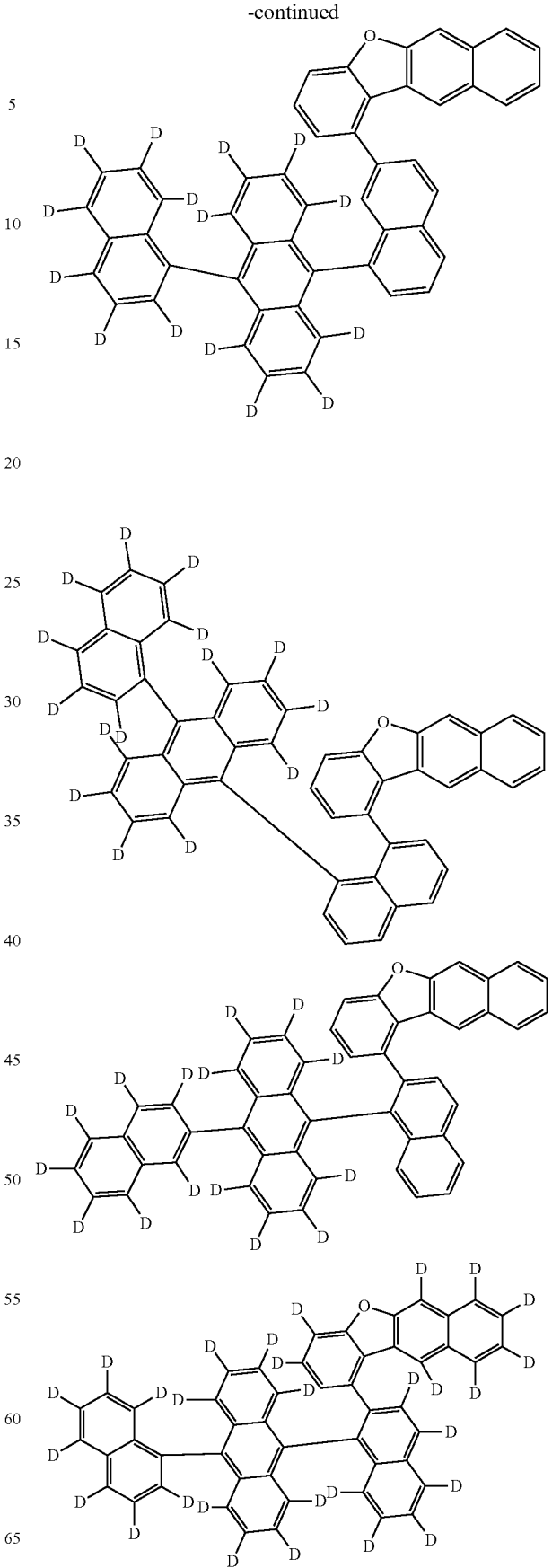

199
-continued
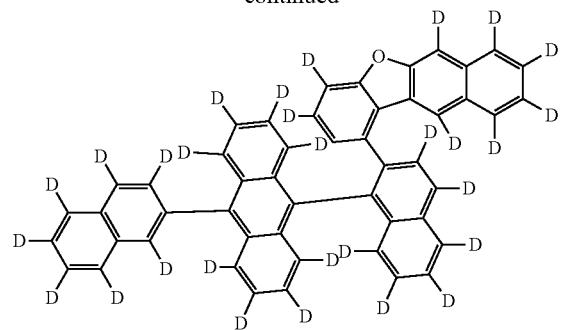
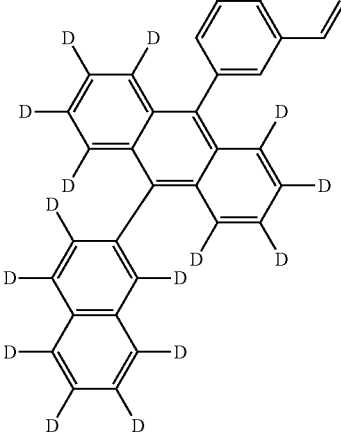
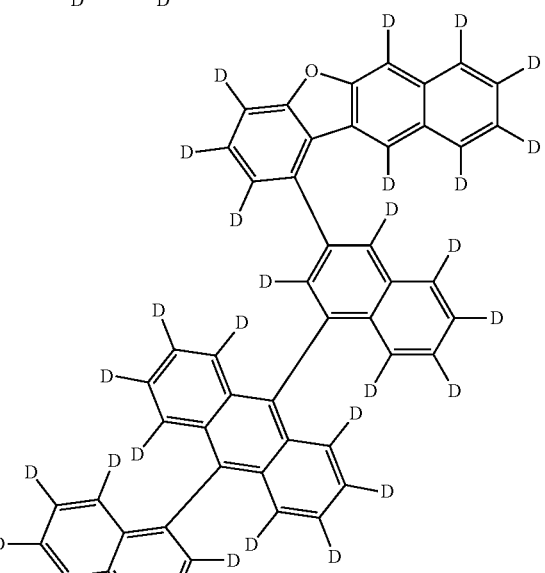
200
-continued
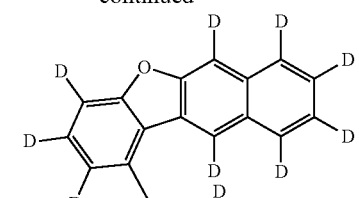
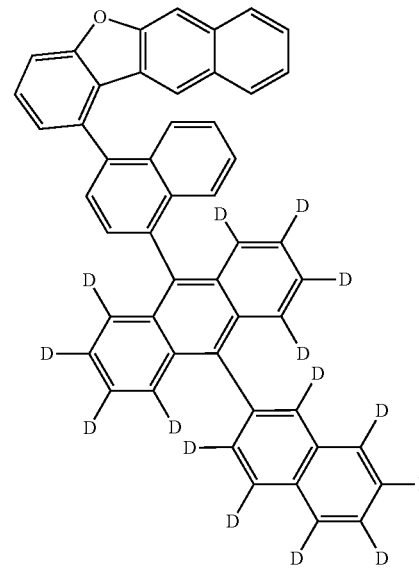

201
-continued
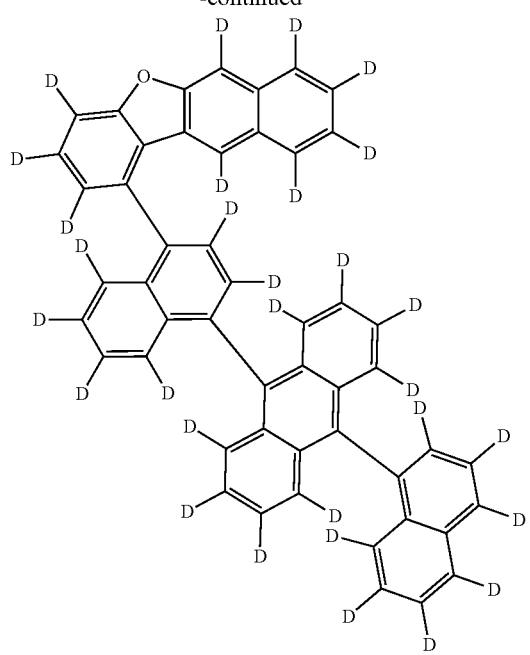
202
-continued
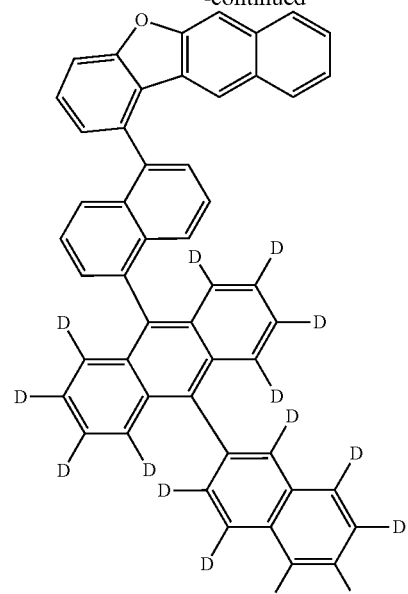
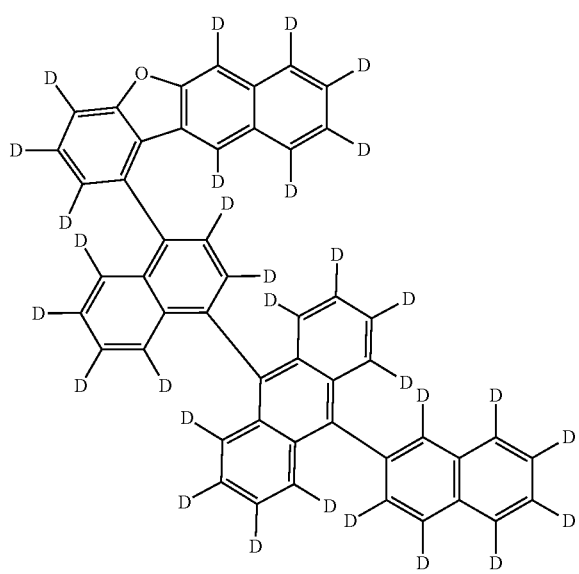
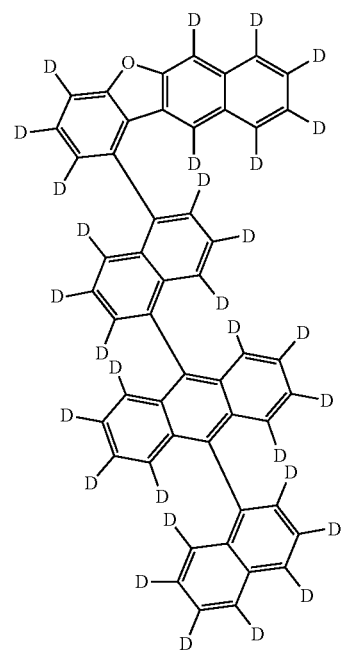

203
-continued
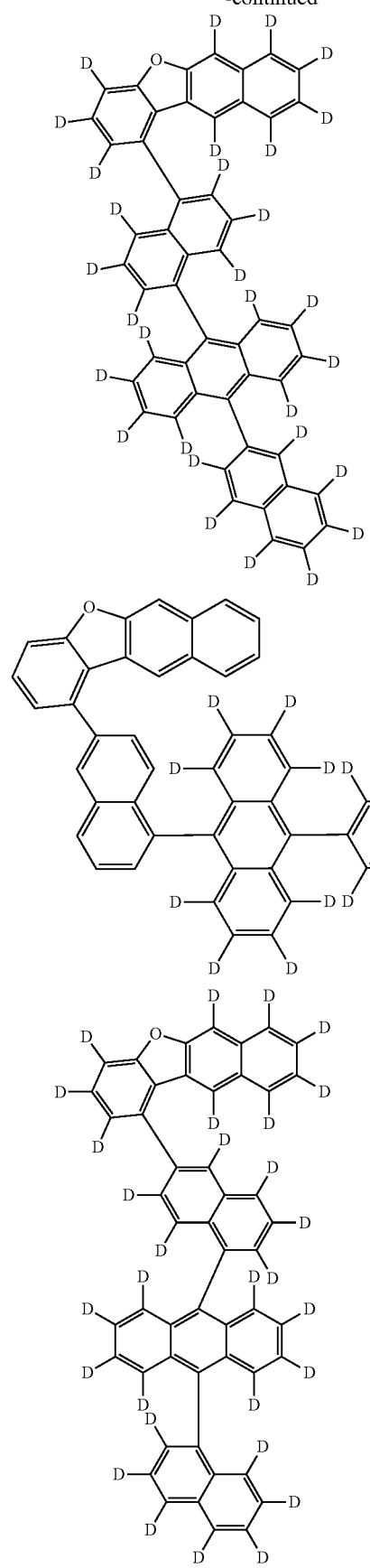
204
-continued
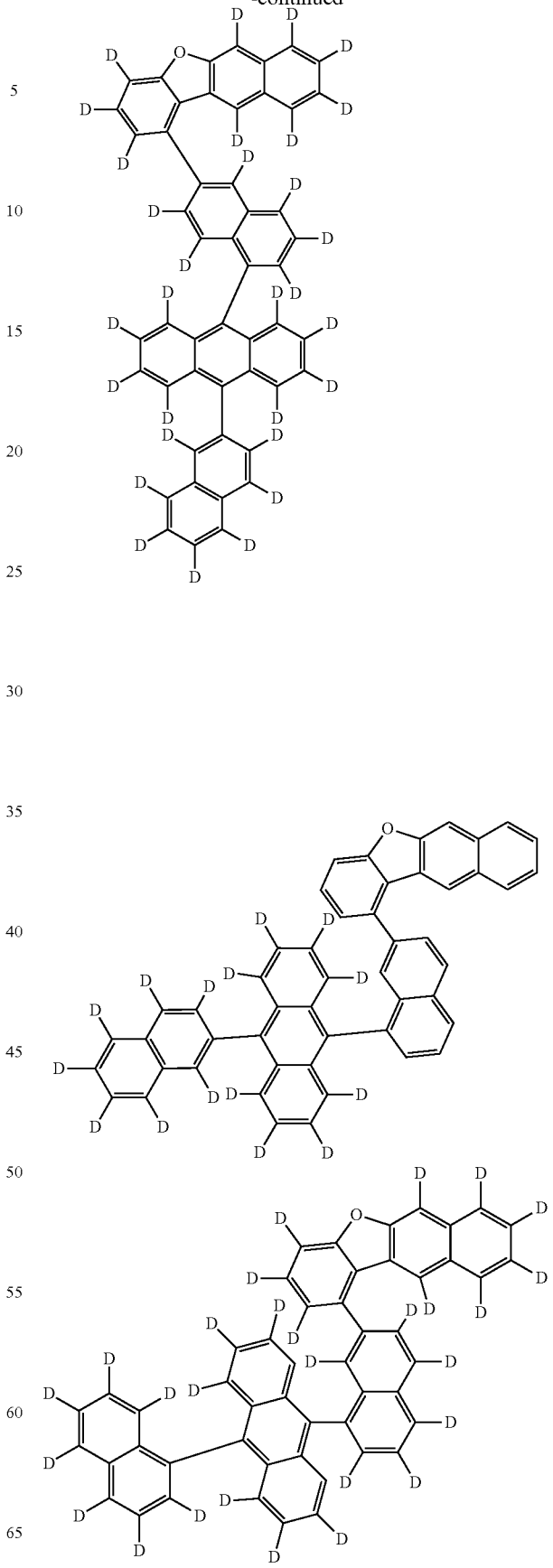

205
-continued
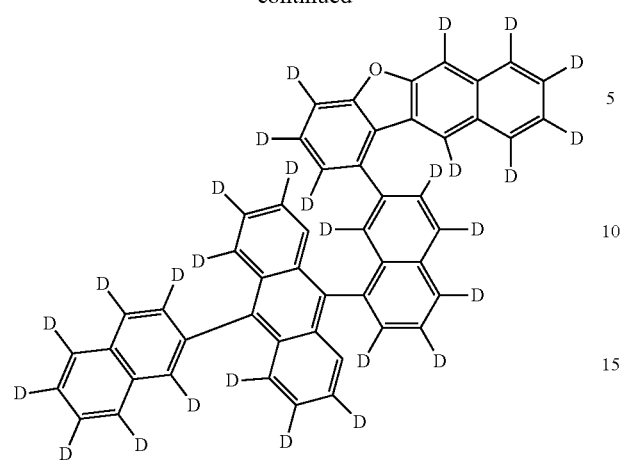
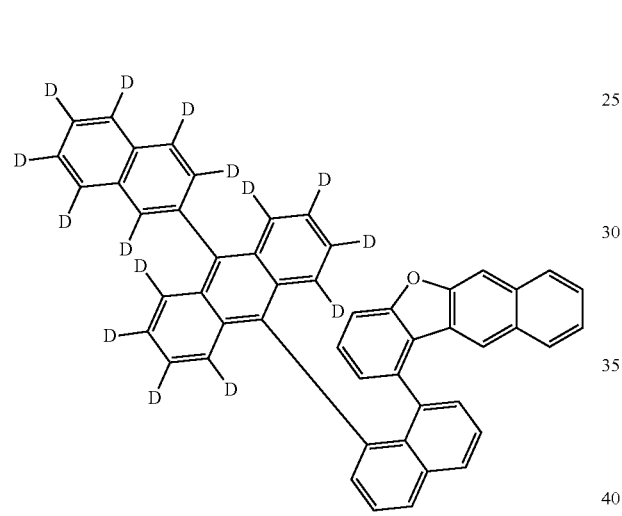
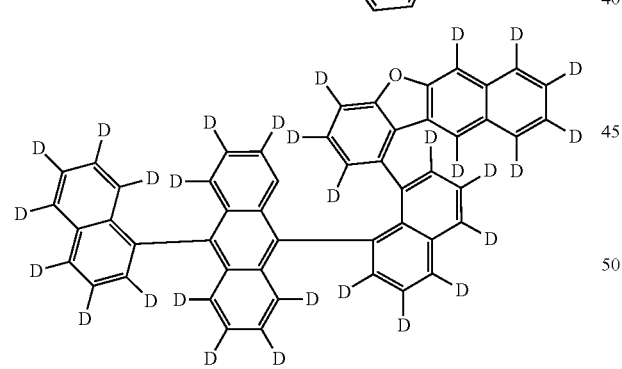
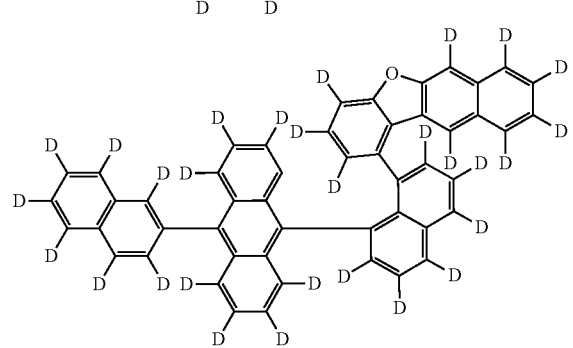
206
-continued
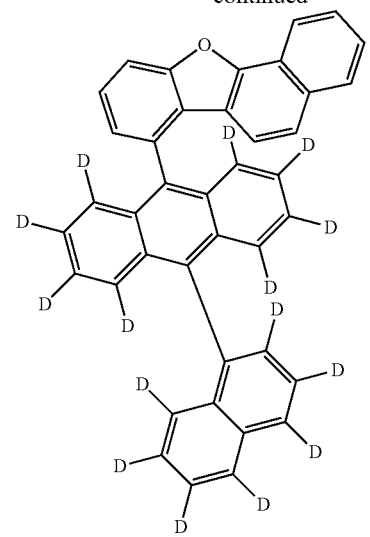
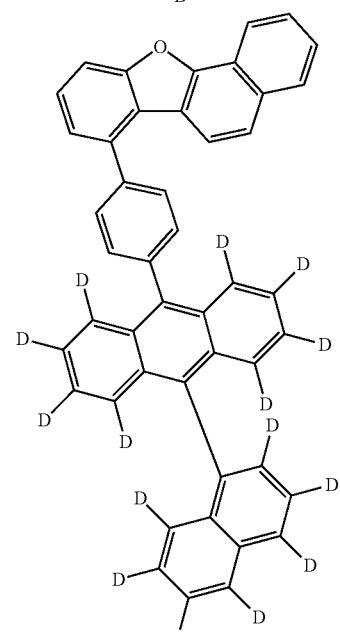
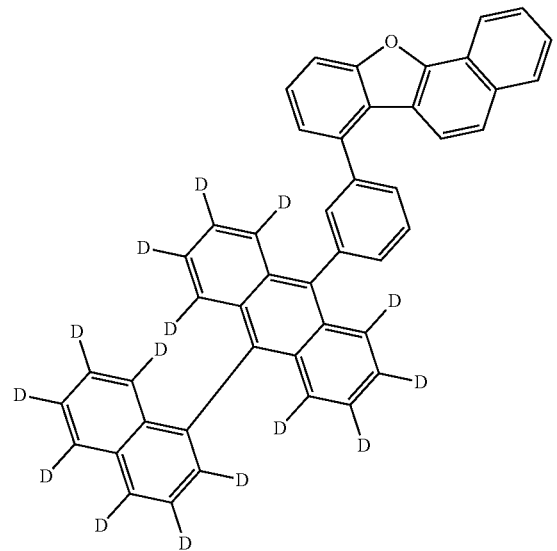 [SMILES: [2H]c1c([2H])c([2H])c2c(-c3c4c([2H])c([2H])c([2H])c([2H])c4c(-c4cccc(-c5cccc6oc7c8ccccc8ccc7c56)c4)c4c([2H])c([2H])c([2H])c([2H])c34)c([2H])c([2H])c([2H])c2c1[2H]]

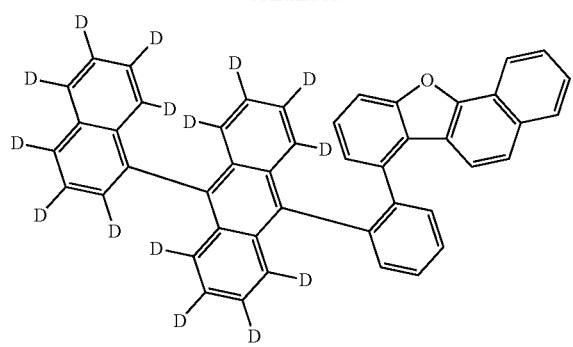 [SMILES: [2H]c1c([2H])c([2H])c2c(-c3c4c([2H])c([2H])c([2H])c([2H])c4c(-c4ccccc4-c4cccc5oc6c7ccccc7ccc6c45)c4c([2H])c([2H])c([2H])c([2H])c34)c([2H])c([2H])c([2H])c2c1[2H]]
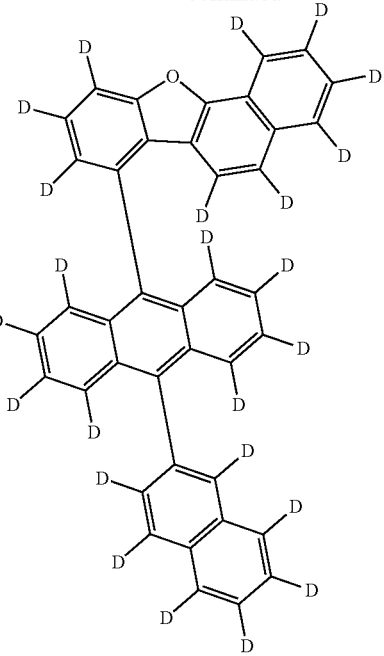
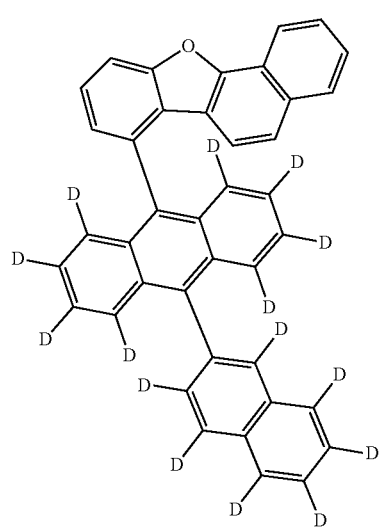
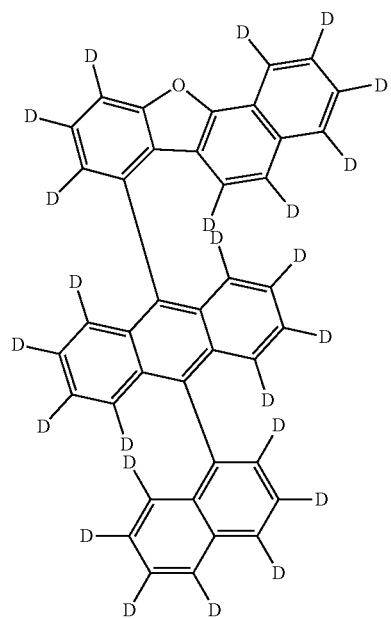
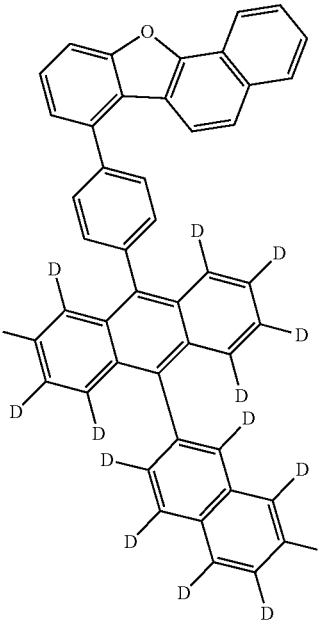

209
-continued
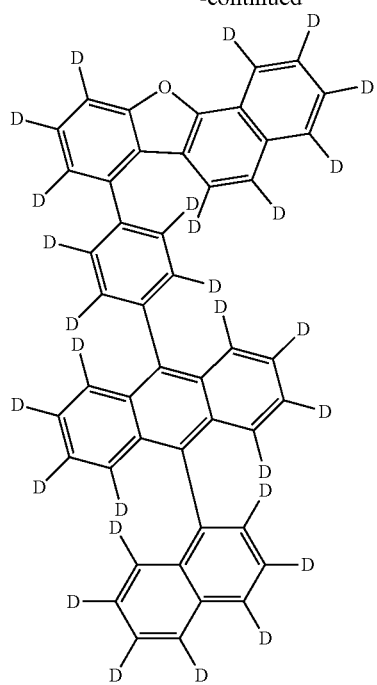
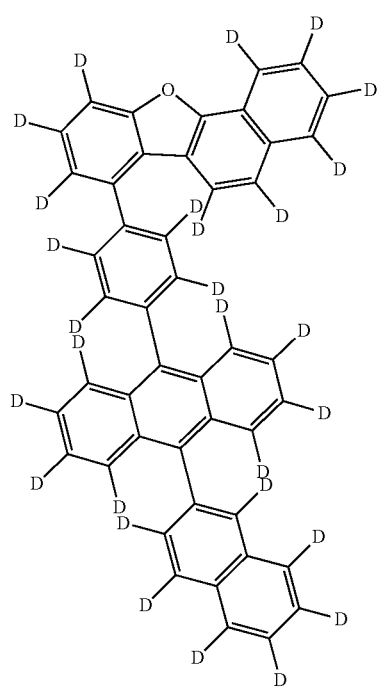
210
-continued
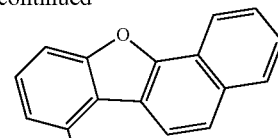
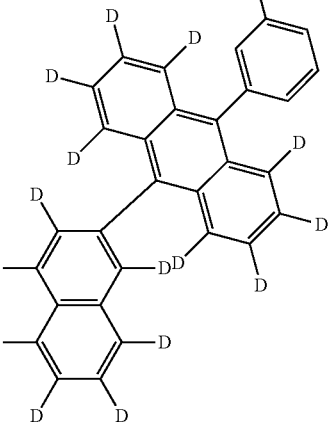
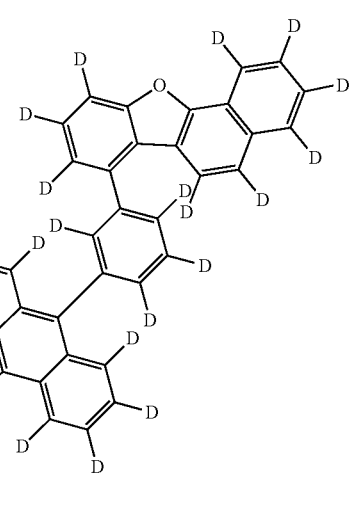
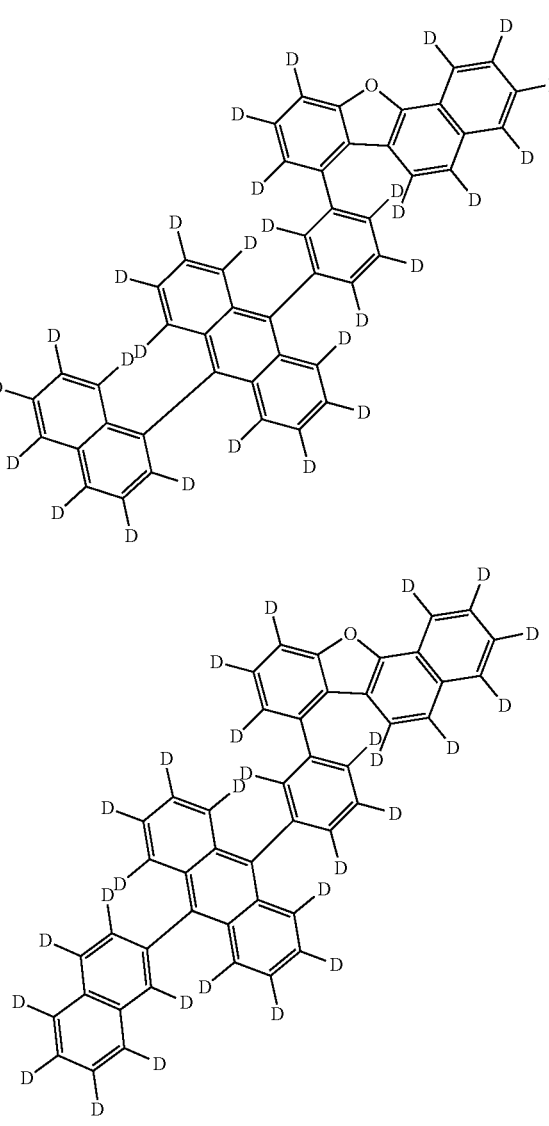

211
-continued
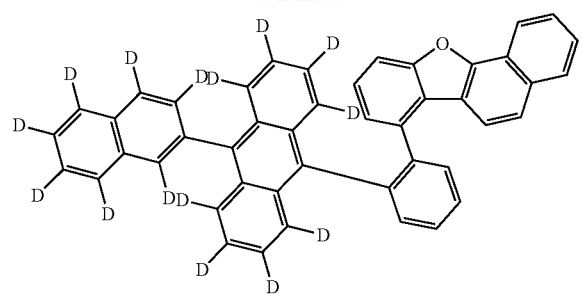
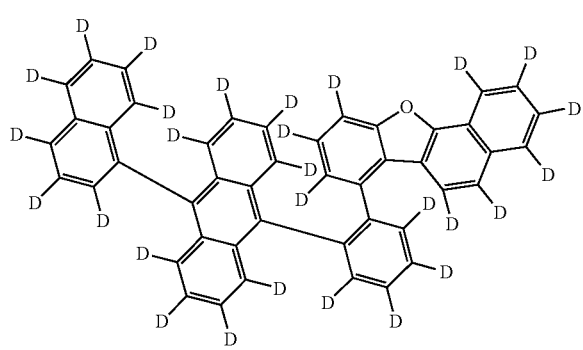
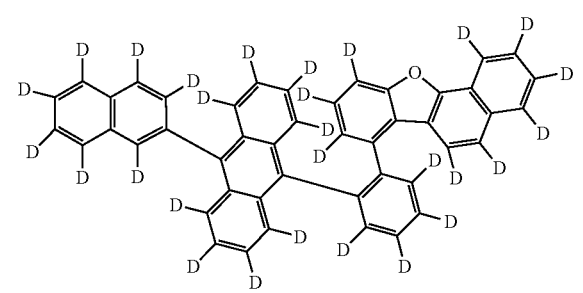
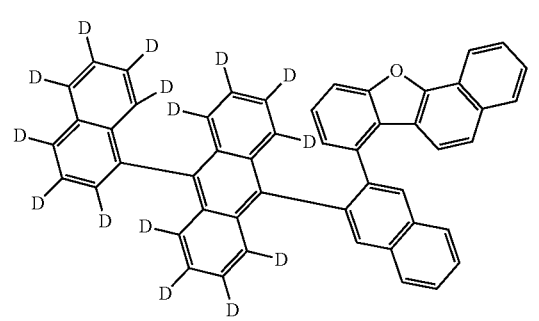
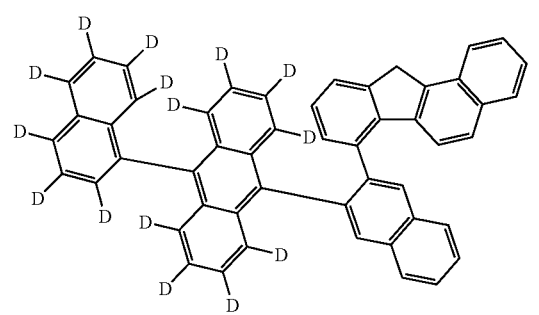
212
-continued
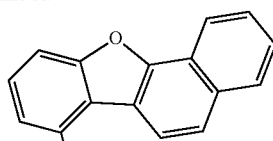
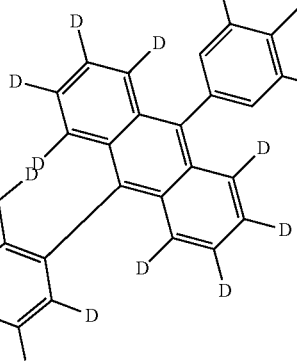
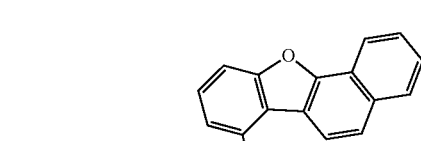
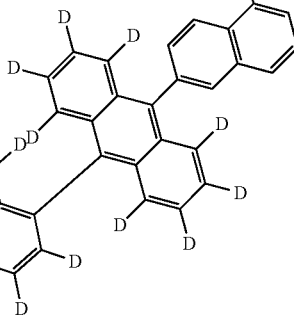
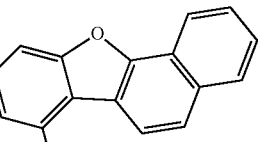
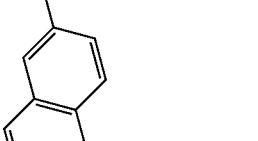
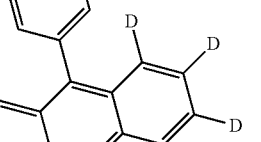
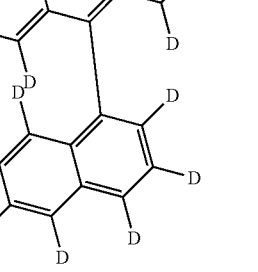

213
-continued
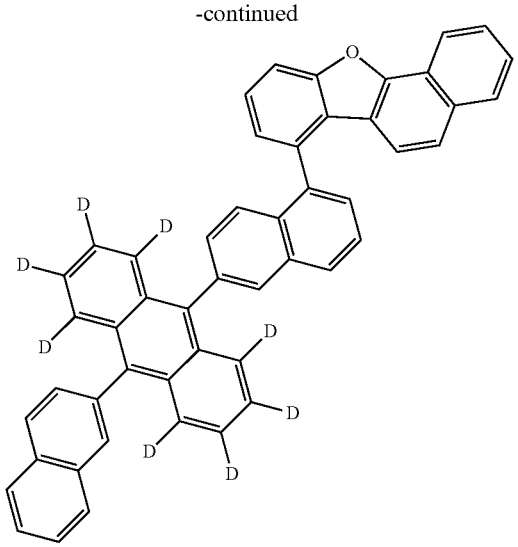
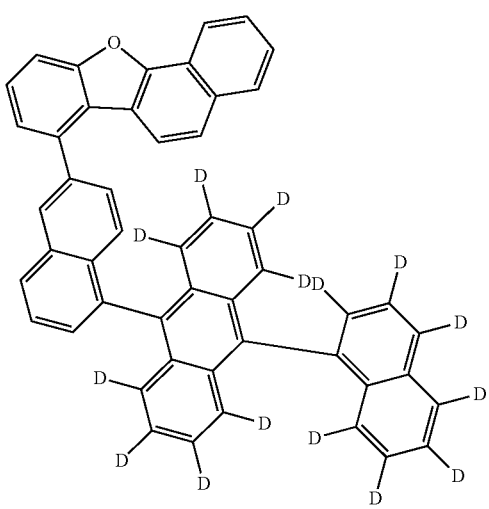
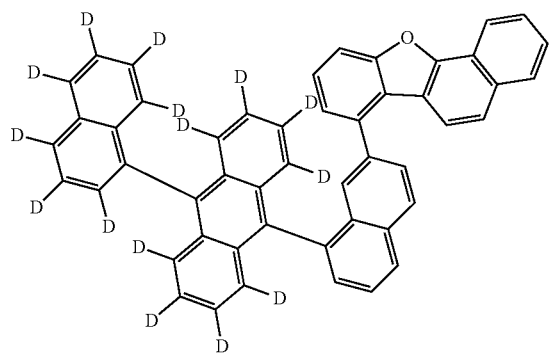
214
-continued
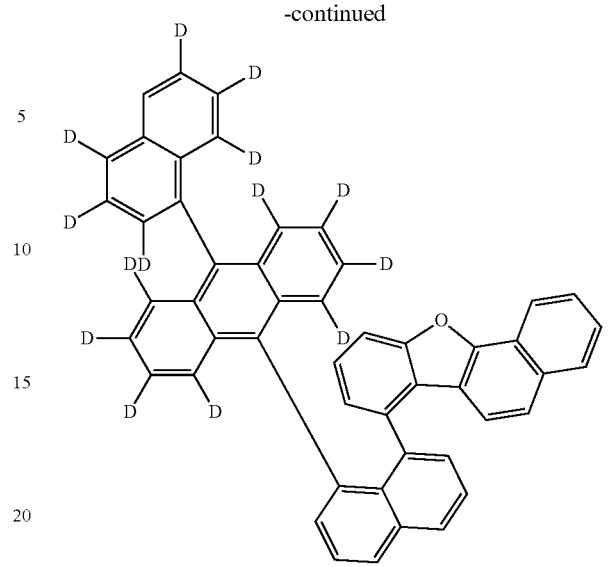
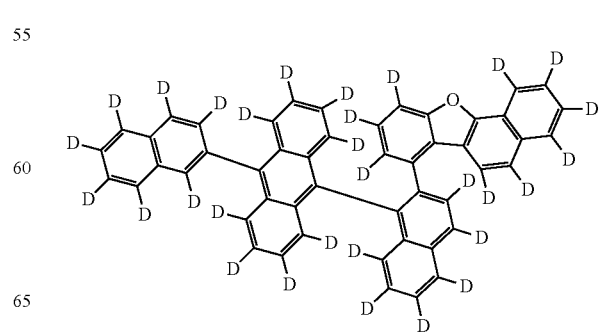

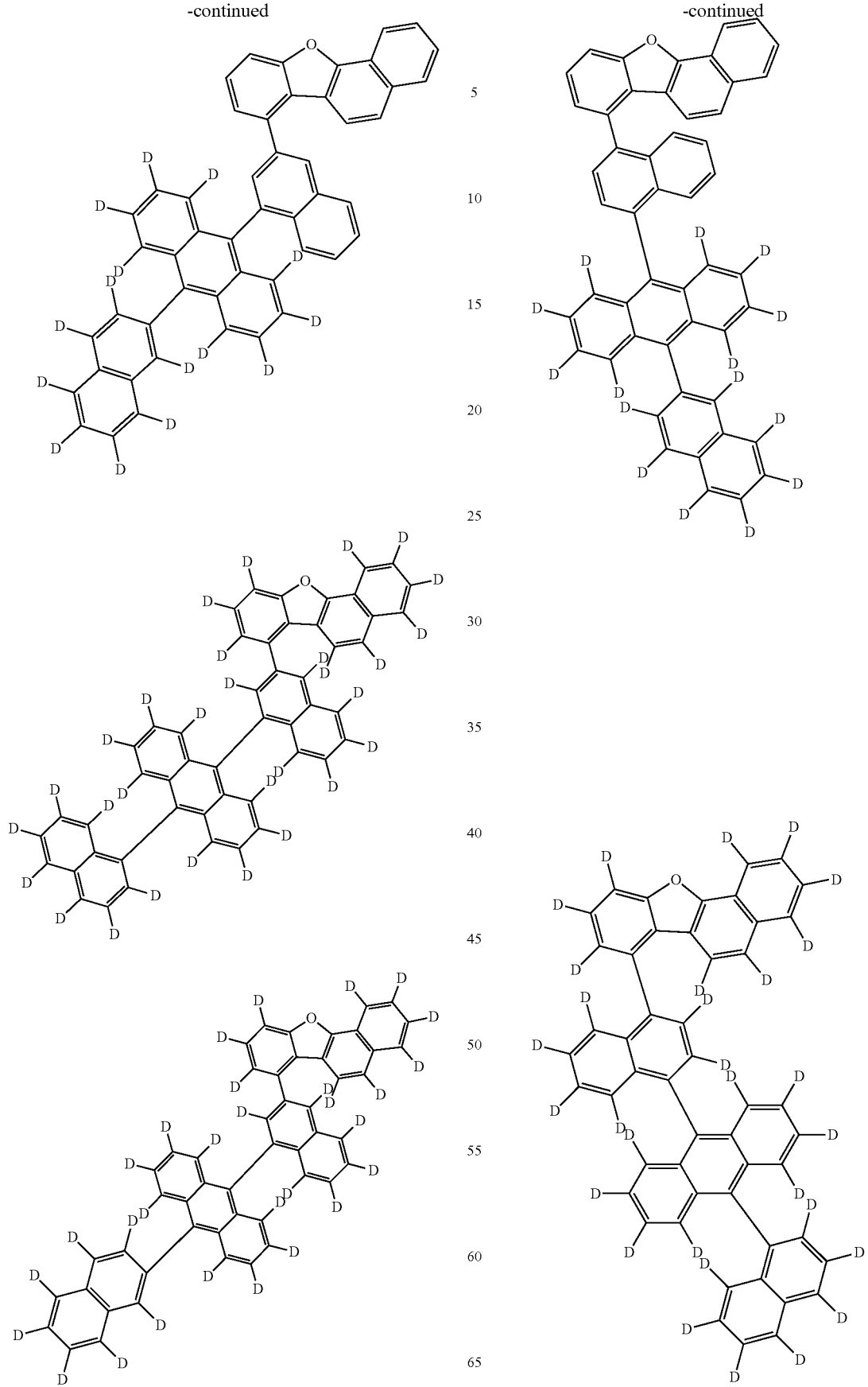

217
-continued
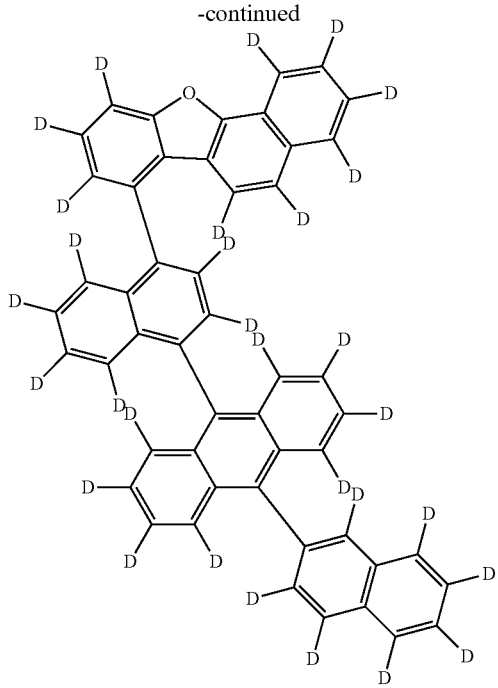
218
-continued
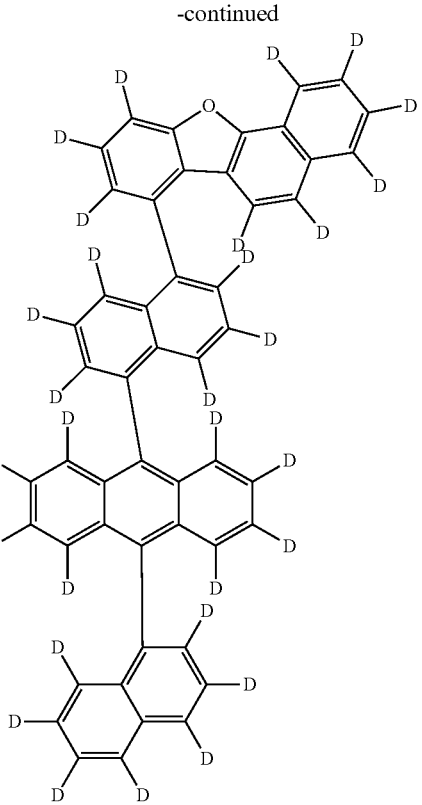
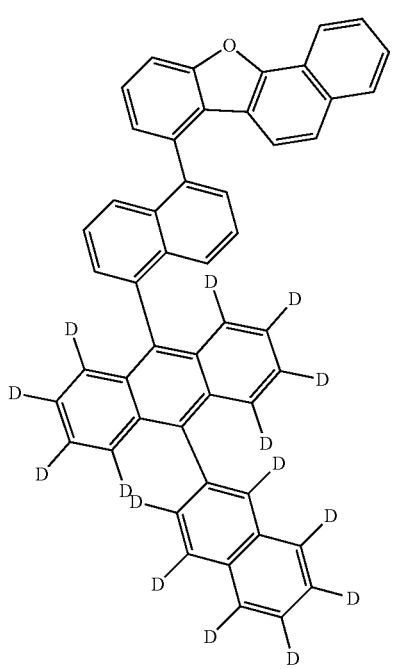

219
-continued
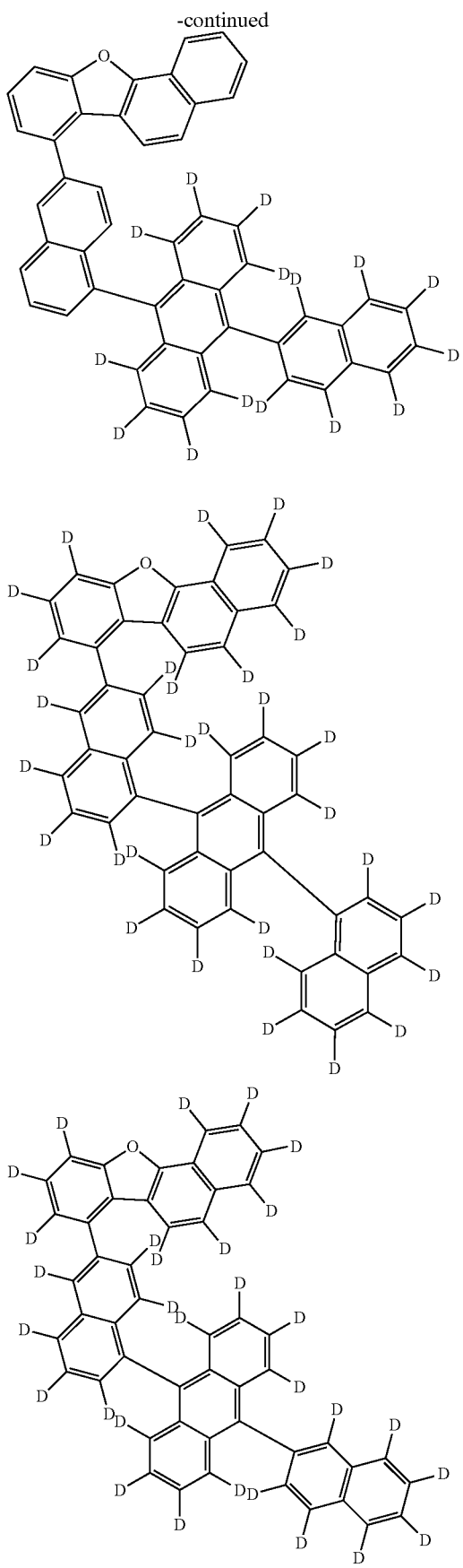
220
-continued
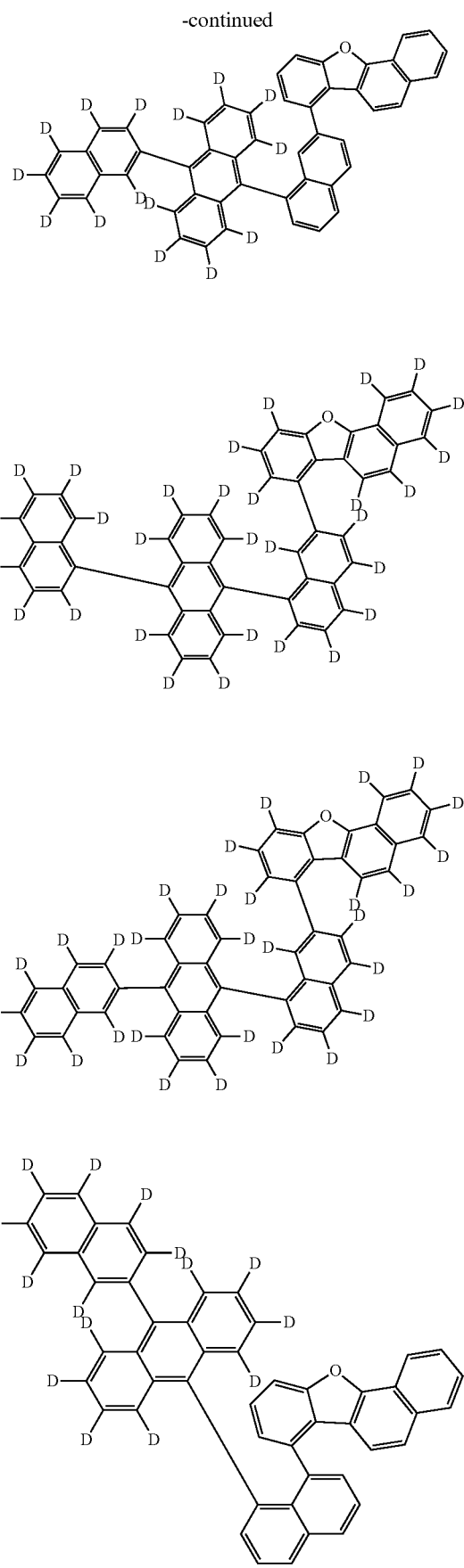

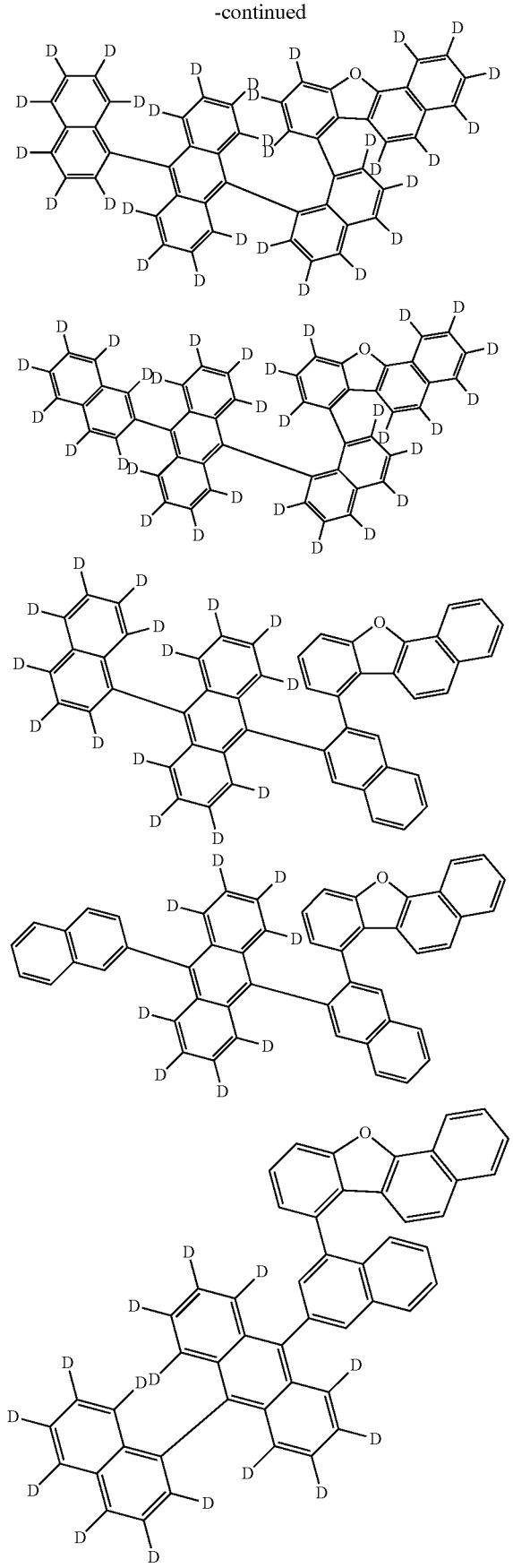
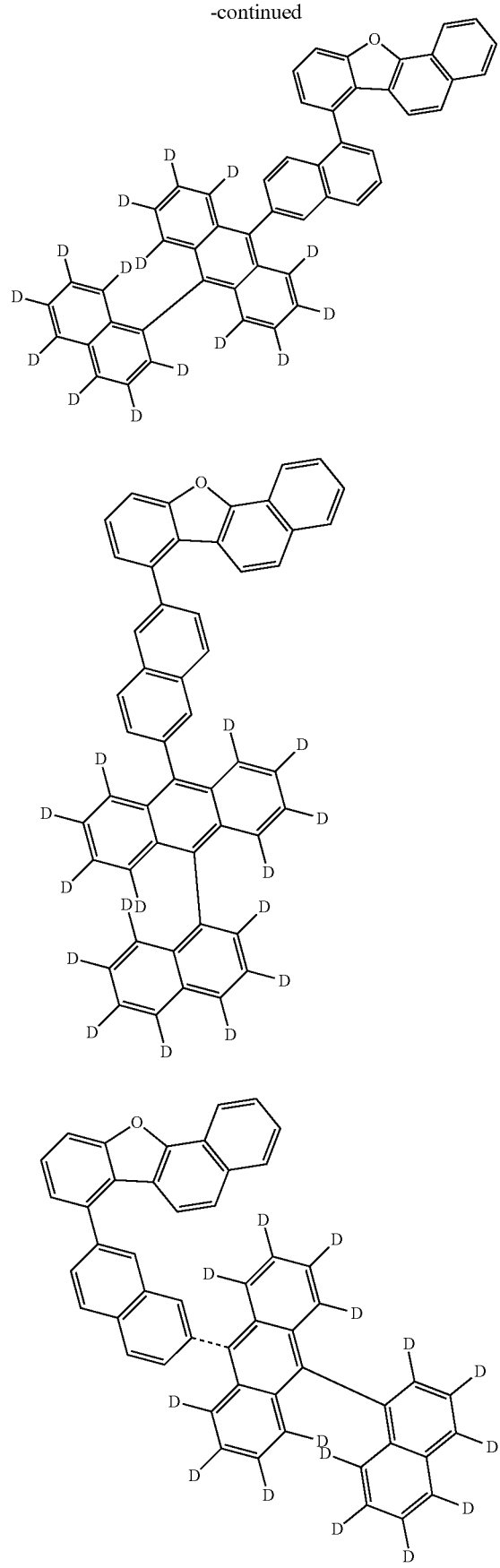

223
-continued
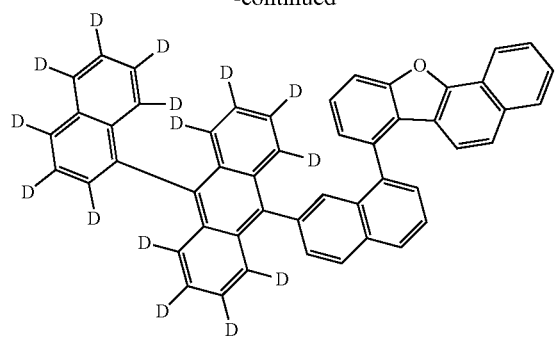
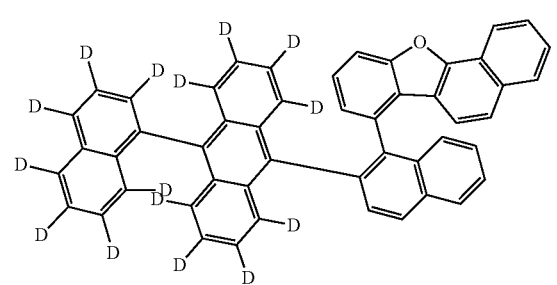
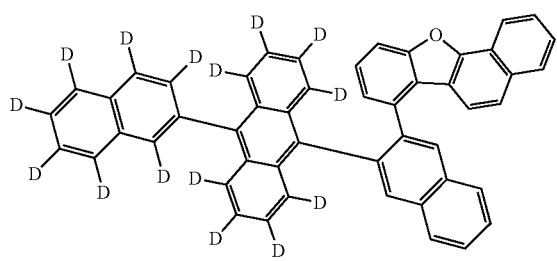
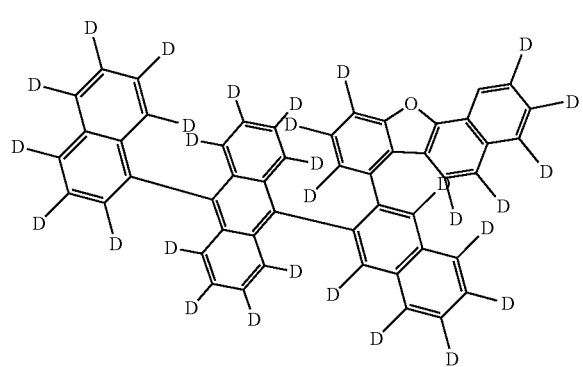
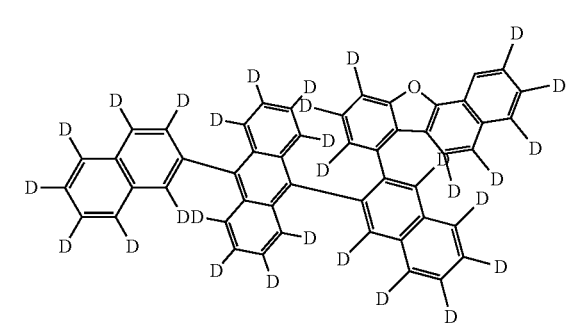
224
-continued
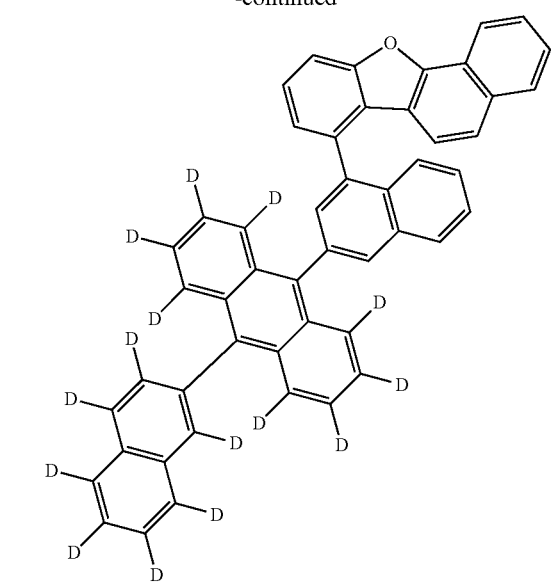
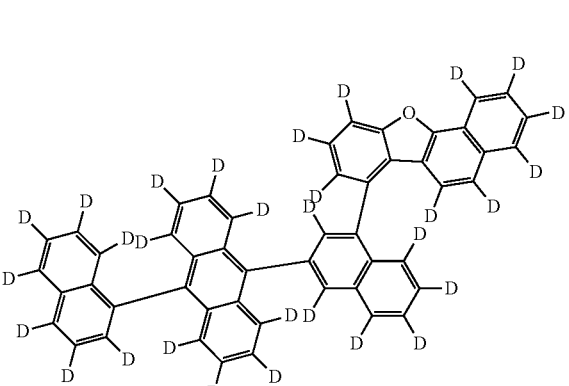
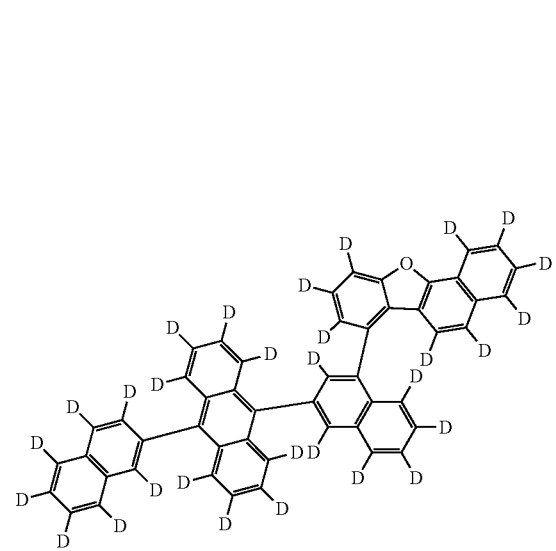

225
-continued
226
-continued
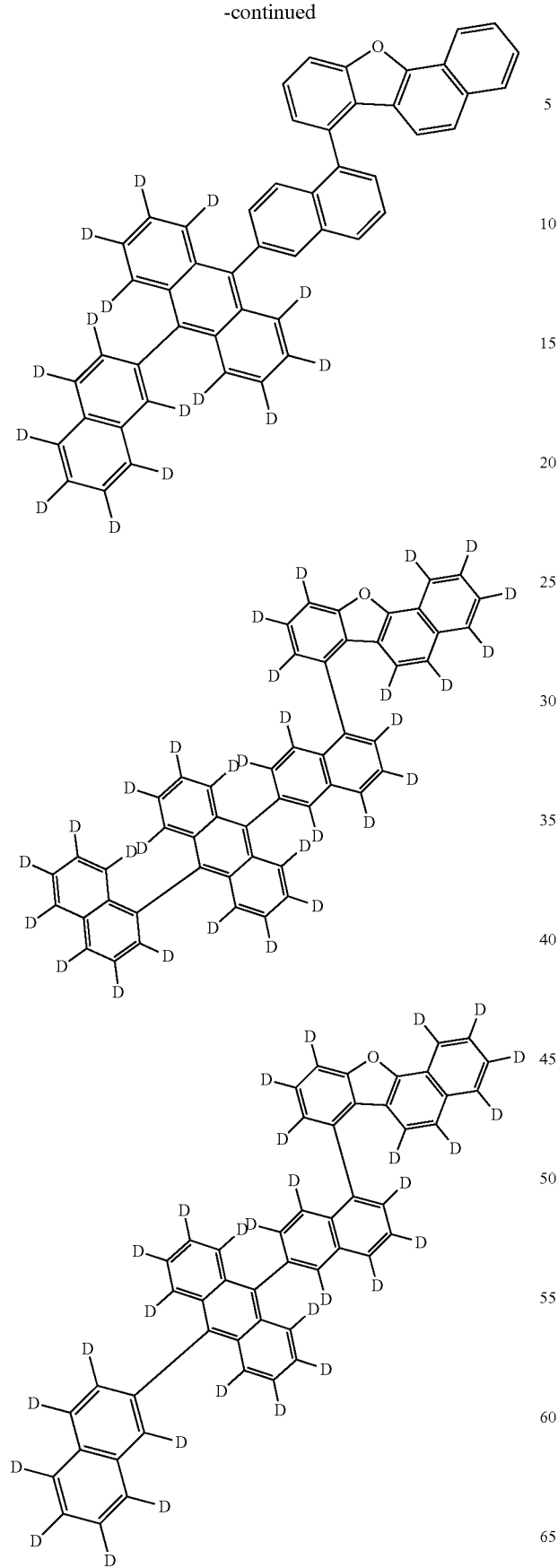
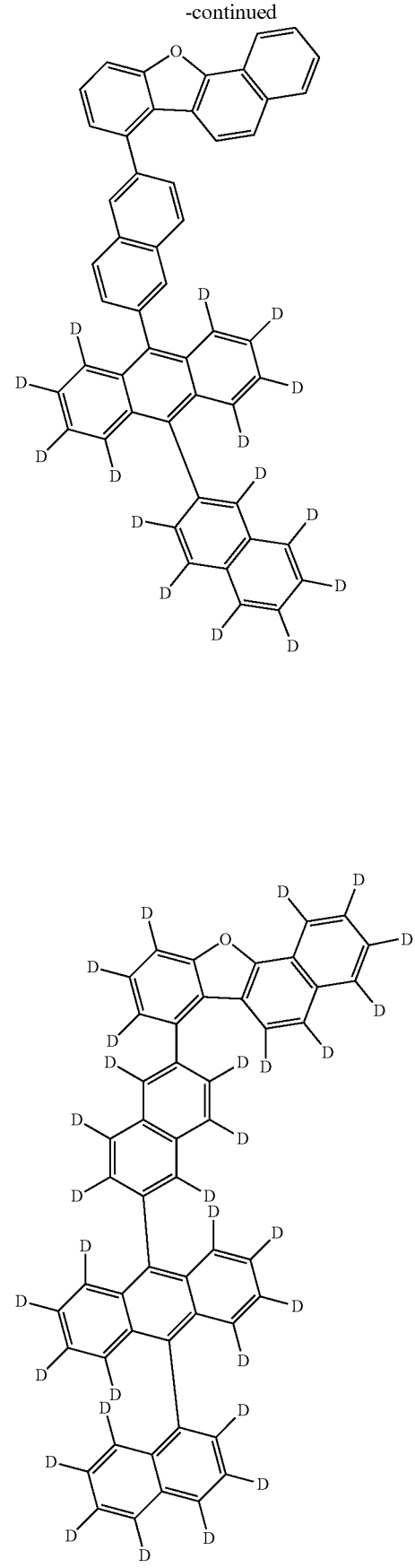

227
-continued
228
-continued
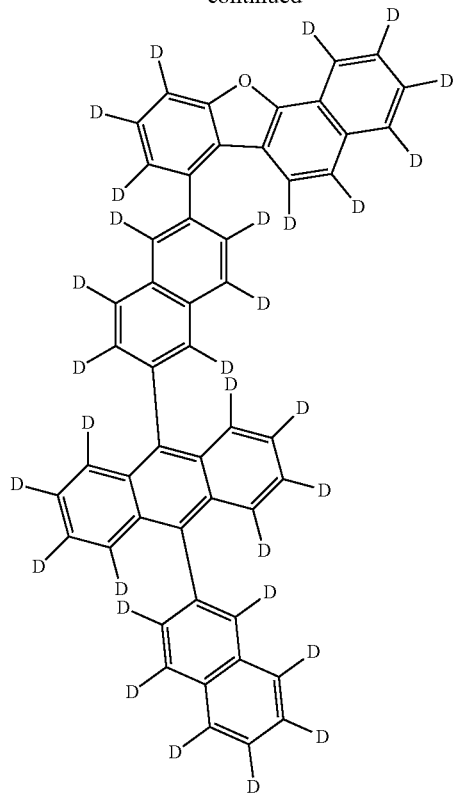
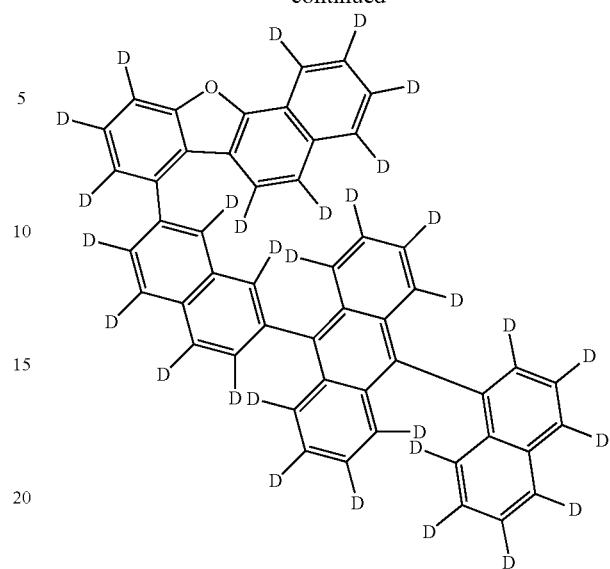
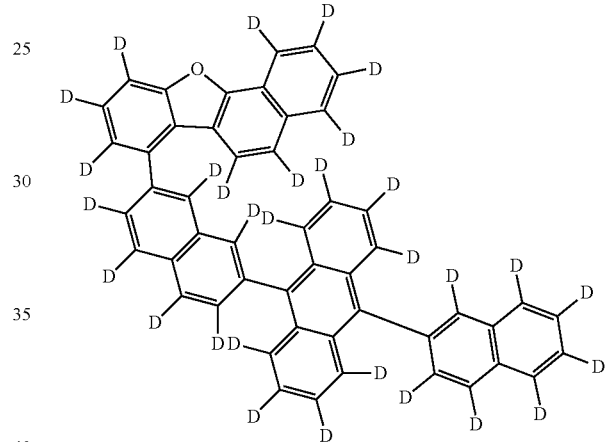
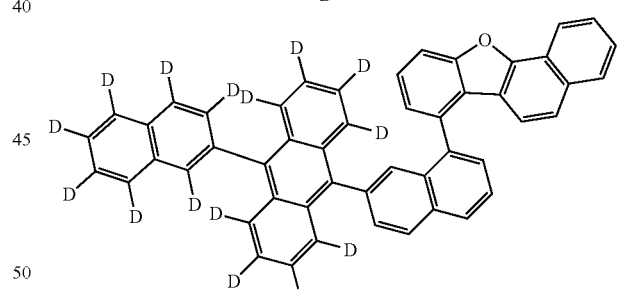
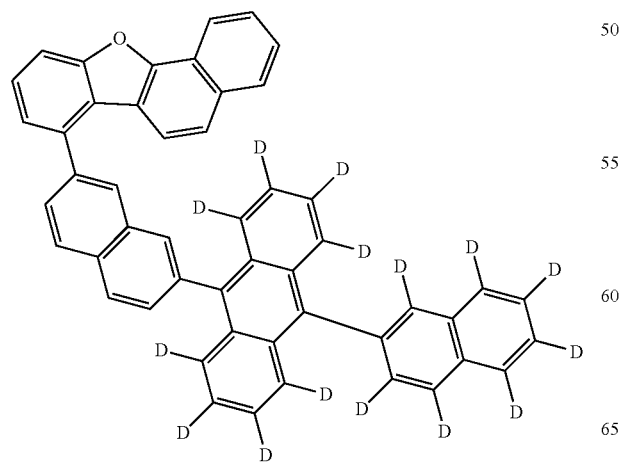

229
-continued

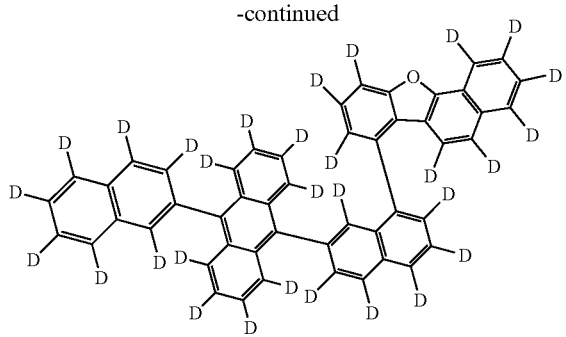

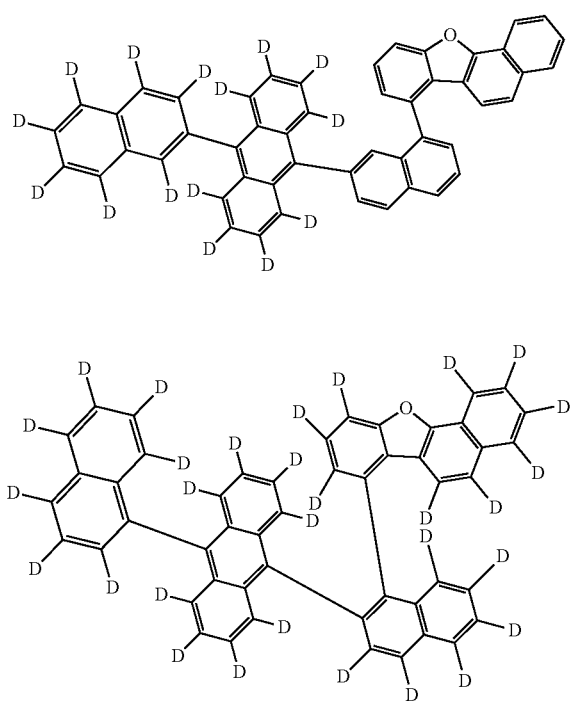

230
-continued

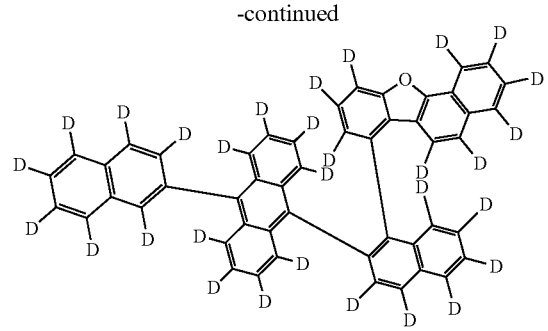

4. An organic light emitting device comprising:
a first electrode;
a second electrode provided to face the first electrode; and
an organic material layer including one or more layers provided between the first electrode and the second electrode,
wherein one or more layers of the organic material layer include the compound of claim 1.

5. The organic light emitting device of claim 4, wherein the organic material layer includes a hole injection layer, a hole transfer layer or an electron blocking layer, and the hole injection layer, the hole transfer layer or the electron blocking layer includes the compound.

6. The organic light emitting device of claim 4, wherein the organic material layer includes a light emitting layer, and the light emitting layer includes the compound.

7. The organic light emitting device of claim 4, wherein the organic material layer includes a light emitting layer, and the light emitting layer includes the compound as a host of the light emitting layer.

8. The organic light emitting device of claim 7, wherein the light emitting layer includes a dopant, and the dopant includes one or more selected from the group consisting of a fluorescent dopant, a phosphorescent dopant and a thermal delayed fluorescence-based dopant.

9. The organic light emitting device of claim 8, wherein the fluorescent dopant includes one or more selected from the group consisting of an arylamine-based compound and a boron-based compound.

* * * * *